United States Patent
Raring et al.

(10) Patent No.: US 11,973,308 B2
(45) Date of Patent: Apr. 30, 2024

(54) INTEGRATED WHITE LIGHT SOURCE USING A LASER DIODE AND A PHOSPHOR IN A SURFACE MOUNT DEVICE PACKAGE

(71) Applicant: KYOCERA SLD Laser, Inc., Goleta, CA (US)

(72) Inventors: James W. Raring, Santa Barbara, CA (US); Paul Rudy, Manhattan Beach, CA (US); Eric Goutain, Fremont, CA (US); Troy Trottier, Cary, NC (US); Melvin McLaurin, Santa Barbara, CA (US); James Harrison, Oro Valley, AZ (US); Sten Heikman, Goleta, CA (US); Michael Cantore, Goleta, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 696 days.

(21) Appl. No.: 17/103,587

(22) Filed: Nov. 24, 2020

(65) Prior Publication Data

US 2021/0151956 A1 May 20, 2021

Related U.S. Application Data

(60) Division of application No. 16/014,010, filed on Jun. 21, 2018, now Pat. No. 10,879,673, which is a
(Continued)

(51) Int. Cl.
*H01S 5/00* (2006.01)
*F21K 9/64* (2016.01)
(Continued)

(52) U.S. Cl.
CPC .............. *H01S 5/0087* (2021.01); *F21K 9/64* (2016.08); *H01S 5/02257* (2021.01);
(Continued)

(58) Field of Classification Search
CPC ........... F21K 9/64; H01S 5/005; H01S 5/0092
See application file for complete search history.

(56) References Cited

U.S. PATENT DOCUMENTS

| | | | |
|---|---|---|---|
| 4,341,592 A | 7/1982 | Shortes et al. | |
| 4,747,648 A | 5/1988 | Gilliland, III | |

(Continued)

FOREIGN PATENT DOCUMENTS

| | | |
|---|---|---|
| CN | 101567417 A | 10/2009 |
| CN | 101604665 A | 12/2009 |

(Continued)

OTHER PUBLICATIONS

ABARE "Cleaved and Etched Facet Nitride Laser Diodes," IEEE Journal of Selected Topics in Quantum Electronics, vol. 4, No. 3, pp. 505-509 (May 1998).
(Continued)

*Primary Examiner* — Sean P Hagan
(74) *Attorney, Agent, or Firm* — Kilpatrick Townsend & Stockton LLP

(57) ABSTRACT

The embodiments described herein provide a device and method for an integrated white colored electromagnetic radiation source using a combination of laser diode excitation sources based on gallium and nitrogen containing materials and light emitting source based on phosphor materials. A violet, blue, or other wavelength laser diode source based on gallium and nitrogen materials may be closely integrated with phosphor materials, such as yellow phosphors, to form a compact, high-brightness, and highly-efficient, white light source. The phosphor material is provided with a plurality of scattering centers scribed on an excitation surface or inside bulk of a plate to scatter electromagnetic radiation of a laser beam from the excitation source incident on the excitation surface to enhance generation and quality of an emitted light from the phosphor (Continued)

material for outputting a white light emission either in reflection mode or transmission mode.

18 Claims, 60 Drawing Sheets

Related U.S. Application Data continuation-in-part of application No. 14/829,927, filed on Aug. 19, 2015, now Pat. No. 10,938,182.

(51) Int. Cl.
| | |
|---|---|
| *H01S 5/02212* | (2021.01) |
| *H01S 5/02257* | (2021.01) |
| *H01S 5/023* | (2021.01) |
| *H01S 5/02315* | (2021.01) |
| *H01S 5/02326* | (2021.01) |
| *H01S 5/0233* | (2021.01) |
| *H01S 5/32* | (2006.01) |
| *H01S 5/343* | (2006.01) |
| *H01L 33/00* | (2010.01) |
| *H01S 5/02* | (2006.01) |
| *H01S 5/02345* | (2021.01) |
| *H01S 5/0235* | (2021.01) |
| *H01S 5/22* | (2006.01) |
| *H01S 5/40* | (2006.01) |

(52) U.S. Cl.
CPC .......... *H01S 5/023* (2021.01); *H01S 5/02315* (2021.01); *H01S 5/02326* (2021.01); *H01S 5/0233* (2021.01); *H01S 5/32* (2013.01); *H01S 5/3203* (2013.01); *H01S 5/34333* (2013.01); H01L 33/0045 (2013.01); H01L 2224/48091 (2013.01); H01L 2224/48465 (2013.01); H01L 2224/49175 (2013.01); H01S 5/0202 (2013.01); H01S 5/0216 (2013.01); H01S 5/0217 (2013.01); H01S 5/02212 (2013.01); H01S 5/02345 (2021.01); H01S 5/0235 (2021.01); H01S 5/2201 (2013.01); H01S 5/320225 (2019.08); H01S 5/32025 (2019.08); H01S 5/320275 (2019.08); H01S 5/4056 (2013.01)

(56) References Cited

U.S. PATENT DOCUMENTS

| | | | |
|---|---|---|---|
| 4,860,687 A | 8/1989 | Frijlink | |
| 4,878,161 A | 10/1989 | Nakata | |
| 4,911,102 A | 3/1990 | Manabe et al. | |
| 5,184,882 A | 2/1993 | Davenport et al. | |
| 5,208,307 A | 5/1993 | Doi et al. | |
| 5,297,227 A | 3/1994 | Brown et al. | |
| 5,301,090 A | 4/1994 | Hed | |
| 5,331,654 A | 7/1994 | Jewell et al. | |
| 5,334,277 A | 8/1994 | Nakamura | |
| 5,366,953 A | 11/1994 | Char et al. | |
| 5,527,417 A | 6/1996 | Lida et al. | |
| 5,535,230 A | 7/1996 | Abe | |
| 5,607,899 A | 3/1997 | Yoshida et al. | |
| 5,632,812 A | 5/1997 | Hirabayashi | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 5,890,796 A | 4/1999 | Marinelli et al. | |
| 5,926,493 A | 7/1999 | O'Brien et al. | |
| 5,951,923 A | 9/1999 | Rorie et al. | |
| 6,069,394 A | 5/2000 | Hashimoto et al. | |
| 6,147,953 A | 11/2000 | Duncan | |
| 6,153,010 A | 11/2000 | Kiyoku et al. | |
| 6,239,454 B1 | 5/2001 | Glew et al. | |
| 6,379,985 B1 | 4/2002 | Cervantes et al. | |
| 6,451,157 B1 | 9/2002 | Hubacek | |
| 6,489,636 B1 | 12/2002 | Goetz et al. | |
| 6,586,762 B2 | 7/2003 | Kozaki | |
| 6,635,904 B2 | 10/2003 | Goetz et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,791,103 B2 | 9/2004 | Nakamura et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,920,166 B2 | 7/2005 | Akasaka et al. | |
| 7,009,199 B2 | 3/2006 | Hall | |
| 7,033,858 B2 | 4/2006 | Chai et al. | |
| 7,053,413 B2 | 5/2006 | D'Evelyn et al. | |
| 7,063,741 B2 | 6/2006 | D'Evelyn | |
| 7,128,849 B2 | 10/2006 | Setlur et al. | |
| 7,177,069 B2 | 2/2007 | Spath et al. | |
| 7,206,133 B2 | 4/2007 | Cassarly et al. | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,489,441 B2 | 2/2009 | Scheible et al. | |
| 7,555,025 B2 | 6/2009 | Yoshida | |
| 7,667,238 B2 | 2/2010 | Erchak et al. | |
| 7,691,658 B2 | 4/2010 | Kaeding et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,842,958 B1 | 11/2010 | Sekine | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,017,932 B2 | 10/2011 | Okamoto et al. | |
| 8,044,412 B2 | 10/2011 | Murphy et al. | |
| 8,124,996 B2 | 2/2012 | Raring et al. | |
| 8,126,024 B1 | 2/2012 | Raring | |
| 8,143,148 B1 | 3/2012 | Raring et al. | |
| 8,242,522 B1 | 8/2012 | Raring | |
| 8,247,887 B1 | 8/2012 | Raring et al. | |
| 8,252,662 B1 | 8/2012 | Poblenz et al. | |
| 8,254,425 B1 | 8/2012 | Raring | |
| 8,259,769 B1 | 9/2012 | Raring et al. | |
| 8,294,179 B1 | 10/2012 | Raring | |
| 8,314,429 B1 | 11/2012 | Raring et al. | |
| 8,351,478 B2 | 1/2013 | Raring et al. | |
| 8,355,418 B2 | 1/2013 | Raring et al. | |
| 8,422,525 B1 | 4/2013 | Raring et al. | |
| 8,427,590 B2 | 4/2013 | Raring et al. | |
| 8,591,062 B2 | 11/2013 | Hussell et al. | |
| 8,634,442 B1 | 1/2014 | Raring et al. | |
| 8,847,249 B2 | 9/2014 | Raring et al. | |
| 9,025,635 B2 | 5/2015 | Goutain et al. | |
| 9,246,311 B1 | 1/2016 | Raring et al. | |
| 9,318,875 B1 | 4/2016 | Goutain | |
| 9,362,715 B2 | 6/2016 | Sztein et al. | |
| 9,531,164 B2 | 12/2016 | Raring et al. | |
| 9,543,738 B2 | 1/2017 | Raring et al. | |
| 9,595,813 B2 | 3/2017 | Raring et al. | |
| 9,800,017 B1 | 10/2017 | Raring et al. | |
| 10,084,281 B1 | 9/2018 | Raring et al. | |
| 10,297,977 B1 | 5/2019 | Raring et al. | |
| 10,551,542 B1 | 2/2020 | Tan et al. | |
| 10,732,340 B2 | 8/2020 | Schubert et al. | |
| 10,879,673 B2 | 12/2020 | Raring et al. | |
| 10,904,506 B1 | 1/2021 | Raring et al. | |
| 10,938,182 B2 | 3/2021 | Raring et al. | |

(56) References Cited

U.S. PATENT DOCUMENTS

| | | |
|---|---|---|
| 11,421,843 B2 | 8/2022 | Harrison et al. |
| 11,437,774 B2 | 9/2022 | Rudy et al. |
| 11,437,775 B2 | 9/2022 | Raring et al. |
| 2001/0026991 A1 | 10/2001 | Ichikawa et al. |
| 2002/0050488 A1 | 5/2002 | Nikitin et al. |
| 2002/0050517 A1 | 5/2002 | Oliva |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0094893 A1 | 5/2003 | Ellens et al. |
| 2003/0140846 A1 | 7/2003 | Biwa et al. |
| 2003/0147259 A1 | 8/2003 | Kraft |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0105481 A1 | 6/2004 | Ishida et al. |
| 2004/0112866 A1 | 6/2004 | Maleville et al. |
| 2004/0137265 A1 | 7/2004 | Shimada et al. |
| 2004/0149998 A1 | 8/2004 | Henson et al. |
| 2004/0151222 A1 | 8/2004 | Sekine |
| 2004/0196877 A1 | 10/2004 | Kawakami et al. |
| 2004/0213016 A1 | 10/2004 | Rice |
| 2004/0213317 A1 | 10/2004 | Hashimoto et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2004/0263074 A1 | 12/2004 | Baroky et al. |
| 2005/0040384 A1 | 2/2005 | Tanaka et al. |
| 2005/0072986 A1 | 4/2005 | Sasaoka |
| 2005/0105572 A1 | 5/2005 | Simoun-Ou et al. |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn |
| 2006/0038193 A1 | 2/2006 | Wu et al. |
| 2006/0049421 A1 | 3/2006 | Suehiro et al. |
| 2006/0056855 A1 | 3/2006 | Nakagawa et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0113553 A1 | 6/2006 | Srivastava et al. |
| 2006/0118799 A1 | 6/2006 | D'Evelyn et al. |
| 2006/0126688 A1 | 6/2006 | Kneissl |
| 2006/0139926 A1* | 6/2006 | Morioka ............ G02F 1/133603 |
| | | 362/260 |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0221021 A1* | 10/2006 | Hajjar .................. G03B 33/16 |
| | | 345/84 |
| 2006/0256482 A1 | 11/2006 | Araki et al. |
| 2006/0256559 A1 | 11/2006 | Bitar |
| 2006/0288928 A1 | 12/2006 | Eom et al. |
| 2007/0012940 A1* | 1/2007 | Suh ...................... H01L 33/56 |
| | | 257/E33.059 |
| 2007/0029571 A1 | 2/2007 | Hanaoka et al. |
| 2007/0039226 A1 | 2/2007 | Stokes |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenthe et al. |
| 2007/0217462 A1 | 9/2007 | Yamasaki |
| 2007/0228262 A1 | 10/2007 | Cantin et al. |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0054280 A1 | 3/2008 | Reginelli et al. |
| 2008/0087919 A1 | 4/2008 | Tysoe et al. |
| 2008/0089089 A1 | 4/2008 | Hama et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0198881 A1 | 8/2008 | Farrell et al. |
| 2008/0205477 A1 | 8/2008 | Hama et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0262316 A1 | 10/2008 | Ajima et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0003400 A1* | 1/2009 | Nagahama ............ H01L 33/483 |
| | | 372/50.23 |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0103581 A1 | 4/2009 | Bessho |
| 2009/0141765 A1 | 6/2009 | Kohda et al. |
| 2009/0159869 A1 | 6/2009 | Ponce et al. |
| 2009/0173957 A1 | 7/2009 | Brunner et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321771 A1 | 12/2009 | Hattori et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0006875 A1 | 1/2010 | Naum et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0091515 A1 | 4/2010 | Goto et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0149222 A1 | 6/2010 | Welford et al. |
| 2010/0151194 A1 | 6/2010 | D'Evelyn |
| 2010/0165306 A1 | 7/2010 | McGettigan et al. |
| 2010/0195687 A1 | 8/2010 | Okamoto et al. |
| 2010/0220262 A1 | 9/2010 | DeMille et al. |
| 2010/0246159 A1 | 9/2010 | Wada |
| 2010/0246628 A1 | 9/2010 | Hattori et al. |
| 2010/0295054 A1 | 11/2010 | Okamoto et al. |
| 2010/0295438 A1* | 11/2010 | Ott ........................ F21V 13/14 |
| | | 313/46 |

(56) References Cited

U.S. PATENT DOCUMENTS

| | | |
|---|---|---|
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0001431 A1 | 1/2011 | Brukilacchio |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Philippe et al. |
| 2011/0148280 A1 | 6/2011 | Kishimoto |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0215700 A1 | 9/2011 | Tong et al. |
| 2011/0216795 A1 | 9/2011 | Hsu et al. |
| 2011/0220926 A1 | 9/2011 | Kim |
| 2011/0247556 A1 | 10/2011 | Raring et al. |
| 2011/0286200 A1 | 11/2011 | Iimura et al. |
| 2011/0305000 A1 | 12/2011 | Bukesov et al. |
| 2012/0039072 A1 | 2/2012 | Lell et al. |
| 2012/0051377 A1 | 3/2012 | Liang et al. |
| 2012/0106178 A1 | 5/2012 | Takahashi et al. |
| 2012/0178198 A1 | 7/2012 | Raring et al. |
| 2012/0205825 A1 | 8/2012 | Nagafuji et al. |
| 2012/0224374 A1 | 9/2012 | Aliberti |
| 2012/0224384 A1 | 9/2012 | Takahira et al. |
| 2012/0230007 A1 | 9/2012 | Kawakami |
| 2012/0243203 A1 | 9/2012 | Koike et al. |
| 2012/0248483 A1 | 10/2012 | Beppu et al. |
| 2012/0314398 A1 | 12/2012 | Raring et al. |
| 2013/0001627 A1 | 1/2013 | Kinoshita et al. |
| 2013/0003400 A1 | 1/2013 | Kijima et al. |
| 2013/0003403 A1 | 1/2013 | Takahira et al. |
| 2013/0010456 A1 | 1/2013 | Ishii et al. |
| 2013/0155418 A1 | 6/2013 | Shaw et al. |
| 2013/0176705 A1 | 7/2013 | Ohta |
| 2013/0194821 A1 | 8/2013 | Maxik et al. |
| 2013/0207148 A1 | 8/2013 | Krauter et al. |
| 2013/0208442 A1* | 8/2013 | Reiherzer ............ B29C 43/146 216/13 |
| 2013/0234111 A1 | 9/2013 | Pfister et al. |
| 2013/0301288 A1 | 11/2013 | Kishimoto et al. |
| 2013/0314937 A1 | 11/2013 | Takahashi et al. |
| 2013/0329397 A1 | 12/2013 | Shimizu et al. |
| 2014/0050244 A1 | 2/2014 | Ohno et al. |
| 2014/0086539 A1 | 3/2014 | Goutain et al. |
| 2014/0168942 A1* | 6/2014 | Kishimoto ............ G02B 5/045 362/355 |
| 2014/0268815 A1 | 9/2014 | Li et al. |
| 2015/0023376 A1 | 1/2015 | Yamanaka et al. |
| 2015/0062953 A1 | 3/2015 | Woelfing et al. |
| 2015/0131306 A1 | 5/2015 | Genier et al. |
| 2015/0222091 A1 | 8/2015 | Futami et al. |
| 2015/0229107 A1 | 8/2015 | McLaurin et al. |
| 2015/0267880 A1 | 9/2015 | Hadrath et al. |
| 2015/0346411 A1 | 12/2015 | Bauco et al. |
| 2015/0377430 A1 | 12/2015 | Bhakta |
| 2016/0077415 A1 | 3/2016 | Motoya et al. |
| 2016/0084451 A1 | 3/2016 | Annen et al. |
| 2016/0131334 A1 | 5/2016 | Rousseau et al. |
| 2016/0159273 A1 | 6/2016 | Nakazato |
| 2016/0268770 A1 | 9/2016 | Tazawa et al. |
| 2016/0290584 A1 | 10/2016 | Nomura et al. |
| 2017/0051883 A1 | 2/2017 | Raring et al. |
| 2017/0051884 A1 | 2/2017 | Raring |
| 2017/0059763 A1 | 3/2017 | Lucrecio et al. |
| 2017/0093123 A1 | 3/2017 | Takizawa et al. |
| 2017/0327032 A1 | 11/2017 | Fimeri et al. |
| 2018/0083422 A1 | 3/2018 | Castiglia et al. |
| 2018/0180789 A1 | 6/2018 | Russert et al. |
| 2018/0316160 A1 | 11/2018 | Raring et al. |
| 2019/0235182 A1 | 8/2019 | Cheng |
| 2019/0305503 A1 | 10/2019 | Osawa et al. |
| 2019/0323663 A1 | 10/2019 | Rudy et al. |
| 2020/0200348 A1 | 6/2020 | Romero et al. |
| 2020/0200363 A1 | 6/2020 | Harrison et al. |
| 2020/0233292 A1 | 7/2020 | Rudy et al. |
| 2021/0226410 A1 | 7/2021 | Raring et al. |
| 2022/0123528 A1 | 4/2022 | Romero et al. |
| 2022/0231479 A1 | 7/2022 | Raring et al. |
| 2022/0320819 A1 | 10/2022 | Rudy et al. |
| 2022/0333745 A1 | 10/2022 | Goutain et al. |
| 2022/0364699 A1 | 11/2022 | Harrison et al. |
| 2022/0376462 A1 | 11/2022 | Heikman |
| 2023/0238767 A1 | 7/2023 | Heikman et al. |

FOREIGN PATENT DOCUMENTS

| | | |
|---|---|---|
| CN | 102144294 A | 8/2011 |
| CN | 102804432 A | 11/2012 |
| CN | 103797597 A | 5/2014 |
| CN | 104566108 A | 4/2015 |
| CN | 104798203 A | 7/2015 |
| CN | 108139054 A | 6/2018 |
| DE | 10 2010 062 463 A1 | 6/2012 |
| EP | 1 995 834 A1 | 11/2008 |
| EP | 2 672 178 A2 | 12/2013 |
| EP | 2 796 771 A1 | 10/2014 |
| EP | 3 338 023 A1 | 6/2016 |
| EP | 3 045 947 A1 | 7/2016 |
| EP | 3 093 556 A1 | 11/2016 |
| JP | 2007-068398 A2 | 3/2007 |
| JP | 2007-173467 A | 7/2007 |
| JP | 2009-224397 A | 10/2009 |
| JP | 2010-225917 A | 10/2010 |
| JP | 2010-238784 A | 10/2010 |
| JP | 2010-251686 A | 11/2010 |
| JP | 2015-022954 A | 2/2012 |
| JP | 2012-054272 A | 3/2012 |
| JP | 2012-512508 A | 5/2012 |
| JP | 2013-187145 A | 5/2012 |
| JP | 2014-007093 A | 1/2014 |
| JP | 2015-001709 A | 1/2015 |
| JP | 2018-525836 A | 9/2018 |
| KR | 10-2018-0044327 A | 5/2018 |
| WO | 2008-041521 A1 | 4/2008 |
| WO | 2010/069282 A2 | 6/2010 |
| WO | 2012/053245 A1 | 4/2012 |
| WO | 2014/087047 A1 | 6/2014 |
| WO | 2015/090556 A1 | 6/2015 |
| WO | 2017/031446 A1 | 2/2017 |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.

Asano et al., "100-mW kink-Free Blue-Violet Laser Diodes with Low Aspect Ratio, " 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pP. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'EVELYN et al., "Bulk GaN Crystal Growth by the High-Pressure Ammonothermal Method," Journal of Crystal Growth, 2007, vol. 300, pp. 11-16.

(56) References Cited

OTHER PUBLICATIONS

Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting, " 2008, Applied Physics Express, vol. 1, pp. 011106-1-011106-3.
Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.
Gardner et al. "Blue-emitting InGaN—GaN double-heterostructure light-emitting diodes reaching maximum quantum efficiency above 200 A/ cm2", Applied Physics Letters 91, 243506 (2007).
Okubo, S., Nichia Develops Blue-green Semiconductor Laser w/ 488nm Wavelength, Jan. 22, 2008; http://techon.nikkeibp.co.jp/english/NEWS_EN/20080122/146009/?ST=english_PRINT, downloaded Jul. 3, 2018, 2 pages.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al., "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate" 1998, Applied Physics Letters, vol. 72, No. 12, pp. 211-213.
Nam et al., "Later Epitaxial Overgrowth of GaN films on SiO2 Areas via Metalorganic Vapor Phase Epitaxy," 1998, Journal of Electronic Materials, vol. 27, No. 4, pp. 233-237.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of I Applied Physics JJAP Express Letter, vol. 46, No. 9, 2007 pp. L 187-L 189.
Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells,", Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN—GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Uchida et al., "Recent Progress in High-Power Blue-violet Lasers, " 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
USPTO Office action for U.S. Appl. No. 12/749,466 dated Feb. 3, 2012, 16 pages.
USPTO Office Action for U.S. Appl. No. 12/749,466 dated Jun. 29, 2011, 20 pages.
USPTO Office action for U.S. Appl. No. 12/749,466 dated Jul. 3, 2012, 18 pages.
U.S. Appl. No. 12/749,466 Notice of Allowance dated Jan. 2, 2013, 8 pages.
USPTO Office action for U.S. Appl. No. 12/873,820 dated Oct. 4, 2012, 10 pages.
USPTO Office action for U.S. Appl. No. 12/484,924 dated Oct. 31, 2011, 11 pages.
USPTO Office Action for U.S. Appl. No. 12/484,924 dated Apr. 14, 2011, 12 pages.

(56) References Cited

OTHER PUBLICATIONS

USPTO Office action for U.S. Appl. No. 12/497,289 dated Feb. 2, 2012, 7 pages.
USPTO Notice of Allowance for U.S. Appl. No. 12/497,289 dated May 22, 2012, 7 pages.
USPTO Office action for U.S. Appl. No. 12/759,273 dated Nov. 21, 2011, 10 pages.
USPTO Office action for U.S. Appl. No. 12/759,273 dated Apr. 3, 2014, 15 pages.
USPTO Office action for U.S. Appl. No. 12/759,273 dated Jan. 29, 2015, 15 pages.
USPTO Office action for U.S. Appl. No. 12/759,273 dated Sep. 23, 2015, 17 pages.
USPTO Notice of Allowance for U.S. Appl. No. 12/759,273 dated Aug. 19, 2016, 8 pages.
USPTO Office action for U.S. Appl. No. 12/759,273 dated Mar. 29, 2016, 12 pages.
USPTO Office action for U.S. Appl. No. 12/759,273 dated Jun. 8, 2015, 17 pages.
USPTO Office action for U.S. Appl. No. 12/759,273 dated Oct. 24, 2014, 16 pages.
USPTO Office action for U.S. Appl. No. 12/762,269 dated Jun. 26, 2012, 10 pages.
USPTO Office action for U.S. Appl. No. 12/762,269 dated Oct. 12, 2011, 12 pages.
USPTO Notice of Allowance for U.S. Appl. No. 12/762,269 dated Apr. 23, 2012, 8 pages.
USPTO Office Action for U.S. Appl. No. 12/762,271 dated Jun. 6, 2012, 13 pages.
USPTO Office action for U.S. Appl. No. 12/762,271 dated Dec. 23, 2011, 12 pages.
U.S. Appl. No. 12/762,271 Notice of Allowance dated Aug. 8, 2012, 8 pages.
USPTO Notice of Allowance for U.S. Appl. No. 12/778,718 dated Apr. 3, 2012, 14 pages.
USPTO Notice of Allowance for U.S. Appl. No. 12/778,718 dated Jun. 13, 2012, 7 pages.
USPTO Office action for U.S. Appl. No. 12/778,718 dated Nov. 25, 2011, 11 pages.
USPTO Notice of Allowance for U.S. Appl. No. 12/762,278 dated Nov. 7, 2011, 11 pages.
USPTO Office Action for U.S. Appl. No. 12/481,543 dated Jun. 27, 2011, 10 pages.
USPTO Office Action for U.S. Appl. No. 12/482,440 dated Feb. 23, 2011, 6 pages.
USPTO Office Action for U.S. Appl. No. 12/482,440 dated Aug. 12, 2011, 7 pages.
USPTO Office Action for U.S. Appl. No. 12/491,169 dated Oct. 22, 2010, 10 pages.
USPTO Office Action for U.S. Appl. No. 12/491,169 dated May 11, 2011, 10 pages.
USPTO Office Action for U.S. Appl. No. 12/502,058 dated Dec. 8, 2010, 15 pages.
USPTO Office Action for U.S. Appl. No. 12/502,058 dated Aug. 19, 2011, 13 pages.
USPTO Notice of Allowance for U.S. Appl. No. 12/502,058 dated Apr. 16, 2012, 10 pages.
USPTO Office Action for U.S. Appl. No. 12/534,829 dated Apr. 19, 2011, 9 pages.
USPTO Notice of Allowance for U.S. Appl. No. 12/534,829 dated Oct. 28, 2011, 8 pages.
USPTO Notice of Allowance for U.S. Appl. No. 12/534,829 dated Dec. 5, 2011, 7 pages.
USPTO Notice of Allowance for U.S. Appl. No. 12/534,829 dated Dec. 21, 2011, 4 pages.
USPTO Office Action for U.S. Appl. No. 12/573,820 dated Mar. 2, 2011, 19 pages.
USPTO Office Action for U.S. Appl. No. 12/573,820 dated Oct. 11, 2011, 23 pages.
USPTO Office Action for U.S. Appl. No. 12/573,820 dated Oct. 9, 2013, 28 pages.
USPTO Office Action for U.S. Appl. No. 12/749,476 dated Nov. 8, 2011, 16 pages.
USPTO Notice of Allowance for U.S. Appl. No. 12/749,476 dated May 4, 2012, 8 pages.
USPTO Office Action for U.S. Appl. No. 12/749,476 dated Apr. 11, 2011, 15 pages.
USPTO Office Action for U.S. Appl. No. 12/868,441 dated Apr. 30, 2012, 12 pages.
U.S. Appl. No. 12/868,441 Notice of Allowance dated Sep. 18, 2013, 13 pages.
USPTO Office Action for U.S. Appl. No. 12/868,441 dated Dec. 18, 2012, 33 pages.
USPTO Office Action for U.S. Appl. No. 12/880,803 dated Feb. 22, 2012, 9 pages.
USPTO Office Action for U.S. Appl. No. 12/883,652 dated Apr. 17, 2012, 8 pages.
USPTO Office Action for U.S. Appl. No. 12/883,652 dated May 14, 2014, 13 pages.
USPTO Office Action for U.S. Appl. No. 12/883,652 dated Jun. 3, 2015, 16 pages.
USPTO Office Action for U.S. Appl. No. 12/883,652 dated Apr. 5, 2016, 11 pages.
U.S. Appl. No. 12/883,652 Notice of Allowance dated Aug. 30, 2016, 7 pages.
USPTO Office Action for U.S. Appl. No. 12/883,652 dated Jan. 11, 2013, 11 pages.
USPTO Office Action for U.S. Appl. No. 12/883,652 dated Dec. 19, 2014, 16 pages.
USPTO Office Action for U.S. Appl. No. 12/883,652 dated Oct. 26, 2015, 11 pages.
USPTO Office Action for U.S. Appl. No. 12/884,993 dated Aug. 2, 2012, 15 pages.
USPTO Notice of Allowance for U.S. Appl. No. 12/884,993 dated Nov. 26, 2012, 12 pages.
USPTO Office Action for U.S. Appl. No. 12/884,993 dated Mar. 16, 2012, 15 pages.
USPTO Office Action for U.S. Appl. No. 12/883,093 dated Mar. 13, 2012, 12 pages.
USPTO Office Action for U.S. Appl. No. 12/883,093 dated Aug. 3, 2012, 13 pages.
USPTO Notice of Allowance for U.S. Appl. No. 12/883,093 dated Nov. 21, 2012.
USPTO Office Action for U.S. Appl. No. 13/014,622 dated Nov. 28, 2011, 14 pages.
USPTO Office Action for U.S. Appl. No. 13/014,622 dated Apr. 30, 2012, 14 pages.
USPTO Office Action for U.S. Appl. No. 13/014,622 dated Jun. 20, 2015, 15 pages.
USPTO Office Action for U.S. Appl. No. 13/014,622 dated May 11, 2015, 14 pages.
USPTO Office action for U.S. Appl. No. 13/046,565 dated Feb. 2, 2012, 17 pages.
USPTO Office action for U.S. Appl. No. 13/046,565 dated Nov. 7, 2011, 17 pages.
USPTO Office Action for U.S. Appl. No. 13/046,565 dated Apr. 13, 2012, 40 pages.
USPTO Office Action for U.S. Appl. No. 13/046,565 dated Jul. 19, 2012, 23 pages.
Non-Final Office Action of Jun. 3, 2015 for U.S. Appl. No. 14/534,636, 24 pages.
Notice of Allowance of Sep. 15, 2015 for U.S. Appl. No. 14/534,636, 11 pages.
U.S. Appl. No. 14/176,403 Notice of Allowance dated Feb. 12, 2016, 8 pages.
Non-Final Office Action of Sep. 11, 2015 for U.S. Appl. No. 14/176,403, 27 pages.
U.S. Appl. No. 14/829,927 Non-Final Office Action dated Sep. 26, 2017, 44 pages.
U.S. Appl. No. 14/829,927 Final Office Action dated Jul. 26, 2018, 39 pages.

(56) References Cited

OTHER PUBLICATIONS

U.S. Appl. No. 14/829,927 Non-Final Office Action dated Mar. 21, 2019, 26 pages.
U.S. Appl. No. 14/829,927 Non-Final Office Action dated May 12, 2020, 28 pages.
U.S. Appl. No. 14/829,927 Notice of Allowance dated Oct. 28, 2020, 16 pages.
U.S. Appl. No. 15/160,873 Non-Final Office Action dated Apr. 5, 2018, 45 pages.
U.S. Appl. No. 15/160,873 Final Office Action dated Nov. 19, 2018, 37 pages.
U.S. Appl. No. 15/160,873 Non-Final Office Action dated Apr. 4, 2019, 31 pages.
U.S. Appl. No. 15/160,873 Non-Final Office Action dated Oct. 18, 2019, 33 pages.
U.S. Appl. No. 15/160,873 Non-Final Office Action dated Apr. 16, 2020, 37 pages.
U.S. Appl. No. 15/160,873 Non-Final Office Action dated Jul. 7, 2020, 39 pages.
U.S. Appl. No. 15/160,873 Final Office Action dated Dec. 22, 2020, 45 pages.
U.S. Appl. No. 16/014,010 Non-Final Office Action dated Apr. 30, 2020, 43 pages.
U.S. Appl. No. 16/014,010 Notice of Allowance dated Aug. 18, 2020, 13 pages.
U.S. Appl. No. 16/000,802 Notice of Allowance dated Dec. 19, 2018, 12 pages.
U.S. Appl. No. 16/252,570 Non-Final Office Action dated Apr. 30, 2020, 72 pages.
U.S. Appl. No. 16/252,570 Final Office Action dated Aug. 27, 2020, 68 pages.
U.S. Appl. No. 16/252,570 Non-Final Office Action dated Feb. 23, 2021, 73 pages.
U.S. Appl. No. 16/353,657 Non-Final Office Action dated May 19, 2020, 12 pages.
U.S. Appl. No. 16/353,657 Non-Final Office Action dated Nov. 18, 2020, 17 pages.
U.S. Appl. No. 16/449,126 Non-Final Office Action dated Dec. 31, 2019, 19 pages.
U.S. Appl. No. 16/449,126 Final Office Action dated Aug. 21, 2020, 22 pages.
U.S. Appl. No. 16/449,126 Non-Final Office Action dated Dec. 21, 2020, 28 pages.
U.S. Appl. No. 16/796,272 Non-Final Office Action dated Jun. 22, 2020, 21 pages.
U.S. Appl. No. 16/796,272 Notice of Allowance dated Sep. 25, 2020, 10 pages.
U.S. Appl. No. 16/796,368 Non-Final Office Action dated Jun. 22, 2020, 19 pages.
U.S. Appl. No. 16/796,368 Non-Final Office Action dated Nov. 18, 2020, 17 pages.
U.S. Appl. No. 61/249,568, filed Oct. 7, 2009, Raring et al. Unpublished, 62 pages.
U.S. Appl. No. 61/182,105, filed May 29, 2009, Raring, Unpublished, 10 pages.
U.S. Appl. No. 61/164,409, filed Mar. 28, 2009, Raring et al., Unpublished, 23 pages.
U.S. Appl. No. 12/573,820, filed Oct. 5, 2009, Raring et al., Unpublished, 32 pages.
U.S. Appl. No. 12/880,889, filed Sep. 13, 2010, Raring et al., Unpublished, 18 pages.
U.S. Appl. No. 12/727,148, filed Mar. 18, 2010, Raring, Unpublished, 41 pages.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion of PCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
International Search Report and Written Opinion of the International Searching Authority for PCT/US2016/047834 dated Oct. 28, 2016, 13 pages.
International Search Report and Written Opinion of the International Searching Authority for PCT/US15/14567 dated Jul. 8, 2015, 23 pages.
International Search Report and Written Opinion for Application No. PCT/US2019/068428, dated Apr. 16, 2020, 13 pages.
International Search Report and Written Opinion for Application No. PCT/US2019/068091, dated Apr. 16, 2020, 16 pages.
International Search Report and Written Opinion for Application No. PCT/US2020/014476 dated Jun. 9, 2020, 24 pages.
International Search Report and Written Opinion for Application No. PCT/US2020/038504 dated Jul. 14, 2020, 12 pages.
Extended European Search Report for Application No. EP 16 83 7921 dated May 16, 2019, 14 pages.
Extended European Search Report for Application No. EP 16 83 7921 dated Feb. 2, 2021, 8 pages.
Merriam Webster, "Collimate", retrieved from https://www.merriam-webster.com/dictionary/collimate on Feb. 10, 2021, 1 page.
U.S. Appl. No. 16/449,126 Notice of Allowance dated Nov. 10, 2021, 11 pages.
U.S. Appl. No. 15/160,873 Notice of Allowance dated Dec. 13, 2021, 9 pages.
International Preliminary Report on Patentability for Application No. PCT/US2020/038504, dated Dec. 30, 2021, 11 pages.
U.S. Appl. No. 16/252,570 Final Office Action dated Feb. 2, 2022, 77 pages.
U.S. Appl. No. 16/230,365 Notice of Allowance dated Apr. 18, 2022, 10 pages.
Extended European Search Report for Application No. 19899609.2-1201, dated Jul. 15, 2022, 13 pages.
U.S. Appl. No. 16/252,570 Advisory Action dated Jul. 19, 2022, 11 pages.
U.S. Appl. No. 16/252,570 Non-Final Office Action dated Aug. 26, 2022, 64 pages.
Extended European Search Report for Application No. 22180266.3-1212, dated Sep. 15, 2022, 15 pages.
U.S. Appl. No. 17/563,986 Notice of Allowance dated Sep. 28, 2022, 9 pages.
International Preliminary Report on Patentability for Application No. PCT/US2019/068091, dated Jul. 1, 2021, 13 pages.
International Preliminary Report on Patentability for Application No. PCT/US2019/068428, dated Jul. 1, 2021, 10 pages.
International Preliminary Report on Patentability for Application No. PCT/US2020/014476, dated Jul. 29, 2021, 13 pages.
U.S. Appl. No. 16/252,570 Non-Final Office Action dated Aug. 17, 2021, 64 pages.
U.S. Appl. No. 16/230,158 Notice of Allowance dated Sep. 21, 2021, 12 pages.
U.S. Appl. No. 16/353,657 Notice of Allowance dated Apr. 8, 2021, 7 pages.
U.S. Appl. No. 16/796,368 Notice of Allowance dated Apr. 13, 2021, 8 pages.
U.S. Appl. No. 16/449,126 Final Office Action dated Jun. 8, 2021, 28 pages.
Extended European Search Report for Application No. 20826976.1-1201, dated Jun. 14, 2023, 8 pages.
U.S. Appl. No. 17/163,903 Non-Final Office Action dated Sep. 27, 2023, 27 pages.

* cited by examiner

θ₁ = Fast axis beam divergence
θ₂ = Slow axis beam divergence
D₁ = Fast axis projected beam diameter
D₂ = Slow axis projected beam diameter L = distance from emitter to phosphor
D = r1 + r2 = Beam spot diameter at center
θ = 1/e2 beam divergence L = distance from emitter to phosphor
D = r1 + r2 = Beam spot diameter at center
θ = 1/e2 beam divergence
ω = center beam incidence angle to phosphor

INTEGRATED WHITE LIGHT SOURCE USING A LASER DIODE AND A PHOSPHOR IN A SURFACE MOUNT DEVICE PACKAGE

CROSS-REFERENCE TO RELATED APPLICATIONS

The present application is a division of U.S. application Ser. No. 16/014,010, filed Jun. 21, 2018, which is a continuation-in-part of U.S. application Ser. No. 14/829,927, filed Aug. 19, 2015, the contents of which are incorporated herein by reference in their entirety for all purposes.

BACKGROUND

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb:

The conventional light bulb dissipates more than 90% of the energy used as thermal energy.

The conventional light bulb routinely fails due to thermal expansion and contraction of the filament element.

The conventional light bulb emits light over a broad spectrum, much of which is not perceived by the human eye.

The conventional light bulb emits in all directions, which is undesirable for applications requiring strong directionality or focus, e.g. projection displays, optical data storage, etc.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Due to the high efficiency, long lifetimes, low cost, and non-toxicity offered by solid state lighting technology, light emitting diodes (LED) have rapidly emerged as the illumination technology of choice. An LED is a two-lead semiconductor light source typically based on a p-i-n junction diode, which emits electromagnetic radiation when activated. The emission from an LED is spontaneous and is typically in a Lambertian pattern. When a suitable voltage is applied to the leads, electrons and holes recombine within the device releasing energy in the form of photons. This effect is called electroluminescence, and the color of the light is determined by the energy band gap of the semiconductor.

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness.

The earliest blue and violet gallium nitride (GaN)-based LEDs were fabricated using a metal-insulator-semiconductor structure due to a lack of p-type GaN. The first p-n junction GaN LED was demonstrated by Amano et al. using the LEEBI treatment to obtain p-type GaN in 1989. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 µW at 20 mA. The first p-GaN/n-InGaN/n-GaN DH blue LEDs were demonstrated by Nakamura et al. in 1993. The LED showed a strong band-edge emission of InGaN in a blue wavelength regime with an emission wavelength of 440 nm under a forward biased condition. The output power and the EQE were 125 µW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps.

By combining GaN-based LEDs with wavelength converting materials such as phosphors, solid-state white light sources were realized. This technology utilizing GaN-based LEDs and phosphor materials to produce white light is now illuminating the world around us as a result of the many advantages over incandescent light sources including lower energy consumption, longer lifetime, improved physical robustness, smaller size, and faster switching. Light-emitting diodes are now used in applications as diverse as aviation lighting, automotive headlamps, advertising, general lighting, traffic signals, and camera flashes. LEDs have allowed new text, video displays, and sensors to be developed, while their high switching rates are also useful in advanced communications technology.

Although useful, LEDs still have limitations that are desirable to overcome in accordance to the inventions described in the following disclosure.

SUMMARY

The present invention provides a device and method for an integrated white colored electromagnetic radiation source using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials, such as yellow phosphors configured with designated scattering centers on an excitation surface or inside a bulk, to form a compact, high-brightness, and highly-efficient, white light source. In an example, the source can be provided for specialized applications, among general applications, and the like.

Additional benefits are achieved over pre-existing techniques using the present invention. In particular, the present invention enables a cost-effective white light source. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a chip on submount (CoS) with an integrated phosphor on the submount to form a chip and phosphor on submount (CPoS) white light source. In some embodiments the light source and phosphor are configured on a common support member wherein the common support member may be a package member.

In various embodiments, the laser device and phosphor device are mounted on a common support member with or without intermediate submounts and the phosphor materials are operated in a transmissive mode, a reflective mode, or a side-pumped mode to result in a white emitting laser-based light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) more than 10,000 times higher than conventional LEDs, extreme directionality of the laser emission, and without the droop phenomenon that plagues LEDs, laser diodes enable characteristics unachievable by LEDs and other light sources. Specifically, since the laser diodes output beams carrying over 0.5 W, over 1 W, over 3 W, over 10 W, or even over 100 W can be focused to very small spot sizes of less than 1 mm in diameter, less than 500 microns in diameter, less than 100 microns in diameter, or even less than 50 microns in diameter, power densities of over 1 W/mm$^2$, 100 W/mm$^2$, or even over 2,500 W/mm$^2$ can be achieved. When this very small and powerful beam of laser excitation light is incident on a phosphor material an extremely bright spot or point source of white light can be achieved. Assuming a phosphor conversion ratio of 200 lumens of emitted white light per optical watt of excitation light, a 5 W excitation power could generate 1000 lumens in a beam diameter of 100 microns, or 50 microns, or less. This unprecedented source brightness can be game changing in applications such as spotlighting or range finding where parabolic reflectors or lensing optics can be combined with the point source to create highly collimated white light spots that can travel drastically higher distances than ever possible before using LEDs or bulb technology.

In one embodiment, the present invention provides a CPoS laser-based white light source comprising a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations. The apparatus has a support member and at least one gallium and nitrogen containing laser diode devices and phosphor material overlying the support member. The laser device is capable of an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In some embodiments two or more laser diodes or laser stripes are included in the integrated white light source. Combining multiple laser sources can offer many potential benefits according to this invention. First, the excitation power can be increased by beam combining to provide a more powerful excitation spit and hence produce a brighter light source. Similarly, the reliability of the source can be increased by using multiple sources at lower drive conditions to achieve the same excitation power as a single source driven at more harsh conditions such as higher current and voltage. A second advantage is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color or wavelength lasers can be included to offer improved performance such as an improved color rendering or color quality. For example, two or more blue excitation lasers with slightly detuned wavelengths (e.g. 5 nm 10 nm, 15 nm, etc.) can be included to create a larger blue spectrum. In one embodiment, separate individual laser chips are configured within the laser-phosphor light source. By positioning multiple laser chips in a predetermined configuration, multiple excitation beams can be overlapped on the phosphor spot to create a more ideal spot geometry. In alternative embodiments, laser diodes with multiple adjacent laser stripes, multi-stripe lasers are included in the integrated white light source. The multiple stripes can enable an increased excitation power for a brighter light source and/or an improved or modified spot pattern on the phosphor. In a preferred embodiment the phosphor material can provide a yellowish emission in the 550 nm to 590 nm range such that when mixed with the blue emission of the laser diode a white light is produced. In other embodiments, phosphors with red, green, yellow, and even blue emission can be used in combination with the laser diode excitation source to produce a white light with color mixing.

In an embodiment, the device layers comprise a superluminescent light emitting diode or SLED. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode. The emission spectral width is typically substantially wider (>5 nm) than that of a laser diode and offer advantages with respect to reduced image distortion in displays, increased eye safety, and enhanced capability in measurement and spectroscopy applications.

SLEDs are designed to have high single pass gain or amplification for the spontaneous emission generated along the waveguide. The SLED device would also be engineered to have a low internal loss, preferably below 1 cm$^{-1}$, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide high flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet. A low reflectivity facet may also be formed by roughening the emitting facet in such a way that light extraction is enhanced and coupling of reflected light back into the guided modes is limited. SLEDs are applicable to all embodiments according to the present invention and the device can be used interchangeably with laser diode device when applicable.

The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In alternative embodiments laser diodes with multiple parallel adjacent emitter stripes can be configured to result in a wider and/or more powerful excitation spot on the phosphor. By making the spot wider in the lateral direction the spot could become more circular to the faster divergence angle of the laser emission in the vertical direction. For example, two or more laser stripes may be spaced by 10-30 µm, 30-60 µm, 60-100 µm, or 100-300 µm. In some embodiments the parallel stripes have slightly detuned wavelengths for an improved color quality. In other embodiments free space optics such as collimating lenses can be used to shape the beam prior to incidence on the phosphor. In one example, a re-imaging optic is used to reflect and reshape the beam onto the phosphor member. In an alternative example, the otherwise wasted reflected incident light from the phosphor is recycled with a re-imaging optic by being reflected back to the phosphor.

The excitation beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 20 W.

The phosphor material can be operated in a transmissive mode, a reflective mode, or a combination of a transmissive mode and reflective mode, or a side-pumped mode, or other modes. The phosphor material is characterized by a conversion efficiency, a resistance to thermal damage, a resistance to optical damage, a thermal quenching characteristic, a porosity to scatter excitation light, and a thermal conductivity. The phosphor may have an intentionally roughened surface to increase the light extraction from the phosphor. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the laser diode device to generate the laser beam and excite the phosphor material. The white light source configured to produce greater than 1 lumen, 10 lumens, 100 lumens, 250 lumens, 500 lumens, 1000 lumens, 3000 lumens, or 10000 lumens of white light output. The support member is configured to transport thermal energy from the at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, alumina, SiC, sapphire, AlN, or other metals, ceramics, or semiconductors.

In a preferred configuration of this integrated white light source, the common support member comprises the same submount that the gallium and nitrogen containing laser diode chip is directly bonded to. That is, the laser diode chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The laser diode can be attached to a first surface of the submount using conventional die attaching techniques using solders such as AuSn solder, SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Similarly, the phosphor material may be bonded to the submount using a soldering technique, or a sintered Ag technique, but it can be other techniques such as gluing technique or epoxy technique. Optimizing the bond for the lowest thermal impedance is a key parameter for heat dissipation from the phosphor, which is critical to prevent phosphor degradation and thermal quenching of the phosphor material.

In an alternative configuration of this white light source, the laser diode is bonded to an intermediate submount configured between the gallium and nitrogen containing laser chip and the common support member. In this configuration, the intermediate submount can be comprised of SiC, AlN, diamond, or other, and the laser can be attached to a first surface of the submount using conventional die attaching techniques using solders such as AuSn solder, a SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The second surface of the submount can be attached to the common support member using similar techniques, but could be others. Similarly, the phosphor material may have an intermediate material or submount positioned between the common support member and the phosphor. The intermediate material may be comprised of a thermally conductive material such as copper or copper tungsten. The phosphor material may be bonded using a soldering technique, a sintered Ag technique, or other technique. In this configuration, the common support member should be configured of a thermally conductive material such as copper or copper tungsten. Optimizing the bond for the lowest thermal impedance is a key parameter for heat dissipation from the phosphor, which is critical to prevent phosphor degradation and thermal quenching of the phosphor material.

In yet another preferred variation of this CPoS integrated white light source, a process for lifting-off gallium and nitrogen containing epitaxial material and transferring it to the common support member can be used to attach the gallium and nitrogen containing laser epitaxial material to a submount member. In this embodiment, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a laser diode with a cavity member, front and back facets, and electrical contacts for injecting current. After laser fabrication is complete, a phosphor material is introduced onto the submount to form an integrated white light source. The phosphor material may have an intermediate material positioned between the submount and the phosphor. The intermediate material may be comprised of a thermally conductive material such as copper. The phosphor material can be attached to the submount using conventional die attaching techniques using solders such as AuSn solder, SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Optimizing the bond for the lowest thermal impedance is a key parameter for heat dissipation from the phosphor, which is critical to prevent phosphor degradation and thermal quenching of the phosphor material. The benefits of using this embodiment with lifted-off and transferred gallium and nitrogen containing material are the reduced cost, improved laser performance, and higher degree of flexibility for integration using this technology.

In all embodiments of this integrated white light source, the present invention may include safety features and design considerations. In any based laser based source, safety is a key aspect. It is critical that the light source cannot be compromised or modified in such a way to create laser diode beam that can be harmful to human beings, animals, or the environment. Thus, the overall design should include safety considerations and features, and in some cases even active components for monitoring. Examples of design considerations and features for safety include positioning the laser beam with respect to the phosphor in a way such that if the phosphor is removed or damaged, the exposed laser beam would not make it to the outside environment in a harmful form such as collimated, coherent beam. More specifically, the white light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor. In some embodiments thermal fuses are incorporated wherein the fuse creates an open circuit and turns the laser diode off in an un-safe condition.

In some embodiments of this invention, safety features and systems use active components. Example active components include photodiodes/photodetectors and thermistors. Strategically located detectors designed to detect direct blue emission from the laser, scatter blue emission, or phosphor emission such as yellow phosphor emission can be used to detect failures of the phosphor where a blue beam could be exposed. Upon detection of such an event, a close circuit or feedback loop would be configured to cease power supply to the laser diode and effectively turn it off. As an example, a detector used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system. In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and shut it off. Of course these are merely example embodiments, there are several configurations for photodiodes and/or thermistors to be integrated with a laser based white light source to form a safety feature such as a feedback loop to cease operation of the laser.

In many embodiments of the present invention an electrostatic discharge (ESD) protection element is included. For example, an ESD protection element would be used to protect the integrated white light source from damage that could occur with a sudden flow of current resulting from a build-up of charge. In one example a transient voltage suppression (TVS) element is employed.

In all embodiments of the integrated white light source final packaging would need to be considered. There are many aspects of the package that should be accounted for such as form factor, cost, functionality, thermal impedance, sealing characteristics, and basic compatibility with the application. Form factor will depend on the application, but in general making the smallest size packaged white source will be desirable. Cost should be minimized in all applications, but in some applications cost will be the most important consideration. In such cases using an off-the-shelf packages produced in high volume may be desirable. Functionality options include direction and properties of the exiting light emission for the application as well as integration of features such as photodetectors, thermistors, or other electronics or optoelectronics. For best performance and lifetime the thermal impedance of the package should be minimized, especially in high power applications. Examples of sealing configurations include open environment, environmentally sealed, or hermetically sealed. Typically for GaN based lasers it is desirable for hermetically sealed packages, but other packages can be considered and deployed for various applications. Examples of off the shelf packages for the integrated white light source include TO cans such as TO38, TO56, TO9, TO5, or other TO can type packages. Flat packages configured with windows can also be used. Examples of flat packages include a butterfly package like a TOSA. Surface mount device (SMD) packages can also be used, which are attractive due to their low price, hermetic sealing, and potentially low thermal impedance. In other embodiments, custom packages are used. In another embodiment, a "Flash" package could be used for the integrated white light source. For example, this package could be used to adapt the laser based white light source to camera flash applications. One of the standard packaging formats for today's LEDs employ the use of a flat ceramic package, sometimes called "Flash" packages as devices built on these platforms have primarily been used in Camera Flash and Cell Phone applications. The typical flash package consists of a flat ceramic substrate (Alumina or AlN) with attach pads for LED and ESD devices as well as leads providing a location for clipping or soldering external electrical connections to power the device. The phosphor is contained near the LED die via molding or other silicone containing dispensing application. This layer is then typically over molded with a clear silicone lens to improve light extraction. The primary benefits of a package in this format is a very small overall package dimension (~3 mm×~5 mm), reasonable light output performance (hundreds of Lumens), small source size and overall low cost LED device. This package style could also be achieved by employing a laser plus phosphor design style which would potentially could eliminate the encapsulation and lensing steps, providing an LED replacement with superior spot size and brightness. If a protective cover were needed to house the laser and phosphor subcomponents, a hollow glass dome could be used to provide protection.

In some embodiments of this invention, the integrated white light source is combined with optical members to manipulate the generated white light. In an example the white light source could serve in a spot light system such as a flashlight or an automobile headlamp or other light applications where the light must be directed or projected to a specified location or area. In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector. In another example a lens is used to collimate the white light into a projected beam. In one example a simple aspheric lens would be positioned in front of the phosphor to collimate the white light. In another example, a total internal reflector optic is used for collimation. In other embodiments other types of collimating optics may be used such as spherical lenses or aspherical lenses. In several embodiments, a combination of optics is used.

In a specific embodiment of the general invention described above, the present invention is configured for a side-pumped phosphor operated in transmissive mode. In this configuration, the phosphor is positioned in front of the laser facet outputting the laser beam, wherein both the laser and the phosphor are configured on a support member. The gallium and nitrogen containing laser diode is configured with a cavity that has a length greater than 100 µm, greater than 500 µm, greater than 1000 µm, or greater than 1500 µm long and a width greater than 1 µm, greater than 10 µm, greater than 20 µm, greater than 30 µm, or greater than 45 µm. The cavity is configured with a front facets and back facet on the end wherein the front facet comprises the output facet and emits the laser beam incident on the phosphor. The output facet may contain an optical coating to reduce the reflectivity in the cavity. The back facet can be coated with a high reflectivity coating to reduce the amount of light exiting the back of the laser diode. The phosphor is comprised of Ce doped YAG and emits yellow emission. The phosphor is shaped as a block, plate, sphere, cylinder, or other geometrical form. Specifically, the phosphor geometry primary dimensions may be less than 50 µm, less than 100 µm, less than 200 µm, less than 500 µm, less than 1 mm, or less than 10 mm. Operated in transmissive mode, the phosphor has a first primary side for receiving the incident laser beam and at least a second primary side where most of the useful white light will exit the phosphor to be coupled to the application. To improve the efficiency by maximizing the amount of light exiting the second side of the phosphor, the phosphor may be coated with layers configured to modify the reflectivity for certain colors. In one example, a coating configured to increase the reflectivity for yellow light is applied to the first side of the phosphor such that the amount of yellow light emitted from the first side is reduce. In another example, a coating to increase the reflectivity of the blue light is spatially patterned on the first side of the phosphor to allow the excitation light to pass, but prevent backward propagating scattered light to escape. In another example, optical coatings configured to reduce the reflectivity to yellow and blue light are applied to at least the second side of the phosphor to maximize the light escaping from this primary side where the useful light exits. In an alternative embodiment, a powdered phosphor such as a yellow phosphor is dispensed onto a transparent plate or into a solid structure using a binder material and is configured to emit a white light when excited by and combined with the blue laser beam. The powdered phosphors could be comprised of YAG based phosphors, and other phosphors.

With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm*cm, or pressured sintered Ag can have a thermal conductivity of about 250 W/mK and electrical conductivity of about 2.5 micro-ohm× cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, alumina, SiC, sapphire, AlN, or other metals, ceramics, or semiconductors. The side-pumped transmissive apparatus has a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

In alternative embodiments of the present invention, multiple phosphors are operated in a transmissive mode for a white emission. In one example, a violet laser diode configured to emit a wavelength of 395 nm to 425 nm and excite a first blue phosphor and a second yellow phosphor. In this configuration, a first blue phosphor plate could be fused or bonded to the second yellow phosphor plate. In a practical configuration the laser beam would be directly incident on the first blue phosphor wherein a fraction of the blue emission would excite the second yellow phosphor to emit yellow emission to combine with blue emission and generate a white light. Additionally, the violet pump would essentially all be absorbed since what may not be absorbed in the blue phosphor would then be absorbed in the yellow phosphor. In an alternative practical configuration the laser beam would be directly incident on the second yellow phosphor wherein a fraction of the violet electromagnetic emission would be absorbed in the yellow phosphor to excite yellow emission and the remaining violet emission would pass to the blue phosphor and create a blue emission to combine a yellow emission with a blue emission and generate a white light. In an alternative embodiment, a powdered mixture of phosphors would be dispensed onto a transparent plate or into a solid structure using a binder material such that the different color phosphors such as blue and yellow phosphors are co-mingled and are configured to emit a white light when excited by the violet laser beam. The powdered phosphors could be comprised of YAG based phosphors, LuAG phosphors, and other phosphors.

In an alternative embodiment of a multi-phosphor transmissive example according to the present invention, a blue laser diode operating with a wavelength of 425 nm to 480 nm is configured to excite a first green phosphor and a second red phosphor. In this configuration, a first green phosphor plate could be fused or bonded to the second red phosphor plate. In a practical configuration the laser beam would be directly incident on the first green phosphor wherein a fraction of the green emission would excite the second red phosphor to emit red emission to combine with green phosphor emission and blue laser diode emission to generate a white light. In an alternative practical configuration the laser beam would be directly incident on the second red phosphor wherein a fraction of the blue electromagnetic emission would be absorbed in the red phosphor to excite red emission and a portion of the remaining blue laser emission would pass to the green phosphor and create a green emission to combine with the red phosphor emission and blue laser diode emission to generate a white light. In an alternative embodiment, a powdered mixture of phosphors would be dispensed onto a transparent plate or into a solid structure using a binder material such that the different color phosphors such as red and green phosphors are co-mingled and are configured to emit a white light when excited by and combined with the blue laser beam. The powdered phosphors could be comprised of YAG based phosphors, LuAG phosphors, and other phosphors. The benefit or feature of this embodiment is the higher color quality that could be achieved from a white light comprised of red, green, and blue emission. Of course there could be other variants of this invention including integrating more than two phosphor and could include one of or a combination of a red, green, blue, and yellow phosphor.

In several embodiments according to the present invention, the laser based integrated white light sources is configured as a high CRI white light source with a CRI over 70, over 80, or over 90. In these embodiments, multiple phosphors are used in the form of a mixed power phosphor composition or multiple phosphor plate configuration or others. Examples of such phosphors include, but are not limited to YAG, LuAG, red nitrides, aluminates, oxynitrides, $CaMgSi_2O_6:Eu^{2+}$, $BAM:Eu^{2+}$, $AlN:Eu^{2+}$, $(Sr,Ca)_3MgSi_2O_8:Eu^{2+}$, and JEM.

In some configurations of the high CRI embodiments of the integrated laser based white light source a blue laser diode excitation source operating in the wavelength range of 430 nm to 470 nm is used to excite;
1) Yellow phosphor+red phosphor, or
2) Green phosphor+red phosphor, or
3) Cyan phosphor+orange phosphor, or
4) Cyan phosphor+orange phosphor+red phosphor, or
5) Cyan phosphor+yellow phosphor+red phosphor, or
6) Cyan phosphor+green phosphor+red phosphor In some alternative configurations of the high CRI embodiments of the integrated laser based white light source a violet laser diode excitation source operating in the wavelength range of 390 nm to 430 nm is used to excite;
1) Blue phosphor+yellow phosphor+red phosphor, or
2) Blue phosphor+green phosphor+red phosphor, or
3) Blue phosphor+cyan phosphor+orange phosphor, or
4) Blue phosphor+cyan phosphor+orange phosphor+red phosphor, or
5) Blue phosphor+cyan phosphor+yellow phosphor+red phosphor, or
6) Blue phosphor+cyan phosphor+green phosphor+red phosphor In an alternative embodiment of a multi-phosphor transmissive example according to the present invention, a blue laser diode operating with a wavelength of 395 nm to 425 nm is configured to excite a first blue phosphor, a second green phosphor, and a third red phosphor. In this one embodiment of this configuration, a first blue phosphor plate could be fused or bonded to the second green phosphor plate which is fused or bonded to the third red phosphor plate. In a practical configuration the laser beam would be directly incident on the first blue phosphor wherein a fraction of the blue emission would excite the second green phosphor and third red phosphor to emit green and red emission to combine with first phosphor blue emission to generate a white light. In an alternative practical configuration the violet laser beam would be directly incident on the third red phosphor wherein a fraction of the violet electromagnetic emission would be absorbed in the red phosphor to excite red emission and a portion of the remaining violet laser emission would pass to the second green phosphor and create a green emission to combine with the red phosphor emission and a portion of the violet laser diode would pass to the first blue phosphor to create a blue emission to combine the red and green emission to generate a white light. In an alternative embodiment, a powdered mixture of phosphors would be dispensed onto a transparent plate or into a solid structure using a binder material such that the different color phosphors such as red, green, and blue phosphors are co-mingled and are configured to emit a white light when excited by the violet laser beam. The powdered phosphors could be comprised of YAG based phosphors, LuAG phosphors, and other phosphors. The benefit or feature of this embodiment is the higher color quality and color rendering quality that could be achieved from a white light comprised of red, green, and blue emission. Of course there could be other variants of this invention including integrating more than two phosphor and could include one of or a combination of a red, green, blue, and yellow phosphor.

In yet another variation of a side pumped phosphor configuration, a "point source" or "point source like" integrated white emitting device is achieved. In this configuration the phosphor would most likely have a cube geometry or spherical geometry such that white light can be emitted from more than 1 primary emission surface. For example, in a cube geometry up to all six faces of the cube can emit white light or in a sphere configuration the entire surface can emit to create a perfect point source. A first strong advantage to this configuration is that the white light spot size is controlled by the phosphor size, which can enable smaller spot sizes than alternative transmissive or reflective mode configurations by avoiding the spot size growth that happens within the phosphor due to scattering, reflection, and lack of efficient absorption in the phosphor. Ultra-small spot sizes are ideal for most efficient collimation in directional applications. A second advantage to this configuration is the ideal heat sinking configuration wherein for the phosphor member it is identical to a reflection mode configuration with the entire bottom surface of the phosphor can be thermally and mechanically attached to a heat-sink. Further, since the laser diode member does not require thick or angled intermediate support members to elevate the beam and dictate an angled incidence as in the reflection mode configurations, the laser can be mounted closer to the base member for a shorter thermal conduction path to the heat-sink. A third advantage is the inherent design for safety since the primary emission may be from the top surface of the phosphor orthogonal to the laser beam direction such that in the event of a phosphor breakage or compromise the laser beam would not be pointing the direction of white light capture. In this configuration, if the phosphor were to be removed or compromised the laser beam would be incident on the side of the package. Moreover, this configuration would avoid the potential issue in a reflective configuration where an escaped beam can result from a reflection of the incident beam on the top of the surface. In this side pumped configuration the reflected beam would be substantially contained in the package. A fourth advantage is that since the laser diode or SLED device can be mounted flat on the base member, the assembly process and components can be simplified. In this side pumped configuration it may be advantageous to promote primary emission from the top surface of the phosphor. This could be achieved with treatments to promote light escape from the top surface such as application of an anti-reflective coating or roughening, and treatments to reduce light escape from the side and bottom surfaces such as application of highly reflective layers such as metal or dielectric layers.

In some configurations of this embodiment the phosphor is attached to the common support member wherein the common support member may not be fully transparent. In this configuration the surface or side of the phosphor where it is attached would have impeded light emission and hence would reduce the overall efficiency or quality of the point source white light emitter. However, this emission impediment can be minimized or mitigated to provide a very efficient illumination. In other configurations, the phosphor is supported by a optically transparent member such that the light is free to emit in all directions from the phosphor point source. In one variation, the phosphor is fully surrounded in or encapsulated by an optically transparent material such as a solid material like SiC, diamond, GaN, or other, or a liquid material like water or a more thermally conductive liquid.

In another variation, the support member could also serve as a waveguide for the laser light to reach the phosphor. In another variation, the support member could also serve as a protective safety measure to ensure that no direct emitting laser light is exposed as it travels to reach the phosphor. Such point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics and/or reflector assembly are applied to a large point source, the optical control and collimation is diminished.

In some embodiments according to the present invention a periodic 2D photonic crystal structure can be applied to the single crystal or poly crystal phosphor materials structure. The photonic crystal structure would be employed to suppress emission in given directions and re-direct light out of the photonic crystal in a direction suitable and chosen for the device design. Phosphor structures today are largely Lambertian emitters except where waveguiding and critical angle comes into play. Many phosphors today satisfy the basic materials requirements needed to create photonic crystal structures—(dielectric or metallo-dielectric materials with low optical absorption). Adding photonic crystal structures to phosphor plate materials would allow light extraction to be enhanced in 1 direction over another in these materials. This can separate the excitation and emission characteristics thereby allowing greater flexibility in design.

In yet another variation of a side pumped phosphor embodiment, a phosphor is excited from the side and configured to emit a substantial portion of the white light from a top surface. In this configuration the phosphor would most likely have a cubic geometry, a cylindrical geometry, a faceted geometry, a hexagonal geometry, a triangular geometry, a pyramidal geometry, or other multi-sided geometries wherein the white light is configured to be emitted primarily from the top surface of the phosphor. In this configuration the laser beam would enter the phosphor from a first of side of the phosphor where a fraction of the laser excitation light with a first wavelength would be converted to a second wavelength. This first side of the phosphor may be configured for a modified reflectivity such as a coating or treatment to reduce the reflectivity in the blue or violet wavelength range and/or for increased reflectivity for the phosphor emission wavelength range such as yellow. In one example of the side pumped embodiment the laser excitation beam is incident on the first side of the phosphor at the Brewster angle. In further examples, the additional sides of the phosphor may be coated, treated, or shaped for an increased reflectivity to both the laser excitation wavelength and the phosphor conversion wavelength such that the light within the phosphor would be reflected inside the phosphor until it escaped from the top. Special phosphor shaping or coating techniques could be used to enhance the fraction of light escaping the top surface. A first strong advantage to this configuration is that the white light spot size is controlled by the phosphor size, which can enable smaller spot sizes than alternative transmissive or reflective mode configurations by avoiding the spot size growth that happens within the phosphor due to scattering, reflection, and lack of efficient absorption in the phosphor. Ultra-small spot sizes are ideal for most efficient collimation in directional applications. A second advantage to this configuration is the ideal heat sinking configuration wherein for the phosphor member it is identical to a reflection mode configuration with the entire bottom surface of the phosphor can be thermally and mechanically attached to a heat-sink. Further, since the laser diode member does not require thick or angled intermediate support members to elevate the beam and dictate an angled incidence as in the reflection mode configurations, the laser can be mounted closer to the base member for a shorter thermal conduction path to the heat-sink. A third advantage is the inherent design for safety since the primary emission may be from the top surface of the phosphor orthogonal to the laser beam direction such that in the event of a phosphor breakage or compromise the laser beam would not be pointing the direction of white light capture. In this configuration, if the phosphor were to be removed or compromised the laser beam would be incident on the side of the package. Moreover, this configuration would avoid the potential issue in a reflective configuration where an escaped beam can result from a reflection of the incident beam on the top of the surface. In this side pumped configuration the reflected beam would be substantially contained in the package. A fourth advantage is that since the laser diode or SLED device can be mounted flat on the base member, the assembly process and components can be simplified. In this side pumped configuration it may be advantageous to promote primary emission from the top surface of the phosphor.

In all of the side pumped and transmissive embodiments of this invention the additional features and designs can be included. For example shaping of the excitation laser beam for optimizing the beam spot characteristics on the phosphor can be achieved by careful design considerations of the laser beam incident angle to the phosphor or with using integrated optics such as free space optics like collimating lens. In some embodiments re-imaging optics such as re-imaging reflectors are used to shape the excitation beam and/or re-capture excitation light reflected from the phosphor. Safety features can be included such as passive features like physical design considerations and beam dumps and/or active features such as thermal fuses, photodetectors, or thermistors that can be used in a closed loop to turn the laser off when a signal is indicated.

A point source omni-directional light source is configurable into several types of illumination patterns including 4-pi steradian illumination to provide a wide illumination to a three dimensional volume such as a room, lecture hall, or stadium. Moreover, optical elements can be included to manipulate the generated white light to produce highly directional illumination. In some embodiments reflectors such as parabolic reflectors or lenses such as collimating lenses are used to collimate the white light or create a spot light that could be applicable in an automobile headlight, flashlight, spotlight, or other lights. In other embodiments, the point source illumination can be modified with cylindrical optics and reflectors into linear omni-directional illumination, or linear directional illumination. Additionally, the point source illumination coupled into planar waveguides for planar 2-pi steradian emission, planar 4-pi steradian emission to produce glare-free illumination patterns that emit from a plane.

In another specific preferred embodiment of the integrated white light source, the present invention is configured for a reflective mode phosphor operation. In one example the excitation laser beam enters the phosphor through the same primary surface as the useful white light is emitted from. That is, operated in reflective mode the phosphor could have a first primary surface configured for both receiving the incident excitation laser beam and emitting useful white light. In this configuration, the phosphor is positioned in front of the laser facet outputting the laser beam, wherein both the laser and the phosphor are configured on a support member. The gallium and nitrogen containing laser diode is configured with a cavity that has a length greater than 100 µm, greater than 500 µm, greater than 1000 µm, or greater than 1500 µm long and a width greater than 1 µm, greater than 10 µm, greater than 20 µm, greater than 30 µm, or greater than 45 µm. The cavity is configured with a front facets and back facet on the end wherein the front facet comprises the output facet and emits the laser beam incident on the phosphor. The output facet may contain an optical coating to reduce the reflectivity in the cavity. The back facet can be coated with a high reflectivity coating to reduce the amount of light exiting the back facet of the laser diode. In one example, the phosphor can be comprised of Ce doped YAG and emits yellow emission. The phosphor may be a powdered ceramic phosphor, a ceramic phosphor plate, or could be a single crystal phosphor. The phosphor is preferably shaped as a substantially flat member such as a plate or a sheet with a shape such as a square, rectangle, polygon, circle, or ellipse, and is characterized by a thickness. In a preferred embodiment the length, width, and or diameter dimensions of the large surface area of the phosphor are larger than the thickness of the phosphor. For example, the diameter, length, and/or width dimensions may be 2× greater than the thickness, 5× greater than the thickness, 10× greater than the thickness, or 50× greater than the thickness. Specifically, the phosphor plate may be configured as a circle with a diameter of greater than 50 µm, greater than 100 µm, greater than 200 µm, greater than 500 µm, greater than 1 mm, or greater than 10 mm and a thickness of less than 500 µm, less than 200 µm, less than 100 µm or less than 50 µm.

In one example of the reflective mode CPoS white light source embodiment of this invention optical coatings, material selections are made, or special design considerations are taken to improve the efficiency by maximizing the amount of light exiting the primary surface of the phosphor. In one example, the backside of the phosphor may be coated with reflective layers or have reflective materials positioned on the back surface of the phosphor adjacent to the primary emission surface. The reflective layers, coatings, or materials help to reflect the light that hits the back surface of the phosphor such that the light will bounce and exit through the primary surface where the useful light is captured. In one example, a coating configured to increase the reflectivity for yellow light and blue light and is applied to the phosphor prior to attaching the phosphor to the common support member. In another example, a reflective material is used as a bonding medium that attaches the phosphor to the support member or to an intermediate submount member. Examples of reflective materials include reflective solders and reflective glues, but could be others. In some configurations the top primary surface of the phosphor wherein the laser excitation beam is incident is configured for a reduced reflectivity to the blue or violet excitation beam wavelength and/or the phosphor emission wavelength such as a yellow wavelength. The reduced reflectivity can be achieved with an optical coating of the phosphor using dielectric layers, a shaping of the phosphor surface, and roughening of the phosphor surface, or other techniques. In some examples the laser beam incident angle is configured at or near Brewster's angle, wherein the light with a particular polarization is perfectly transmitted through the primary surface of the phosphor. Due to the divergence of the laser resulting in a variation of incident angles for the plane waves within the beam a perfect transmission may be challenging, but ideally a substantial fraction of the light incident on the phosphor could be at or near Brewster's angle. For example, a YAG or LuAG phosphor may have a refractive index of about 1.8 in the violet and blue wavelength range. With the Brewster angle, $\theta_B$, given as arctan (n2/n1), where n1 is the index of air and n2 is the index of the phosphor, would be about 61 degrees [or about 55 to 65 degrees], off of the axis of normal incidence. Or alternatively, about 29 degrees [or about 25 to 35 degrees] rotated from the axis parallel to the phosphor surface.

With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies, and other materials. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors. The reflective mode white light source apparatus has a form factor characterized by a length, a width, and a height. In an example, the height is characterized by a dimension of less than 25 mm and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

The reflective mode integrated white light source embodiment of this invention is configured with the phosphor member attached to the common support member with the large primary surface configured for receiving laser excitation light and emitting useful white light positioned at an angle normal (about 90 degrees) or off-normal (about 0 degrees to about 89 degrees) to the axis of the laser diode output beam functioning to excite the phosphor. That is, the laser output beam is pointing toward the phosphor's emission surface at an angle of between 0 and 90 degrees. The nature of this configuration wherein the laser beam is not directed in the same direction the primary phosphor emission surface emits is a built in safety feature. That is, the laser beam is directed away from or opposite of the direction the useful white light will exit the phosphor. As a result, if the phosphor is to break or get damaged during normal operation or from tampering, the laser beam would not be directed to the outside world where it could be harmful. Instead, the laser beam would be incident on the backing surface where the phosphor was attached. As a result, the laser beam could be scattered or absorbed instead of exiting the white light source and into the surrounding environment. Additional safety measure can be taken such as using a beam dump feature or use of an absorbing material such as a thermal fuse that heats up and creates an open circuit within the laser diode drive circuit.

One example of this reflective mode integrated white light source embodiment is configured with the laser beam normal to the primary phosphor emission surface. In this configuration the laser diode would be positioned in front of the primary emission surface of the phosphor where it could impede the useful white light emitted from the phosphor. In a preferable embodiment of this reflective mode integrated white light source, the laser beam would be configured with an incident angle that is off-axis to the phosphor such that it hits the phosphor surface at an angle of between 0 and 89 degrees or at a "grazing" angle. In some configurations the incident angle is configured at or near Brewster's angle to maximize the transmission of the laser excitation light into the phosphor. In this preferable embodiment the laser diode device is positioned to the side of the phosphor instead of in front of the phosphor where it will not substantially block or impede the emitted white light. Moreover, in this configuration the built in safety feature is more optimal than in the normal incidence configuration since when incident at an angle in the case of phosphor damage or removal the incident laser beam would not reflect directly off the back surface of the support member where the phosphor was attached. By hitting the surface at an off-angle or a grazing angle any potential reflected components of the beam can be directed to stay within the apparatus and not exit the outside environment where it can be a hazard to human beings, animals, and the environment.

In all of the reflective mode embodiments of this invention the additional features and designs can be included. For example, shaping of the excitation laser beam for optimizing the beam spot characteristics on the phosphor can be achieved by careful design considerations of the laser beam incident angle to the phosphor or with using integrated optics such as free space optics like collimating lens. Beam shaping can also be achieved by using two or more adjacent parallel emitter stripes spaced by 10 μm to 30 μm, or 30 μm to 50 μm, or 100 μm to 250 μm such that the beam is enlarged in the slow-divergence axis from the laser emission apertures. Beam shaping may also be achieved with re-imaging optics. Safety features can be included such as passive features like physical design considerations and beam dumps and/or active features such as photodetectors or thermistors that can be used in a closed loop or a type of feedback loop to turn the laser off when a signal is indicated. Moreover, optical elements can be included to manipulate the generated white light. In some embodiments reflectors such as parabolic reflectors or lenses such as collimating lenses are used to collimate the white light or create a spot light that could be applicable in an automobile headlight, flashlight, spotlight, or other lights.

In some embodiments according to the present invention, multiple laser diode sources are configured to excite the same phosphor or phosphor network. Combining multiple laser sources can offer many potential benefits according to this invention. First, the excitation power can be increased by beam combining to provide a more powerful excitation spit and hence produce a brighter light source. In some embodiments, separate individual laser chips are configured within the laser-phosphor light source. By including multiple lasers emitting 1 W, 2 W, 3 W, 4 W, 5 W or more power each, the excitation power can be increased and hence the source brightness would be increased. For example, by including two 3 W lasers exciting the same phosphor area, the excitation power can be increased to 6 W for double the white light brightness. In an example where about 200 lumens of white are generated per 1 watt of laser excitation power, the white light output would be increased from 600 lumens to 1200 lumens. Similarly, the reliability of the source can be increased by using multiple sources at lower drive conditions to achieve the same excitation power as a single source driven at more harsh conditions such as higher current and voltage. A second advantage is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color lasers in a emitting device can significantly improve color quality (CRI and CQS) by improving the fill of the spectra in the violet/blue and cyan region of the visible spectrum. For example, two or more blue excitation lasers with slightly detuned wavelengths (e.g. 5 nm 10 nm, 15 nm, etc.) can be included to excite a yellow phosphor and create a larger blue spectrum.

In an specific embodiment, the present invention provides an integrated white light source. The integrated white light source includes a laser diode device comprising a gallium and nitrogen containing material and configured as an excitation source and a phosphor member configured as a wavelength converter and an emitter and coupled to the laser diode device. The integrated white light source further includes a common support member configured to support the laser diode device and the phosphor member, a heat sink thermally coupled to the common support member, the common support member configured to transport thermal energy from the laser diode device and phosphor member to the heat sink, and an output facet configured on the laser diode device to output a laser beam comprised of electromagnetic radiation selected from a violet and/or a blue emission with a first wavelength ranging from 400 nm to 485 nm. Additionally, the integrated white light source includes a free space between the output facet and the phosphor member with a non-guided characteristic capable of transmitting the laser beam from the laser diode device to an excitation surface of the phosphor member, a range of angle of incidence between the laser beam and the excitation surface of the phosphor member so that on average the laser beam has an off-normal incidence to the excitation surface and a beam spot is configured for a certain geometrical size and shape. The phosphor member converts a fraction of the electromagnetic radiation from the laser beam with the first wavelength to an emitted electromagnetic radiation with a second wavelength that is longer than the first wavelength. The integrated white light source further includes a plurality of scattering centers associated with the phosphor member to scatter electromagnetic radiation with the first wavelength from the laser beam incident on the phosphor member. Furthermore, the integrated white light source includes a reflective mode characterizing the phosphor member such that the laser beam is incident on a beam spot area on the excitation surface of the phosphor member and a white light emission is outputted substantially from the same beam spot area, the white light emission being comprised of a mixture of wavelengths characterized by at least the second wavelength emitted electromagnetic radiation from the phosphor member. Moreover, the integrated white light source includes a form factor characterizing a package of the integrated white light source, the form factor having a length, a width, and a height dimension.

In another specific embodiment, the present invention provides an integrated white light source based on a beam of laser light. The integrated white light source includes a laser diode device comprising a gallium and nitrogen containing material and configured as an excitation source, a phosphor member configured as a wavelength converter and an emitter and coupled to the laser diode device. Also, the integrated white light source includes a shaped support member having at least a flat surface portion and one or more wedge portions with inclined planes. Each inclined plane forms a wedge angle relative to surface normal of the flat surface region. The flat surface region is configured to support the phosphor member with an excitation surface. The each inclined plane is configured to have one of the one or more laser diode devices being attached thereon. Additionally, the integrated white light source includes an output facet configured on the laser diode device to output a laser beam comprised of electromagnetic radiation selected from a violet and/or a blue emission with a first wavelength ranging from 400 nm to 485 nm. The integrated white light source further includes a free space, between the output facet and the phosphor member with a non-guided characteristic capable of transmitting the laser beam from the laser diode device to an excitation surface of the phosphor member. Furthermore, the integrated white light source includes a range of angle of incidence between the laser beam and the excitation surface of the phosphor member so that on average the laser beam has an off-normal incidence to the excitation surface and a beam spot area is configured for a certain geometrical size and shape. The phosphor member converts a fraction of the electromagnetic radiation from the laser beam with the first wavelength to an emitted electromagnetic radiation with a second wavelength that is longer than the first wavelength. A plurality of scattering centers associated with the phosphor member to scatter electromagnetic radiation with the first wavelength from the laser beam incident on the phosphor member Moreover, the integrated white light source includes a reflective mode characterizing the phosphor member such that the laser beam is incident on a beam spot area on the excitation surface of the phosphor member and a white light emission is outputted substantially from the same beam spot area. The white light emission is comprised of a mixture of wavelengths characterized by at least the second wavelength emitted electromagnetic radiation from the phosphor member. Also, the integrated white light source includes a form factor characterizing a package of the integrated white light source, the form factor having a length, a width, and a height dimension.

In yet another specific embodiment, the present invention provides an integrated white light source package. The integrated white light source package includes one or more laser diode devices, each laser diode device comprising a gallium and nitrogen containing material and configured as an excitation source and a phosphor member configured as a wavelength converter and an emitter and coupled to the laser diode device. The integrated white light source package further includes a shaped support member having at least a flat surface portion and one or more wedge portions with inclined planes and being configured as a submount structure integrated the one or more wedge portions in one piece of material or at the flat surface portion or as a base for separately attaching the one or more wedge portions to support the one or more laser diode devices in a surface mount device (SMD) package. Additionally, the integrated white light source package includes an output facet configured on each of the one or more laser diode devices to output a laser beam comprised of electromagnetic radiation selected from a violet and/or a blue emission with a first wavelength ranging from 400 nm to 485 nm. The integrated white light source package further includes an optical path between the output facet and the phosphor member with a non-guided characteristic capable of transmitting the laser beam to the excitation surface of the phosphor member. Furthermore, the integrated white light source package includes a range of angles of incidence of the laser beam into the excitation surface of the phosphor member so that on average an excitation spot on the excitation surface is configured for a certain geometrical size and shape confined from a lower bound to an upper bound of the laser beam. Moreover, the integrated white light source package includes a frame member having a base with a surrounding edge to form a cavity for holding the shaped support member therein to support at least the phosphor member and the one or more laser diode devices and a lid member attached with the surrounding edge to seal the cavity.

A further understanding of the nature and advantages of the present invention may be realized by reference to the latter portions of the specification and attached drawings.

DETAILED DESCRIPTION

Figure 1:
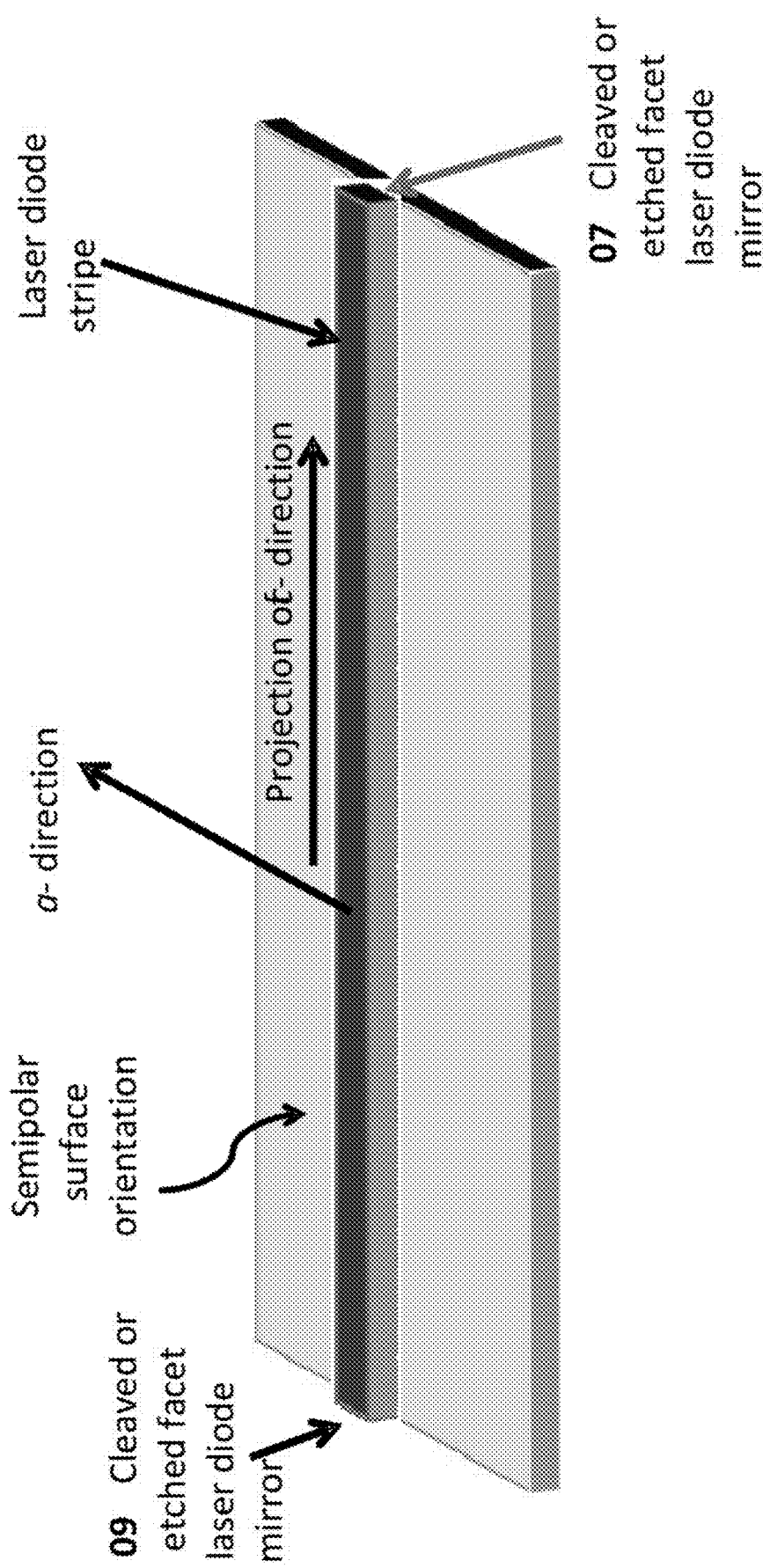
FIG. 1 is a simplified diagram illustrating a laser diode device configured on a semipolar substrate according to the present invention.

The present invention provides a method and device for emitting white colored electromagnetic radiation using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials to form a compact, high-brightness, and highly-efficient, white light source.

As background, while LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm2 range. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based light bulb will require 3 mm$^2$ to 30 mm$^2$ of epi area. A second limitation of LEDs is also related to their brightness, more specifically it is related to their spatial brightness. A conventional high brightness LED emits~1 W per mm$^2$ of epi area. With some advances and breakthrough perhaps this can be increased up to 5-10× to 5-10 W per mm$^2$ of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

An exciting new class of solid-state lighting based on laser diodes is rapidly emerging. Like an LED, a laser diode is a two-lead semiconductor light source that that emits electromagnetic radiation. However, unlike the output from an LED that is primarily spontaneous emission, the output of a laser diode is comprised primarily of stimulated emission. The laser diode contains a gain medium that functions to provide emission through the recombination of electron-hole pairs and a cavity region that functions as a resonator for the emission from the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. At the threshold condition, the carrier density clamps and stimulated emission dominates the emission. Since the droop phenomenon that plagues LEDs is dependent on carrier density, the clamped carrier density within laser diodes provides a solution to the droop challenge. Further, laser diodes emit highly directional and coherent light with orders of magnitude higher spatial brightness than LEDs. For example, a commercially available edge emitting GaN-based laser diode can reliably produce about 2 W of power in an aperture that is 15 wide by about 0.5 µm tall, which equates to over 250,000 W/mm$^2$. This spatial brightness is over 5 orders of magnitude higher than LEDs or put another way, 10,000 times brighter than an LED.

In 1960, the laser was demonstrated by Theodore H. Maiman at Hughes Research Laboratories in Malibu. This laser utilized a solid-state flash lamp-pumped synthetic ruby crystal to produce red laser light at 694 nm. Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

Based on essentially all the pioneering work on GaN LEDs described above, visible laser diodes based on GaN technology have rapidly emerged over the past 20 years. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common laser-quality bulk GaN c-plane substrate size today with recent progress enabling 4" diameter, which are still relatively small compared to the 6" and greater diameters that are commercially available for mature substrate technologies. Further details of the present invention can be found throughout the present specification and more particularly below.

Additional benefits are achieved over pre-existing techniques using the present invention. In particular, the present invention enables a cost-effective white light source. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a chip on submount (CoS) with an integrated phosphor on the submount to form a chip and phosphor on submount (CPoS) white light source. In some embodiments intermediate submount members may be included. In some embodiments the laser diode and the phosphor member are supported by a common support member such as a package base. In this embodiment there could be submount members or additional support members included between the laser diode and the common support member. Similarly there could be submount members or additional support members included between the phosphor member and the common support member.

In various embodiments, the laser device and phosphor device are mounted on a common support member with or without intermediate submounts and the phosphor materials are operated in a transmissive mode, a reflective mode, or a side-pumped mode to result in a white emitting laser-based light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) greater than 10,000 times higher than conventional LEDs and the extreme directionality of the laser emission, laser diodes enable characteristics unachievable by LEDs and other light sources. Specifically, since the laser diodes output beams carrying over 0.5 W, over 1 W, over 3 W, over 10 W, or even over 100 W can be focused to very small spot sizes of less than 1 mm in diameter, less than 500 µm in diameter, less than 100 µm in diameter, or even less than 50 µm in diameter, power densities of over 1 W/mm$^2$, 100 W/mm$^2$, or even over 2,500 W/mm$^2$ can be achieved. When this very small and powerful beam of laser excitation light is incident on a phosphor material the ultimate point source of white light can be achieved. Assuming a phosphor conversion ratio of 200 lumens of emitted white light per optical watt of excitation light, a 5 W excitation power could generate 1000 lumens in a beam diameter of 100 µm, or 50 µm, or less. Such a point source is game changing in applications such as spotlighting or range finding where parabolic reflectors or lensing optics can be combined with the point source to create highly collimated white light spots that can travel drastically higher distances than ever possible before using LEDs or bulb technology.

In some embodiments of the present invention the gallium and nitrogen containing light emitting device may not be a laser device, but instead may be configured as a superluminescent diode or superluminescent light emitting diode (SLED) device. For the purposes of this invention, a SLED device and laser diode device can be used interchangeably. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. The advantage of a SLED device is that SLED it can combine the unique properties of high optical emission power and extremely high spatial brightness of laser diodes that make them ideal for highly efficient long throw illumination and high brightness phosphor excitation applications with a broad spectral width of (>5 nm) that provides for an improved eye safety and image quality in some cases. The broad spectral width results in a low coherence length similar to an LED. The low coherence length provides for an improved safety such has improved eye safety. Moreover, the broad spectral width can drastically reduce optical distortions in display or illumination applications. As an example, the well-known distortion pattern referred to as "speckle" is the result of an intensity pattern produced by the mutual interference of a set of wavefronts on a surface or in a viewing plane. The general equations typically used to quantify the degree of speckle are inversely proportional to the spectral width.

In an example application of this invention, a laser diode device or superluminescent diode (SLED) device according to this invention could be used as a preferred light source for visible light communications (VLC) systems, such as Li-Fi communication systems. VLC systems are those that use modulation of a visible, UV, infra-red or near-infra-red light source for data transmission. VLC systems using modulation of visible light sources would be an advantageous use of this invention for two reasons. Firstly, bandwidth would be higher than that expected when using light emitting diodes due to the increase in carrier recombination rates due to the significant amount of stimulated emission found in laser diodes and SLEDs. In LEDs, diode lasers and SLEDs the recombination rate will increase with carrier density, however unlike SLEDs and diode lasers, which peak in efficiency at relatively high carrier densities, LEDs peak in efficiency at very low carrier densities. Typically LED peak efficiency is at carrier densities 2-3 orders of magnitude lower than those found at typical SLED or laser diode operating conditions. Modulation and therefore data transfer rates should be significantly higher than those achievable using LEDs.

Moreover, in white-light based VLC sources a violet or blue "pump" light source consisting of a LED or laser diode or SLED is used to optically excite or "pump" a phosphor element to produce a broad spectrum covering wavelengths corresponding to green and red and sometimes blue. The phosphor derived spectrum and unabsorbed pump light are combined to produce a white light spectrum. Laser and SLED light sources have significantly narrower spectra than blue LEDs; <1.5 nm and <5 nm, respectively as compared to approximately 20 nm for a blue LED. Narrower FWHMs make separation of the pump light signal from the phosphor emission using notch (i.e. bandpass) filters easier. This is important because though the phosphor derived component of the white light spectra comprises a significant fraction of the total optical power emitted by the device, the long recombination lifetimes in phosphors result in very low modulation rates for the phosphor emitted component of the spectra.

In an embodiment, multiple laser die emitting at different wavelengths are transferred to the same carrier wafer in close proximity to one another; preferably within one millimeter of each other, more preferably within about 200 µm of each other and most preferably within about 50 µm of each other. The laser die wavelengths are chosen to be separated in wavelength by at least twice the full width at half maximum of their spectra. For example, three die, emitting at 440 nm, 450 nm and 460 nm, respectively, are transferred to a single carrier chip with a separation between die of less than 50 µm and die widths of less than 50 µm such that the total lateral separation, center to center, of the laser light emitted by the die is less than 200 µm. The closeness of the laser die allows for their emission to be easily coupled into the same optical train or fiber optic waveguide or projected in the far field into overlapping spots. In a sense, the lasers can be operated effectively as a single laser light source.

Such a configuration offers an advantage in that each individual laser light source could be operated independently to convey information using for example frequency and phase modulation of an RF signal superimposed on DC offset. The time-averaged proportion of light from the different sources could be adjusted by adjusting the DC offset of each signal. At a receiver, the signals from the individual laser sources would be demultiplexed by use of notch filters over individual photodetectors that filter out both the phosphor derived component of the white light spectra as well as the pump light from all but one of the laser sources. Such a configuration would offer an advantage over an LED based VLC source in that bandwidth would scale easily with the number of laser emitters. Of course, a similar embodiment with similar advantages could be constructed from SLED emitters.

In one embodiment, the present invention provides a laser-based white light source comprising a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations. The apparatus has a support member and at least one gallium and nitrogen containing laser diode devices and phosphor material overlying the support member. The laser device is capable of an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm.

In some embodiments according to the present invention, multiple laser diode sources are configured to be excite the same phosphor or phosphor network. Combining multiple laser sources can offer many potential benefits according to this invention. First, the excitation power can be increased by beam combining to provide a more powerful excitation spit and hence produce a brighter light source. In some embodiments, separate individual laser chips are configured within the laser-phosphor light source. By including multiple lasers emitting 1 W, 2 W, 3 W, 4 W, 5 W or more power each, the excitation power can be increased and hence the source brightness would be increased. For example, by including two 3 W lasers exciting the same phosphor area, the excitation power can be increased to 6 W for double the white light brightness. In an example where about 200 lumens of white are generated per 1 watt of laser excitation power, the white light output would be increased from 600 lumens to 1200 lumens. Similarly, the reliability of the source can be increased by using multiple sources at lower drive conditions to achieve the same excitation power as a single source driven at more harsh conditions such as higher current and voltage.

A second advantage is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color lasers in a emitting device can significantly improve color quality (CRI and CQS) by improving the fill of the spectra in the violet/blue and cyan region of the visible spectrum. For example, two or more blue excitation lasers with slightly detuned wavelengths (e.g. 5 nm 10 nm, 15 nm, etc.) can be included to excite a yellow phosphor and create a larger blue spectrum.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

The laser diode device can be fabricated on a conventional orientation of a gallium and nitrogen containing film or substrate (e.g., GaN) such as the polar c-plane, on a nonpolar orientation such as the m-plane, or on a semipolar orientation such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane.

FIG. 1 is a simplified schematic diagram of an example of a polar c-plane laser diode formed on a gallium and nitrogen containing substrate with the cavity aligned in the m-direction with cleaved or etched mirrors. The laser stripe region is characterized by a cavity orientation substantially in an m-direction, which is substantially normal to an a-direction, but can be others such as cavity alignment substantially in the a-direction. The laser strip region has a first end 07 and a second end 09 and is formed on an m-direction on a {0001} gallium and nitrogen containing substrate having a pair of cleaved or etched mirror structures, which face each other. For example, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or between $10^5$ and $10^7$ cm$^{-2}$. The nitride crystal or wafer may comprise $Al_xIn_yGa_{1-x-y}N$, where 0≤x, y, x+y≤1. In one specific embodiment, the nitride crystal comprises GaN. In an embodiment, the GaN substrate has threading dislocations, at a concentration between about $10^5$ cm$^{-2}$ and about $10^8$ cm$^{-2}$, in a direction that is substantially orthogonal or oblique with respect to the surface.

Figure 2:
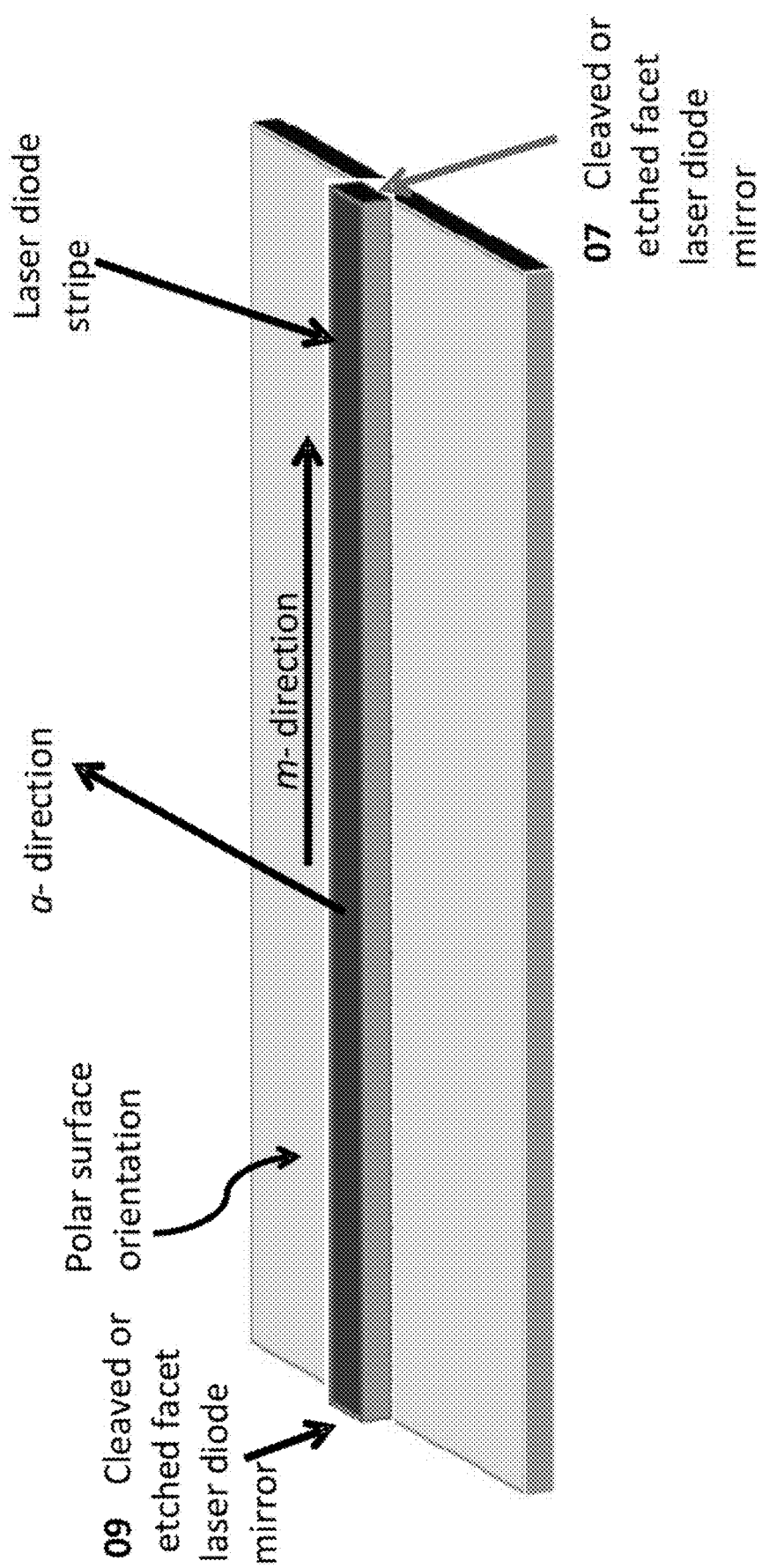
FIG. 2 is a simplified diagram illustrating a laser diode device configured on a polar c-plane substrate according to the present invention.

FIG. 2 is a simplified schematic diagram of an example of a semipolar plane laser diode formed on a gallium and nitrogen containing substrate with the cavity aligned in a projection of a c-direction with cleaved or etched mirrors. The laser stripe region is characterized by a cavity orientation substantially in a projection of a c-direction, which is substantially normal to an a-direction, but can be others such as cavity alignment substantially in the a-direction. The laser strip region has a first end 07 and a second end 09 and is formed on an semipolar substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing substrate. For example, the gallium and nitrogen containing substrate member is a bulk GaN substrate characterized by having a nonpolar or semipolar crystalline surface region, but can be others. The bulk GaN substrate may have a surface dislocation density below $10^5$ cm$^{-2}$ or between $10^5$ and $10^7$ cm$^{-2}$. The nitride crystal or wafer may comprise Al$_x$In$_y$Ga$_{1-x-y}$N, where 0≤x, y, x+y≤1. In one specific embodiment, the nitride crystal comprises GaN. In an embodiment, the GaN substrate has threading dislocations, at a concentration between about $10^5$ cm$^{-2}$ and about $10^8$ cm$^{-2}$, in a direction that is substantially orthogonal or oblique with respect to the surface.

The example laser diode devices in FIGS. 1 and 2 have a pair of cleaved or etched mirror structures, which face each other. The first cleaved or etched facet comprises a reflective coating and the second cleaved or etched facet comprises no coating, an antireflective coating, or exposes gallium and nitrogen containing material. The first cleaved or etched facet is substantially parallel with the second cleaved or etched facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in different patterns and profiles. In an embodiment, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 µm deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO$_2$), silicon nitride (Si$_x$N$_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the catastrophic optical mirror damage (COMD) threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 µm to about 3000 µm, but is preferably between about 10 µm and about 400 microns, between about 400 microns and about 800 microns, or about 800 µm and about 1600 µm, but could be others. The stripe also has a width ranging from about 0.5 µm to about 50 µm, but is preferably between about 0.8 µm and about 2.5 µm for single lateral mode operation or between about 2.5 µm and about 50 µm for multi-lateral mode operation, but can be other dimensions. In a specific embodiment, the present device has a width ranging from about 0.5 µm to about 1.5 µm, a width ranging from about 1.5 µm to about 3.0 µm, a width ranging from about 3.0 µm to about 50 µm, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

In certain embodiments, GaN surface orientation is substantially in the c-plane, m-plane, {40-41}, {30-31}, {20-21}, {40-4-1}, {30-3-1}, {20-2-1} {20-21} orientation, and the device has a laser stripe region formed overlying a portion of the off-cut crystalline orientation surface region. For example, the laser stripe region is characterized by a cavity orientation substantially in a projection of a c-direction, which is substantially normal to an a-direction. In a specific embodiment, the laser strip region has a first end 07 and a second end 09. In a preferred embodiment wherein the laser is formed on a semipolar orientation, the device is formed on a projection of a c-direction on a gallium and nitrogen containing substrate having a pair of cleaved mirror structures, which face each other.

In a preferred embodiment, the device has a first cleaved facet provided on the first end of the laser stripe region and a second cleaved facet provided on the second end of the laser stripe region. In an embodiment, the first cleaved is substantially parallel with the second cleaved facet. Mirror surfaces are formed on each of the cleaved surfaces. The first cleaved facet comprises a first mirror surface. In a preferred embodiment, the first mirror surface is provided by a topside skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. The first mirror surface can also have an anti-reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface has an anti-reflective coating.

Similar to an edge emitting laser diode, a SLED is typically configured as an edge-emitting device wherein the high brightness, highly directional optical emission exits a waveguide directed outward from the side of the semiconductor chip. SLEDs are designed to have high single pass gain or amplification for the spontaneous emission generated along the waveguide. However, unlike laser diodes, they are designed to provide insufficient feedback to in the cavity to achieve the lasing condition where the gain equals the total losses in the waveguide cavity. In a typical example, at least one of the waveguide ends or facets is designed to provide very low reflectivity back into the waveguide. Several methods can be used to achieve reduced reflectivity on the waveguide end or facet. In one approach an optical coating is applied to at least one of the facets, wherein the optical coating is designed for low reflectivity such as less than 1%, less than 0.1%, less than 0.001%, or less than 0.0001% reflectivity. In another approach for reduced reflectivity the waveguide ends are designed to be tilted or angled with respect to the direction of light propagation such that the light that is reflected back into the chip does not constructively interfere with the light in the cavity to provide feedback. The tilt angle must be carefully designed around a null in the reflectivity versus angle relationship for optimum performance. The tilted or angled facet approach can be achieved in a number of ways including providing an etched facet that is designed with an optimized angle lateral angle with respect to the direction of light propagation. The angle of the tilt is pre-determined by the lithographically defined etched facet patter. Alternatively, the angled output could be achieved by curving and/or angling the waveguide with respect to a cleaved facet that forms on a pre-determined crystallographic plane in the semiconductor chip. Another approach to reduce the reflectivity is to provide a roughened or patterned surface on the facet to reduce the feedback to the cavity. The roughening could be achieved using chemical etching and/or a dry etching, or with an alternative technique. Of course there may be other methods for reduced feedback to the cavity to form a SLED device. In many embodiments a number of techniques can be used in combination to reduce the facet reflectivity including using low reflectivity coatings in combination with angled or tilted output facets with respect to the light propagation.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nm to about 470 nm to yield a blue emission, or about 500 nm to about 540 nm to yield a green emission, and others. For example, the spontaneously emitted light can be violet (e.g., 395 to 420 nanometers), blue (e.g., 420 to 470 nm); green (e.g., 500 to 540 nm), or others. In a preferred embodiment, the spontaneously emitted light is highly polarized and is characterized by a polarization ratio of greater than 0.4. In another specific embodiment on a semipolar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 501 nm and greater light in a ridge laser embodiment. The device is provided with the following epitaxially grown elements:
- an n-GaN or n-AlGaN cladding layer with a thickness from 100 nm to 3000 nm with Si doping level of $5 \times 10^{17}$ cm$^{-3}$ to $3 \times 10^{18}$ cm$^{-3}$;
- an n-side SCH layer comprised of InGaN with molar fraction of indium of between 2% and 10% and thickness from 20 nm to 250 nm;
- multiple quantum well active region layers comprised of at least two 2.0 nm to 8.5 nm InGaN quantum wells separated by 1.5 nm and greater, and optionally up to about 12 nm, GaN or InGaN barriers;
- a p-side SCH layer comprised of InGaN with molar a fraction of indium of between 1% and 10% and a thickness from 15 nm to 250 nm or an upper GaN-guide layer;
- an electron blocking layer comprised of AlGaN with molar fraction of aluminum of between 0% and 22% and thickness from 5 nm to 20 nm and doped with Mg;
- a p-GaN or p-AlGaN cladding layer with a thickness from 400 nm to 1500 nm with Mg doping level of $2 \times 10^{17}$ cm$^{-3}$ to $2 \times 10^{19}$ cm$^{-3}$; and
- a p++-GaN contact layer with a thickness from 20 nm to 40 nm with Mg doping level of $1 \times 10^{19}$ cm$^{-3}$ to $1 \times 10^{21}$ cm$^{-3}$.

Figure 3:
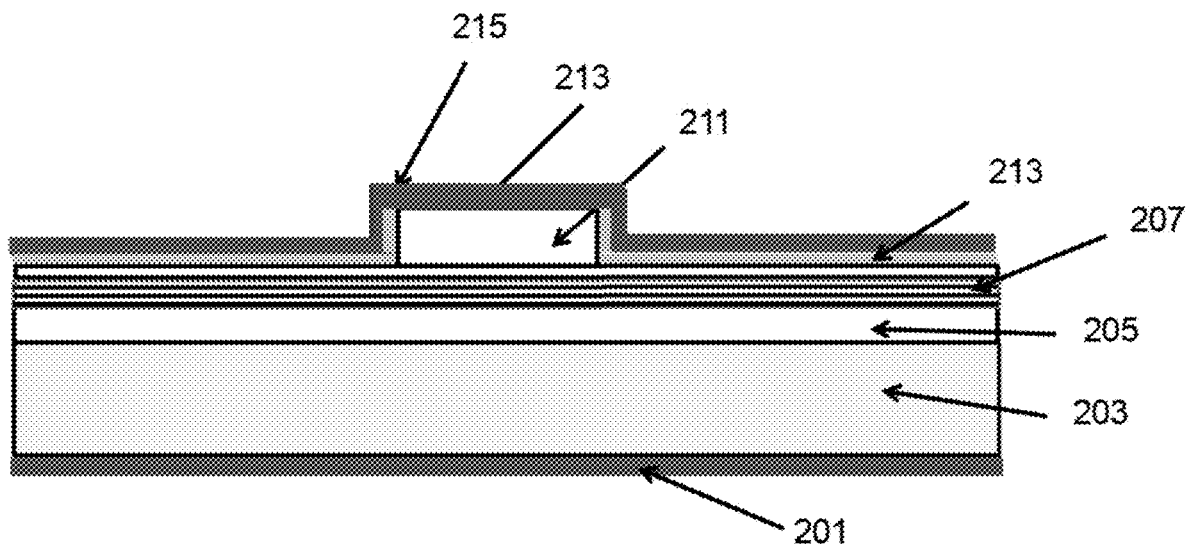
FIG. 3 is a simplified schematic cross-section of conventional ridge laser diode-plane substrate according to the present invention.

FIG. 3 is a cross-sectional view of a laser device 200. As shown, the laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

An n-type Al$_u$In$_v$Ga$_{1-u-v}$N layer, where 0≤u, v, u+v≤1, is deposited on the substrate. The carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes 213 contact region. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au), or a combination thereof.

Active region 207 preferably includes one to ten quantum well regions or a double heterostructure region for light emission. Following deposition of the n-type layer to achieve a desired thickness, an active layer is deposited. The quantum wells are preferably InGaN with GaN, AlGaN, InAlGaN, or InGaN barrier layers separating them. In other embodiments, the well layers and barrier layers comprise Al$_w$In$_x$Ga$_{1-w-x}$N and Al$_y$In$_z$Ga$_{1-y-z}$N, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise Al$_s$In$_t$Ga$_{1-s-t}$N, where 0≤s, t, s+t≤1, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes contact region 213.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIGS. 1 and 2 and described above are typically suitable for relative low-power applications.

In various embodiments, the present invention realizes high output power from a diode laser is by widening portions of the laser cavity member from the single lateral mode regime of 1.0-3.0 µm to the multi-lateral mode range 5.0-20 µm. In some cases, laser diodes having cavities at a width of 50 µm or greater are employed.

The laser stripe length, or cavity length ranges from 100 to 3000 µm and employs growth and fabrication techniques such as those described in U.S. patent application Ser. No. 12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

FIG. 3 illustrates an example cross-sectional diagram of a gallium and nitrogen based laser diode device. The epitaxial device structure is formed on top of the gallium and nitrogen containing substrate member 203. The substrate member may be n-type doped with O and/or Si doping. The epitaxial structures will contain n-side layers 205 such as an n-type buffer layer comprised of GaN, AlGaN, AlINGaN, or InGaN and n-type cladding layers comprised of GaN, AlGaN, or AlInGaN. The n-typed layers may have thickness in the range of 0.3 µm to about 3 µm or to about 5 µm and may be doped with an n-type carriers such as Si or O to concentrations between $1 \times 10^{16}$ cm$^{-3}$ to $1 \times 10^{19}$ cm$^{-3}$. Overlying the n-type layers is the active region and waveguide layers 207. This region could contain an n-side waveguide layer or separate confinement heterostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double heterostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlINGaN, or a combination thereof. The thickness of the p-type cladding layers is in the range of 0.3 µm to about 2 microns and is doped with Mg to a concentration of between $1 \times 10^{16}$ cm$^{-3}$ to $1 \times 10^{19}$ cm$^{-3}$. A ridge 211 is formed in the p-cladding region for lateral confinement in the waveguide using an etching process selected from a dry etching or a wet etching process. A dielectric material 213 such as silicon dioxide or silicon nitride or deposited on the surface region of the device and an opening is created on top of the ridge to expose a portion of the p++ GaN layer. A p-contact 215 is deposited on the top of the device to contact the exposed p++ contact region. The p-type contact may be comprised of a metal stack containing one of Au, Pd, Pt, Ni, Ti, or Ag and may be deposited with electron beam deposition, sputter deposition, or thermal evaporation. An n-contact 201 is formed to the bottom of the substrate member. The n-type contact may be comprised of a metal stack containing one of Au, Al, Pd, Pt, Ni, Ti, or Ag and may be deposited with electron beam deposition, sputter deposition, or thermal evaporation.

In multiple embodiments according to the present invention, the device layers comprise a super-luminescent light emitting diode or SLED. In all applicable embodiments a SLED device can be interchanged with or combined with laser diode devices according to the methods and architectures described in this invention. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode.

SLEDs are designed to have high single pass gain or amplification for the spontaneous emission generated along the waveguide. The SLED device would also be engineered to have a low internal loss, preferably below 1 cm$^{-1}$, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide the most flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet.

The spectra emitted by SLEDs differ from lasers in several ways. While a SLED device does produce optical gain in the laterally guided modes, the reduced optical feedback at the emitting facet results in a broader and more continuous emission spectra. For example, in a Fabry-Perot (FP) laser, the reflection of light at the ends of the waveguide limits the wavelengths of light that can experience gain to those that result in constructive interference, which is dependent on the length of the cavity. The spectra of a FP laser is thus a comb, with peaks and valleys corresponding to the longitudinal modes and with an envelope defined by the gain media and transverse modes supported by the cavity. Moreover, in a laser, feedback from emitting facet ensures that the transverse modes will reach threshold at a finite current density. When this happens, a subset of the longitudinal modes will dominate the spectra. In a SLED, the optical feedback is suppressed, which reduces the peak to valley height of the comb in the gain spectra and also pushes out thresholds to higher current densities. A SLED then will be characterized by a relatively broad (>5 nm) and incoherent spectrum, which has advantages for spectroscopy, eye safety and reduced speckle. As an example, the well-known distortion pattern referred to as "speckle" is the result of an intensity pattern produced by the mutual interference of a set of wavefronts on a surface or in a viewing plane. The general equations typically used to quantify the degree of speckle are inversely proportional to the spectral width.

In an example application of this invention, a laser diode device or superluminescent diode (SLED) device according to this invention could be used as a preferred light source for visible light communications (VLC) systems, such as Li-Fi communication systems. VLC systems are those that use modulation of a visible, UV, infra-red or near-infra-red light source for data transmission. VLC systems using modulation of visible light sources would be an advantageous use of this invention for two reasons. Firstly, bandwidth would be higher than that expected when using light emitting diodes due to the increase in carrier recombination rates due to the significant amount of stimulated emission found in laser diodes and SLEDs. In LEDs, diode lasers and SLEDs the recombination rate will increase with carrier density, however unlike SLEDs and diode lasers, which peak in efficiency at relatively high carrier densities, LEDs peak in efficiency at very low carrier densities. Typically LED peak efficiency is at carrier densities 2-3 orders of magnitude lower than those found at typical SLED or laser diode operating conditions. Modulation and therefore data transfer rates should be significantly higher than those achievable using LEDs.

Moreover, in white-light based VLC sources a violet or blue "pump" light source consisting of a LED or laser diode or SLED is used to optically excite or "pump" a phosphor element to produce a broad spectrum covering wavelengths corresponding to green and red and sometimes blue. The phosphor derived spectrum and unabsorbed pump light are combined to produce a white light spectrum. Laser and SLED light sources have significantly narrower spectra than blue LEDs; <1.5 nm and <5 nm, respectively as compared to approximately 20 nm for a blue LED. Narrower FWHMs make separation of the pump light signal from the phosphor emission using notch (i.e. bandpass) filters easier. This is important because though the phosphor derived component of the white light spectra comprises a significant fraction of the total optical power emitted by the device, the long recombination lifetimes in phosphors result in very low modulation rates for the phosphor emitted component of the spectra.

In an embodiment, multiple laser die emitting at different wavelengths are transferred to the same carrier wafer in close proximity to one another; preferably within one millimeter of each other, more preferably within about 200 µm of each other and most preferably within about 50 µm of each other. The laser die wavelengths are chosen to be separated in wavelength by at least twice the full width at half maximum of their spectra. For example, three die, emitting at 440 nm, 450 nm and 460 nm, respectively, are transferred to a single carrier chip with a separation between die of less than 50 µm and die widths of less than 50 µm such that the total lateral separation, center to center, of the laser light emitted by the die is less than 200 µm. The closeness of the laser die allows for their emission to be easily coupled into the same optical train or fiber optic waveguide or projected in the far field into overlapping spots. In a sense, the lasers can be operated effectively as a single laser light source.

Such a configuration offers an advantage in that each individual laser light source could be operated independently to convey information using for example frequency and phase modulation of an RF signal superimposed on DC offset. The time-averaged proportion of light from the different sources could be adjusted by adjusting the DC offset of each signal. At a receiver, the signals from the individual laser sources would be demultiplexed by use of notch filters over individual photodetectors that filter out both the phosphor derived component of the white light spectra as well as the pump light from all but one of the laser sources. Such a configuration would offer an advantage over an LED based VLC source in that bandwidth would scale easily with the number of laser emitters. Of course, a similar embodiment with similar advantages could be constructed from SLED emitters.

After the laser diode chip fabrication as described above, the laser diode can be mounted to a submount. In some examples the submount is comprised of AlN, SiC, BeO, diamond, or other materials such as metals, ceramics, or composites. The submount can be the common support member wherein the phosphor member of the CPoS would also be attached. Alternatively, the submount can be an intermediate submount intended to be mounted to the common support member wherein the phosphor material is attached. The submount member may be characterized by a width, length, and thickness. In an example wherein the submount is the common support member for the phosphor and the laser diode chip the submount would have a width and length ranging in dimension from about 0.5 mm to about 5 mm or to about 15 mm and a thickness ranging from about 150 µm to about 2 mm. In the example wherein the submount is an intermediate submount between the laser diode chip and the common support member it could be characterized by width and length ranging in dimension from about 0.5 mm to about 5 mm and the thickness may range from about 50 µm to about 500 µm. The laser diode is attached to the submount using a bonding process, a soldering process, a gluing process, or a combination thereof. In one embodiment the submount is electrically isolating and has metal bond pads deposited on top. The laser chip is mounted to at least one of those metal pads. The laser chip can be mounted in a p-side down or a p-side up configuration. After bonding the laser chip, wire bonds are formed from the chip to the submount such that the final chip on submount (CoS) is completed and ready for integration.

Figure 4:
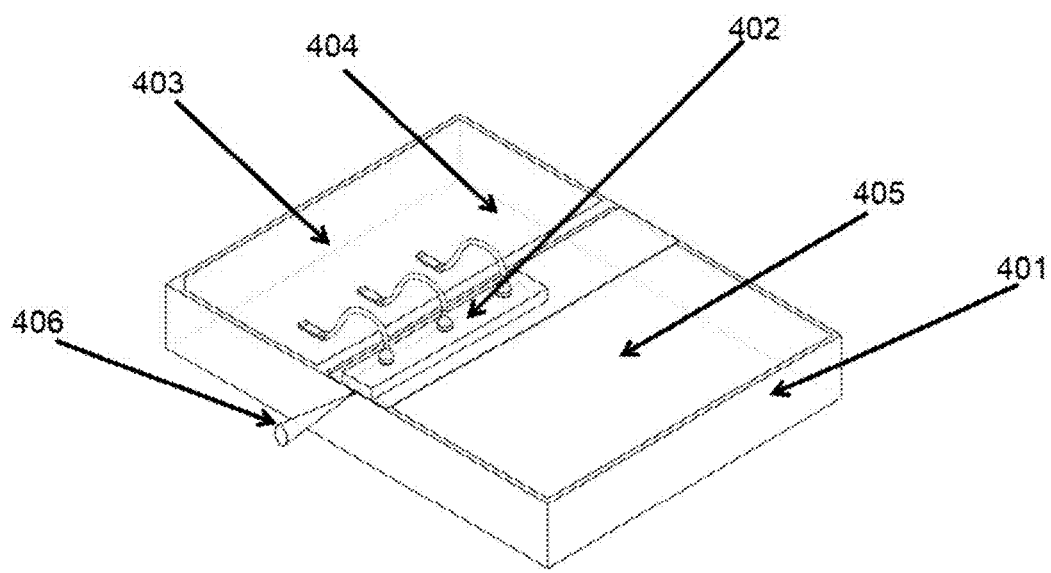
FIG. 4 is a simplified diagram illustrating a conventional laser diode chip on submount (CoS) according to the present invention.

A schematic diagram illustrating a CoS based on a conventional laser diode formed on gallium and nitrogen containing substrate technology according to this present invention is shown in FIG. 4. The CoS is comprised of submount material 401 configured to act as an intermediate material between a laser diode chip 402 and a final mounting surface. The submount is configured with electrodes 403 and 405 that may be formed with deposited metal layers such as Au. In one example, Ti/Pt/Au is used for the electrodes. Wirebonds 404 are configured to couple the electrical power from the electrodes 403 and 405 on the submount to the laser diode chip to generate a laser beam output 406 from the laser diode. The electrodes 403 and 405 are configured for an electrical connection to an external power source such as a laser driver, a current source, or a voltage source. Wirebonds can be formed on the electrodes to couple electrical power to the laser diode device and activate the laser.

In another embodiment, the gallium and nitrogen containing laser diode fabrication includes an epitaxial release step to lift off the epitaxially grown gallium and nitrogen layers and prepare them for transfer to a carrier wafer which could comprise the submount after laser fabrication. The transfer step requires precise placement of the epitaxial layers on the carrier wafer to enable subsequent processing of the epitaxial layers into laser diode devices. The attachment process to the carrier wafer could include a wafer bonding step with a bond interface comprised of metal-metal, semiconductor-semiconductor, glass-glass, dielectric-dielectric, or a combination thereof.

In yet another preferred variation of this CPoS white light source, a process for lifting-off gallium and nitrogen containing epitaxial material and transferring it to the common support member can be used to attach the gallium and nitrogen containing laser epitaxial material to a submount member. In this embodiment, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a laser diode with a cavity member, front and back facets, and electrical contacts for injecting current. After laser fabrication is complete, a phosphor material is introduced onto the submount to form an integrated white light source. The phosphor material may have an intermediate material positioned between the submount and the phosphor. The intermediate material may be comprised of a thermally conductive material such as copper. The phosphor material can be attached to the submount using conventional die attaching techniques using solders such as AuSn solder, but can be other techniques such as SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Optimizing the bond for the lowest thermal impedance is a key parameter for heat dissipation from the phosphor, which is critical to prevent phosphor degradation and thermal quenching of the phosphor material. The benefits of using this embodiment with lifted-off and transferred gallium and nitrogen containing material are the reduced cost, improved laser performance, and higher degree of flexibility for integration using this technology.

In this embodiment, gallium and nitrogen containing epitaxial layers are grown on a bulk gallium and nitrogen containing substrate. The epitaxial layer stack comprises at least a sacrificial release layer and the laser diode device layers overlying the release layers. Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to a carrier wafer. In one embodiment, a bonding material is deposited on the surface overlying the semiconductor device layers. A bonding material is also deposited either as a blanket coating or patterned on a carrier wafer. Standard lithographic processes are used to selectively mask the semiconductor device layers. The wafer is then subjected to an etch process such as dry etch or wet etch processes to define via structures that expose the sacrificial layer on the sidewall of the mesa structure. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is performed to fully or partially remove the sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and HNO3 have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

Figure 5:
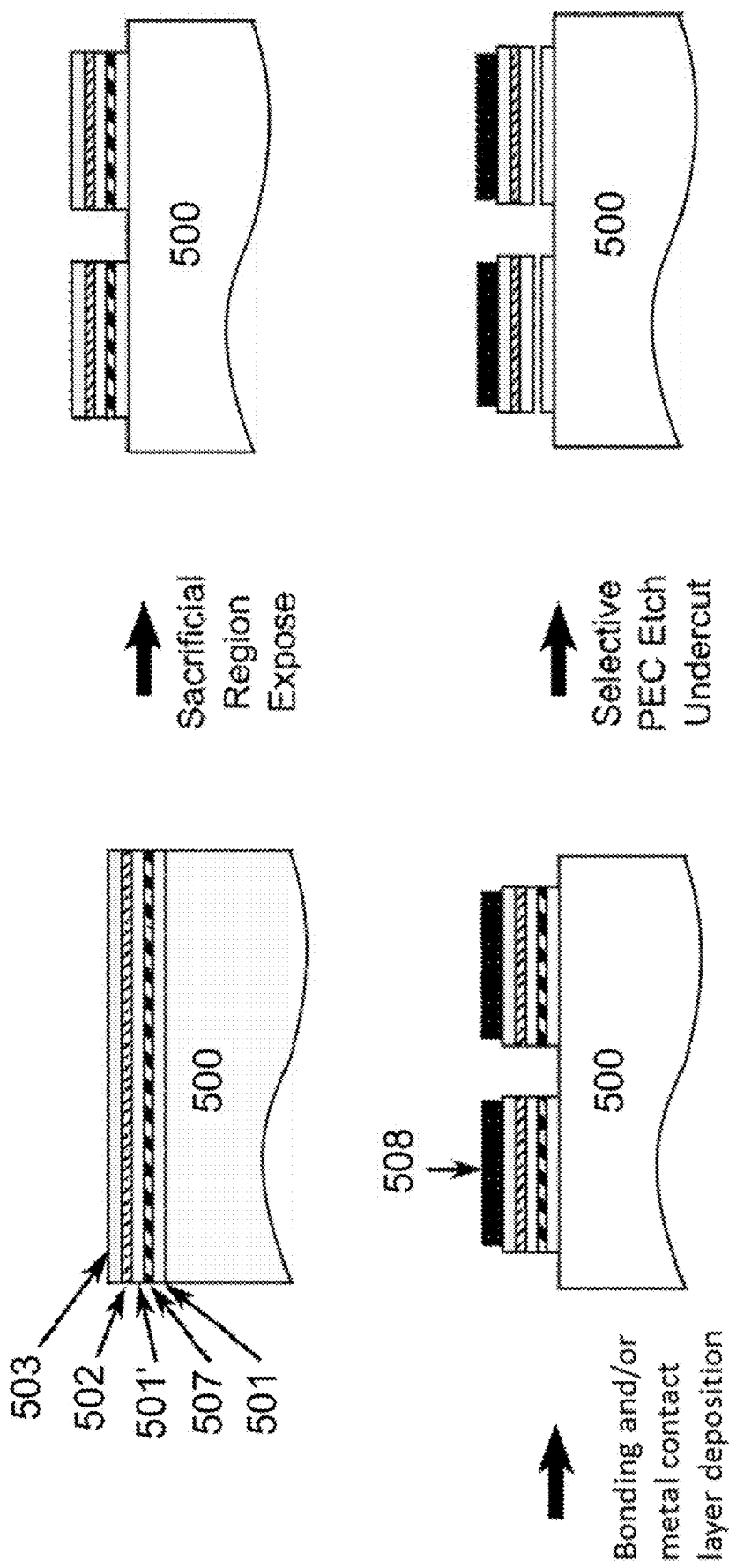
FIG. 5 is a simplified diagram illustrating epitaxy preparation process flow for epi transfer to a carrier wafer according to the present invention.

The preparation of the epitaxy wafer is shown in FIG. 5. A substrate 500 is overlaid by a buffer layer 501, a selectively removable sacrificial layer 507, another buffer layer 501', a collection of device layers 502 and a contact layer 503. The sacrificial region is exposed by etching of vias that extend below the sacrificial layer and segment the layers 501, 502, 503, and 507 into mesas. A layer composed of bonding media 508 is deposited overlaying the mesas. In some embodiments the bonding layer is deposited before the sacrificial layer is exposed. Finally the sacrificial layer is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching. The first step depicted in FIG. 5 is a top down etch to expose the sacrificial layers, followed by a bonding metal deposition as shown in FIG. 5. With the sacrificial region exposed a bandgap selective PEC etch is used to undercut the mesas. In one embodiment, the bandgaps of the sacrificial region and all other layers are chosen such that only the sacrificial region will absorb light, and therefore etch, during the PEC etch. Another embodiment of the invention involving light emitting devices uses a sacrificial region with a higher bandgap than the active region such that both layers are absorbing during the bandgap PEC etching process.

In one embodiment involving light emitting devices, the active region can be prevented from etching during the bandgap selective PEC etch using an insulating protective layer on the sidewall. The device layers are exposed using an etch process and an etch resistant protect layer is deposited overlaying the edges of the device layers such that they are not exposed to the etch chemicals. The sacrificial layer is then exposed by an etch of vias. A bonding layer is deposited and a selective etch process is used to remove the sacrificial layers. In some embodiments the bonding layer is deposited after the selective etch. This work flow is advantageous when the device layers are susceptible to damage from the etch process used to remove the sacrificial layer. With the sacrificial region exposed a bandgap selective PEC etch is used to undercut the mesas. At this point, the selective area bonding process is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching. In other embodiments involving electronic devices or power electronic devices that do not contain light emitting layers, no special measures need to be taken to protect the semiconductor device layers during the selective etch.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In some embodiments PEC etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200 degrees Celsius. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercial available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with acids, bases or plasma treatments to produce a surface that yields a weak bond when brought into contact with the oxide surface. For example the exposed surface of the gallium containing material may be treated to form a thin layer of gallium oxide, which being chemically similar to the oxide bonding surface will bond more readily. Furthermore the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide is deposited overlying the device layer mesa region to form a bond region. The carrier wafer is also prepared with an oxide layer to form a bond region. The oxide layer overlying the carrier could be patterned or could be a blanket layer. The oxide surface on the carrier wafer and the oxide surface overlying the mesa device layer mesa regions are cleaned to reduce the amount of hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with acids, bases or plasma treatments to produce a surface that yields a weak bond when brought into contact with the oxide surface. Bonding is performed at elevated temperatures and elevated pressures.

In another embodiment the bonding media could be a dielectric such as silicon dioxide or silicon nitride. Such a media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In one embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, copper tungsten, gold, silver, aluminum, stainless steel, or steel.

In another embodiment, the carrier wafer is selected based on size and cost. For example, ingle crystal silicon wafers are available in diameters up to 300 mm or 12 inch, and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

Figure 6:
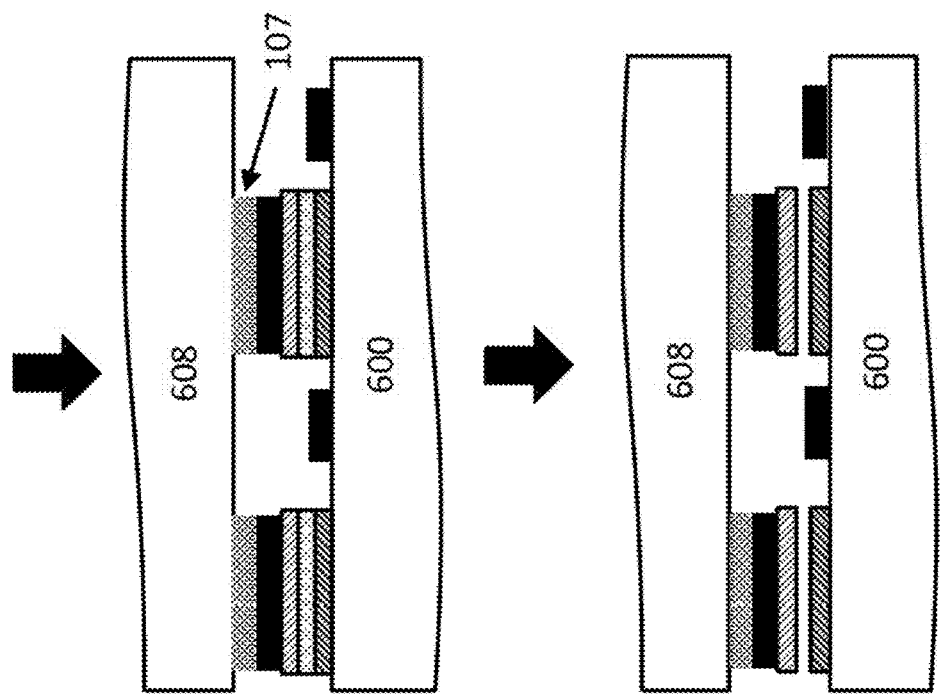
FIG. 6 is a simplified diagram illustrating a bond then etch process flow for epi layer transfer to a carrier wafer according to the present invention.
Figure 6:
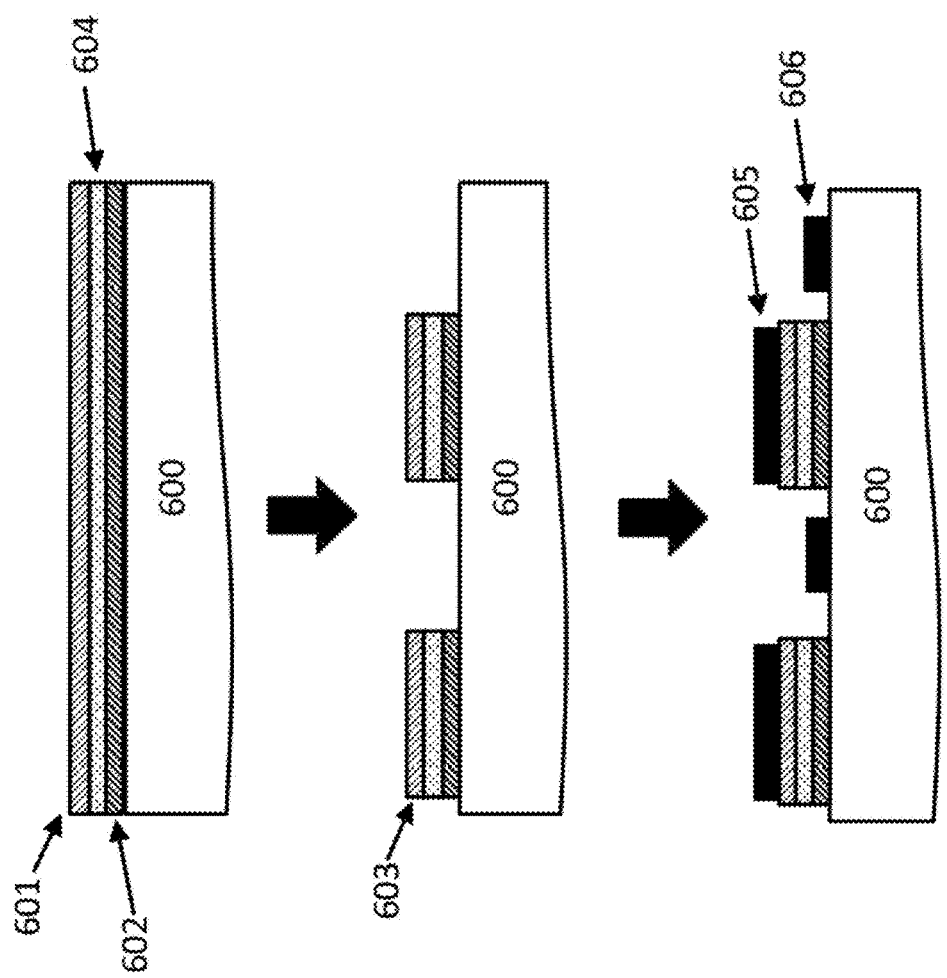

In one embodiment of this invention, the bonding of the semiconductor device epitaxial material to the carrier wafer process can be performed prior to the selective etching of the sacrificial region and subsequent release of the gallium and nitrogen containing substrate. FIG. 6 is a schematic illustration of a process comprised of first forming the bond between the gallium and nitrogen containing epitaxial material formed on the gallium and nitrogen containing substrate and then subjecting the release material to the PEC etch process to release the gallium and nitrogen containing substrate. In this embodiment, an epitaxial material is deposited on the gallium and nitrogen containing substrate, such as a GaN substrate, through an epitaxial deposition process such as metal organic chemical vapor deposition (MOCVD), molecular beam epitaxy (MBE), or other. The epitaxial material consists of at least a sacrificial release layer and device layers. In some embodiments a buffer layer is grown on between the substrate surface region and the sacrificial release region. In FIG. 6 a substrate wafer 600 is overlaid by a buffer layer 602, a selectively etchable sacrificial layer 604 and a collection of device layers 601. The bond layer 605 is deposited along with a cathode metal 606 that will be used to facilitate the photoelectrochemical etch process for selectively removing the sacrificial layer 604.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate 600 such as GaN and bulk gallium and nitrogen containing epitaxial device layers. A second advantage is the ability to perform multiple bond steps. In one example, the "etch then bond" process flow can be deployed where mesas 603 are retained on the substrate 600 by controlling the etch process such that not all of the sacrificial layer 604 is removed. The substrate wafer 600 is overlaid by a buffer layer 602, a selectively etchable sacrificial layer 604 and a collection of device layers 601. The bond layer 605 is deposited along with a cathode metal 606 that will be used to facilitate the photoelectrochemical etch process for selectively removing the sacrificial layer 604. The selective etch process is carried out to the point where only a small fraction of the sacrificial layer 604 is remaining, such that the mesas 603 are retained on the substrate 600, but the unetched portions of the sacrificial layer 604 are easily broken during or after the mesas are bonded to a carrier wafer 608.

A critical challenge of the etch then bond embodiment is mechanically supporting the undercut epitaxial device layer mesa region 603 from spatially shifting prior to the bonding step. If the mesas 603 shift the ability to accurately align and arrange them to the carrier wafer 608 will be compromised, and hence the ability to manufacture with acceptable yields. This challenge mechanically fixing the mesa regions 603 in place prior to bonding can be achieved in several ways. In a preferred embodiment anchor regions (not shown) are used to mechanically support the mesas 603 to the gallium and nitrogen containing substrate 600 prior to the bonding step wherein they are releases from the gallium and nitrogen containing substrate 600 and transferred to the carrier wafer 608.

Anchor regions are special features that can be designed into the photo masks which attach the undercut device layers to the gallium and nitrogen containing substrate 600, but which are too large to themselves be undercut, or which due to the design of the mask contain regions where the sacrificial layers 604 are not removed or these features may be composed of metals or dielectrics that are resistant to the etch. These features act as anchors, preventing the undercut device layers 603 from detaching from the substrate 600 and prevent the device layers 603 from spatially shifting. This attachment to the substrate 600 can also be achieved by incompletely removing the sacrificial layer, such that there is a tenuous connection between the undercut device layers 603 and the substrate 600 which can be broken during bonding. The surfaces of the bonding material on the carrier wafer 608 and the device wafer 600 are then brought into contact and a bond is formed which is stronger than the attachment of the undercut device layers 603 to the anchors or remaining material of the sacrificial layers 604. After bonding, the separation of the carrier 608 and device wafers 600 transfers the device layers 603 to the carrier wafer 608.

In one embodiment the anchor region is formed by features that are wider than the device layer mesas 603 such that the sacrificial region in these anchor regions is not fully removed during the undercut of the device layers 603. In one example the mesas 603 are retained on the substrate 600 by deposition of an etch resistant material acting as an anchor by connecting the mesas 603 to the substrate 600. In this example a substrate wafer 600 is overlaid by a buffer layer 602, a selectively etchable sacrificial layer 604 and a collection of device layers 601. The bond layer 605 is deposited along with a cathode metal 606 that will be used to facilitate the photoelectrochemical etch process for selectively removing the sacrificial layer 604. A layer of etch resistant material, which may be composed of metal, ceramic, polymer or a glass, is deposited such that it connects to both the mesa 603 and the substrate 600. The selective etch process is carried out such that the sacrificial layer 604 is fully removed and only the etch-resistant layer connects the mesa 603 to the substrate 600.

In another example of anchor techniques, the mesas 603 are retained on the substrate 600 by use of an anchor composed of epitaxial material. In this example a substrate wafer 600 is overlaid by a buffer layer 602, a selectively etchable sacrificial layer 604 and a collection of device layers 601. The bond layer 605 is deposited along with a cathode metal that will be used to facilitate the photoelectrochemical etch process for selectively removing the sacrificial layer 604. The anchor is shaped such that during the etch, a small portion of the sacrificial layer 604 remains unetched and creates a connection between the undercut mesa 603 and the substrate wafer 600.

In one embodiment the anchors are positioned either at the ends or sides of the undercut die such that they are connected by a narrow undercut region of material. In this example the narrow connecting material is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing regions of an etch-resistant material that adheres well to the epitaxial and substrate material. These regions overlay a portion of the semiconductor device layer mesa and some portion of the structure that will not be undercut during the etch such as the substrate. These regions form a continuous connection, such that after the semiconductor device layer mesa is completely undercut they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

The mesa regions can be formed by dry or wet chemical etching, and in one example would include at least a p++ GaN contact layer, a p-type cladding layer comprised of GaN, AlGaN, or InAlGaN, light emitting layers such as quantum wells separated by barriers, waveguiding layers such as InGaN layers, and the n-type cladding layers comprised of GaN, AlGaN, or InAlGaN, the sacrificial layer, and a portion of the n-type GaN epitaxial layer beneath the sacrificial layer. A p-contact metal is first deposited on the p++ GaN contact layer in order to form a high quality electrical contact with the p-type cladding. A second metal stack is then patterned and deposited on the mesa, overlaying the p-contact metal. The second metal stack consists of an n-contact metal, forming a good electrical contact with the n-type GaN layer beneath the sacrificial layer, as well as a relatively thick metal layer that acts as both the mesa bond pad as well as the cathode metal. The bond/cathode metal also forms a thick layer overlaying the edge of the mesa and providing a continuous connection between the mesa top and the substrate. After the sacrificial layer is removed by selective photochemical etching the thick metal provides mechanical support to retain the mesa in position on the GaN wafer until the bonding to the carrier wafer is carried out.

The use of metal anchors have several advantages over the use of anchors made from the epitaxial device material. The first is density of the transferrable mesas on the donor wafer containing the epitaxial semiconductor device layers and the gallium and nitrogen containing bulk substrate. Anchors made from the epitaxial material must be large enough to not be fully undercut by the selective etch, or they must be protected somehow with a passivating layer. The inclusion of a large feature that is not transferred will reduce the density of mesas in on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In a particular embodiment, the cathode metal stack also includes metal layers intended to increase the strength of the metal anchors. For example the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment the undercutting process is controlled such that the sacrificial layer is not fully removed.

In a preferred embodiment, the semiconductor device epitaxy material with the underlying sacrificial region is fabricated into a dense array of mesas on the gallium and nitrogen containing bulk substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below the sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 μm to about 500 microns or to about 5000 μm. Each of these mesas is a 'die'.

In a preferred embodiment, these die are transferred to a carrier wafer at a second pitch using a selective bonding process such that the second pitch on the carrier wafer is greater than the first pitch on the gallium and nitrogen containing substrate. In this embodiment the die are on an expanded pitch for so called "die expansion". In an example, the second pitch is configured with the die to allow each die with a portion of the carrier wafer to be a semiconductor device, including contacts and other components. For example, the second pitch would be about 50 μm to about 1000 μm or to about 5000 but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

Figure 7:
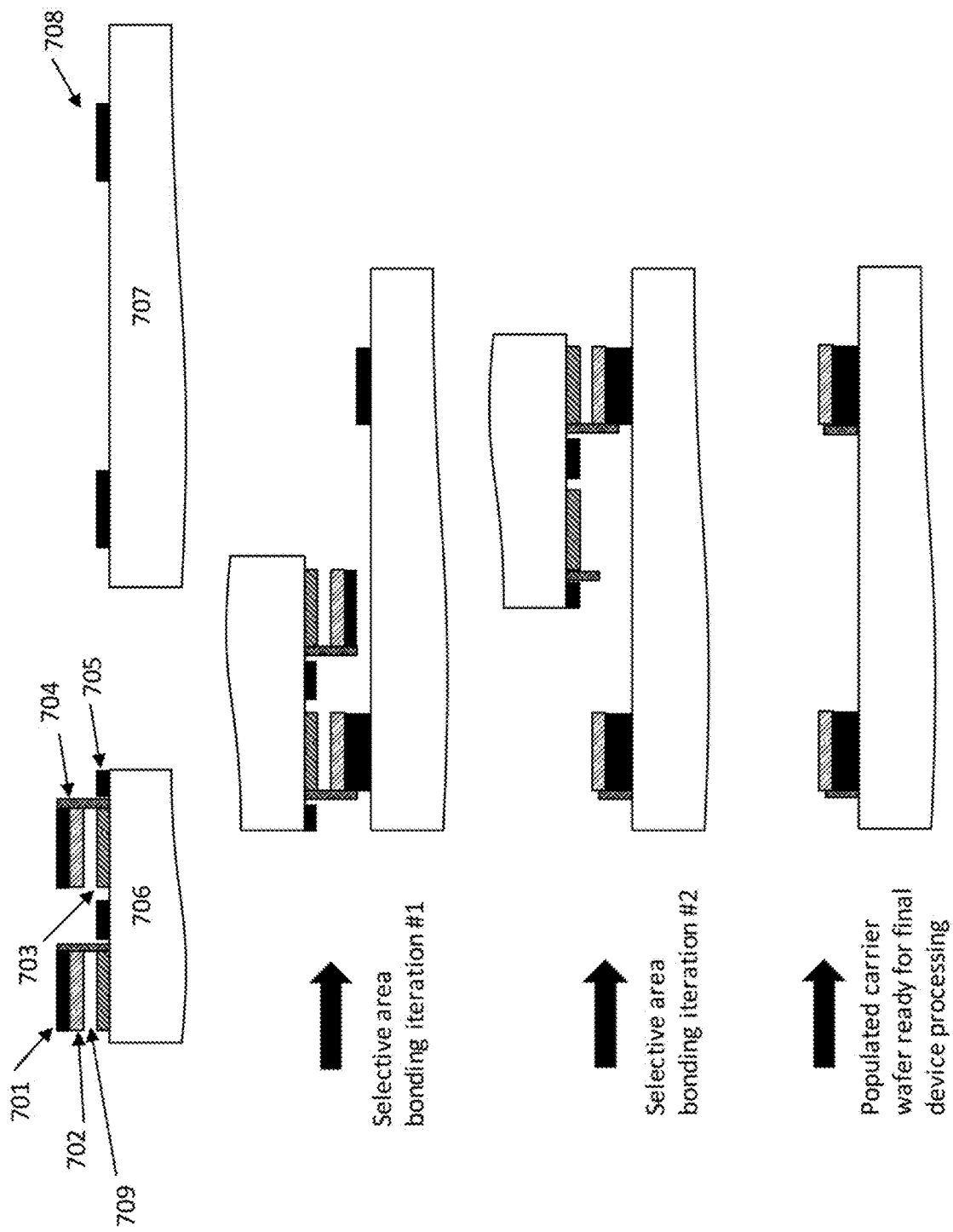
FIG. 7 is a simplified diagram illustrating a side view of die expansion with selective area bonding according to the present invention.

FIG. 7 is a schematic representation of the die expansion process with selective area bonding according to the present invention. A device wafer is prepared for bonding in accordance with an embodiment of this invention. The wafer consists of a substrate 706, buffer layers 703, the fully removed sacrificial layer 709, the device layers 702, the bonding media 701, the cathode metal utilized in the PEC etch removal of the sacrificial layer and the anchor material 704. The mesa regions formed in the gallium and nitrogen containing epitaxial wafer form dice of epitaxial material and release layers defined through processing. Individual epitaxial material die are formed at first pitch. A carrier wafer 707 is prepared consisting of the carrier wafer 707 itself and bond pads 708 at second pitch. The substrate 706 is aligned to the carrier wafer 707 such that a subset of mesa on the gallium and nitrogen containing substrate 706 with a first pitch align with a subset of bond pads 708 on the carrier wafer 707 at a second pitch. Since the first pitch is greater than the second pitch and the mesas will comprise device die, the basis for die expansion is established. The bonding process is carried out and upon separation of the substrate 706 from the carrier wafer 707 the subset of mesas are selectively transferred to the carrier wafer 707. The process is then repeated with a second set of mesas and bond pads 708 on the carrier wafer 707 until the carrier wafer 707 is populated fully by epitaxial mesas. The gallium and nitrogen containing epitaxy substrate can now optionally be prepared for reuse.

In the example depicted in FIG. 7, one quarter of the epitaxial die are transferred in this first selective bond step, leaving three quarters on the epitaxy wafer 706. The selective area bonding step is then repeated to transfer the second quarter, third quarter, and fourth quarter of the epitaxial die to the patterned carrier wafer 707. This selective area bond may be repeated any number of times and is not limited to the four steps depicted in FIG. 7. The result is an array of epitaxial die on the carrier wafer 707 with a wider die pitch than the original die pitch on the epitaxy wafer 706. The die pitch on the epitaxial wafer 706 will be referred to as pitch 1, and the die pitch on the carrier wafer 707 will be referred to as pitch 2, where pitch 2 is greater than pitch 1.

In one embodiment the bonding between the carrier wafer 707 and the gallium and nitrogen containing substrate 706 with epitaxial layers is performed between bonding layers that have been applied to the carrier wafer 707 and the gallium and nitrogen containing substrate 706 with epitaxial layers. The bonding layers can be a variety of bonding pairs including metal-metal, oxide-oxide, soldering alloys, photoresists, polymers, wax, etc. Only epitaxial die which are in contact with a bond bad on the carrier wafer 707 will bond. Sub-micron alignment tolerances are possible on commercial die bonders. The epitaxy wafer 706 is then pulled away, breaking the epitaxy material at a weakened epitaxial release layer such that the desired epitaxial layers remain on the carrier wafer 707. Herein, a 'selective area bonding step' is defined as a single iteration of this process.

In one embodiment, the carrier wafer 707 is patterned in such a way that only selected mesas come in contact with the metallic bond pads on the carrier wafer 707. When the epitaxy substrate 706 is pulled away the bonded mesas break off at the weakened sacrificial region, while the un-bonded mesas remain attached to the epitaxy substrate 706. This selective area bonding process can then be repeated to transfer the remaining mesas in the desired configuration. This process can be repeated through any number of iterations and is not limited to the two iterations depicted in FIG. 3. The carrier wafer 707 can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 μm and about 100 μm wide or between about 100 μm and about 500 μm wide or between about 500 μm and about 3000 μm wide and between about 100 μm and about 3000 μm long. In an example, the second die pitch on the carrier wafer is between about 100 μm and about 200 μm or between about 200 μm and about 1000 μm or between about 1000 μm and about 3000 μm. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components, which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring die at close spacing from multiple epitaxial wafers, it is important for the un-transferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate transfer a second set of die to the carrier. Finally, the semiconductor devices are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of devices per dice from each substrate.

Figure 8:
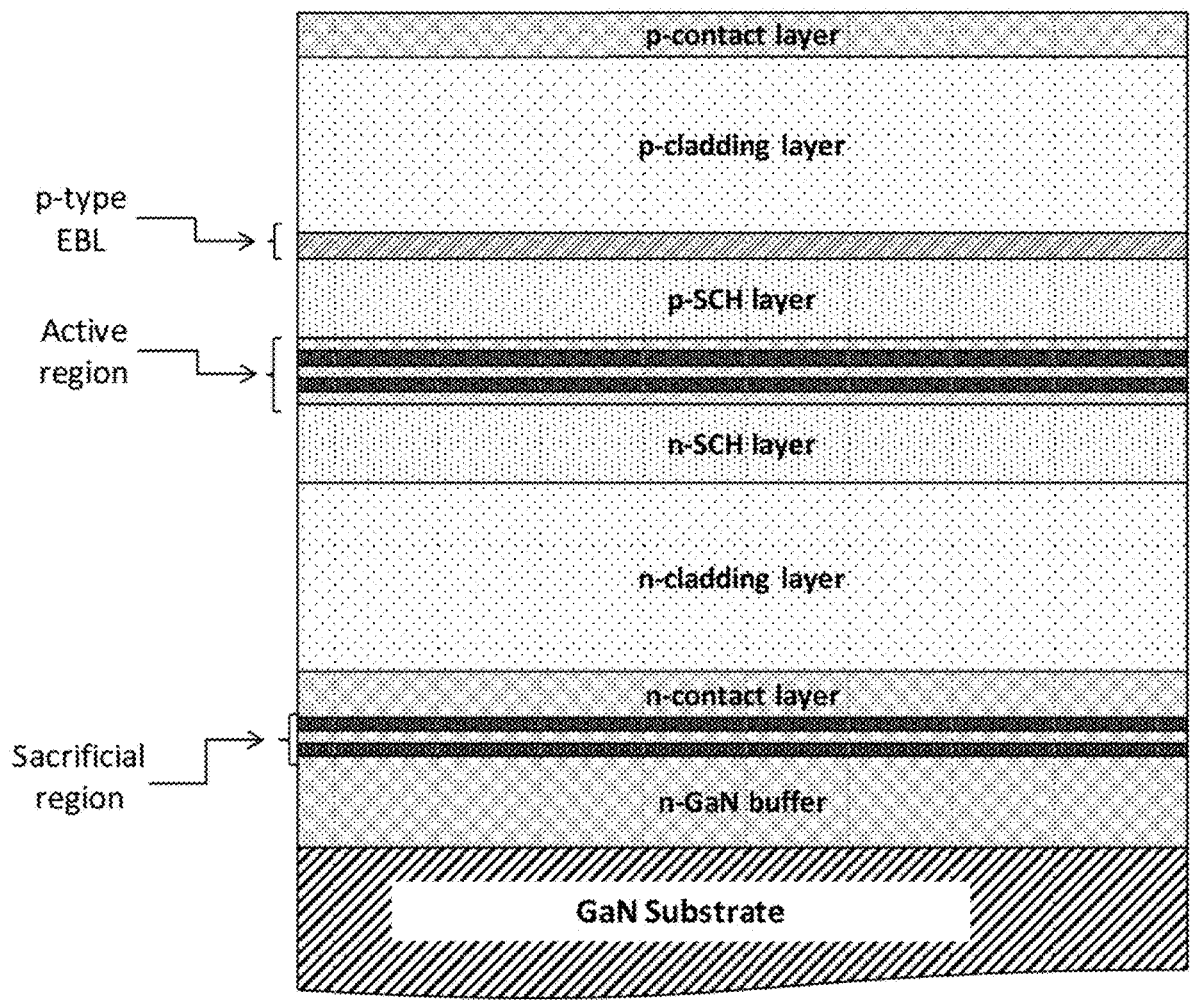
FIG. 8 is a simplified diagram illustrating an example of an LD epitaxial structure according to the epitaxial transfer embodiment according to the present invention.

An example of an epitaxial structure for a laser diode device according to this invention is shown in FIG. 8. In this embodiment, an n-GaN buffer layer followed by a sacrificial layer is grown along with an n-contact layer that will be exposed after transfer. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. In another example the substrate is comprised of a semipolar or nonpolar orientation. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of $5 \times 10^{18}$ cm$^{-3}$, but can be other doping levels in the range between $5 \times 10^{17}$ and $1 \times 10^{19}$ cm$^{-3}$. Overlaying the contact layer is an n-type cladding layer comprised of GaN or AlGaN layer with a thickness of 1 micron with an average composition of 4% AlN, though in other embodiments the thickness may range from 0.25 to 2 μm with an average composition of 0-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 nm to 300 nm in thickness and from 0-8% InN and may be composed of several layers of varying composition and thickness. Overlaying the n-SCH are light emitting quantum well layers consisting of two 3.5 nm thick $In_{0.15}Ga_{0.85}N$ quantum wells separated by 4 nm thick GaN barriers, though in other embodiments there may 1 to 7 light emitting quantum well layers consisting of 1 nm to 6 nm thick quantum wells separated by GaN or InGaN barriers of 1 nm to 25 nm thick. Overlaying the light emitting layers is an optional InGaN pSCH with a composition of 4% InN and has a thickness of 100 nm, though in other embodiments the nSCH may range from 20 nm to 300 nm in thickness and from 0-8% InN and may be composed of several layers of varying composition and thickness. Overlaying the pSCH is an optional AlGaN electron blocking layer (EBL) with a composition of 10% AN, though in other embodiments the AlGaN EBL composition may range from 0% to 30% AlN. Overlaying the EBL a p-type cladding comprised of GaN or AlGaN layer with a thickness of 0.8 micron with an average composition of 4% AlN, though in other embodiments the thickness may range from 0.25 μm to 2 μm with an average composition of 0-8% AlN. The p-cladding is terminated at the free surface of the crystal with a highly doped p++ or p-contact layer that enables a high quality electrical p-type contact to the device.

Once the laser diode epitaxial structure has been transferred to the carrier wafer as described in this invention, wafer level processing can be used to fabricate the die into laser diode devices. The wafer process steps may be similar to those described in this specification for more conventional laser diodes. For example, in many embodiments the bonding media and die will have a total thickness of less than about 7 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools.

The laser diode device may have laser stripe region formed in the transferred gallium and nitrogen containing epitaxial layers. In the case where the laser is formed on a polar c-plane, the laser diode cavity can be aligned in the m-direction with cleaved or etched mirrors. Alternatively, in the case where the laser is formed on a semipolar plane, the laser diode cavity can be aligned in a projection of a c-direction. The laser strip region has a first end and a second end and is formed on a gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. Typical gases used in the etching process may include Cl and/or $BCl_3$. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for ridge lasers. In a preferred embodiment, the pair of facets facet each other and are in parallel alignment with each other. In a preferred embodiment, the method uses a UV (355 nm) laser to scribe the laser bars. In a specific embodiment, the laser is configured on a system, which allows for accurate scribe lines configured in different patterns and profiles. In some embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 μm deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

In an embodiment, the device layers comprise a superluminescent light emitting diode or SLED. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode. The emission spectral width is typically substantially wider (>5 nm) than that of a laser diode and offer advantages with respect to reduced image distortion in displays, increased eye safety, and enhanced capability in measurement and spectroscopy applications.

SLEDs are designed to have high single pass gain or amplification for the spontaneous emission generated along the waveguide. The SLED device would also be engineered to have a low internal loss, preferably below 1 cm−1, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide high flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet. A low reflectivity facet may also be formed by roughening the emitting facet in such a way that light extraction is enhanced and coupling of reflected light back into the guided modes is limited. SLEDs are applicable to all embodiments according to the present invention and the device can be used interchangeably with laser diode device when applicable.

The laser stripe is characterized by a length and width. The length ranges from about 50 μm to about 3000 μm, but is preferably between about 10 μm and about 400 μm, between about 400 μm and about 800 μm, or about 800 μm and about 1600 μm, but could be others. The stripe also has a width ranging from about 0.5 μm to about 50 μm, but is preferably between about 0.8 μm and about 2.5 μm for single lateral mode operation or between about 2.5 μm and about 35 μm for multi-lateral mode operation, but can be other dimensions. In a specific embodiment, the present device has a width ranging from about 0.5 μm to about 1.5 μm, a width ranging from about 1.5 μm to about 3.0 μm, a width ranging from about 3.0 μm to about 35 μm, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Figure 9:
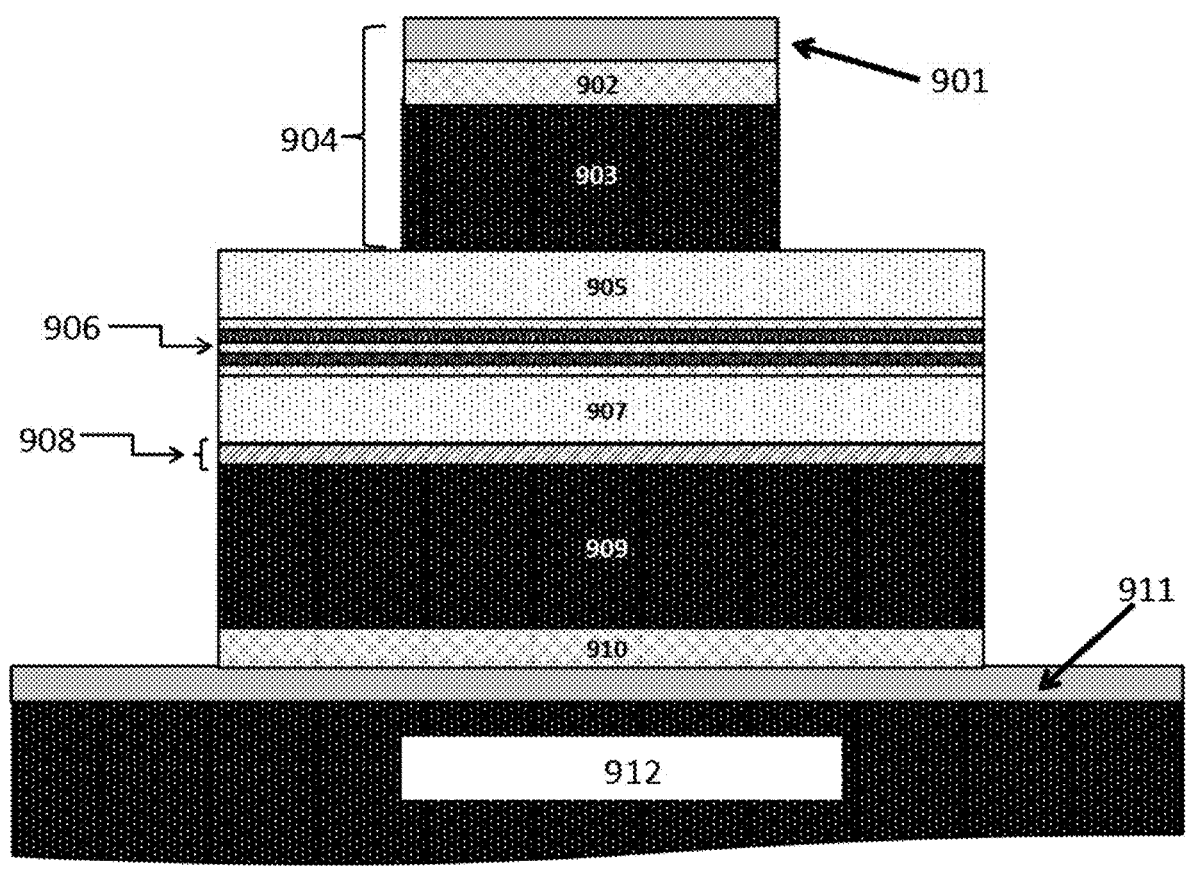
FIG. 9 is a simplified diagram illustrating an example of an LD device structure formed on carrier wafer from epitaxial structure in FIG. 8 according to the present invention.

An example of a processed laser diode cross-section according to one embodiment of the present invention is shown in FIG. 9. In this example an n-contact 901 is formed on top of n-type gallium and nitrogen contact layer 902 and n-type cladding layer 903 that have been etched to form a ridge waveguide 904. The n-type cladding layer 903 overlies an n-side waveguide layer or separate confinement heterostructure (SCH) layer 905 and the n-side SCH overlies an active region 906 that contains light emitting layers such as quantum wells. The active region overlies an optional p-side SCH layer 907 and an electron blocking layer (EBL) 908. The optional p-side SCH layer overlies the p-type cladding 909 and a p-contact layer 910. Underlying the p-contact layer 910 is a metal stack 911 that contains the p-type contact and bond metal used to attach the transferred gallium and nitrogen containing epitaxial layers to the carrier wafer 912.

Once the lasers have been fully processed within the gallium and nitrogen containing layers that have been transferred to the carrier wafer 912, the carrier wafer 912 must be diced. Several techniques can be used to dice the carrier wafer 912 and the optimal process will depend on the material selection for the carrier wafer 912. As an example, for Si, InP, or GaAs carrier wafers that cleave very easily, a cleaving process can be used wherein a scribing and breaking process using conventional diamond scribe techniques may be most suitable. For harder materials such as GaN, AlN, SiC, sapphire, or others where cleaving becomes more difficult a laser scribing and breaking technique may be most suitable. In other embodiments a sawing process may be the most optimal way to dice the carrier wafer into individual laser chips. In a sawing process a rapidly rotating blade with hard cutting surfaces like diamond are used, typically in conjunction with spraying water to cool and lubricate the blade. Example saw tools used to commonly dice wafers include Disco saws and Accretech saws.

By choosing a carrier wafer material such as AlN, BeO, diamond, or SiC that is suitable as a submount between the laser chip and the mounting surface, the diced laser chip on the carrier wafer is in itself a chip on submount (CoS). This wafer level packaging features is a strong benefit of the lifted-off and transferred gallium and nitrogen containing epitaxial layer embodiment of this invention. The submount can be the common support member wherein the phosphor member of the CPoS would also be attached. Alternatively, the submount can be an intermediate submount intended to be mounted to the common support member wherein the phosphor material is attached. The submount member is characterized by a width, length, and thickness. In one example wherein the submount is the common support member for the phosphor and the laser diode, the submount would likely have a length ranging in dimension from about 0.5 mm to about 3 mm or about 5 mm, a width ranging from about 0.3 mm to about 1 mm or from about 1 mm to 3 mm, and a thickness from about 200 µm to about 1 mm. In tan example wherein the submount is an intermediate submount between the laser diode and the common support member it may be characterized by length ranging in dimension from about 0.5 mm to about 2 mm, a width ranging from about 150 µm to about 1 mm, and the thickness may ranging from about 50 µm to about 500 µm.

Figure 10:
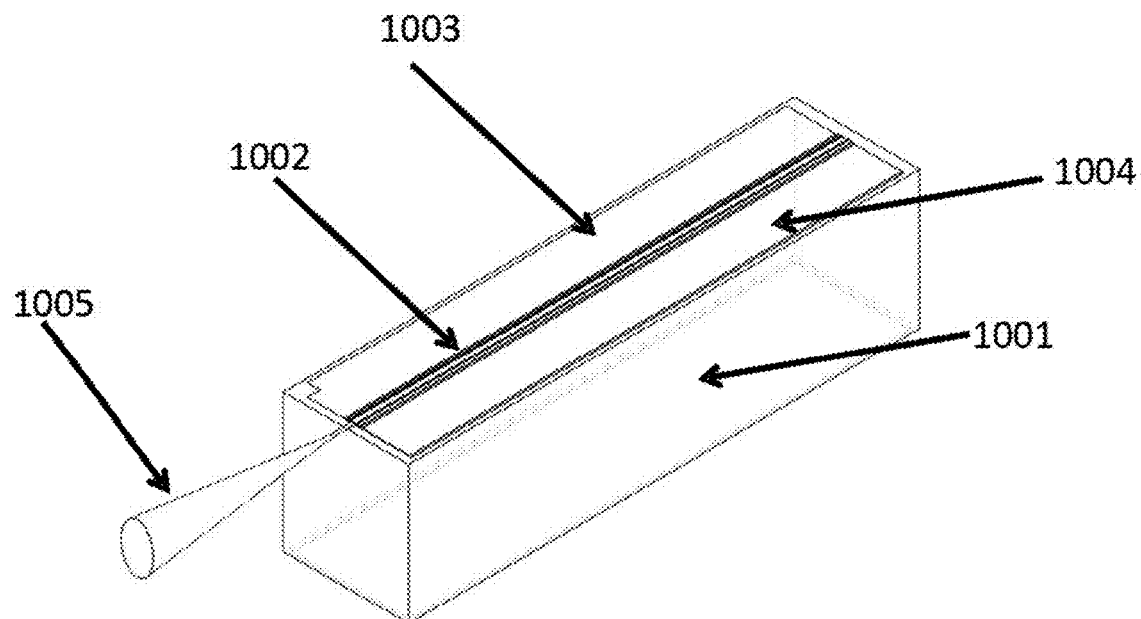
FIG. 10 is a simplified diagram illustrating a chip on submount (CoS) fabricated via wafer-level laser processing after transfer of gallium and nitrogen containing epitaxial layers according to an embodiment of the present invention.

A schematic diagram illustrating a CoS based on lifted off and transferred epitaxial gallium and nitrogen containing layers according to this present invention is shown in FIG. 10. The CoS is comprised of submount material 1001 configured from the carrier wafer with the transferred epitaxial material with a laser diode configured within the epitaxy 1002. Electrodes 1003 and 1004 are electrically coupled to the n-side and the p-side of the laser diode device and configured to transmit power from an external source to the laser diode to generate a laser beam output 1005 from the laser diode. The electrodes are configured for an electrical connection to an external power source such as a laser driver, a current source, or a voltage source. Wirebonds can be formed on the electrodes to couple the power to the laser diode device. This integrated CoS device with transferred epitaxial material offers advantages over the conventional configuration illustrated in FIG. 4 such as size, cost, and performance due to the low thermal impedance.

Further process and device description for this embodiment describing laser diodes formed in gallium and nitrogen containing epitaxial layers that have been transferred from the native gallium and nitrogen containing substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

In this embodiment, the carrier wafer can be selected to provide an ideal submount material for the integrated CPoS white light source. That is, the carrier wafer serving as the laser diode submount would also serve as the common support member for the laser diode and the phosphor to enable an ultra-compact CPoS integrated white light source. In one example, the carrier wafer is formed from silicon carbide (SiC). SiC is an ideal candidate due to its high thermal conductivity, low electrical conductivity, high hardness and robustness, and wide availability. In other examples AlN, diamond, GaN, InP, GaAs, or other materials can be used as the carrier wafer and resulting submount for the CPoS. In one example, the laser chip is diced out such that there is an area in front of the front laser facet intended for the phosphor. The phosphor material would then be bonded to the carrier wafer and configured for laser excitation according to this embodiment.

After fabrication of the laser diode on a submount member, in some embodiments of this invention the construction of the integrated white source would proceed to integration of the phosphor with the laser diode and common support member. Phosphor selection is a key consideration within the laser based integrated white light source. The phosphor must be able to withstand the extreme optical intensity and associated heating induced by the laser excitation spot without severe degradation. Important characteristics to consider for phosphor selection include;

A high conversion efficiency of optical excitation power to white light lumens. In the example of a blue laser diode exciting a yellow phosphor, a conversion efficiency of over 150 lumens per optical watt, or over 200 lumens per optical watt, or over 300 lumens per optical watt is desired.

A high optical damage threshold capable of withstanding 1-20 W of laser power in a spot comprising a diameter of 1 mm, 500 µm, 200 µm, 100 µm, or even 50 µm.

High thermal damage threshold capable of withstanding temperatures of over 150° C., over 200° C., or over 300° C. without decomposition.

A low thermal quenching characteristic such that the phosphor remains efficient as it reaches temperatures of over 150° C., 200° C., or 250° C.

A high thermal conductivity to dissipate the heat and regulate the temperature. Thermal conductivities of greater than 3 W/mK, greater than 5 W/mK, greater than 10 W/mK, and even greater than 15 W/mK are desirable.

A proper phosphor emission color for the application.

A suitable porosity characteristic that leads to the desired scattering of the coherent excitation without unacceptable reduction in thermal conductivity or optical efficiency.

A proper form factor for the application. Such form factors include, but are not limited to blocks, plates, disks, spheres, cylinders, rods, or a similar geometrical element. Proper choice will be dependent on whether phosphor is operated in transmissive or reflective mode and on the absorption length of the excitation light in the phosphor.

A surface condition optimized for the application. In an example, the phosphor surfaces can be intentionally roughened for improved light extraction.

In a preferred embodiment, a blue laser diode operating in the 420 nm to 480 nm wavelength range would be combined with a phosphor material providing a yellowish emission in the 560 nm to 580 nm range such that when mixed with the blue emission of the laser diode a white light is produced. For example, to meet a white color point on the black body line the energy of the combined spectrum may be comprised of about 30% from the blue laser emission and about 70% from the yellow phosphor emission. In other embodiments phosphors with red, green, yellow, and even blue emission can be used in combination with the laser diode excitation sources in the violet, ultra-violet, or blue wavelength range to produce a white light with color mixing. Although such white light systems may be more complicated due to the use of more than one phosphor member, advantages such as improved color rendering could be achieved.

In an example, the light emitted from the laser diodes is partially converted by the phosphor element. In an example, the partially converted light emitted generated in the phosphor element results in a color point, which is white in appearance. In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

The phosphor material can be operated in a transmissive mode, a reflective mode, or a combination of a transmissive mode and reflective mode, or other modes. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material.

In some embodiments of the present invention, the environment of the phosphor can be independently tailored to result in high efficiency with little or no added cost. Phosphor optimization for laser diode excitation can include high transparency, scattering or non-scattering characteristics, and use of ceramic phosphor plates. Decreased temperature sensitivity can be determined by doping levels. A reflector can be added to the backside of a ceramic phosphor, reducing loss. The phosphor can be shaped to increase in-coupling, increase out-coupling, and/or reduce back reflections. Surface roughening is a well-known means to increase extraction of light from a solid material. Coatings, mirrors, or filters can be added to the phosphors to reduce the amount of light exiting the non-primary emission surfaces, to promote more efficient light exit through the primary emission surface, and to promote more efficient in-coupling of the laser excitation light. Of course, there can be additional variations, modifications, and alternatives.

In some embodiments, certain types of phosphors will be best suited in this demanding application with a laser excitation source. As an example, a ceramic yttrium aluminum garnets (YAG) doped with $Ce^{3+}$ ions, or YAG based phosphors can be ideal candidates. They are doped with species such as Ce to achieve the proper emission color and are often comprised of a porosity characteristic to scatter the excitation source light, and nicely break up the coherence in laser excitation. As a result of its cubic crystal structure the YAG:Ce can be prepared as a highly transparent single crystal as well as a polycrystalline bulk material. The degree of transparency and the luminescence are depending on the stoichiometric composition, the content of dopant, and entire processing and sintering route. The transparency and degree of scattering centers can be optimized for a homogenous mixture of blue and yellow light. The YAG:CE can be configured to emit a green emission. In some embodiments the YAG can be doped with Eu to emit a red emission.

In a preferred embodiment according to this invention, the white light source is configured with a ceramic polycrystalline YAG:Ce phosphors comprising an optical conversion efficiency of greater than 100 lumens per optical excitation watt, of greater than 200 lumens per optical excitation watt, or even greater than 300 lumens per optical excitation watt, or greater. Additionally, the ceramic YAG:Ce phosphors is characterized by a temperature quenching characteristics above 150° C., above 200° C., or above 250° C. and a high thermal conductivity of 5-10 W/mK to effectively dissipate heat to a heat sink member and keep the phosphor at an operable temperature.

In another preferred embodiment according to this invention, the white light source is configured with a single crystal phosphor (SCP) such as YAG:Ce. In one example the Ce:Y3Al5O12 SCP can be grown by the Czochralski technique. In this embodiment according the present invention the SCP based on YAG:Ce is characterized by an optical conversion efficiency of greater than 100 lumens per optical excitation watt, of greater than 200 lumens per optical excitation watt, or even greater than 300 lumens per optical excitation watt, or greater. Additionally, the single crystal YAG:Ce phosphors is characterized by a temperature quenching characteristics above 150° C., above 200° C., or above 300° C. and a high thermal conductivity of 8-20 W/mK to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments the YAG:CE can be configured to emit a yellow emission. In alternative or the same embodiments a YAG:CE can be configured to emit a green emission. In yet alternative or the same embodiments the YAG can be doped with Eu to emit a red emission. In some embodiments a LuAG is configured for emission. In alternative embodiments, silicon nitrides or aluminum-oxi-nitrides can be used as the crystal host materials for red, green, yellow, or blue emissions.

In an alternative embodiment, a powdered single crystal or ceramic phosphor such as a yellow phosphor or green phosphor is included. The powdered phosphor can be dispensed on a transparent member for a transmissive mode operation or on a solid member with a reflective layer on the back surface of the phosphor or between the phosphor and the solid member to operate in a reflective mode. The phosphor powder may be held together in a solid structure using a binder material wherein the binder material is preferable in inorganic material with a high optical damage threshold and a favorable thermal conductivity. The phosphor power may be comprised of colored phosphors and configured to emit a white light when excited by and combined with the blue laser beam or excited by a violet laser beam. The powdered phosphors could be comprised of YAG, LuAG, or other types of phosphors.

In one embodiment of the present invention the phosphor material contains a yttrium aluminum garnet host material and a rare earth doping element, and others. In an example, the wavelength conversion element is a phosphor which contains a rare earth doping element, selected from one of Ce, Nd, Er, Yb, Ho, Tm, Dy and Sm, or combinations thereof, and the like. In an example, the phosphor material is a high-density phosphor element. In an example, the high-density phosphor element has a density greater than 90% of pure host crystal. Cerium (III)-doped YAG (YAG:$Ce^{3+}$, or $Y_3Al_5O_{12}$:$Ce^{3+}$) can be used wherein the phosphor absorbs the light from the blue laser diode and emits in a broad range from greenish to reddish, with most of output in yellow. This yellow emission combined with the remaining blue emission gives the "white" light, which can be adjusted to color temperature as warm (yellowish) or cold (blueish) white. The yellow emission of the $Ce^{3+}$:YAG can be tuned by substituting the cerium with other rare earth elements such as terbium and gadolinium and can even be further adjusted by substituting some or all of the aluminum in the YAG with gallium.

In alternative examples, various phosphors can be applied to this invention, which include, but are not limited to organic dyes, conjugated polymers, semiconductors such as AlInGaP or InGaN, yttrium aluminum garnets (YAGs) doped with $Ce^+$ ions $(Y_{1-a}Gd_a)_3(Al_{1-b}Ga_b)_5O_{12}:Ce^{3+}$, $SrGa_2S_4:Eu^{2+}$, $SrS:Eu^{2+}$, terbium aluminum based garnets (TAGs) $(Tb_3Al_5O_5)$, colloidal quantum dot thin films containing CdTe, ZnS, ZnSe, ZnTe, CdSe, or CdTe.

In further alternative examples, some rare-earth doped Sialons can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. In an alternative example, green and yellow SiAlON phosphor and a red $CaAlSiN_3$-based (CASN) phosphor may be used.

In yet a further example, white light sources can be made by combining near ultraviolet emitting laser diodes with a mixture of high efficiency europium based red and blue emitting phosphors plus green emitting copper and aluminum doped zinc sulfide (ZnS:Cu,Al).

In an example, a phosphor or phosphor blend can be selected from a of (Y, Gd, Tb, Sc, Lu, La)$_3$(Al, Ga, In)$_5$O$_{12}$: $Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In an example, a phosphor is capable of emitting substantially red light, wherein the phosphor is selected from the group consisting of $(Gd,Y,Lu, La)_2O_3:Eu^{3+}, Bi^{3+}$; $(Gd, Y,Lu,La)_2O_2S:Eu^{3+}, Bi^{3+}$; $(Gd, Y,Lu,La)VO_4:Eu^{3+}$, $Bi^{3+}$; $Y_2(O,S)_3$: $Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4$: $Eu^{2+}$; $CaLa_2S_4:Ce^{3+}$; $(Ca,Sr)S:Eu^{2+}$; $3.5MgO \times 0.5MgF_2 \times GeO_2:Mn^{4+}$ (MFG); $(Ba,Sr,Ca)Mg_xP_2O_7:Eu^{2+}, Mn^{2+}$; $(Y,Lu)_2WO_6:Eu^{3+}, Mo^{6+}$; $(Ba,Sr,Ca)_3Mg_xSi_2O_8:Eu^{2+}$, $Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 \leq y < 0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.0 \leq x \leq 0.3$; $SrZnO_2:Sm^{3+}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Further details of other phosphor species and related techniques can be found in U.S. Pat. No. 8,956,894, in the name of Raring et al. issued Feb. 17, 2015, and titled White light devices using non-polar or semipolar gallium containing materials and phosphors, which is commonly owned, and hereby incorporated by reference herein.

In another preferred embodiment according to this invention, the white light source is configured with a single crystal phosphor (SCP) or Ceramic plate phosphor selected from a Lanthanum Silicon Nitride compound and Lanthanum aluminum Silicon Nitrogen Oxide compound containing $Ce^{3+}$ ions atomic concentration ranging from 0.01% to 10%. Optionally, the Lanthanum Silicon Nitride compound and Lanthanum aluminum Silicon Nitrogen Oxide compound containing $Ce^{3+}$ ions includes $LaSi_3N_5:Ce^{3+}$ or $LaAl(Si_{6-z}Al_z)(N_{10-z}O_z):Ce^{3+}$ (wherein $z=1$). In this embodiment according the present invention the SCP or Ceramic plate based on $LaSi_3N_5:Ce^{3+}$ or $LaAl(Si_{6-z}Al_z)(N_{10-z}O_z):Ce^{3+}$ (wherein $z=1$) is characterized by an optical conversion efficiency of greater than 100 lumens per optical excitation watt, or greater than 200 lumens per optical excitation watt, or even greater than 300 lumens per optical excitation watt, or greater. Additionally, the single crystal phosphor (SCP) or Ceramic plate phosphor $LaSi_3N_5:Ce^{3+}$ or $LaAl(Si_{6-z}Al_z)(N_{10-z}O_z):Ce^{3+}$ (wherein $z=1$) is characterized by a temperature quenching characteristics above 150° C., above 200° C., or above 300° C. and a high thermal conductivity of >10 W/m·K to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments of the present invention, ceramic phosphor materials are embedded in a binder material such as silicone. This configuration is typically less desirable because the binder materials often have poor thermal conductivity, and thus get very hot wherein the rapidly degrade and even burn. Such "embedded" phosphors are often used in dynamic phosphor applications such as color wheels where the spinning wheel cools the phosphor and spreads the excitation spot around the phosphor in a radial pattern.

Sufficient heat dissipation from the phosphor is a critical design consideration for the integrated white light source based on laser diode excitation. Specifically, the optically pumped phosphor system has sources of loss in the phosphor that result is thermal energy and hence must be dissipated to a heat-sink for optimal performance. The two primary sources of loss are the Stokes loss which is a result of converting photons of higher energy to photons of lower energy such that difference in energy is a resulting loss of the system and is dissipated in the form of heat. Additionally, the quantum efficiency or quantum yield measuring the fraction of absorbed photons that are successfully re-emitted is not unity such that there is heat generation from other internal absorption processes related to the non-converted photons. Depending on the excitation wavelength and the converted wavelength, the Stokes loss can lead to greater than 10%, greater than 20%, and greater than 30%, and greater loss of the incident optical power to result in thermal power that must be dissipated. The quantum losses can lead to an additional 10%, greater than 20%, and greater than 30%, and greater of the incident optical power to result in thermal power that must be dissipated. With laser beam powers in the 0.5 W to 100 W range focused to spot sizes of less than 1 mm in diameter, less than 500 microns in diameter, or even less than 100 microns in diameter, power densities of over 1 W/mm$^2$, 100 W/mm$^2$, or even over 2,500 W/mm$^2$ can be generated. As an example, assuming that the spectrum is comprised of 30% of the blue pump light and 70% of the converted yellow light and a best case scenario on Stokes and quantum losses, we can compute the dissipated power density in the form of heat for a 10% total loss in the phosphor at 0.1 W/mm$^2$, 10 W/mm$^2$, or even over 250 W/mm$^2$. Thus, even for this best case scenario example, this is a tremendous amount of heat to dissipate. This heat generated within the phosphor under the high intensity laser excitation can limit the phosphor conversion performance, color quality, and lifetime.

For optimal phosphor performance and lifetime, not only should the phosphor material itself have a high thermal conductivity, but it should also be attached to the submount or common support member with a high thermal conductivity joint to transmit the heat away from the phosphor and to a heat-sink. In this invention, the phosphor is either attached to the common support member as the laser diode as in the CPoS or is attached to an intermediate submount member that is subsequently attached to the common support member. Candidate materials for the common support member or intermediate submount member are SiC, AlN, BeO, diamond, copper, copper tungsten, sapphire, aluminum, or others. The interface joining the phosphor to the submount member or common support member must be carefully considered. The joining material should be comprised of a high thermal conductivity material such as solder (or other) and be substantially free from voids or other defects that can impede heat flow. In some embodiments, glue materials can be used to fasten the phosphor. Ideally the phosphor bond interface will have a substantially large area with a flat surface on both the phosphor side and the support member sides of the interface.

In the present invention, the laser diode output beam must be configured to be incident on the phosphor material to excite the phosphor. In some embodiments the laser beam may be directly incident on the phosphor and in other embodiments the laser beam may interact with an optic, reflector, or other object to manipulate the beam prior to incidence on the phosphor. Examples of such optics include, but are not limited to ball lenses, aspheric collimator, aspheric lens, fast or slow axis collimators, dichroic mirrors, turning mirrors, optical isolators, but could be others.

The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In other embodiments free space optics such as collimating lenses can be used to shape the beam prior to incidence on the phosphor. The beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning.

The white light apparatus also has an electrical input interface configured to couple electrical input power to the laser diode device to generate the laser beam and excite the phosphor material. In an example, the laser beam incident on the phosphor has a power of less than 0.1 W, greater than 0.1 W, greater than 0.5 W, greater than 1 W, greater than 5 W, greater than 10 W, or greater than 20 W. The white light source configured to produce greater than 1 lumen, 10 lumens, 100 lumens, 250 lumens, 500 lumens, 1000 lumens, 3000 lumens, 10,000 lumens, or greater of white light output.

The support member is configured to transport thermal energy from the at least one laser diode device and the phosphor material to a heat sink. The support member is configured to provide thermal impedance of less than 10 degrees Celsius per watt, less than 5 degrees Celsius per watt, or less than 3 degrees Celsius per watt of dissipated power characterizing a thermal path from the laser device to a heat sink. The support member is comprised of a thermally conductive material such as copper with a thermal conductivity of about 400 W/(mK), aluminum with a thermal conductivity of about 200 W/(mK), 4H—SiC with a thermal conductivity of about 370 W/(mK), 6H—SiC with a thermal conductivity of about 490 W/(mK), AlN with a thermal conductivity of about 230 W/(mK), a synthetic diamond with a thermal conductivity of about >1000 W/(mK), sapphire, or other metals, ceramics, or semiconductors. The support member may be formed from a growth process such as SiC, AlN, or synthetic diamond, and then mechanically shaped by machining, cutting, trimming, or molding. Alternatively the support member may be formed from a metal such as copper, copper tungsten, aluminum, or other by machining, cutting, trimming, or molding.

In a preferred configuration of this CPoS white light source, the common support member comprises the same submount that the gallium and nitrogen containing laser diode chip is directly bonded to. That is, the laser diode chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The laser diode can be attached to a first surface of the submount using conventional die attaching techniques using solders such as AuSn solder, but can be other techniques such as SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm*cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Similarly, the phosphor material may be bonded to the submount using a soldering technique such as AuSn solder, SAC solder, lead containing phosphor, or with indium, but it can be other techniques such as sintered Ag interface materials. The joint could also be formed from thermally conductive glues, thermal epoxies such as silver epoxy, thermal adhesives, and other materials. Alternatively the joint could be formed from a metal-metal bond such as a Au—Au bond. Optimizing the bond for the lowest thermal impedance is a key parameter for heat dissipation from the phosphor, which is critical to prevent phosphor degradation and thermal quenching of the phosphor material.

In an alternative configuration of this CPoS white light source, the laser diode is bonded to an intermediate submount configured between the gallium and nitrogen containing laser chip and the common support member. In this configuration, the intermediate submount can be comprised of SiC, AlN, diamond, or other, and the laser can be attached to a first surface of the submount using conventional die attaching techniques using solders such as AuSn solder, but can be other techniques. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The second surface of the submount can be attached to the common support member using similar techniques, but could be others. Similarly, the phosphor material may have an intermediate material or submount positioned between the common support member and the phosphor. The intermediate material may be comprised of a thermally conductive material such as copper. The phosphor material may be bonded using a soldering technique. In this configuration, the common support member should be configured of a thermally conductive material such as copper. Optimizing the bond for the lowest thermal impedance is a key parameter for heat dissipation from the phosphor, which is critical to prevent phosphor degradation and thermal quenching of the phosphor material.

In a specific embodiment of the present invention, the CPoS white light source is configured for a side-pumped phosphor operated in transmissive mode. In this configuration, the phosphor is positioned in front of the laser facet that outputs the laser beam such that upon activation the generated laser beam is incident on a backside of the phosphor, wherein both the laser and the phosphor are configured on a support member. The gallium and nitrogen containing laser diode is configured with a cavity that has a length greater than 100 µm, greater than 500 µm, greater than 1000 µm, or greater than 1500 µm long and a width greater than 1 µm, greater than 10 µm, greater than 20 µm, greater than 30 µm, or greater than 45 µm. The cavity is configured with a front facet or mirror and back facet or mirror on the end, wherein the front facet comprises the output facet and configured to emit the laser beam incident on the phosphor. The front facet can be configured with an anti-reflective coating to decrease the reflectivity or no coating at all thereby allowing radiation to pass through the mirror without excessive reflectivity. In some cases the coating may be configured to slightly increase the reflectivity. Since no laser beam is to be emitted from the back end of the cavity member, the back facet or mirror is configured to reflect the radiation back into the cavity. For example, the back facet includes highly reflective coating with a reflectivity greater than 85% or 95%. In one example, the phosphor is comprised of a ceramic yttrium aluminum garnet (YAG) doped with $Ce^{3+}$ ions and emits yellow emission. The phosphor is shaped as a block, plate, sphere, cylinder, or other geometrical form. Specifically, the phosphor geometry primary dimensions may be less than 50 µm, less than 100 µm, less than 200 µm, less than 500 µm, less than 1 mm, or less than 10 mm. Operated in transmissive mode, the phosphor has a first primary side (back side) for receiving the incident laser beam and at least a second primary side (front side) where most of the useful white light will exit the phosphor to be coupled to the application. The phosphor is attached to the common support member or submount positioned in front of the laser diode output facet such that the first primary side of the phosphor configured for receiving the excitation light will be in the optical pathway of the laser output beam. The laser beam geometrical shape, size, spectral width, wavelength, intensity, and polarization are configured to excite the phosphor material. An advantage to transmissive mode phosphor operation is mitigation of the excitation source blocking or impeding any useful white light emitted from the primary emitting surface. Additionally, by exciting from the backside of the phosphor there will not be an obstruction relating to the excitation source or beam that may make integration of optics to collimate or project the white light difficult. In alternative embodiments the YAG:CE can be configured to emit a green emission. In yet alternative or the same embodiments the YAG can be doped with Eu to emit a red emission. In alternative embodiments, silicon nitrides or aluminum-oxinitrides can be used as the crystal host materials for red, green, yellow, or blue emissions.

Figure 11:
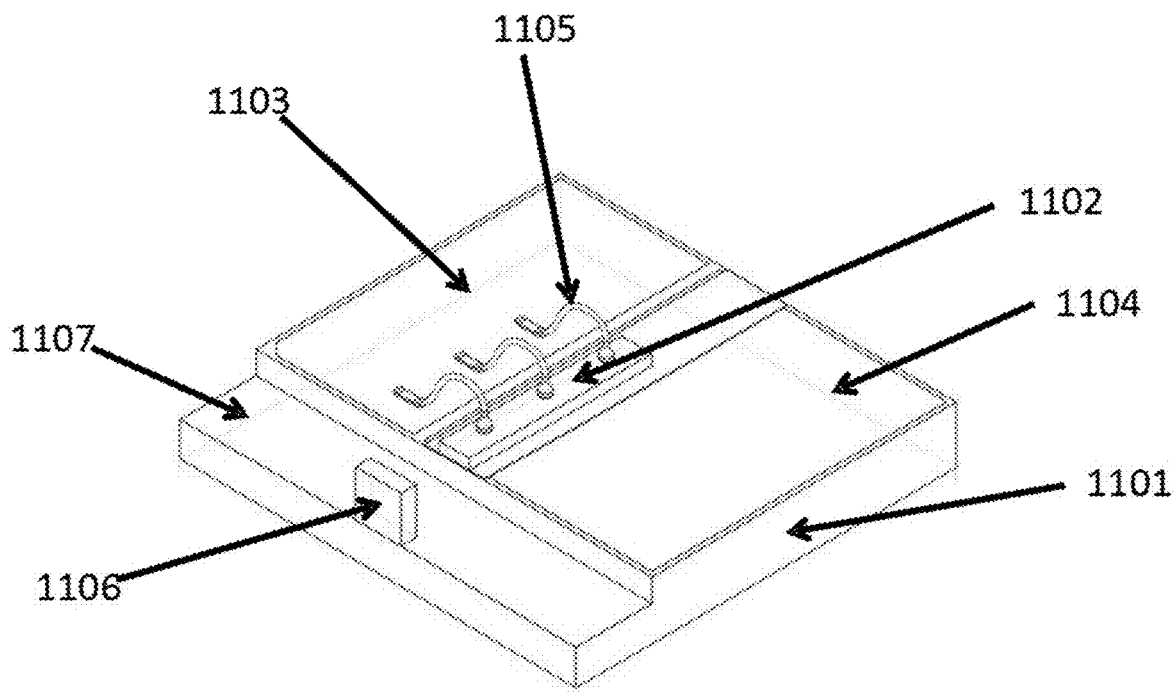
FIG. 11 is a simplified diagram illustrating an integrated laser-based white light source with a laser diode and phosphor member integrated onto a submount wherein the phosphor is configured for transmissive operation according to an embodiment of the present invention.

FIG. 11 presents a schematic diagram illustrating a transmissive embodiment of a CPoS integrated white light source based on a conventional laser diode formed on gallium and nitrogen containing substrate technology according to this present invention. The laser based CPoS white light device is comprised of submount material 1101 that serves as the common support member configured to act as an intermediate material between a laser diode chip 1102 and a final mounting surface and as an intermediate material between the phosphor material 1106 and a final mounting surface. The submount 1101 is configured with electrodes 1103 and 1104 that may be formed with deposited metal layers such as Au. In one example, Ti/Pt/Au is used for the electrodes. Wirebonds 1105 are configured to couple the electrical power from the electrodes 1103 and 1104 on the submount 1101 to the laser diode chip 1102 to generate a laser beam output from the laser diode. The laser beam output excites a phosphor plate 1106 positioned in front of the output laser facet. The phosphor plate 1106 is attached to the submount on a ledge 1107 or recessed region. The electrodes 1103 and 1104 are configured for an electrical connection to an external power source such as a laser driver, a current source, or a voltage source. Wirebonds 1105 can be formed on the electrodes to couple the power to the laser diode device 1102. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

Figure 12:
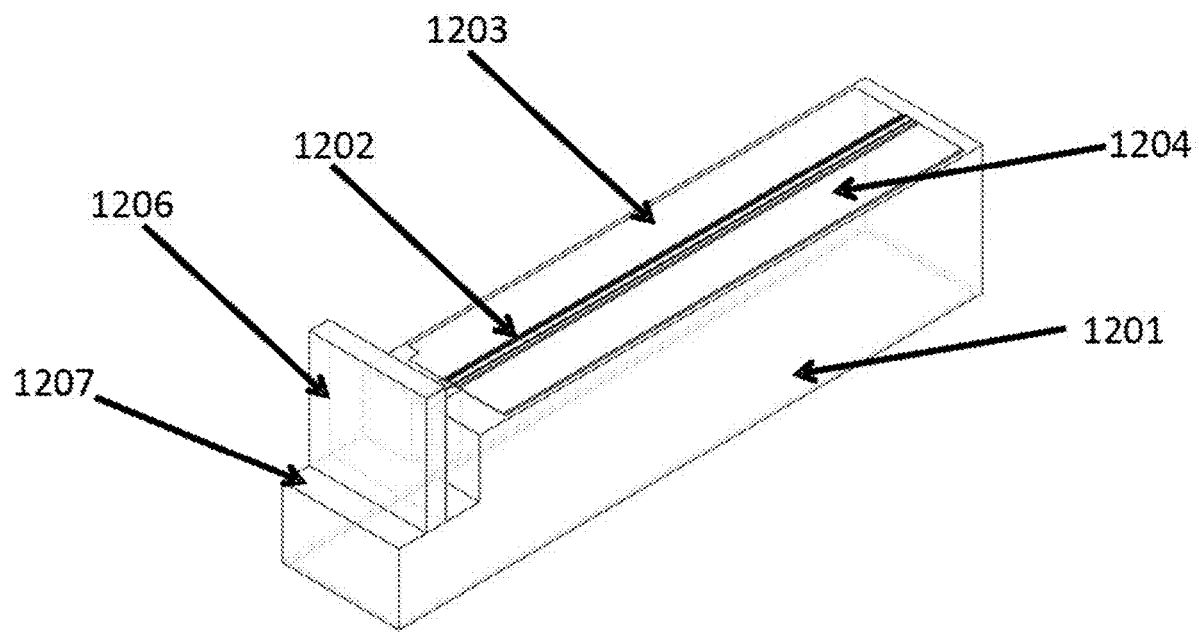
FIG. 12 is a simplified diagram illustrating an integrated laser-based white light source with a laser diode fabricated in gallium and nitrogen containing epitaxial layers transferred to a submount member and a phosphor member integrated onto the submount member wherein the phosphor is configured for transmissive operation according to an embodiment of the present invention.

FIG. 12 presents a schematic diagram illustrating an alternative transmissive embodiment of a CPoS integrated white light source based according to the present invention. In this embodiment the gallium and nitrogen containing lift-off and transfer technique is deployed to fabricate a very small and compact submount member with the laser diode chip formed from transferred epitaxy layers. The laser based CPoS white light device is comprised of submount material 1201 that serves as the common support member configured to act as an intermediate material between a laser diode 1202 formed in transferred gallium and nitrogen containing epitaxial layers and a final mounting surface and as an intermediate material between the phosphor plate material 1206 and a final mounting surface 1207. The laser diode or CoS submount 1201 is configured with electrodes 1203 and 1204 that may be formed with deposited metal layers and combination of metal layers including, but not limited to Au, Pd, Pt, Ni, Al, titanium, or others. The laser beam output excites a phosphor plate 1206 positioned in front of the output laser facet. The phosphor plate 1206 is attached to the submount on a ledge 1207 or recessed region. The electrodes 1203 and 1204 are configured for an electrical connection to an external power source such as a laser driver, a current source, or a voltage source. Wirebonds (not shown) can be formed on the electrodes to couple electrical power to the laser diode device 1202 to generate a laser beam output from the laser diode. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In many embodiments of the present invention the attachment interface between the phosphor and the common support member must be designed and processed with care. The thermal impedance of this attachment joint should be minimized using a suitable attaching material, interface geometry, and attachment process practices for a thermal impedance sufficiently low to allow the heat dissipation. Moreover, the attachment interface may be designed for an increased reflectivity to maximize the useful white light exiting the emission surface of the phosphor. Examples include AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm*cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies, and other materials. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors. The side-pumped transmissive apparatus has a form factor characterized by a length, a width, and a height. In an example, the height is characterized by a dimension of less than 25 mm and greater than 0.5 mm, although there may be variations.

To improve the efficiency of the integrated white light source, measures can be taken to minimize the amount of light exiting from the first surface wherein the laser excitation light is incident on the phosphor and maximize the light exiting the second primary white light emission side of the phosphor where the useful white light exits. Such measures can include the use of filters, spectrally selective reflectors, conventional mirrors, spatial mirrors, polarization based filters, holographic elements, or coating layers, but can be others.

In one example for a transmissive mode phosphor, a filter is positioned on the backside of the phosphor to reflect the backward propagating yellow emission toward the front of the phosphor where it has another opportunity to exit the primary emitting surface into useful white light. In this configuration the reflector would have to be designed to not block the blue excitation light from the laser. The reflector could be configured from the spectrally selective distributed Bragg reflector (DBR) mirror comprised of 2 or more alternating layers with different refractive indices designed to reflect yellow light over a wide range of angles. The DBR could be deposited directly on the phosphor using techniques such as e-beam deposition, sputter deposition, or thermal evaporation. Alternatively, the DBR could be in the form of a plate-like element that is applied to the phosphor. Since in a typical white light source configured from a mixing of yellow and blue emission the yellow emission comprised about 70% of the energy, this approach of reflecting the yellow light may be a sufficient measure in many applications. Of course, there can be additional variations, modifications, and alternatives.

In another example for a transmissive mode phosphor, a filter system is positioned on the backside of the phosphor to reflect the backward propagating yellow emission and the scattered blue excitation light back toward the front of the phosphor where it has another opportunity to exit the primary emitting surface into useful white light. The challenge of this configuration is to allow the forward propagating blue pump excitation light to pass through the filter without allowing the scattered backward propagating blue light to pass. One approach to overcoming this challenge is deploying a filter designed for incident angular reflectivity dependence and configuring the laser at an incident angle wherein the reflectivity is a minimum such as a normal incidence. Again, in this configuration the reflector could be configured from DBR mirrors such that one DBR mirror pair would reflect yellow and a second DBR pair would serve to reflect the blue light with the determined angular dependence. The DBR could be deposited directly on the phosphor using techniques such as e-beam deposition, sputter deposition, or thermal evaporation. Alternatively, the DBR could be in the form of a plate-like element that is applied to the phosphor. Of course, there can be additional variations, modifications, and alternatives.

Figure 13:
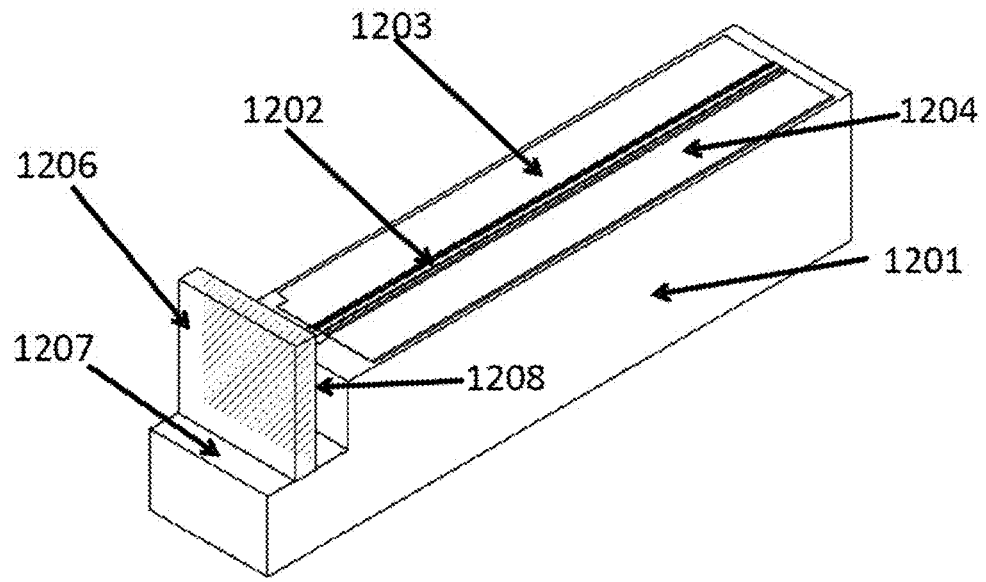
FIG. 13 is a simplified diagram illustrating the apparatus configuration of FIG. 12 but with modification of the phosphor configured with a coating or modification to increase the useful white light output according to an embodiment of the present invention.

FIG. 13 presents a schematic diagram illustrating an alternative transmissive embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment such as that shown in FIG. 4 and in FIG. 11 could be used for this embodiment including optical elements for improved efficiency. The laser based CPoS white light device is comprised of submount material 1201 that serves as the common support member configured to act as an intermediate material between a laser diode 1202 formed in transferred gallium and nitrogen containing epitaxial layers and a final mounting surface and as an intermediate material between the phosphor plate material 1206 and a final mounting surface 1207. The laser diode 1202 or CoS submount 1201 is configured with electrodes 1203 and 1204 that may be formed with deposited metal layers and combination of metal layers including, but not limited to Au, Pd, Pt, Ni, Al, titanium, or others. The laser beam output excites a phosphor plate 1206 positioned in front of the output laser facet. In this embodiment, the phosphor plate 1206 is coated with a material 1208 configured to increase the efficiency of the white source such that more of the useful white light escapes from the primary emitting surface of the phosphor plate 1206. In this embodiment, the coating 1208 is configured to increase the reflectivity of yellow and possibly blue emission to reflect the light back toward the front emitting surface. The phosphor plate is attached to the submount on a ledge 1207 or recessed region. The electrodes 1203 and 1204 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

A second approach to overcoming the challenge of reflecting a backward propagating blue emission and yellow emission while allowing a forward blue emission to pass is deploying a filter system that combines a yellow spectrally selective reflector such as a DBR and a polarization based reflector for the blue light. Since the blue emission from the laser excitation source can be highly polarized with polarization ratios greater than 90% or greater than 95% and the backward propagating scattered blue light will have a mixed polarization, the polarization based reflector can be configured to allow the polarization state of the laser diode output beam (e.g. TE) to freely pass the filter while acting as a reflector to other polarization states. This configuration would likely require two elements that may be combined into a single thing film. A first element would be a yellow reflector such as a DBR mirror pair or another single layer or multi-layer film designed to reflect yellow. The second element would be a polarization sensitive material such as a plastic, ceramic, metal, or glass. The DBR or other yellow reflective material could be deposited directly on the phosphor or on the polarization filter element using techniques such as e-beam deposition, sputter deposition, or thermal evaporation. Alternatively, the DBR could be in the form of a plate-like element that is applied to the phosphor. The polarization sensitive element could be deposited on the phosphor or positioned, glued, or attached on the backside of the phosphor. Of course, there can be additional variations, modifications, and alternatives.

A third approach to overcoming the challenge of reflecting a backward propagating blue emission and yellow emission while allowing a forward blue emission to pass is deploying a filter system that combines a yellow spectrally selective reflector such as a DBR and a spatial based reflector for the blue light. This configuration would likely require two elements that may be combined into a single thing film. A first element would be a yellow reflector such as a DBR mirror pair or another single layer or multi-layer film designed to reflect yellow. The second element would be a comprised of an element to reflect blue and would be applied to the back of the phosphor in a selective manner such that it was not present where the laser beam is incident on the phosphor, but is present over the area where the laser beam is not incident. The second element could be another DBR coating stack or a broadband reflector material such as Ag or Al. Both the first element such as a DBR or other yellow reflective material and the second element spatially reflective to blue light could be deposited directly on the phosphor or on the polarization filter element using techniques such as e-beam deposition, sputter deposition, or thermal evaporation. Alternatively, the DBR could be in the form of a plate-like element that is applied to the phosphor. The polarization sensitive element could be deposited on the phosphor or positioned, glued, or attached on the backside of the phosphor. Of course, there can be additional variations, modifications, and alternatives.

In other embodiments, coatings or other materials may be used to reduce the reflectivity of the front emission surface of the phosphor. In yet other embodiment, coatings or additional elements may be applied to reduce the reflectivity of the incident beam on the phosphor surface. In configurations where off axis laser beam incident angles are used such measure to reduce the reflectivity of the laser beam on the phosphor may be critical.

In the present invention, the laser diode output beam must be configured to be incident on the phosphor material to excite the phosphor. The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. Specifically, in many applications it is desirable to have a round laser excitation beam such that the illuminated spot on the phosphor is also round and the resulting white light emission radiates from a round area. Such a round area is advantageous for forming collimated or spot light sources using conventional optics and reflectors commonly available for round emission. Additionally, the round beam produces some symmetry in the phosphor so that there are not thermal hotspots which can lead to changes in phosphor conversion efficiency or even initiate failure mechanisms in the phosphor.

This same concept can also be utilized to generate other shapes such as elliptical, conical, rectangular and others for applications which require non-circular beams. In automotive headlights for example, customized spatial patterns are desired to produce illumination in desired areas, and darker spots in the beam pattern in order to avoid causing glare to other oncoming drivers.

Figure 14:
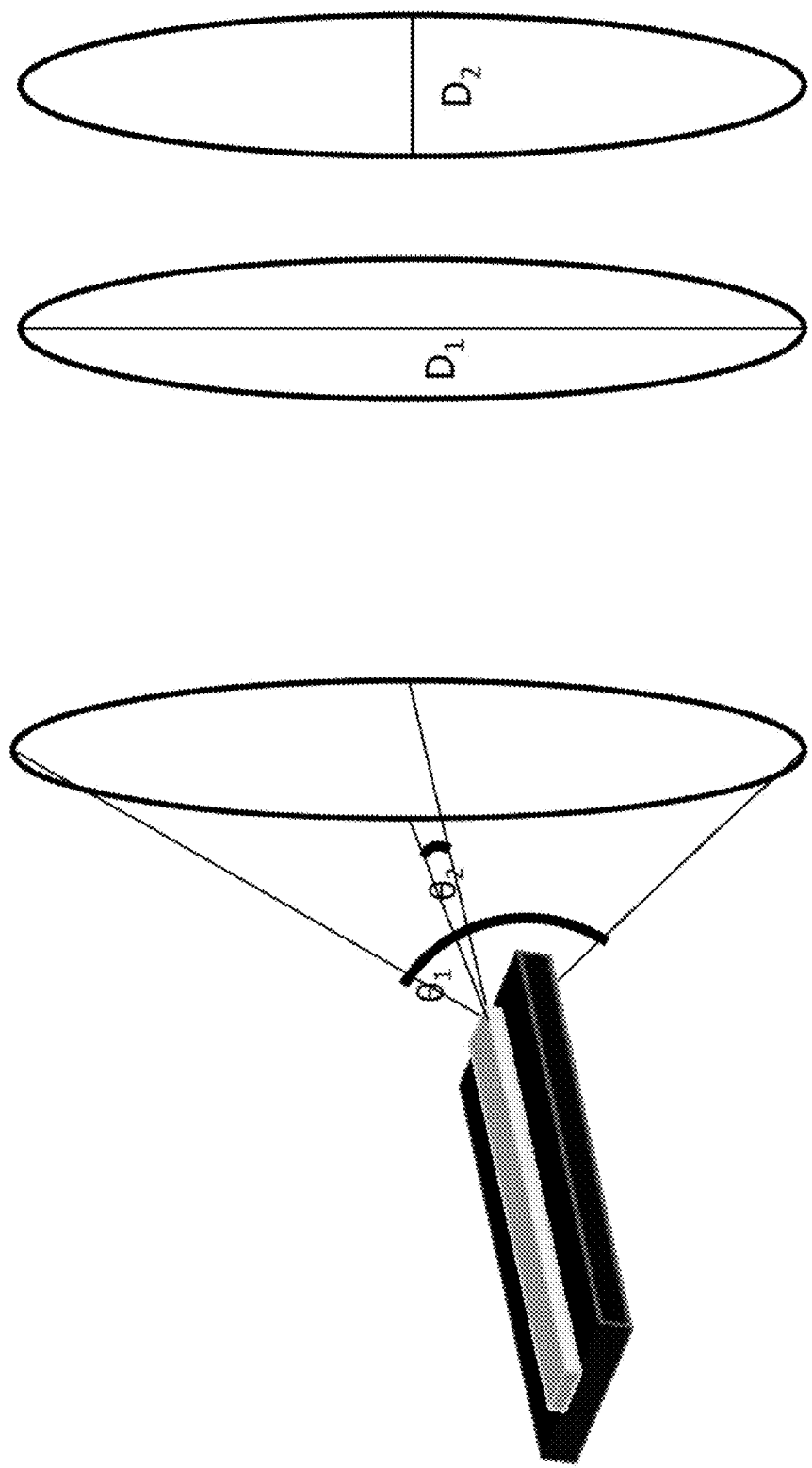
FIG. 14 is a simplified diagram illustrating an example of an elliptical projected laser beam from a conventional laser diode according to an embodiment of the present invention.

The inherent divergence properties of the output beams from typical edge-emitting diode lasers leads to the beam expanding in both the x-direction (slow divergence axis) and y-direction (fast divergence axis) as it propagates in free/unguided space. Complicating matters is the different divergence rates of the beam on the fast and slow axis resulting from the waveguide confinement characteristics in the laser diode. For example, typical full width at half maximum (FWHM) beam divergences range from about 5-20 degrees in the slow axis and 10 to 40 degrees in the fast axis, but can be others. Another measure of divergence of the laser beam is the divergence angles taken at the point in the output beam where the power has dropped to the $1/e2$ level. For this $1/e2$ measure, typical beam divergences range from about 10-30 degrees in the slow axis and 20 to 80 degrees in the fast axis, but can be others. Thus, the ratio of the fast axis to slow axis divergence angles range from about 2:1 to about 4:1. The resulting projected spot from a free-space/unguided laser beam is an elliptical shape, typically with the fast axis diameter being greater than the slow axis diameter. FIG. 14 presents a schematic diagram illustrating an example of an elliptical output beam from a laser diode with a fast axis divergence angle of $\theta_1$, a fast axis spot diameter of $D_1$, a slow axis divergence angle $\theta_2$, and a slow axis spot diameter of $D_2$.

Figure 15:
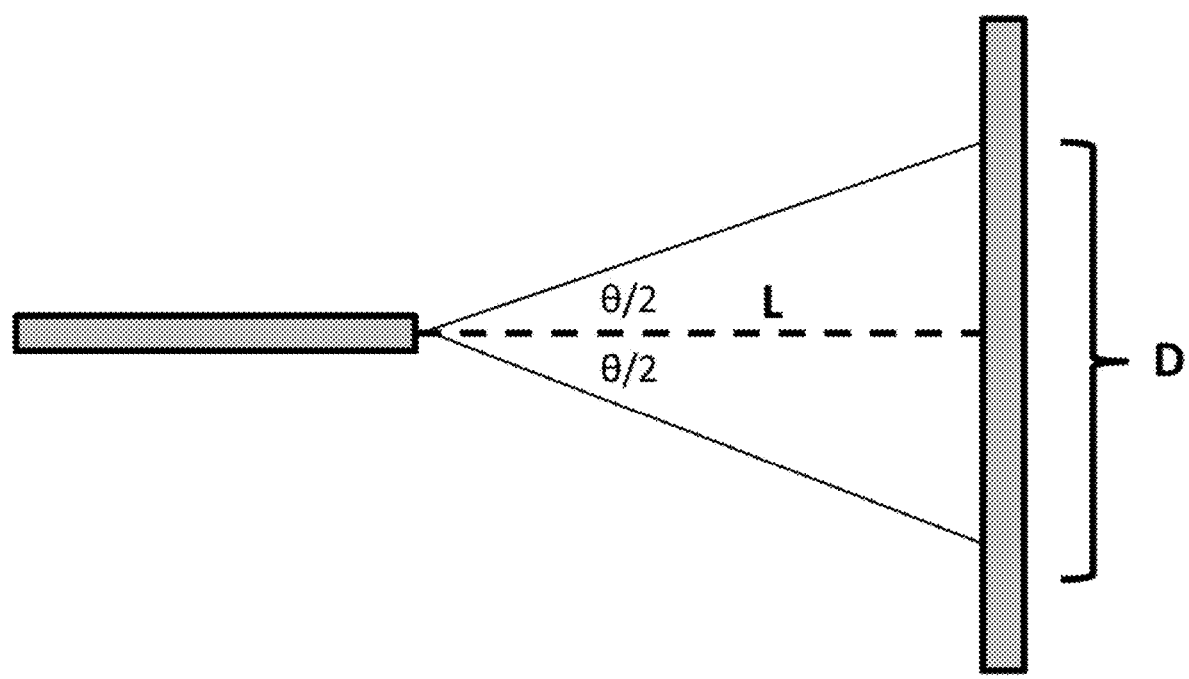
FIG. 15 is a simplified diagram illustrating a side view diagram of a laser beam at normal incidence to a phosphor member according to an embodiment of the present invention.
Figure 16:
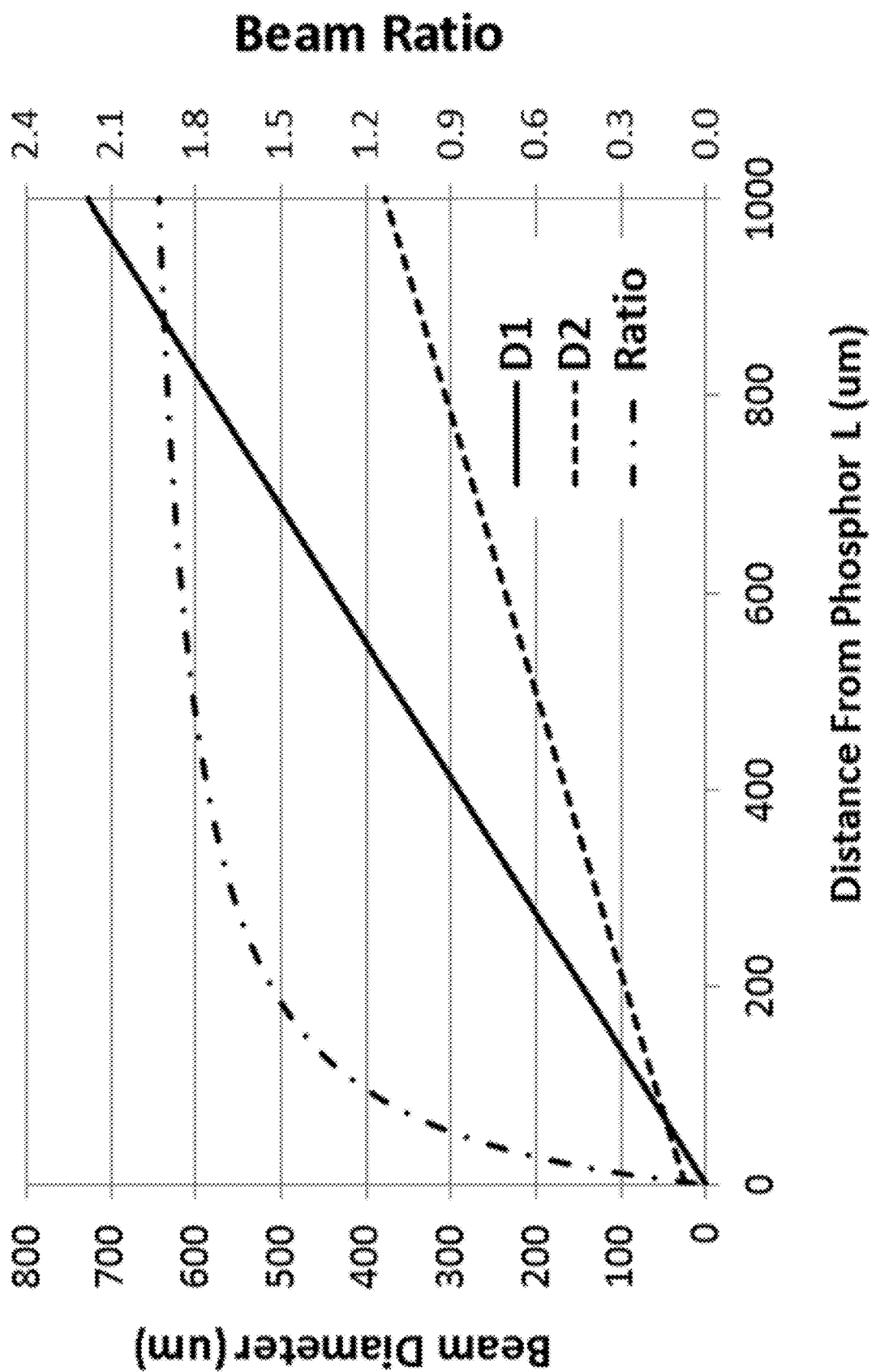
FIG. 16 is a plot illustrating an example calculation of the elliptical beam diameters and ratio of beam diameters versus emitter distance from phosphor according to an embodiment of the present invention.

FIG. 15 schematically illustrates a simplified example of the geometry that can be used to compute the beam diameter in the fast or slow axis with a laser diode a distance L away from a flat surface. To compute the quantitative values of the spot diameters, $D_1$ and $D_2$, the laser diode aperture dimensions must be known as well as the distance of the flat projection surface from the laser aperture. FIG. 16 presents a plot of the fast axis spot diameter, $D_1$, the slow axis spot diameter, $D_2$, and the ratio of the fast to slow spot diameters for a varied distance L from the laser aperture. The example calculation of FIG. 16 assumes a 1/e2 fast axis divergence of 40 degrees, a 1/e2 slow axis divergence of 20 degrees, an aperture width of 25 µm, and an aperture height of 1 µm. As seen in the figure for this example, for projection surfaces [i.e. the phosphor] greater than 100 µm away from the laser aperture the beam quickly becomes elliptical with the fast axis diameter saturating at about 2 times greater than the slow axis diameter. At a distance of about 70 µm away from the aperture, the fast and slow axis diameters are nearly equivalent at about 50 µm. Thus, to achieve a most circular spot with this laser diode configuration, the phosphor should be placed about 70 µm in front of the laser diode where the spot would be 50 µm in diameter. Although it would be advantageous to have a circular beam without the use of additional optics for collimation and shaping, such a design may not be the most practical to implement due to the vicinity of the phosphor to the laser which may create assembly and fabrication challenges. Moreover, the very small beam diameter with very high powers of greater than 1 W or greater than 4 W could cause issues in the phosphor if the phosphor quality and/or heat sinking cannot stand the high power density. However, when moving the phosphor further from the aperture, the beam quickly becomes elliptical which in many applications would not be as ideal as a round spot.

In one embodiment of the present invention a collimating optic is positioned between the laser diode and the phosphor to collimate and beam shape the laser output beam. By placing a free space optic in front of the output laser beam the beam shape can be shaped to provide a circular beam profile and collimated such that the phosphor can be positioned at a distance in front of the facet with a large tolerance and maintain a relatively constant spot size. In one example an aspheric lens is used to collimate and/or shape the laser beam. In an alternative embodiment, the laser beam is collimated using fast axis collimating (FAC) and/or slow axis collimating (SAC) lenses. In alternative embodiments, other optics can be included in various combinations for the shaping, collimating, directing, filtering, or manipulating of the optical beam. Examples of such optics include, but are not limited to re-imaging reflectors, ball lenses, aspheric collimator, dichroic mirrors, turning mirrors, optical isolators, but could be others.

Figure 17:
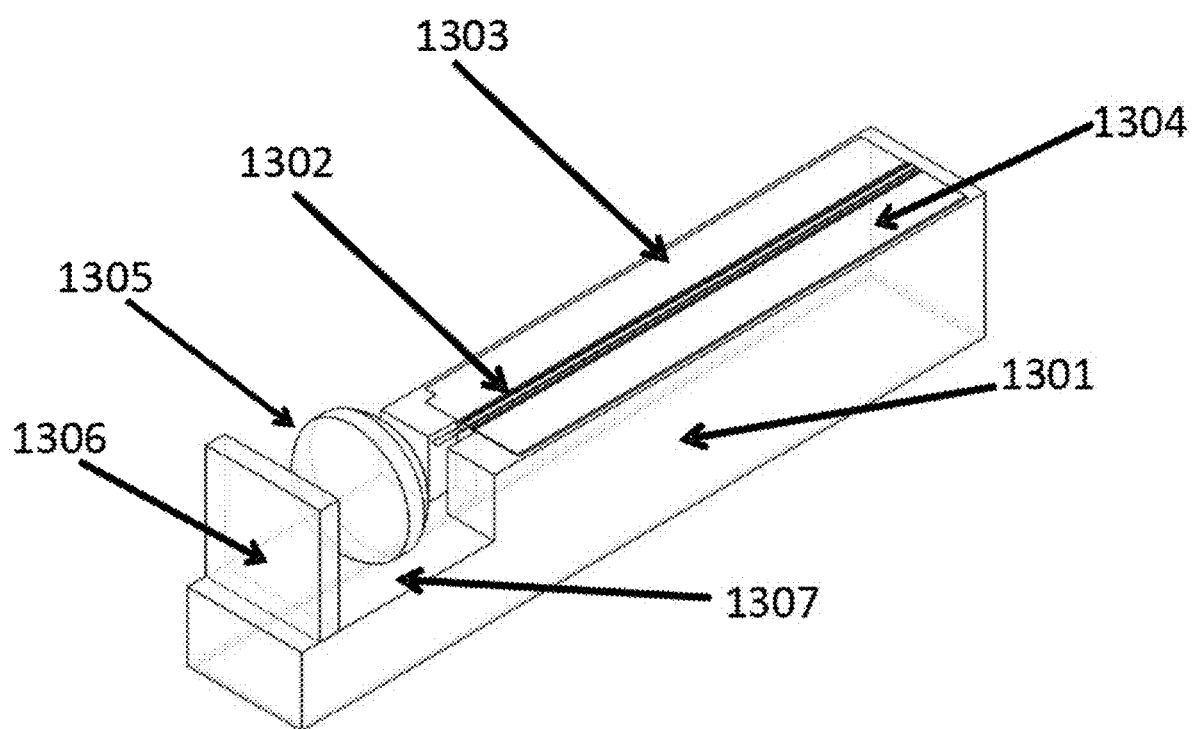
FIG. 17 is a simplified diagram illustrating the apparatus configuration of FIG. 12 but with modification of the laser beam configured through a collimating optic prior to incidence on the phosphor according to an embodiment of the present invention.

FIG. 17 presents a schematic diagram illustrating a transmissive phosphor embodiment of a CPoS integrated white light source including free-space optics to collimate and shape the laser beam for incidence on the phosphor according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment such as that shown in FIG. 4 and in FIG. 11 could be used for this integrated free-space optic embodiment. The laser based CPoS white light device is comprised of submount material 1301 that serves as the common support member configured to act as an intermediate material between a laser diode 1302 formed in transferred gallium and nitrogen containing epitaxial layers and a final mounting surface and as an intermediate material between the phosphor plate material 1306 and a final mounting surface. The laser diode 1302 and/or submount 1301 is configured with electrodes 1303 and 1304 that may be formed with deposited metal layers and combination of metal layers including, but not limited to Au, Pd, Pt, Ni, Al, titanium, or others. The laser beam output is coupled into an aspheric lens 1305 for collimation and beam shaping to create a more circular beam, which then excites a phosphor plate 1306 positioned in front of aspheric lens 1305. The phosphor plate 1306 is attached to the submount on a ledge 1307 or recessed region. The electrodes 1303 and 1304 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

Figure 18:
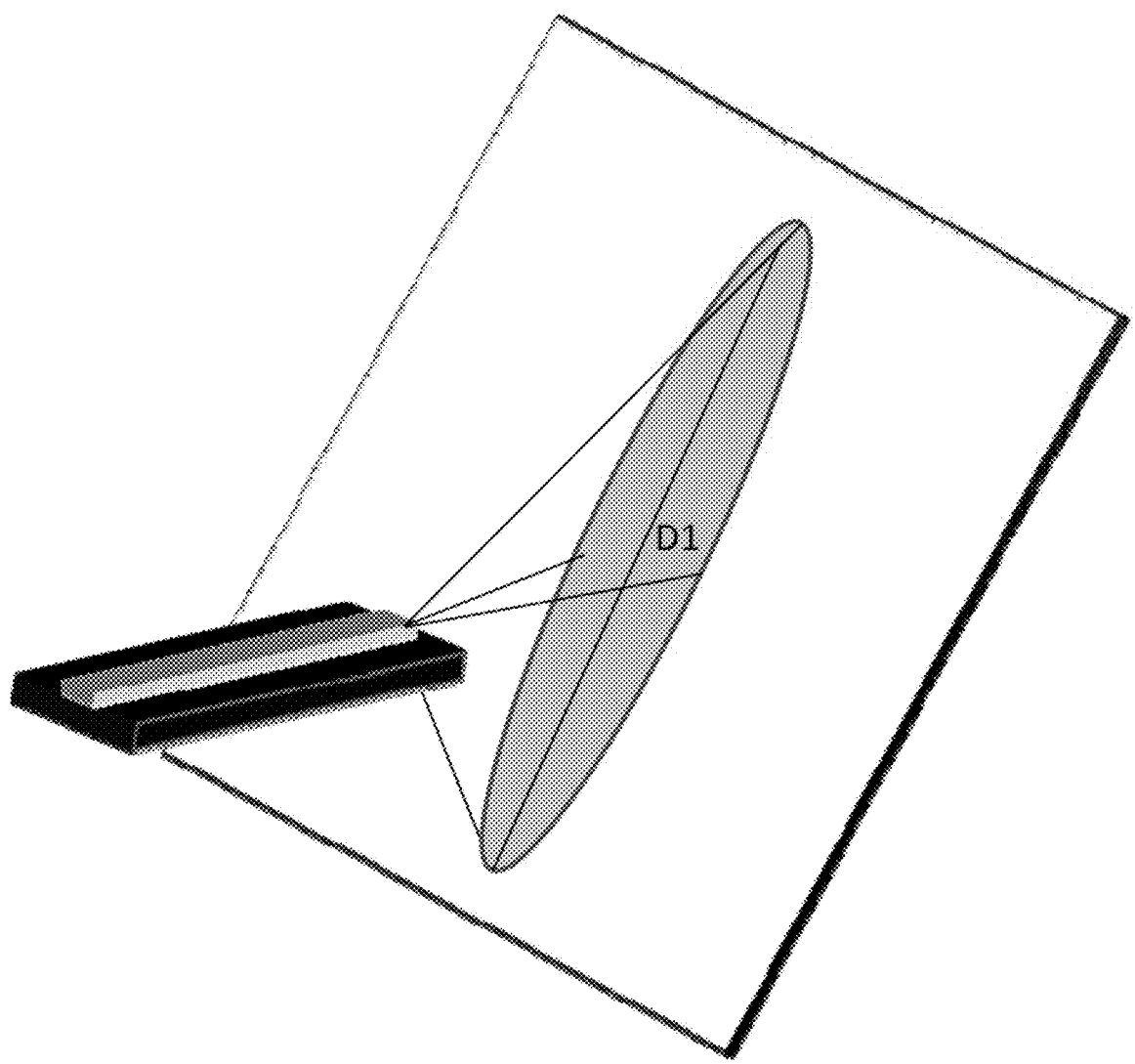
FIG. 18 is a simplified diagram illustrating an example of an exacerbated elliptical laser beam profile from a conventional laser diode with a projection surface tilted with respect to the fast axis of the laser diode the according to an embodiment of the present invention.
Figure 19:
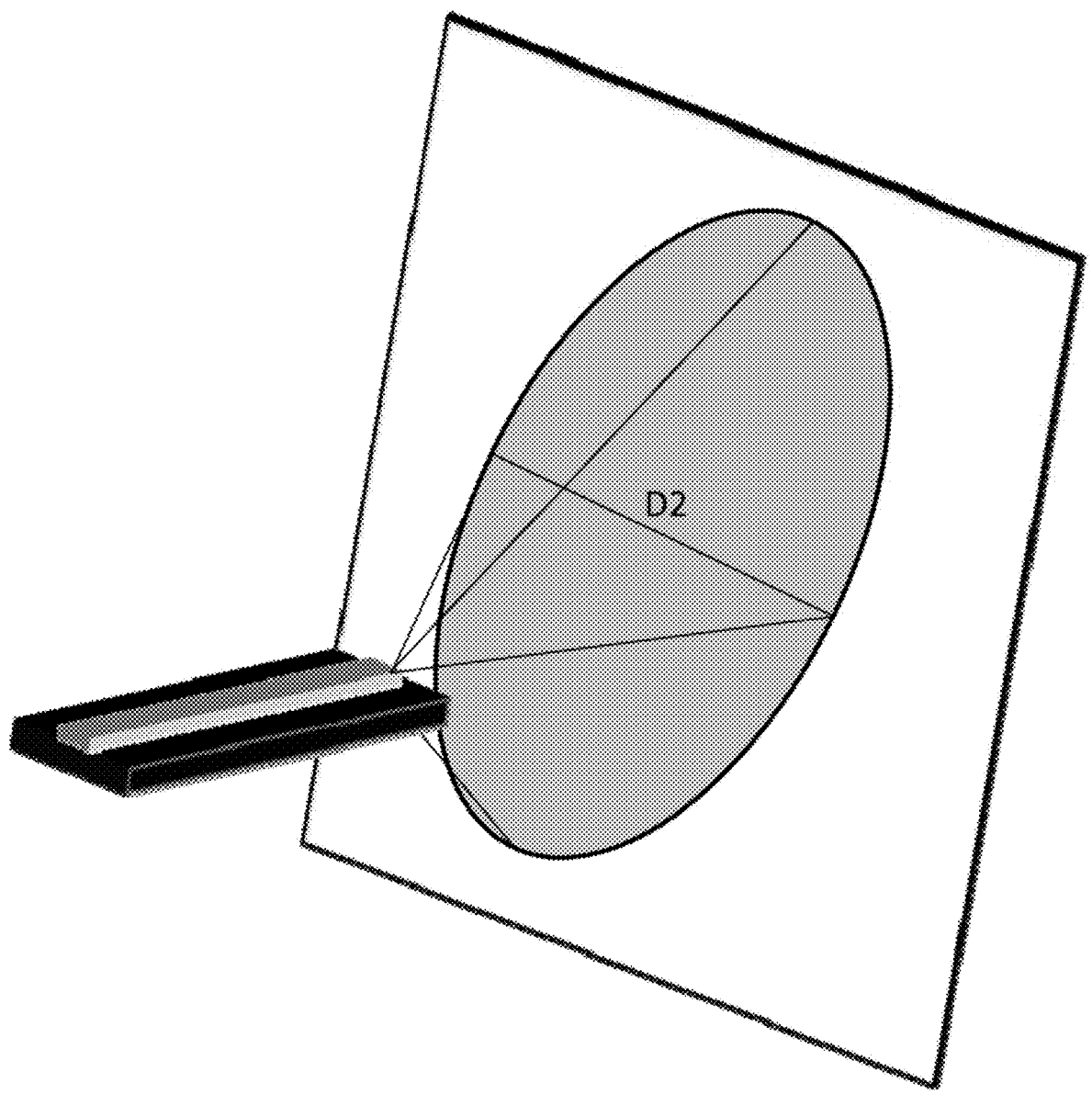
FIG. 19 is a simplified diagram illustrating an example of a more circularized laser beam profile from a conventional laser diode with a projection surface tilted with respect to the slow axis of the laser diode the according to an embodiment of the present invention.

In an alternative preferred embodiment, beam shaping can achieved by tilting the phosphor excitation surface with respect the laser diode aperture and positioning the laser diode at a designed distance from the phosphor to exploit the beam divergence properties of the laser diode and achieve the desired spot size. This "optics-less" beam shaping embodiment is advantageous over embodiments where optical elements are introduced for beam shaping and collimation. These advantages of this embodiment for the white light source apparatus include a simplified design, a lower cost bill of materials, a lower cost assembly process, and potentially a more compact white light source. In one embodiment, the incident angle from the laser to the phosphor is optimized to achieve a desired beam shape on the phosphor. As discussed for the example of FIG. 16, by positioning the phosphor about 70 µm away from the laser aperture a relative uniform beam can be realized with about a 50 µm diameter. In addition to controlling the distance of the laser from the phosphor, the incident angle of the laser beam can also be used to control the shape of the beam incident on the phosphor. As an example, FIG. 18 shows the effect on the spot size when the phosphor or projection surface is tilted with respect to the fast axis. By tilting along this axis a larger fast axis diameter D1 is generated on the phosphor such that the beam spot becomes more elliptical. By the same principle, as illustrated in FIG. 19, when rotating the phosphor or projection surface about the slow axis, the slow axis diameter D2 can be increased such that the spot diameter ratio becomes closer to 1 and the beam becomes more circular.

Figure 20:
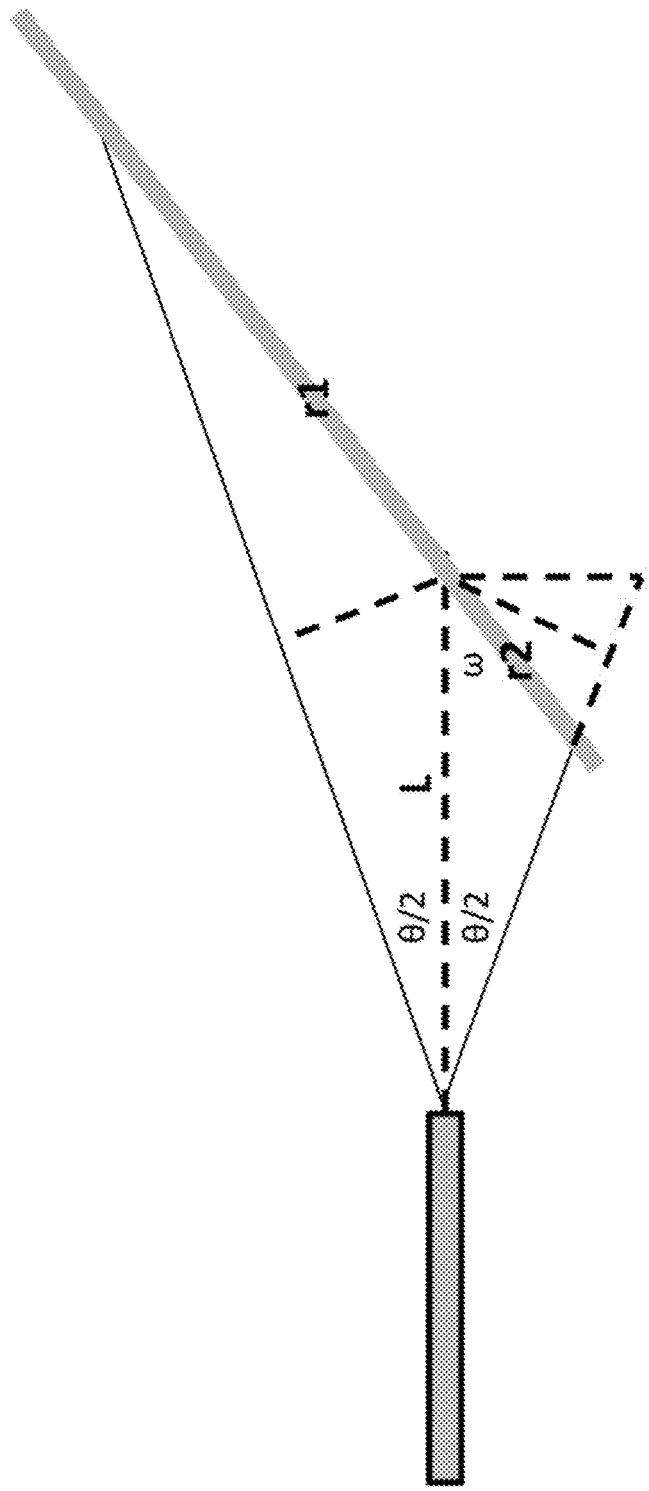
FIG. 20 is a simplified diagram illustrating a side view diagram of a laser beam projected on a phosphor member at a tilted orientation according to an embodiment of the present invention.
Figure 21:
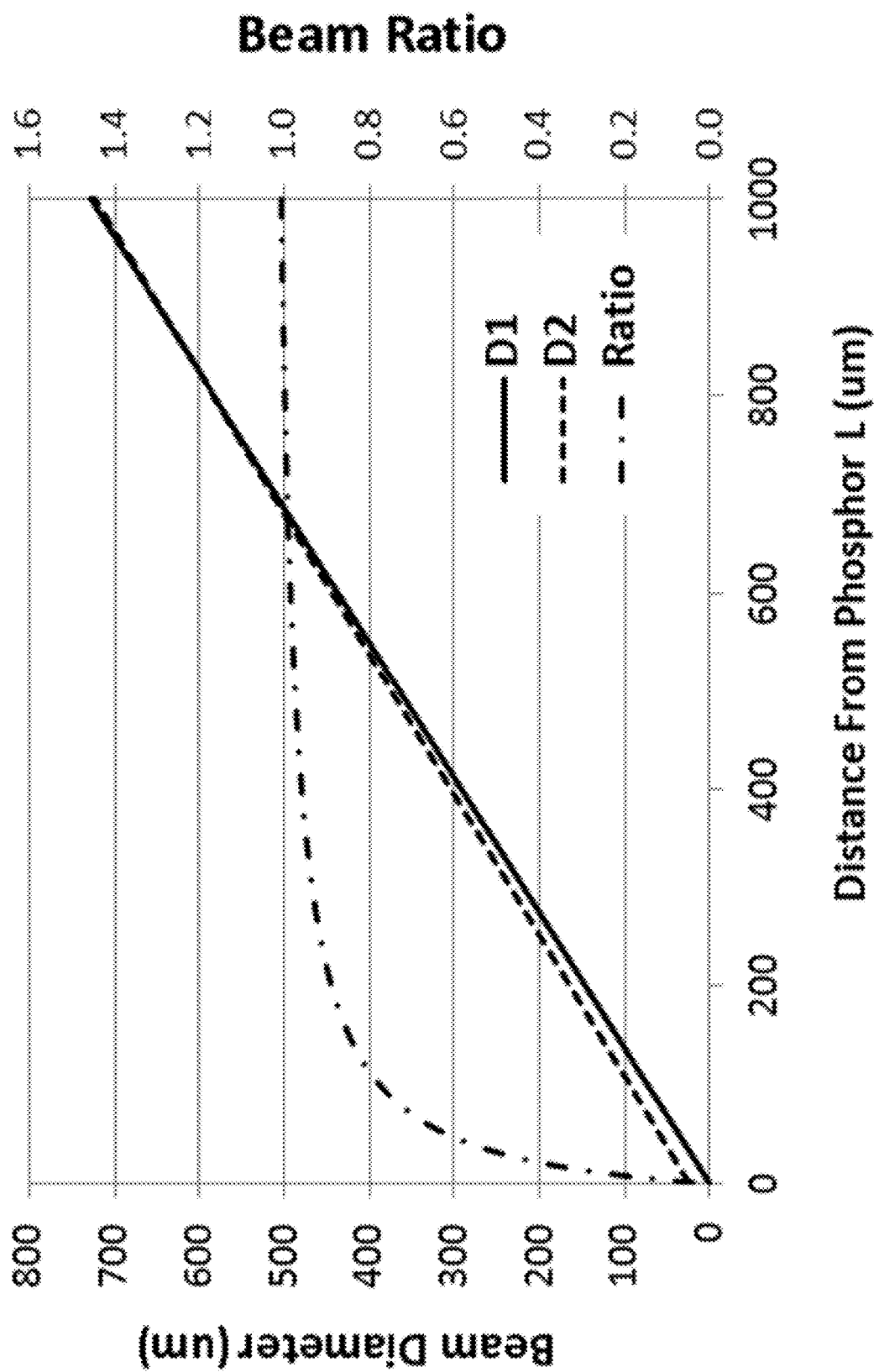
FIG. 21 is a plot illustrating an example calculation of the elliptical beam diameters and ratio of beam diameters versus emitter distance from phosphor tilted at an angle of 33 degrees with respect to the slow axis according to an embodiment of the present invention.

FIG. 20 schematically illustrates a simplified example of the geometry that can be used to compute the beam diameter (r1+r2) in the fast or slow axis with a laser diode a distance L away from a tilted phosphor or projection surface that is tilted at an angle ω from the fast or slow axis. By performing the geometry and optimization sequence and optimal phosphor tilt angle can be determined for a relatively circular beam shape. For example, FIG. 21 presents a plot of the fast axis spot diameter, D1, the slow axis spot diameter, D2, and the ratio of the fast to slow spot diameters for a varied distance L from the laser aperture assuming a phosphor tilt angle of 33 degrees with respect to the slow axis. The example calculation of FIG. 21 assumes a 1/e2 fast axis divergence of 40 degrees, a 1/e2 slow axis divergence of 20 degrees, an aperture width of 25 µm, and an aperture height of 1 µm. As seen in the figure for this example, for projection surfaces such as the phosphor a beam ratio of 1 occurs at a distance L of about 600 µm separating the laser aperture and phosphor, wherein beam the diameters, D1 and D2, are about 500 µm. This configuration is optimized for maintaining even a beam ratio of 1 over large ranges of L and corresponding spot size.

Figure 22:
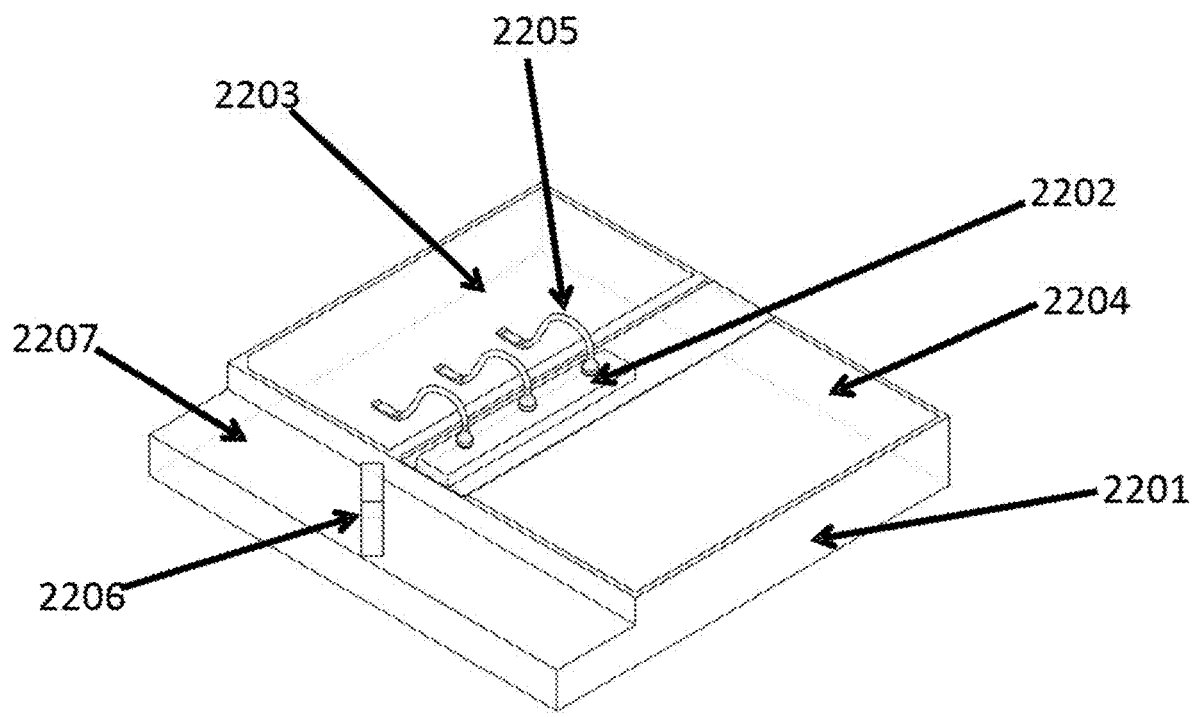
FIG. 22 is a simplified diagram illustrating an integrated laser-based white light source with a laser diode and phosphor member integrated onto a submount wherein the phosphor is configured at an angle with the respect to the laser diode for a beam shaping according to an embodiment of the present invention.

FIG. 22 presents a schematic diagram illustrating a transmissive phosphor embodiment of a CPoS integrated white light source including a tilted phosphor design to achieve a more circular excitation spot on the laser according to the present invention. In this embodiment a conventional full laser diode chip containing substrate is mounted on the submount. The laser based CPoS white light device is comprised of submount material 2201 that serves as the common support member configured to act as an intermediate material between a laser diode chip 2202 and a final mounting surface and as an intermediate material between the phosphor plate material 2206 and a final mounting surface. The laser diode or CoS is configured with electrodes 2203 and 2204 that may be formed with deposited metal layers and combination of metal layers including, but not limited to Au, Pd, Pt, Ni, Al, titanium, or others. Wirebonds 2205 are configured to couple the electrical power from the electrodes 2203 and 2204. The phosphor plate 2206 is tilted about the slow axis of the laser diode output to result in a more circular excitation spot on the phosphor. For example, the phosphor plate 2206 could be at an angle of about 33 degrees according to the calculation in FIG. 20. The phosphor plate 2206 is attached to the submount on a ledge 2207 or recessed region. The electrodes 2203 and 2204 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different phosphor angle or orientation, different geometrical designs of the submount or common support member, different orientations of the laser output beam with respect to the phosphor, different electrode and electrical designs, and others.

Figure 23:
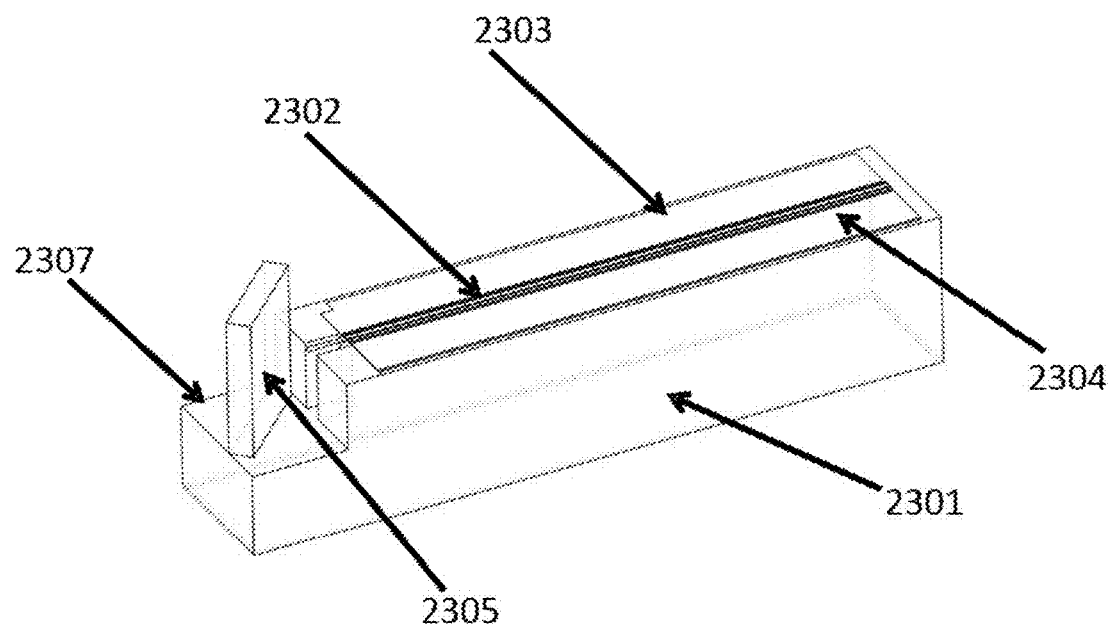
FIG. 23 is a simplified diagram illustrating an integrated laser-based white light source with a laser diode fabricated in gallium and nitrogen containing epitaxial layers transferred to a submount member and a phosphor member integrated onto the submount member wherein the phosphor is configured at an angle with the respect to the laser diode for a beam shaping according to an embodiment of the present invention.

FIG. 23 presents a schematic diagram illustrating a transmissive phosphor embodiment of a CPoS integrated white light source including a tilted phosphor design to achieve a more circular excitation spot on the laser according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment such as that shown in FIG. 4 and in FIG. 11 could be used for this tilted phosphor embodiment. The laser based CPoS white light device is comprised of submount material 2301 that serves as the common support member configured to act as an intermediate material between a laser diode 2302 formed in transferred gallium and nitrogen containing epitaxial layers and a final mounting surface and as an intermediate material between the phosphor plate material 2305 and a final mounting surface. The laser diode or CoS is configured with electrodes 2303 and 2304 that may be formed with deposited metal layers and combination of metal layers including, but not limited to Au, Pd, Pt, Ni, Al, titanium, or others. The phosphor plate 2305 is tilted about the slow axis of the laser diode output to result in a more circular excitation spot on the phosphor. For example, the phosphor plate 2305 could be at an angle of about 33 degrees according to the calculation in FIG. 20. The phosphor plate 2305 is attached to the submount on a ledge 2307 or recessed region. The electrodes 2303 and 2304 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different phosphor angle or orientation, different geometrical designs of the submount or common support member, different orientations of the laser output beam with respect to the phosphor, different electrode and electrical designs, and others.

In alternative embodiments of the present invention, multiple phosphors are operated in a transmissive mode for a white emission. In one example, a violet laser diode configured to emit a wavelength of 395 nm to 425 nm and excite a first blue phosphor and a second yellow phosphor. In this configuration, a first blue phosphor plate could be fused or bonded to the second yellow phosphor plate. In a practical configuration the laser beam would be directly incident on the first blue phosphor wherein a fraction of the blue emission would excite the second yellow phosphor to emit yellow emission to combine with blue emission and generate a white light. Additionally, the violet pump would essentially all be absorbed since what may not be absorbed in the blue phosphor would then be absorbed in the yellow phosphor. In an alternative practical configuration the laser beam would be directly incident on the second yellow phosphor wherein a fraction of the violet electromagnetic emission would be absorbed in the yellow phosphor to excite yellow emission and the remaining violet emission would pass to the blue phosphor and create a blue emission to combine a yellow emission with a blue emission and generate a white light.

In an alternative embodiment of a multi-phosphor transmissive example according to the present invention, a blue laser diode operating with a wavelength of 425 nm to 480 nm is configured to excite a first green phosphor and a second red phosphor. In this configuration, a first green phosphor plate could be fused or bonded to the second red phosphor plate. In a practical configuration the laser beam would be directly incident on the first green phosphor wherein a fraction of the green emission would excite the second red phosphor to emit red emission to combine with green phosphor emission and blue laser diode emission to generate a white light. In an alternative practical configuration the laser beam would be directly incident on the second red phosphor wherein a fraction of the blue electromagnetic emission would be absorbed in the red phosphor to excite red emission and a portion of the remaining blue laser emission would pass to the green phosphor and create a green emission to combine with the red phosphor emission and blue laser diode emission to generate a white light. The benefit or feature of this embodiment is the higher color quality that could be achieved from a white light comprised of red, green, and blue emission. Of course there could be other variants of this invention including integrating more than two phosphor and could include one of or a combination of a red, green, blue, and yellow phosphor.

In yet another variation of a side pumped phosphor configuration, a "point source" or "point source like" CPoS white emitting device is achieved. In this configuration the phosphor would have a 3-dimensional geometry such as a cube geometry or a spherical geometry such that white light can be emitted from multiple primary emission surfaces, and ideally from the entirety of the surface area of the 3-dimensional phosphor geometry. For example, in a cube geometry up to all six faces of the cube can emit white light or in a sphere configuration the entire surface can emit to create a perfect point source. In some practical implementations of this present invention, certain surfaces of the 3-dimension phosphor geometry may not be to freely emit due to obstructions or impediments. For example, in some configurations of this embodiment the phosphor is attached to the common support member wherein the common support member may not be fully transparent. In this configuration the mounting surface or support member would be impede the phosphor emission from the side or portion of the phosphor facing the mounting surface or support member. This impediment would reduce the overall efficiency or quality of the point source white light emitter. However, this emission impediment can be minimized or mitigated using various techniques to provide a very efficient point source. In one configuration, the phosphor is supported by an optically transparent member such that the light is free to emit in all directions from the phosphor point source. In one variation, the phosphor is fully surrounded in or encapsulated by an optically transparent material such as a solid material like SiC, sapphire, diamond, GaN, or other, or a liquid material like water or a more thermally conductive liquid.

Figure 24:
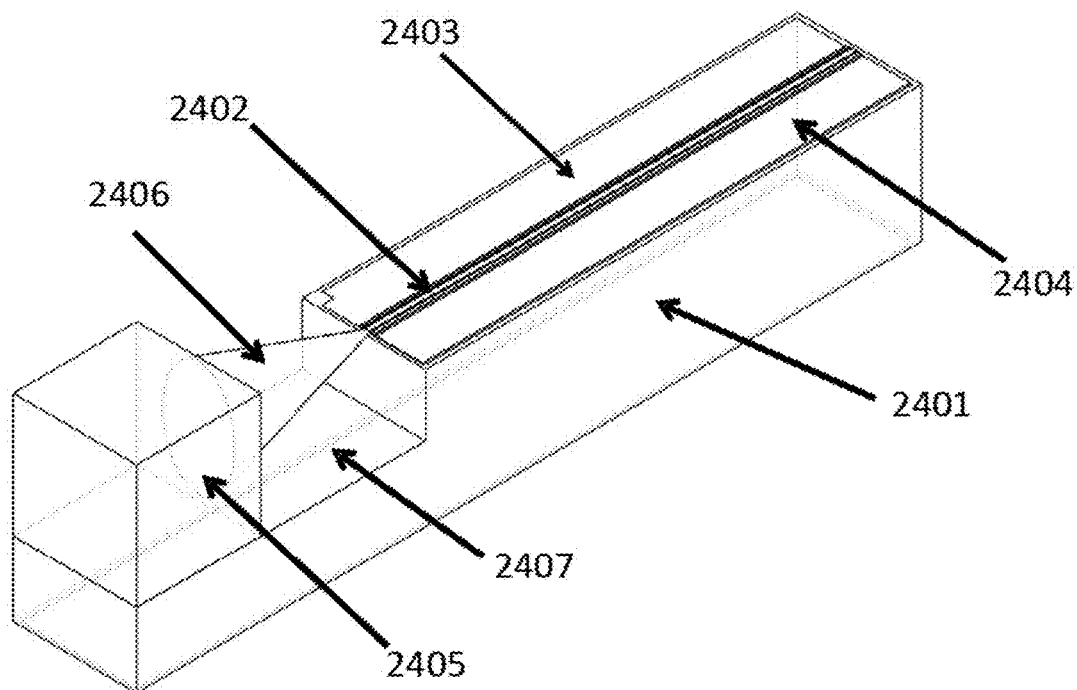
FIG. 24 is a simplified diagram illustrating an integrated laser-based white light source with a laser diode fabricated in gallium and nitrogen containing epitaxial layers transferred to a submount member and a phosphor member integrated onto the submount member wherein the phosphor is configured as point source according to an embodiment of the present invention.

FIG. 24 presents a schematic diagram illustrating a point source laser-pumped phosphor embodiment of a CPoS integrated white light source including a phosphor with a 3-dimensional geometrical design to provide a point source of light according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment such as that shown in FIG. 4 and in FIG. 11 could be used for this point source embodiment. The laser based CPoS white light device is comprised of submount material 2401 that serves as the common support member configured to act as an intermediate material between a laser diode 2402 formed in transferred gallium and nitrogen containing epitaxial layers and a final mounting surface and as an intermediate material between the phosphor plate material 2405 and a final mounting surface. The laser diode or CoS is configured with electrodes 2403 and 2404 that may be formed with deposited metal layers and combination of metal layers including, but not limited to Au, Pd, Pt, Ni, Al, titanium, or others. The 3-dimensional phosphor member 2405 is configured in front of the laser diode such that the output laser beam 2406 is incident on an excitation side of the phosphor and multiple sides of the phosphor member 2405 are configured to emit white light. Up to all sides of the phosphor member 2405 can emit, but in some embodiments such as that shown in FIG. 24 the emission may be obstructed from the mounting surface where the phosphor member 2405 is attached to the submount on a ledge 2407 or recessed region. The electrodes 2403 and 2404 are configured for an electrical connection to an external power source such as a laser driver, a current source, or a voltage source. Wirebonds can be formed on the electrodes to couple electrical power to the laser diode device to generate a laser beam 306 output from the laser diode. Of course this is merely an example of a configuration and there could be many variants on this embodiment including but not limited to different shape phosphors such as spherical or semispherical, different phosphor angle or orientation, different geometrical designs of the submount or common support member, different orientations of the laser output beam with respect to the phosphor, different electrode and electrical designs, and others.

In some embodiments according to the present invention a periodic 2D photonic crystal structure can be applied to the single crystal or poly crystal phosphor materials structure. The structure would be employed to suppress emission in given directions and re-direct light out of the crystal in a direction suitable and chosen for the device design. Phosphor structures today are largely Lambertian emitters except where waveguiding and critical angle comes into play. Many phosphors today satisfy the basic materials requirements needed to create photonic crystal structures—(dielectric or metallo-dielectric materials with low optical absorption). Adding photonic crystal structures to phosphor plate materials would allow light extraction to be enhanced in 1 direction over another in these materials. This can separate the excitation and emission characteristics thereby allowing greater flexibility in design.

In yet another variation of a side pumped phosphor embodiment, a phosphor is excited from the side and configured to emit a substantial portion of the white light from a top surface. In this configuration the phosphor would most likely have a cube geometry, a cylindrical geometry, a faceted geometry, a hexagonal geometry, a triangular geometry, a pyramidal geometry, or other multi-sided geometries wherein the white light is configured to be emitted primarily from the top surface of the phosphor. In this configuration the laser beam would enter the phosphor from a first of side of the phosphor where a fraction of the laser excitation light with a first wavelength would be converted to a second wavelength. This first side of the phosphor may be configured for a modified reflectivity such as a coating or treatment to reduce the reflectivity in the blue or violet wavelength range and for increased reflectivity for the phosphor emission wavelength range such as yellow. In one example of the side pumped embodiment the laser excitation beam is incident on the first side of the phosphor at the Brewster angle. The additional sides of the phosphor may be coated, treated, or shaped for an increased reflectivity to both the laser excitation wavelength and the phosphor conversion wavelength such that the light within the phosphor would be reflected inside the phosphor until it escaped from the top. Special phosphor shaping or coating techniques could be used to enhance the fraction of light escaping the top surface. A first strong advantage to this configuration is that the white light spot size is controlled by the phosphor size, which can enable smaller spot sizes than alternative transmissive or reflective mode configurations by avoiding the spot size growth that happens within the phosphor due to scattering, reflection, and lack of efficient absorption in the phosphor. Ultra-small spot sizes are ideal for most efficient collimation in directional applications. A second advantage to this configuration is the ideal heat sinking configuration wherein for the phosphor member it is identical to a reflection mode configuration with the entire bottom surface of the phosphor can be thermally and mechanically attached to a heat-sink. Further, since the laser diode member does not require thick or angled intermediate support members to elevate the beam and dictate an angled incidence as in the reflection mode configurations, the laser can be mounted closer to the base member for a shorter thermal conduction path to the heat-sink. A third advantage is the inherent design for safety since the primary emission may be from the top surface of the phosphor orthogonal to the laser beam direction such that in the event of a phosphor breakage or compromise the laser beam would not be pointing the direction of white light capture. In this configuration, if the phosphor were to be removed or compromised the laser beam would be incident on the side of the package. Moreover, this configuration would avoid the potential issue in a reflective configuration where an escaped beam can result from a reflection of the incident beam on the top of the surface. In this side pumped configuration the reflected beam would be substantially contained in the package. A fourth advantage is that since the laser diode or SLED device can be mounted flat on the base member, the assembly process and components can be simplified. In this side pumped configuration it may be advantageous to promote primary emission from the top surface of the phosphor. This could be achieved with treatments to promote light escape from the top surface such as application of an anti-reflective coating or roughening, and treatments to reduce light escape from the side and bottom surfaces such as application of highly reflective layers such as metal or dielectric layers.

Figure 24A:
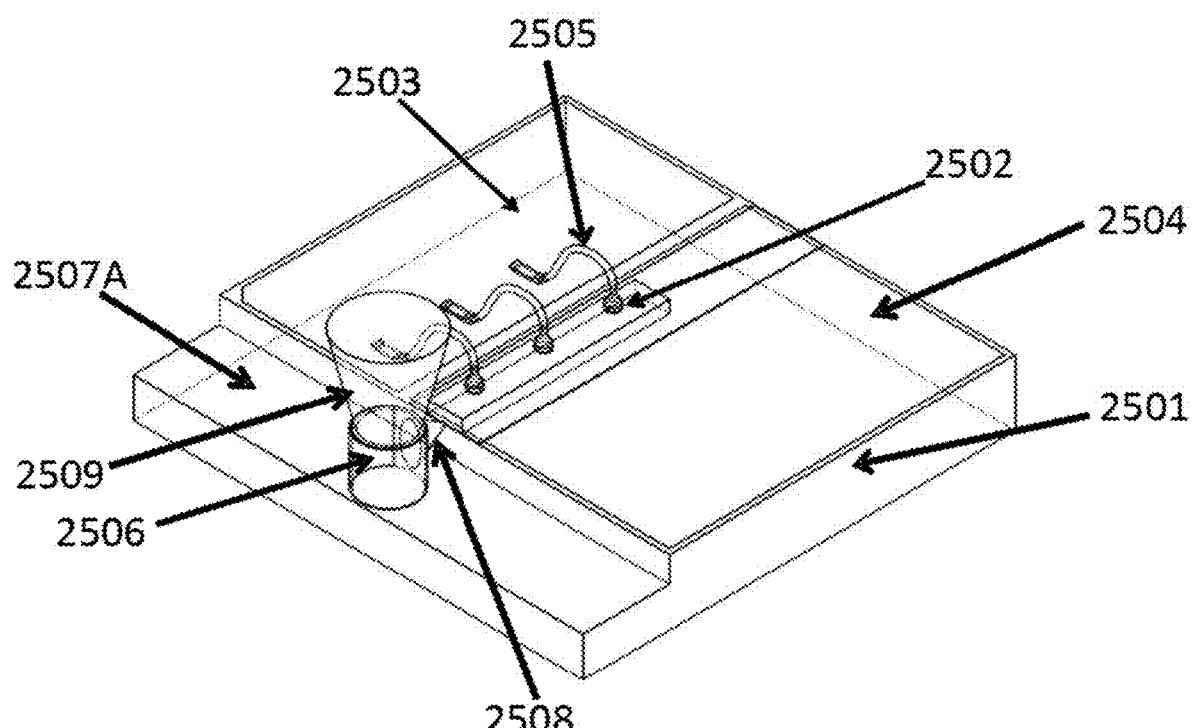
FIG. 24A is a simplified diagram illustrating an integrated laser-based white light source with a laser diode and phosphor member integrated onto a submount wherein the laser is primarily exciting or pumping the phosphor member from a side surface of the phosphor according to an embodiment of the present invention.

FIG. 24A presents a schematic diagram illustrating a side-pumped phosphor embodiment of an integrated laser-phosphor white light source including a phosphor with a 3-dimensional geometrical design to provide a point source of light according to the present invention. The laser based white light device is comprised of submount material 2501 that serves as a common support member configured to act as an intermediate material between a laser diode chip 2502 and a final mounting surface and as an intermediate material between the phosphor material 2506 and a final mounting surface. The submount 2501 is configured with electrodes 2503 and 2504 that may be formed with deposited metal layers such as Au. In one example, Ti/Pt/Au is used for the electrodes. In this example, the laser diode chip is mounted with the p-side down and wirebonds 2505 are configured from the n-side of the chip to the submount. Electrical power provided to electrodes 2503 and 2504 on the submount supply current to the laser diode chip to generate a laser beam 2508 output from the laser diode. The laser beam output excites a phosphor 2506 positioned in front of the output laser facet. The phosphor 2506 is attached to the submount 2501 on a ledge 2507A or recessed region. The electrodes 2503 and 2504 are configured for an electrical connection to an external power source such as a laser driver, a current source, or a voltage source. Wirebonds can be formed on the electrodes to couple the power to the laser diode device to generate an emission beam from the laser diode 308. The emission beam 2508 is configured to excite the phosphor 2506 on a side surface, wherein the white light or wavelength converted light 2509 is emitted from at least the top surface of the phosphor 2506. In the embodiment the top surface of the phosphor 2506 is configured for a reduced reflectivity to promote light emission, which could be configured with an optical coating, a roughening, or another treatment. The sides of the phosphor 2506 may also be configured to contribute to light emission, but may preferably be coated or treated to reflect or contain the light within the phosphor to promote top surface emission. Of course this is merely an example of a configuration and there could be many variants on this embodiment including but not limited to different shape phosphors such as cubes, triangles, or other multi-sided geometries, different geometrical designs of the submount or common support member, different orientations of the laser output beam with respect to the phosphor, different electrode and electrical designs, and others.

Figure 24B:
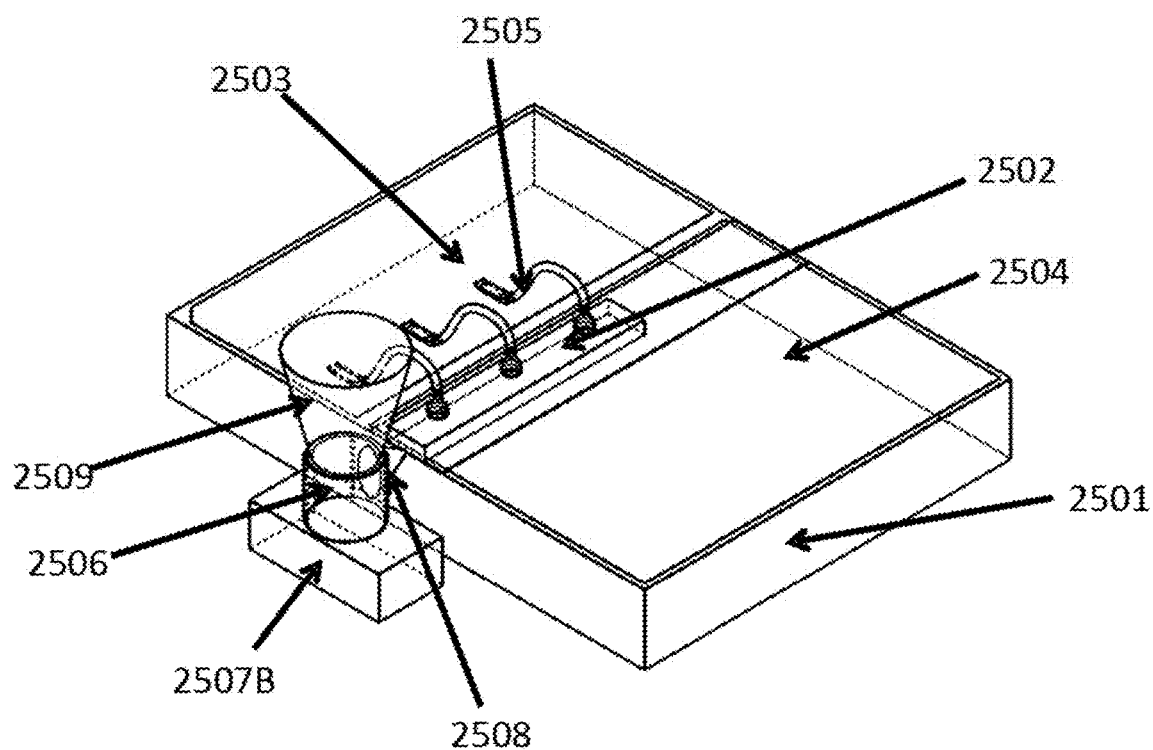
FIG. 24B is a simplified diagram illustrating an integrated laser-based white light source with a laser diode and phosphor member integrated onto a submount wherein the laser is primarily exciting or pumping the phosphor member from a side surface of the phosphor according to an embodiment of the present invention.

FIG. 24B presents a schematic diagram illustrating a side-pumped phosphor in an alternative embodiment of an integrated laser-phosphor white light source including a phosphor with a 3-dimensional geometrical design to provide a point source of light according to the present invention. The laser based white light device is comprised of submount material 2501 that serves as a support member configured to act as an intermediate material between a laser diode chip 2502 and a final mounting surface such as the surface of a package member. The submount 2501 is configured with electrodes 2503 and 2504 that may be formed with deposited metal layers such as Au. In one example, Ti/Pt/Au is used for the electrodes. In this example, the laser diode chip 2502 is mounted with the p-side down and wirebonds 2505 are configured from the n-side of the chip 2502 to the submount 2501. Electrical power provided to electrodes 2503 and 2504 on the submount supply current to the laser diode 2502 to generate a laser beam 2508 output from the laser diode 2502. The laser beam 2508 excites a phosphor 2506 positioned in front of the output laser facet and mounted on a submount 2501 or support member 2507B. The support member 2507B acts as an intermediate material between a laser diode 2502 and a final mounting surface such as the surface of a package member. The electrodes 2503 and 2504 are configured for an electrical connection to an external power source such as a laser driver, a current source, or a voltage source. Wirebonds 2505 can be formed on the electrodes to couple the power to the laser diode device to generate an emission beam from the laser diode 2502. The emission beam 2508 is configured to excite the phosphor 2506 on a side surface, wherein the white light or wavelength converted light 2509 is emitted from at least the top surface of the phosphor 2506. In a preferred embodiment the top surface is configured for a reduced reflectivity to promote light emission, which could be configured with an optical coating, a roughening, or another treatment. In a preferred embodiment the sides of the phosphor 2506 may be configured to contain the light and promote primary emission from the top surface. In alternative embodiments, the phosphor can be configured to contribute to light emission, but may preferably be coated or treated to reflect or contain the light within the phosphor to promote top surface emission. Of course this is merely an example of a configuration and there could be many variants on this embodiment including but not limited to different shape phosphors such as cubes, triangles, or other multi-sided geometries, different geometrical designs of the submount or common support member, different orientations of the laser output beam with respect to the phosphor, different electrode and electrical designs, and others.

In other variations, the support member can be used to manipulate the light in the integrated white light source. In one example, an optically transparent support member could serve as a waveguide for the laser light to reach the phosphor. In another example, an optically transparent support member can be configured to transmit the laser light to the phosphor member. In other examples of this variation wherein the support member manipulates the light, the support member can be shaped or configured to form reflectors, mirrors, diffusers, lenses, absorbers, or other members to manipulate the light. In another variation, the support member could also serve as a protective safety measure to ensure that no direct emitting laser light is exposed as it travels to reach the phosphor. Such point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics or reflector assembly are applied to a large point source, the optical control and collimation is diminished.

In another specific preferred embodiment of the CPoS white light source, the present invention is configured for a reflective mode phosphor operation. In one example the excitation laser beam enters the phosphor through the same primary surface as the useful white light is emitted from. That is, operated in reflective mode the phosphor could have a first primary surface configured for both receiving the incident excitation laser beam and emitting useful white light. In this configuration, the phosphor is positioned in front of the laser facet that outputs the laser beam, wherein both the laser and the phosphor are configured on a support member. The gallium and nitrogen containing laser diode is configured with a cavity that has a length greater than 100 µm, greater than 500 µm, greater than 1000 µm, or greater than 1500 µm long and a width greater than 1 µm, greater than 10 µm, greater than 20 µm, greater than 30 µm, or greater than 45 µm. The cavity is configured with a front facets and back facet on the end wherein the front facet comprises the output facet and emits the laser beam incident on the phosphor. The front facet can be configured with an anti-reflective coating to decrease the reflectivity or no coating at all thereby allowing radiation to pass through the mirror without excessive reflectivity. In some cases the coating may be configured to slightly increase the reflectivity. Since no laser beam is to be emitted from the back end of the cavity member, the back facet or mirror is configured to reflect the radiation back into the cavity. For example, the back facet includes highly reflective coating with a reflectivity greater than 85% or 95%. In one example, the phosphor can be comprised of Ce doped YAG and emits yellow emission. The phosphor may be a ceramic phosphor and could be a single crystal phosphor. The phosphor is preferably shaped as a substantially flat member such as a plate or a sheet with a shape such as a square, rectangle, polygon, circle, or ellipse, and is characterized by a thickness. In a preferred embodiment the length, width, and or diameter dimensions of the large surface area of the phosphor are larger than the thickness of the phosphor. For example, the diameter, length, and/or width dimensions may be 2× greater than the thickness, 5× greater than the thickness, 10× greater than the thickness, or 50× greater than the thickness. Specifically, the phosphor plate may be configured as a circle with a diameter of greater than 50 µm, greater than 100 µm, greater than 200 µm, greater than 500 µm, greater than 1 mm, or greater than 10 mm and a thickness of less than 500 µm, less than 200 µm, less than 100 µm or less than 50 µm. A key benefit to a reflective mode phosphor is the ability to configure it for excellent heat dissipation since the backside of surface of the phosphor can be directly heat-sunk to the common support member or intermediate submount member. Since the phosphor is preferably thin, the thermal path is short and can rapidly travel to the support member. In alternative or the same embodiments a YAG:CE can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

In one example of the reflective mode CPoS white light source embodiment of this invention optical coatings, material selections, or special design considerations are taken to improve the efficiency by maximizing the amount of light exiting the primary surface of the phosphor. In one example, the backside of the phosphor may be coated with reflective layers or have reflective materials positioned on the back surface of the phosphor adjacent to the primary emission surface. The reflective layers, coatings, or materials help to reflect the light that hits the back surface of the phosphor such that the light will bounce and exit through the primary surface where the useful light is captured. In one example, a coating configured to increase the reflectivity for yellow light and blue light is applied to the phosphor prior to attaching the phosphor to the common support member. Such coatings could be comprised of metal layers such as silver or aluminum, or others such as gold, which would offer good thermal conductivity and good reflectance or could be comprised of dielectric layers configured as single layers, multi layers, or DBR stacks, but could be others. In another example, a reflective material is used as a bonding medium that attaches the phosphor to the support member or to an intermediate submount member. Examples of reflective materials include reflective solders like AuSn, SnAgC (SAC), or Pb containing phosphors, or reflective glues, but could be others. With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders, Pb containing solders, indium, and other solders. In an alternative approach sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, aluminum, SiC, sapphire, AlN, or other metals, ceramics, or semiconductors. The reflective mode white light source apparatus has a form factor characterized by a length, a width, and a height. In an example, the height is characterized by a dimension of less than 25 mm and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

The reflective mode CPoS white light source embodiment of this invention is configured with the phosphor member attached to the common support member with the large primary surface configured for receiving laser excitation light and emitting useful white light positioned at an angle normal (about 90 degrees) or off-normal (about 0 degrees to about 89 degrees) to the axis of the laser diode output beam functioning to excite the phosphor. That is, the laser output beam is pointing toward the phosphor's emission surface at an angle of between 0 and 90 degrees, wherein 90 degrees (orthogonal) is considered normal incidence. The inherent geometry of this configuration wherein the laser beam is directed away from or in an opposite direction that the useful white light will exit the phosphor toward the outside world is ideal for safety. As a result of this geometry, if the phosphor get damaged or removed during operation or from tampering, the laser beam would not be directed to the outside world where it could be harmful. Instead, the laser beam would be incident on the backing surface where the phosphor was attached. With proper design of this backing surface the laser beam can be scattered, absorbed, or directed away from the outside world instead of exiting the white light source and into the surrounding environment.

In one embodiment of this reflective mode CPoS white light source the laser beam is configured normal to the primary phosphor emission surface. In this configuration the laser diode would be positioned in front of the primary emission surface of the phosphor where it could impede the useful white light emitted from the phosphor. This could create losses in or inefficiencies of the white light device and would lead to difficulty in efficiently capturing all white light emitted from the phosphor. Such optics and reflectors include, but are not limited to aspheric lenses or parabolic reflectors. To overcome the challenges of normal incident reflective mode phosphor excitation, in a preferable embodiment the laser beam would be configured with an incident angle that is off-axis to the phosphor such that it hits the phosphor surface at an angle of between 0 and 89 degrees or at a "grazing" angle. In this preferable embodiment the laser diode device is positioned adjacent to or to the side of the phosphor instead of in front of the phosphor where it will not substantially block or impede the emitted white light, and importantly, allow for optics such as collimating lenses or reflectors to access the useful light and project it to the application. Additionally, in this configuration the built in safety feature is more optimal than in the normal incidence configuration since when incident at an angle in the case of phosphor damage or removal the incident laser beam would not reflect directly off the back surface of the support member where the phosphor was attached. By hitting the surface at an off-angle or a grazing angle any potential reflected components of the beam can be directed to stay within the apparatus and not exit the outside environment where it can be a hazard to human beings, animals, and the environment.

In some configurations the top primary surface of the phosphor wherein the laser excitation beam is incident is configured for a reduced reflectivity to the blue or violet excitation beam wavelength and/or the phosphor emission wavelength such as a yellow wavelength. The reduced reflectivity can be achieved with an optical coating of the phosphor using dielectric layers, a shaping of the phosphor surface, and/or roughening of the phosphor surface, or other techniques. In some examples the laser beam incident angle is configured at or near Brewster's angle, wherein the light with a particular polarization is perfectly transmitted through the primary surface of the phosphor. Due to the divergence of the laser resulting in a variation of incident angles for the plane waves within the beam a perfect transmission may be challenging, but ideally a substantial fraction of the light incident on the phosphor could be at or near Brewster's angle. For example, a YAG or LuAG phosphor may have a refractive index of about 1.8 in the violet and blue wavelength range. With the Brewster angle, $\theta_B$, given as arctan $(n_2/n_1)$, where $n_1$ is the index of air and $n_2$ is the index of the phosphor, would be about 61 degrees [or about 55 to 65 degrees], off of the axis of normal incidence. Or alternatively, about 29 degrees [or about 25 to 35 degrees] rotated from the axis parallel to the phosphor surface.

Figure 25:
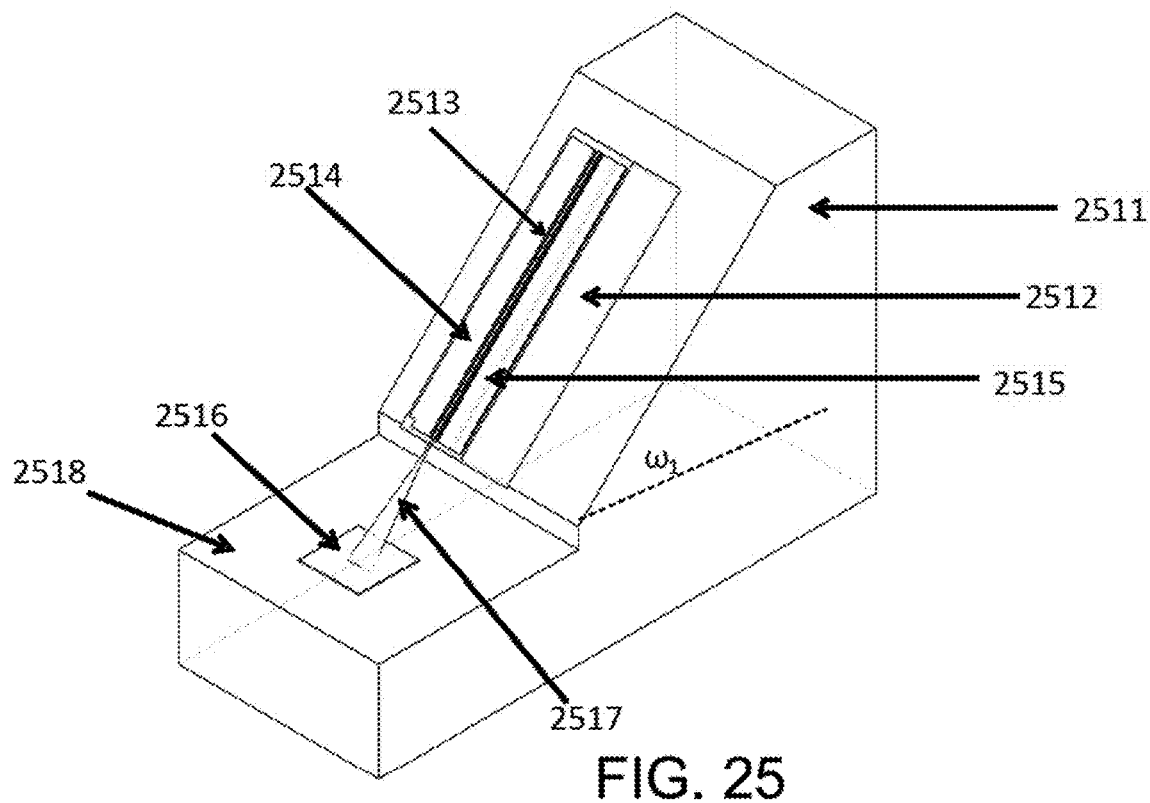
FIG. 25 is a simplified diagram illustrating an integrated laser-based white light source with a laser diode and phosphor member integrated onto a common support member wherein the phosphor is configured for reflective operation and the laser beam has an off-normal incidence to the phosphor according to an embodiment of the present invention.

FIG. 25 presents a schematic diagram illustrating an off-axis reflective mode embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based CPoS white light device is comprised of a common support member 2511 that serves as the common support member configured to act as an intermediate material between a laser diode or laser diode CoS 2512 formed in transferred gallium and nitrogen containing epitaxial layers 2513 and a final mounting surface and as an intermediate material between the phosphor plate material 2616 and a final mounting surface. The laser diode or CoS 2512 is configured with electrodes 2514 and 2515 that may be formed with deposited metal layers and combination of metal layers including, but not limited to Au, Pd, Pt, Ni, Al, titanium, or others. A laser beam 2517 excites a phosphor plate 2516 positioned in front of the output laser facet. The phosphor plate 2516 is attached to the common support member on a flat surface 2518. The electrodes 2514 and 2515 are configured for an electrical connection to an external power source such as a laser driver, a current source, or a voltage source. Wirebonds can be formed on the electrodes to couple electrical power to the laser diode device 2512 to generate the laser beam 2517 output from the laser diode and incident on the phosphor 2516. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

Figure 25A:
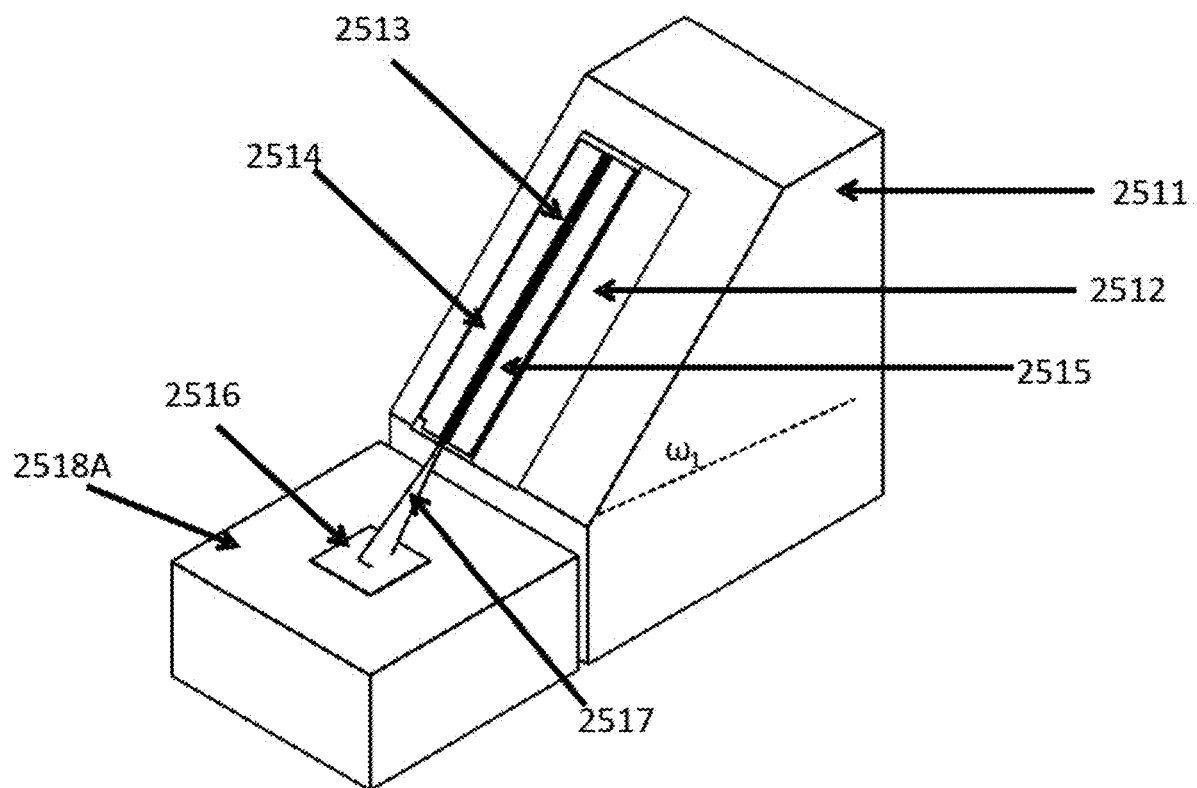
FIG. 25A is a simplified diagram illustrating an integrated laser-based white light source with a laser diode and phosphor member configured to be integrated onto a common support member such as a package member wherein the phosphor is configured for reflective operation and the laser beam has an off-normal incidence to the phosphor according to an embodiment of the present invention.

FIG. 25A presents a schematic diagram illustrating an off-axis reflective mode embodiment of an integrated laser-phosphor white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based white light device is comprised of a support member 2511 that serves as the support member for the laser diode CoS 2512 formed in transferred gallium and nitrogen containing epitaxial layers 2513. The phosphor material 2516 is mounted on a separate support member 2518A wherein the support members 2511 and 2518 would be attached to a common support member (not shown) such as a surface in a package member such as a surface mount package. The laser diode or CoS 2512 is configured with electrodes 2514 and 2515 that may be formed with deposited metal layers and combination of metal layers including, but not limited to Au, Pd, Pt, Ni, Al, Ag titanium, or others such as transparent conductive oxides such as indium tin oxide. A laser beam 2517 excites the phosphor material 2516 positioned in front of the output laser facet. The electrodes 2514 and 2515 are configured for an electrical connection to an external power source such as a laser driver, a current source, or a voltage source. Wirebonds can be formed on the electrodes to couple electrical power to the laser diode device 2512 to generate the laser beam 2517 output from the laser diode and incident on the phosphor 2516. Of course this is merely an example of a configuration and there could be many variants on this embodiment including but not limited to different shape phosphors, different geometrical designs of the submount, support members, different orientations of the laser output beam with respect to the phosphor, different electrode and electrical designs, and others.

The inherent divergence properties typical edge-emitting diode laser output beams leads to the beam expanding in both the x-direction (slow divergence axis) and y-direction (fast divergence axis) as it propagates in free/unguided space. Complicating matters is the different divergence rates of the beam on the fast and slow axis resulting from the waveguide confinement characteristics in the laser diode. For example, typical full width at half maximum (FWHM) beam divergences range from about 5-20 degrees in the slow axis and 10 to 40 degrees in the fast axis, but can be others. Another measure of divergence of the laser beam is the divergence angles taken at the point in the output beam where the power has dropped to the 1/e2 level. For this 1/e2 measure, typical beam divergences range from about 10-30 degrees in the slow axis and 20 to 80 degrees in the fast axis, but can be others. Thus, the ratio of the fast axis to slow axis divergence angles range from about 2:1 to about 4:1. The resulting projected spot from a free-space/unguided laser beam is an elliptical shape, typically with the fast axis diameter being greater than the slow axis diameter. For a laser beam configured for off-axis incidence in the fast direction as shown in FIG. 25 the elliptical nature of the beam would be exacerbated since the angle would increase the fast axis diameter D1 as shown in FIG. 18.

In one embodiment of the present invention, the elliptical nature of the beam from the beam divergence and off-axis laser beam excitation incidence would be mitigating using a beam shaping optic such as a collimating optic. This optic would be positioned between the laser diode and the phosphor to shape and/or collimate the laser output beam prior to incidence with the phosphor. By placing a free space optic in front of the output laser beam the beam shape can be shaped to provide a circular beam profile and collimated such that the phosphor can be positioned at a distance in front of the facet with a large tolerance and maintain a relatively constant spot size. In one example an aspheric lens is used to collimate and/or shape the laser beam. In an alternative embodiment, the laser beam is collimated using fast axis collimating (FAC) and/or slow axis collimating (SAC) lenses. In alternative embodiments, other optics can be included in various combinations for the shaping, collimating, directing, filtering, or manipulating of the optical beam. Examples of such optics include, but are not limited to ball lenses, aspheric collimator, dichroic mirrors, turning mirrors, optical isolators, but could be others.

Figure 26:
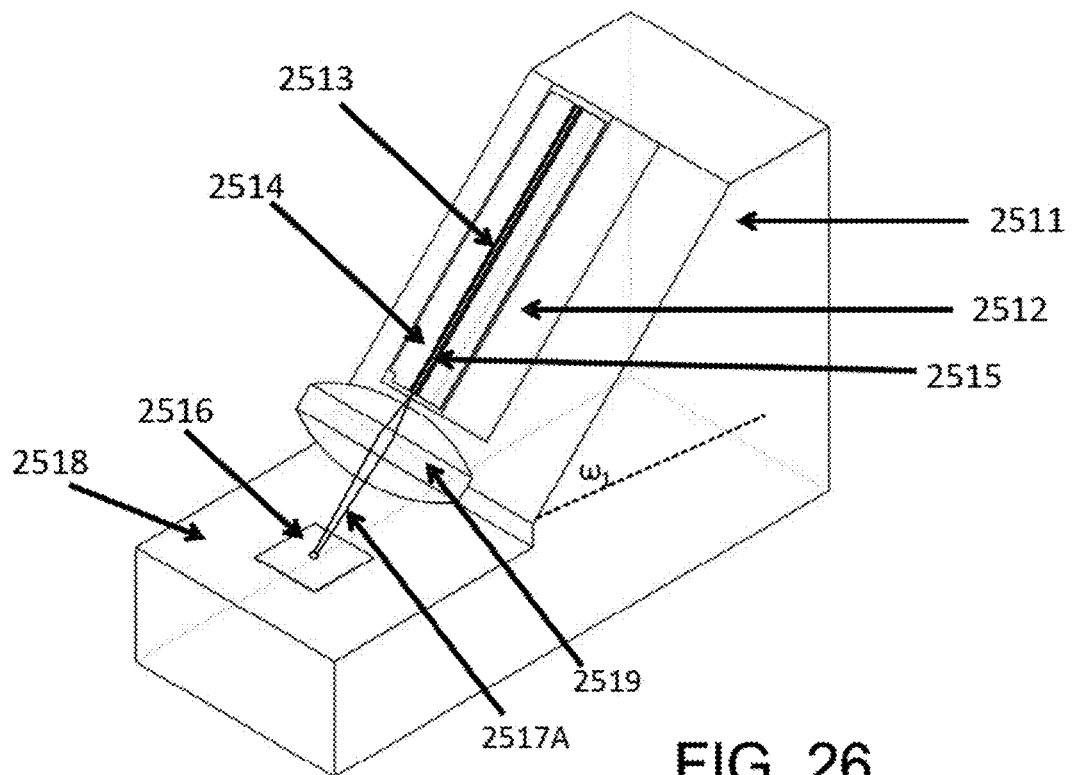
FIG. 26 is a simplified diagram illustrating an integrated laser-based white light source with a laser diode and phosphor member integrated onto a common support member wherein the phosphor is configured for off-axis reflective operation and the laser beam is configured with a collimating or shaping optic according to an embodiment of the present invention.

FIG. 26 presents a schematic diagram illustrating an off-axis reflective mode embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based CPoS white light device is comprised of a common support member 2511 that serves as the common support member configured to act as an intermediate material between a laser diode or laser diode CoS 2512 formed in transferred gallium and nitrogen containing epitaxial layers 2513 and a final mounting surface and as an intermediate material between the phosphor plate material 2516 and a final mounting surface. The laser diode or CoS 2512 is configured with electrodes 2514 and 2515 that may be formed with deposited metal layers and combination of metal layers including, but not limited to Au, Pd, Pt, Ni, Al, titanium, or others. A laser beam 2517A is passed through an aspheric lens 2519 for beam shaping and/or collimating prior to incidence on a phosphor plate 2516. The phosphor plate 2516 is attached to the common support member on a surface 2518. The electrodes 2514 and 2515 are configured for an electrical connection to an external power source such as a laser driver, a current source, or a voltage source. Wirebonds can be formed on the electrodes to couple electrical power to the laser diode device to generate the laser beam 2517A output from the laser diode 2512 and incident on the phosphor 2516. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In an alternative preferred off-axis reflective mode embodiment, beam shaping can be achieved by rotating the laser beam with respect to the tilted phosphor excitation surface. By rotating the laser about the axis of the beam emission, the phosphor tilt will shift from increasing the fast axis beam diameter to the increasing the slow axis beam diameter, and hence, compensate for the slower diverging slow axis beam axis diameter and make for a more circular beam. This dual-axis tilting or rotation embodiment of "optics-less" beam shaping is advantageous over embodiments where optical elements are introduced for beam shaping and collimation. The advantages of this embodiment for the white light source apparatus include a simplified design, a lower cost bill of materials, a lower cost assembly process, and potentially a more compact white light source. In one embodiment, the incident angle from the laser to the phosphor is optimized to achieve a desired beam shape on the phosphor.

In some configurations the top primary surface of the phosphor wherein the laser excitation beam is incident is configured for a reduced reflectivity to the blue or violet excitation beam wavelength and/or the phosphor emission wavelength such as a yellow wavelength. The reduced reflectivity can be achieved with an optical coating of the phosphor using dielectric layers, a shaping of the phosphor surface, and roughening of the phosphor surface, or other techniques. In some examples the laser beam incident angle is configured at or near Brewster's angle, wherein the light with a particular polarization is perfectly transmitted through the primary surface of the phosphor. Due to the divergence of the laser resulting in a variation of incident angles for the plane waves within the beam a perfect transmission may be challenging, but ideally a substantial fraction of the light incident on the phosphor could be at or near Brewster's angle. For example, a YAG or LuAG phosphor may have a refractive index of about 1.8 in the violet and blue wavelength range. With the Brewster angle, $\theta_B$, given as arctan $(n_2/n_1)$, where $n_1$ is the index of air and $n_2$ is the index of the phosphor, would be about 61 degrees [or about 55 to 65 degrees], off of the axis of normal incidence. Or alternatively, about 29 degrees [or about 25 to 35 degrees] rotated from the axis parallel to the phosphor surface.

As discussed for the example of FIG. 16, by positioning the phosphor about 70 μm away from the laser aperture a relative uniform beam can be realized with about a 50 μm diameter. In addition to controlling the distance of the laser from the phosphor, the incident angle of the laser beam can also be used to control the shape of the beam incident on the phosphor. As an example, FIG. 18 shows the effect on the spot size when the phosphor or projection surface is tilted with respect to the fast axis. By tilting along this axis a larger fast axis diameter D1 is generated on the phosphor such that the beam spot becomes more elliptical. By the same principle, as illustrated in FIG. 19, when rotating the phosphor or projection surface about the slow axis, the slow axis diameter D2 can be increased such that the spot diameter ratio becomes closer to 1 and the beam becomes more circular.

Figure 27:
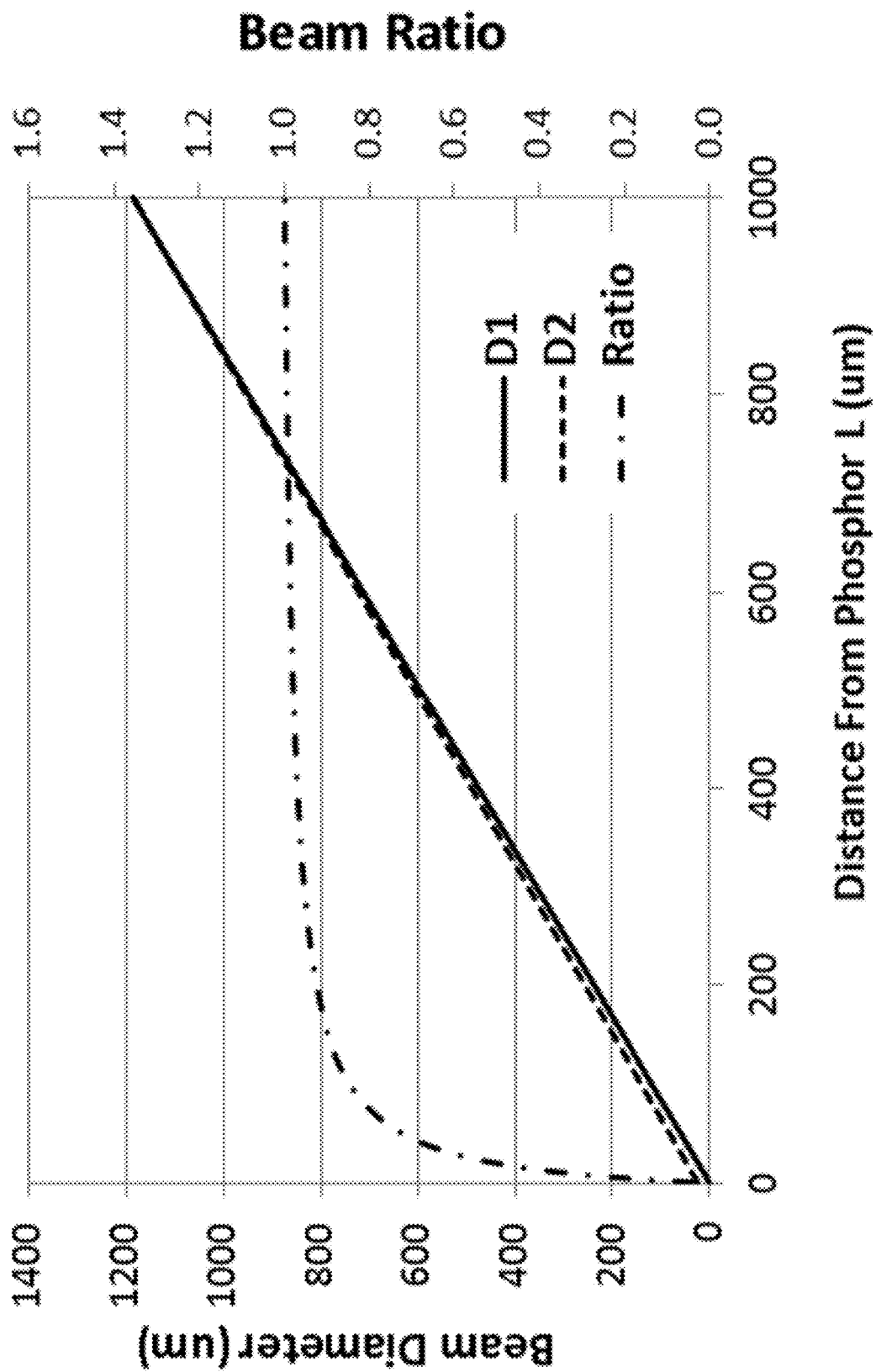
FIG. 27 is a plot illustrating an example calculation of the elliptical beam diameters and ratio of beam diameters versus emitter distance from phosphor tilted at an angle of 45 degrees with respect to the fast axis and 22 degrees with respect to the slow axis for a reflective phosphor operation according to an embodiment of the present invention.

For a given phosphor tilt ($\omega_1$) with respect to the fast axis, the rotation of the laser beam spot ($\omega_2$) can be optimized to realize a more circular beam shape on the phosphor. As an example, FIG. 27 presents a plot of the fast axis spot diameter, D1, the slow axis spot diameter, D2, and the ratio of the fast to slow spot diameters for a varied distance L from the laser aperture assuming a phosphor tilt angle ($\omega_1$) of 45 degrees with respect to the fast axis and a laser rotation ($\omega_2$) of 22 degrees to tilt the beam with respect to the slow axis. The example calculation of FIG. 27 assumes a 1/e2 fast axis divergence of 40 degrees, a 1/e2 slow axis divergence of 20 degrees, an aperture width of 25 μm, and an aperture height of 1 μm. As seen in the figure for this example, for projection surfaces such as the phosphor the beam ratio rapidly approaches 1 at a distance L of about 200 μm and saturates to 1 at a distance L of about 800 μm. Thus, in this example, a beam with a diameter ratio of about 1 can be achieve for a distance L of 200 μm and greater where a desired spot size with a diameter of 200 μm and greater can be achieved.

Figure 28:
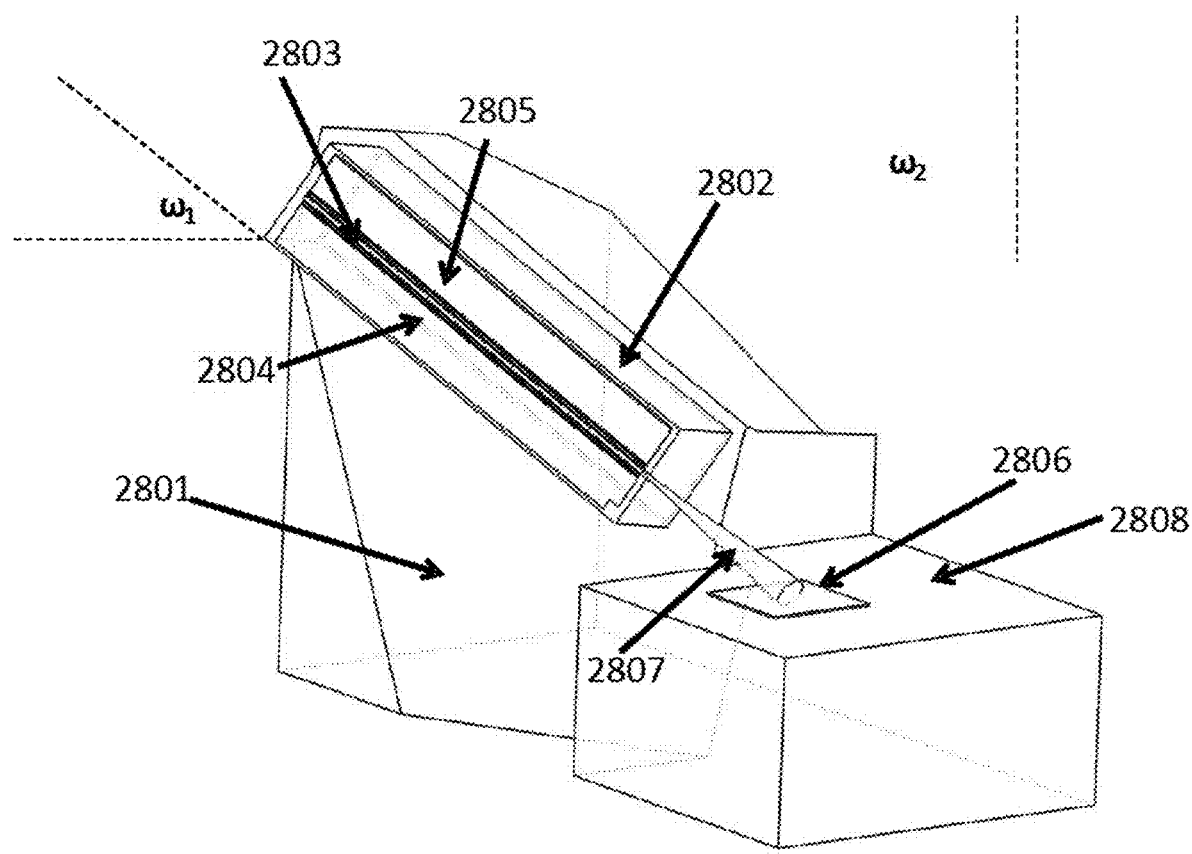
FIG. 28 is a simplified diagram illustrating an integrated laser-based white light source with a laser diode and phosphor member integrated onto a common support member wherein the phosphor is configured for reflective operation and the laser beam has a dual axis rotation with respect to the phosphor for an off-normal incidence to the phosphor with respect to both the slow and fast axis according to an embodiment of the present invention.

FIG. 28 presents a schematic diagram illustrating an off-axis reflective mode embodiment of a CPoS integrated white light source with a laser rotation according to the present invention. In this embodiment the gallium and nitrogen containing lift-off and transfer technique is deployed to fabricate a very small and compact submount member with the laser diode chip formed from transferred epitaxy layers. In this example the phosphor is tilted with respect to the fast axis of the laser beam at an angle $\omega_1$ and the laser is rotated at an angle $\omega_1$ with respect to the slow axis. The laser based CPoS white light device is comprised of a common support member 2801 that serves as the common support member configured to act as an intermediate material between a laser diode or laser diode CoS 2802 formed in transferred gallium and nitrogen containing epitaxial layers 2803 and a final mounting surface and as an intermediate material between the phosphor plate material 2806 and a final mounting surface. The laser diode or CoS is configured with electrodes 2804 and 2805 that may be formed with deposited metal layers and combination of metal layers including, but not limited to Au, Pd, Pt, Ni, Al, titanium, or others. A laser beam 2807 excites a phosphor plate 2806 positioned in front of the output laser facet. The phosphor plate 2806 is attached to the common support member on a surface 2808. The electrodes 2804 and 2805 are configured for an electrical connection to an external power source such as a laser driver, a current source, or a voltage source. Wirebonds can be formed on the electrodes to couple electrical power to the laser diode device to generate the laser beam 2807 output from the laser diode 2802 and incident on the phosphor 2806. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In some embodiments according to the present invention, multiple laser diode sources are configured to be excite the same phosphor or phosphor network. Combining multiple laser sources can offer many potential benefits according to this invention. First, the excitation power can be increased by beam combining to provide a more powerful excitation spit and hence produce a brighter light source. In some embodiments, separate individual laser chips are configured within the laser-phosphor light source. By including multiple lasers emitting 1 W, 2 W, 3 W, 4 W, 5 W or more power each, the excitation power can be increased and hence the source brightness would be increased. For example, by including two 3 W lasers exciting the same phosphor area, the excitation power can be increased to 6 W for double the white light brightness. In an example where about 200 lumens of white are generated per 1 watt of laser excitation power, the white light output would be increased from 600 lumens to 1200 lumens. For example, in some embodiments a single laser diode operating with 3-4 W output power may enable at least a 500 lumen white light source. By adding a second 3-4 W laser diode the light output could be increased to at least a 1,000 lumen white light source or by adding a second, third, and fourth 3-4 W laser diode the light output of the white light source could be increased to at least 2,000 lumens. Similarly, the reliability of the source can be increased by using multiple sources at lower drive conditions to achieve the same excitation power as a single source driven at more harsh conditions such as higher current and voltage.

A second advantage to having two or more laser diode excitation beams incident on the phosphor is for spot shaping to get a more desirable spot geometry, such as a more circular spot. In one example, separate individual laser chips or CoS devices are configured within the light source such that the beams are rotated with respect to each other and the fast-axis of a first beam is rotated to the fast axis of the second beam such as being rotated by about 90 degrees. That is, by positioning multiple laser chips in a predetermined configuration, multiple excitation beams can be overlapped on the phosphor spot to create a more ideal spot geometry.

A third and important advantage is that multiple color lasers in a emitting device can significantly improve color quality (CRI and CQS) by improving the fill of the spectra in the violet/blue and cyan region of the visible spectrum. For example, two or more blue excitation lasers with slightly detuned wavelengths (e.g. 5 nm 10 nm, 15 nm, etc.) can be included to excite a yellow phosphor and create a larger blue spectrum. As compared with an LED based white source which has a blue emission of around 20-30 nm FWHM, a blue laser source may only have a 1 nm or 2 nm FWHM. A similarly color targeted laser based white is deficit in CRI by approximately 5-10 pts due to this narrow emission of the single laser. By adding a second, third, nth laser of different emission wavelength than the first, these empty regions of the power spectrum can be filled and improved color quality can be obtained.

Choice of wavelength for the emitters is dictated by the desired final spectrum and color quality to be achieved. Violet light, though not contributing to visible color quality, has the ability to fluoresce the materials in the world around us, thereby making them slightly glow relative to their environment under near UV stimulation. This additive color benefit can be incorporated into laser plus phosphor devices simply by the addition of a near UV (400-430 nm) laser to provide sufficient violet light in the final light spectrum emitted by the device.

Aside from improving color quality, the replacement of spectral components with narrower spectral components provide improved overall Luminous efficacy of the power spectrum and higher power efficiency for the device. An example of this would be to replace a green or yellow phosphor which has large FWHM (80-100 nm) with a suitable LED or laser device with a lower FWHM (LED~20 nm, Laser, ~1 nm). A real world example of this improvement can be seen today in the use of AlInGaP Red LEDs (20 nm FWHM) to replace Red phosphors (90 nm FWHM). Due to the Luminous efficacy improvement, the overall device performance is much higher for the Red LED based spectra, than the comparable Red Phosphor spectra.

In several embodiments according to the present invention, the laser based integrated white light sources is configured as a high CRI white light source with a CRI over 70, over 80, or over 90. In these embodiments, multiple phosphor are used in the form of a mixed power phosphor composition or multiple phosphor plate configuration or others. Examples of such phosphors include, but are not limited to YAG, LuAG, red nitrides, aluminates, oxynitrides, $CaMgSi_2O_6:Eu^{2+}$, $BAM:Eu^{2+}$, $AlN:Eu^{2+}$, $(Sr,Ca)_3MgSi_2O_8:Eu^{2+}$, and JEM.

Figure 28A:
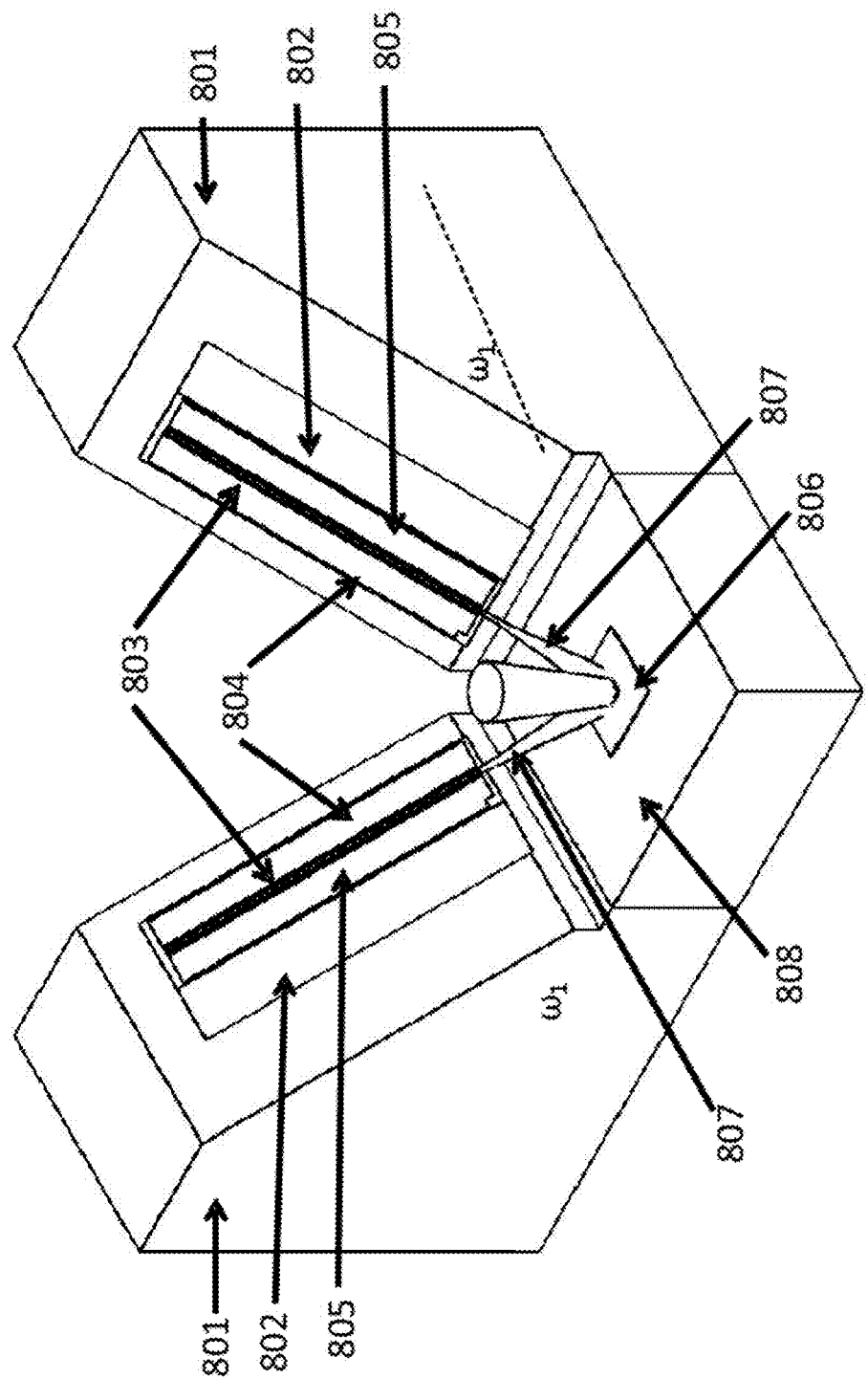
FIG. 28A is a simplified diagram illustrating an integrated laser-based white light source with two laser diode devices and a phosphor member configured to be integrated onto a common support member such as a package member wherein the phosphor is configured for reflective operation and the two output beams of the laser diodes modify the excitation spot geometry and/or increase the total power in the laser emission spot.

In some configurations of the high CRI embodiments of the integrated laser based white light source a blue laser diode excitation source operating in the wavelength range of 430 nm to 470 nm is used to excite;
1) Yellow phosphor+red phosphor, or
2) Green phosphor+red phosphor, or
3) Cyan phosphor+orange phosphor, or
4) Cyan phosphor+orange phosphor+red phosphor, or
5) Cyan phosphor+yellow phosphor+red phosphor, or
6) Cyan phosphor+green phosphor+red phosphor In some alternative configurations of the high CRI embodiments of the integrated laser based white light source a violet laser diode excitation source operating in the wavelength range of 390 nm to 430 nm is used to excite;
1) Blue phosphor+yellow phosphor+red phosphor, or
2) Blue phosphor+green phosphor+red phosphor, or
3) Blue phosphor+cyan phosphor+orange phosphor, or
4) Blue phosphor+cyan phosphor+orange phosphor+red phosphor, or
5) Blue phosphor+cyan phosphor+yellow phosphor+red phosphor, or
6) Blue phosphor+cyan phosphor+green phosphor+red phosphor FIG. 28A presents a schematic diagram illustrating an off-axis reflective mode phosphor with two laser diode devices embodiment of an integrated laser-phosphor white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based white light sources is comprised of two or more laser diodes including support members 801 that serves as the support member for the two laser diodes 802 formed in transferred gallium and nitrogen containing epitaxial layers 803. The phosphor material 806 is mounted on a support member 808 wherein the support members 801 and 808 would be attached to a common support member such as a surface in a package member such as a surface mount package. The laser diodes or CoS devices 802 are configured with electrodes 804 and 805 that may be formed with deposited metal layers and combination of metal layers including, but not limited to Au, Pd, Pt, Ni, Al, Ag titanium, or others such as transparent conductive oxides such as indium tin oxide. The multiple laser beams 807 excite the phosphor material 806 positioned in front of the output laser facet. In a preferred embodiment according to FIG. 28A the laser diode excitation beams 807 are rotated with respect to each other such that the fast axis of the first beam is aligned with the slow axis of the second beam to form a more circular excitation spot. The electrodes 804 and 805 are configured for an electrical connection to an external power source such as a laser driver, a current source, or a voltage source. Wirebonds can be formed on the electrodes to couple electrical power to the laser diode device to generate the multiple laser beams 807 incident on the phosphor 806. Of course this is merely an example of a configuration and there could be many variants on this embodiment including but not limited to more than two laser diodes such as three of four laser diodes, different shape phosphors, different geometrical designs of the submount, support members, different orientations of the laser output beam with respect to the phosphor, wiring the laser diodes in series or parallel, different electrode and electrical designs including individually addressable lasers, and others.

In another example of a multiple laser embodiment according to the present invention, two or more laser stripes are formed on a single laser chip or submount to form a multi-stripe or multi laser configuration. This example can offer all the same benefits of that previously described for multiple individual lasers, but can improve the spot geometry in a slightly different way. By positioning multiple laser stripes adjacent to each other in the horizontal or slow-axis direction spaced by a predetermined dimension, the resulting excitation spot on the phosphor from the laser beams emitted from the multiple laser stripes can be substantially more circular than the elliptical excitation spot resulting from a single emitter. That is, the laser beams from the adjacent laser stripes would be overlapping in the horizontal direction according to a design such that the excitation spot width would be increased in the slow axis direction. Since in typical configurations the laser excitation beam will be much larger in the vertical or fast axis divergence direction by enlarging the spot in the horizontal direction the beam will become more circular. In one embodiment of this configuration laser diodes with multiple adjacent laser stripes, multi-stripe lasers are included in the integrated white light source. The multiple stripes can enable an increased excitation power for a brighter light source and/or an improved or modified spot pattern on the phosphor.

Figure 28B:
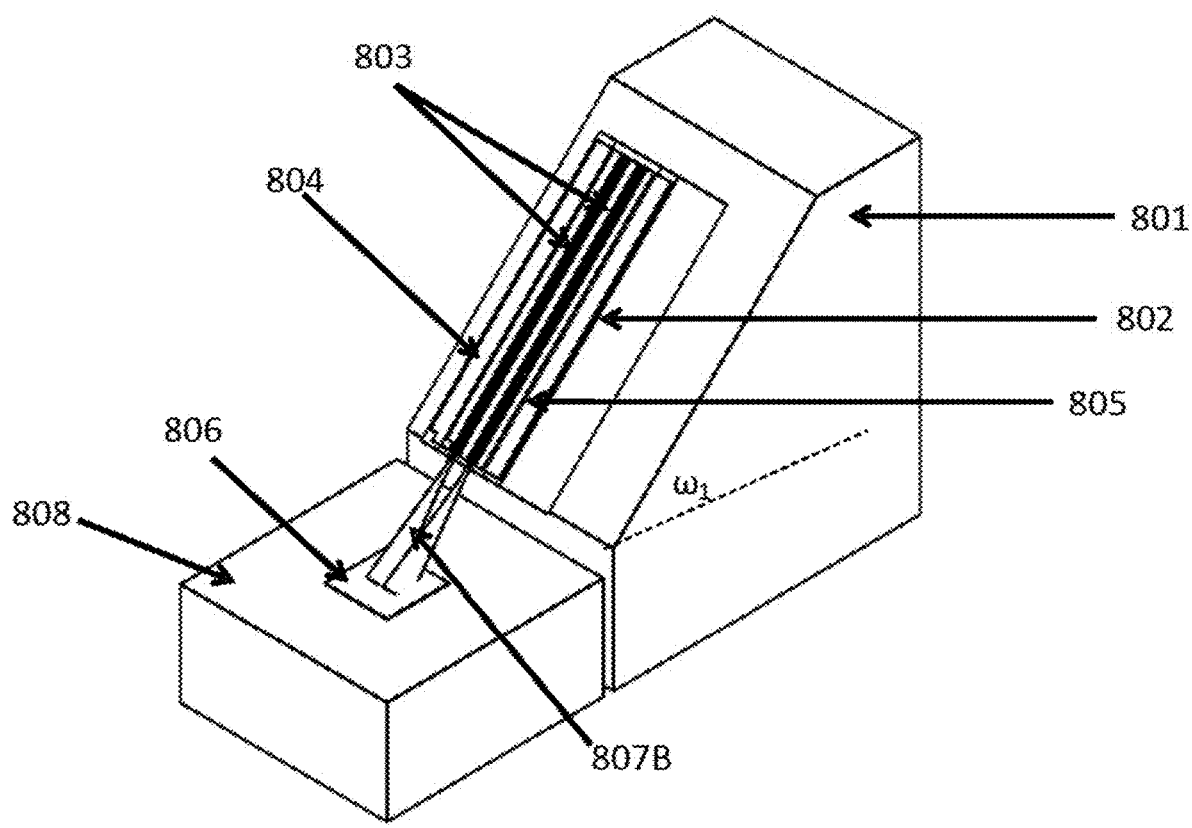
FIG. 28B is a simplified diagram illustrating an integrated laser-based white light source with a laser diode device and phosphor member configured to be integrated onto a common support member such as a package member wherein the phosphor is configured for reflective operation and the laser diode device is configured as a multi-stripe laser diode with multiple adjacent output stripes emitting beams to increase the spot diameter in the slow axis direction and/or increase the total power in the laser emission spot.

FIG. 28B presents a schematic diagram illustrating an off-axis reflective mode phosphor with dual stripe laser diode embodiment of an integrated laser-phosphor white light source according to the present invention. In this embodiment the gallium and nitrogen containing lift-off and transfer technique is deployed to fabricate a very small and compact submount member with the laser diode chip formed from transferred epitaxy layers. Of course there could be other embodiments such as conventional laser diode devices or laser on submounts. Further, in this example the phosphor is tilted with respect to the fast axis of the laser beam at an angle $\omega_1$. The laser based white light device is comprised of a support member 801 that serves as the support member for the laser diode CoS 802 formed in transferred gallium and nitrogen containing epitaxial layers forming a multiple stripe or dual stripe 803 laser diode configuration. The phosphor material 806 is mounted on a support member 808 wherein the support members 801 and 808 would be attached to a common support member such as a surface in a package member such as a surface mount package. The multiple stripe laser diodes or CoSs 802 are configured with electrodes 804 and 805 that may be formed with deposited metal layers and combination of metal layers including, but not limited to Au, Pd, Pt, Ni, Al, Ag titanium, or others such as transparent conductive oxides such as indium tin oxide. The dual stripe laser diode emits at least two laser beams spaced by a predetermined distance in the lateral or slow axis direction, which functions to increase the width of the excitation spot and make it more circular. The dual beam output emission 807B excites the phosphor material 806 positioned in front of the output laser facet. The electrodes 804 and 805 are configured for an electrical connection to an external power source such as a laser driver, a current source, or a voltage source. Wirebonds can be formed on the multiple adjacent laser beams 807 output from the laser diode and incident on the phosphor 806. Of course this is merely an example of a configuration and there could be many variants on this embodiment including but not limited to more than two emission beams such as 3 or more laser stripes for 3 or more emission beams, different shape phosphors, different geometrical designs of the submount, support members, different orientations of the laser output beam with respect to the phosphor, individually addressable laser stripes to operate the stripes independently, different electrode and electrical designs, and others.

Of course the reflective mode embodiment configurations shown in FIG. 25, FIG. 26, and FIG. 28 are merely just examples and there are a wide range of other arrangements, geometries, and designs. In a specific example, in an alternative embodiment of this dual rotation off-axis laser beam incident configuration the phosphor can be tilted with respect to the slow axis of the laser diode instead of rotating the laser diode as shown in FIG. 28. One benefit to this alternative embodiment would be a simplification of the common support member geometry, which may be easier to manufacture. However, the drawback to this alternative embodiment is that the phosphor would no longer parallel to the horizontal base, which could create difficulties in collecting and collimating the useful white light. In the examples for FIGS. 25, 26, and 28 the phosphor was held at a horizontal orientation and the laser was rotated/tilted to achieve the desired laser incidence configuration. However, this is just an example and in other arrangements the phosphor may be tilted with respect to the horizontal axis.

A consideration for the example in FIG. 28 of the present invention where in the laser diode is rotated about its emission axis is the polarization of the emitted laser beam. Because the phosphor and laser are co-packaged together, the need for an environmentally protective window on the phosphor is eliminated. This results in a high efficiency feature of the design because reflection losses of a window are eliminated. Specifically, by utilizing a highly polarized laser diode with the polarization as stated, substantial losses (i.e. >30%) are eliminated since this is s-polarized incident light onto the phosphor. By co-packaging, we avoid this window and avoid the >30% losses. In designs where the laser and phosphor are not co-packaged, a window on the phosphor is needed, and the laser light coming onto the window would experience substantial reflection of roughly 30% or more. It may be possible to apply anti-reflective coatings on this window, but it would need to be an expensive and complex reflective coating design since the laser light is incoming on the window with a variety of emission angles since the laser light may not be collimated.

In other variations, the support member can be used to manipulate the light in the integrated white light source. In one example, an optically transparent support member could serve as a waveguide for the laser light to reach the phosphor. In another example, an optically transparent support member can be configured to transmit the laser light to the phosphor member. In other examples of this variation wherein the support member manipulates the light, the support member can be shaped or configured to form reflectors, mirrors, diffusers, lenses, absorbers, or other members to manipulate the light. In another variation, the support member could also serve as a protective safety measure to ensure that no direct emitting laser light is exposed as it travels to reach the phosphor. Such point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics or reflector assembly are applied to a large point source, the optical control and collimation is diminished.

In all embodiments of the CPoS white light source final packaging would need to be considered. There are many aspects of the package that should be accounted for such as form factor, cost, functionality, thermal impedance, sealing characteristics, and basic compatibility with the application. Form factor will depend on the application, but in general making the smallest size packaged white source will be desirable. Cost should be minimized in all applications, but in some applications cost will be the most important consideration. In such cases using an off-the-shelf packages produced in high volume may be desirable. Functionality options include direction and properties of the exiting light emission for the application as well as integration of features such as photodetectors, thermistors, or other electronics or optoelectronics. For best performance and lifetime the thermal impedance of the package should be minimized, especially in high power applications.

The package is characterized by a sealing configuration. One example of a sealing configuration includes open environment wherein the white light source is subjected to the ambient conditions. In some embodiment with robust laser diode and phosphor designs intended for open environment operation this embodiment is favorable. As an example, the laser diode chip may be encapsulated in a protective layer to prevent oxidation, chemical reaction, or contamination of the laser diode. In some embodiments the laser is formed from a substantially aluminum free nonpolar or semipolar design wherein the laser diode facet regions are less prone to oxidation and degradation. Similarly, the phosphor can also be encapsulated in a protective layer to prevent oxidation, chemical reaction, or contamination of the phosphor.

In preferred embodiments of the present invention, the integrated white light source is characterized with an environmentally sealed package or a hermetically sealed package. For an environmentally sealed configuration, the package enclosure prevents dust and other particles from interacting with the laser or phosphor. For hermetically sealed packages, the package should be leak tight and characterized by a very small or non-existent leak rate. For hermetically sealed packages it is typically favorable to backfill the packaging of a combination of oxygen and nitrogen such as clean dry air (CDA), but can be others such as nitrogen. Typically for GaN based lasers it is desirable for hermetically sealed packages, but other packages can be considered and deployed for various applications. Examples of off the shelf packages for the CPoS white light source include TO cans such as TO38, TO56, TO9, TO5, or TO46. Flat packages configured with windows can also be used. Examples of flat packages include a butterfly package like a TOSA. Surface mount device (SMD) packages can also be used, which are attractive due to their low price, hermetic sealing, and potentially low thermal impedance. In other embodiments, custom packages are used.

In another embodiment, a "Flash" package could be used for the integrated white light source. For example, this package could be used to adapt the laser based white light source to camera flash applications. One of the standard packaging formats for today's LEDs employ the use of a flat ceramic package, sometimes called "Flash" packages as devices built on these platforms have primarily been used in Camera Flash and Cell Phone applications. The typical flash package consists of a flat ceramic substrate (Alumina or AlN) with attach pads for LED and ESD devices as well as leads providing a location for clipping or soldering external electrical connections to power the device. The phosphor is contained near the LED die via molding or other silicone containing dispensing application. This layer is then typically over molded with a clear silicone Lens to improve light extraction. The primary benefits of a package in this format is a very small overall package dimension (~3 mm×~5 mm), reasonable light output performance (hundreds of Lumens), small source size and overall low cost LED device. This package style could also be achieved by employing a laser plus phosphor design style which would potentially could eliminate the encapsulation and lensing steps, providing an LED replacement with superior spot size and brightness. If a protective cover were needed to house the laser and phosphor subcomponents, a hollow glass dome could be used to provide protection.

As an example, the package has a low profile and may include a flat pack ceramic multilayer or single layer. The layer may include a copper, a copper tungsten base such as butterfly package or covered CT mount, Q-mount, or others. In a specific embodiment, the laser devices are soldered on CTE matched material with low thermal resistance (e.g., AlN, diamond, diamond compound) and forms a sub-assembled chip on ceramics. The sub-assembled chip is then assembled together on a second material with low thermal resistance such as copper including, for example, active cooling (i.e., simple water channels or micro channels), or forming directly the base of the package equipped with all connections such as pins. The flatpack is equipped with an optical interface such as window, free space optics, connector or fiber to guide the light generated and a cover environmentally protective.

Figure 29:
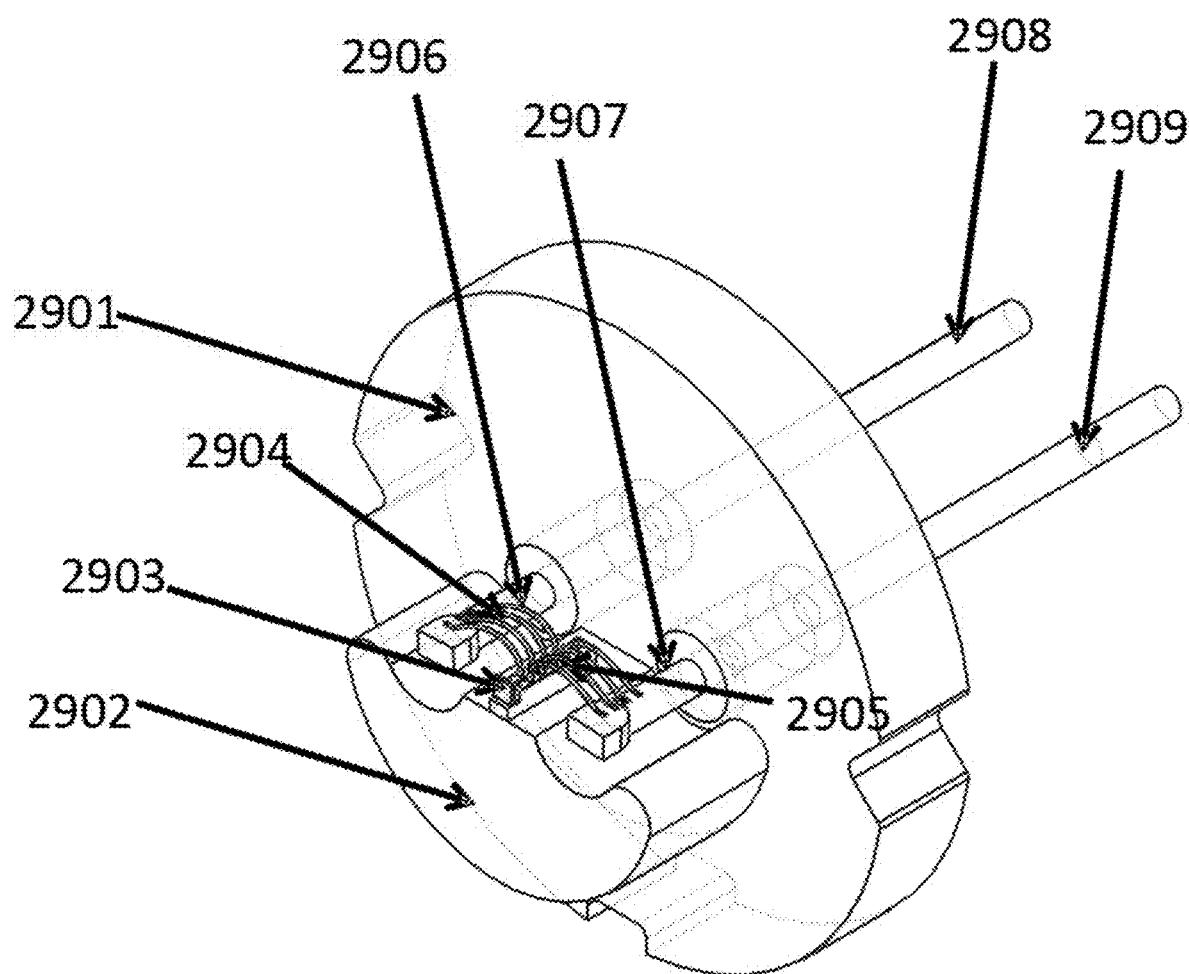
FIG. 29 is a simplified diagram illustrating a transmissive mode phosphor integrated laser-based white light source mounted in a can-type package according to an embodiment of the present invention.

FIG. 29 presents a schematic illustration of one example of a packaged CPoS white light source according to the present invention. In this example, a transmission mode white light source is configured in a TO-can type package. The TO-can has a base member 2901 with a protruding pedestal member 2902, wherein the pedestal member is configured to transmit heat from the pedestal to the base where the heat is subsequently passed to a heat sink. The base member can be comprised of a metal such as copper, copper tungsten, aluminum, or steel, or other. The transmissive white light source 2903 according to this invention is mounted on the pedestal 2902. The mounting to the pedestal can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Electrical connections from the p-electrode and n-electrode of the laser diode are made using wire bonds 2904 and 2905. The wirebonds connect the electrode to electrical feedthroughs 2906 and 2907 that are electrically connected to external pins 2908 and 2909 on the backside of the TO-can base. The pins are then electrically coupled to a power source to electrify the white light source and generate white light emission. In this configuration the white light source is not capped or sealed such that is exposed to the open environment. Of course, the example in FIG. 29 is merely an example and is intended to illustrate one possible simple configuration of a packaged CPoS white light source. Specifically, since can-type packages are widely popular for laser diodes and are available off the shelf they could be one option for a low cost and highly adaptable solution.

Figure 30:
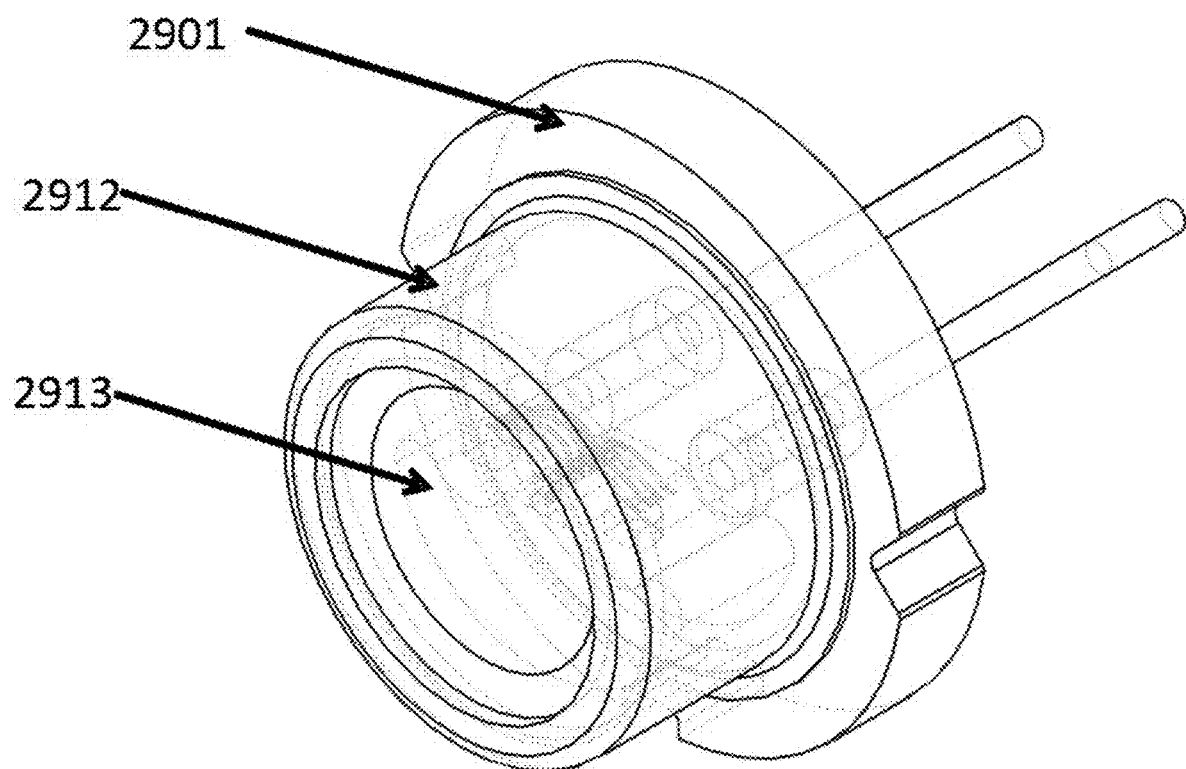
FIG. 30 is a simplified diagram illustrating a transmissive mode phosphor integrated laser-based white light source mounted in a can-type package and sealed with a cap member according to an embodiment of the present invention.

FIG. 30 is a schematic illustration of the CPoS white light source configured in a can type package as shown in FIG. 29, but with an additional cap member to form a seal around the white light source. As seen in FIG. 30, the TO-can type package 2901 has a cap 2912 mounted to the base. The cap can be soldered, brazed, welded, or glue to the base. The cap member has a transparent window region 2913 configured to allow the emitted white light to pass to the outside environment where it can be harnessed in application. The sealing type can be an environmental seal or a hermetic seal, and in an example the sealed package is backfilled with a nitrogen gas or a combination of a nitrogen gas and an oxygen gas. In some embodiments, a lens or other type of optical element to shape, direct, or collimate the white light is included directly in the cap member. Of course, the example in FIG. 30 is merely an example and is intended to illustrate one possible configuration of sealing a white light source. Specifically, since TO-can type packages are easily hermetically sealed, this embodiment may be suitable for applications where hermetic seals are needed. In some examples of this embodiment of the integrated white light source apparatus, an electrostatic discharge (ESD) protection element such as a transient voltage suppression (TVS) element is included.

Figure 31:
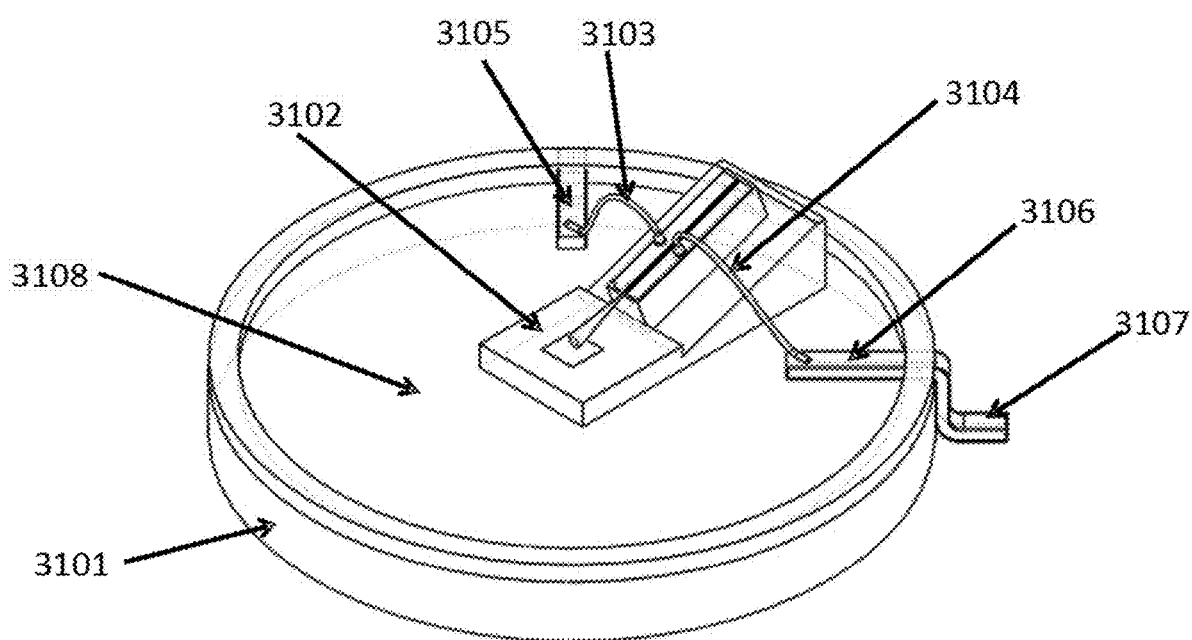
FIG. 31 is a simplified diagram illustrating a reflective mode phosphor integrated laser-based white light source mounted in a surface mount package according to an embodiment of the present invention.

An alternative example of a packaged CPoS white light source according to the present invention is provided in the schematic diagram of FIG. 31. In this example, a reflective mode white light source is configured in a surface mount device (SMD) type package. The example SMD package has a base member 3101 with the reflective mode white light source 3102 mounted on the base member wherein the base member is configured to conduct heat away from the white light source and to a heat sink. The base member is comprised of a thermally conductive material such as copper, copper tungsten, aluminum, SiC, steel, diamond, composite diamond, AlN, sapphire, or other metals, ceramics, or semiconductors The mounting to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diode are made to using wirebonds 3103 and 3104 to internal feedthroughs 3105 and 3106. The feedthroughs are electrically coupled to external leads such as 3107. The external leads can be electrically coupled to a power source to electrify the white light source and generate white light emission. The top surface 3108 of the surface mount package may be comprised of or coated with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, the example is FIG. 31 is merely an example and is intended to illustrate one possible simple configuration of a surface mount packaged CPoS white light source. Specifically, since surface mount type packages are widely popular for LEDs and other devices and are available off the shelf they could be one option for a low cost and highly adaptable solution.

Figure 31A:
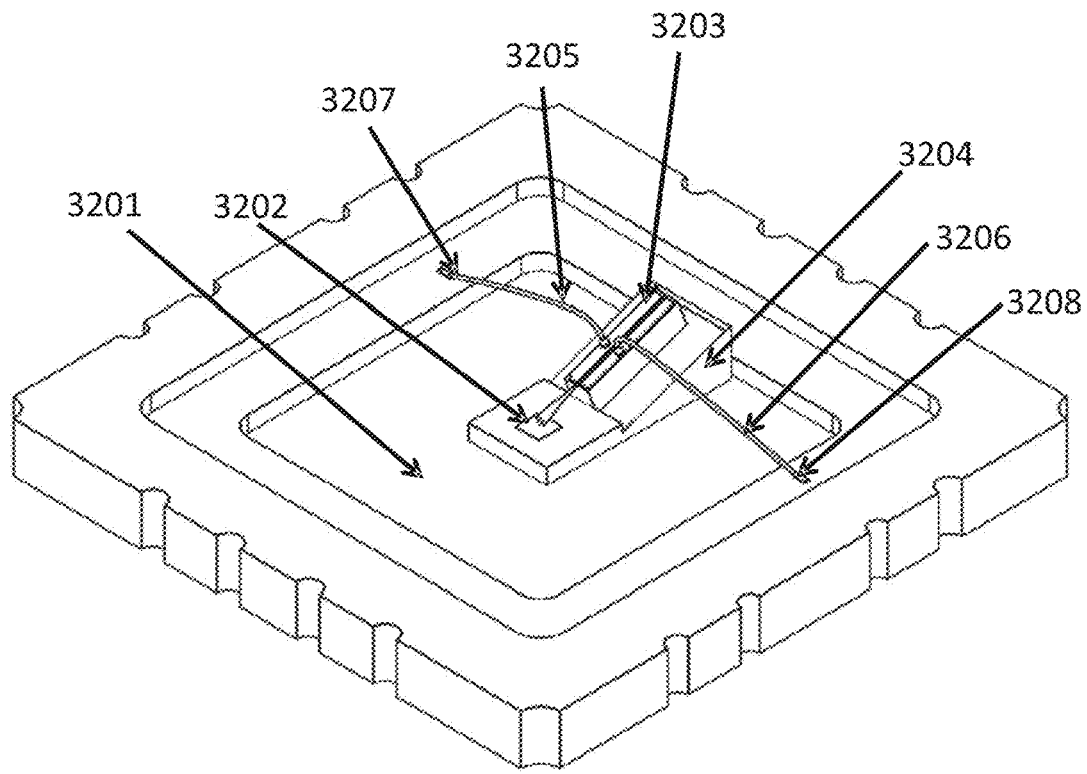
FIG. 31A is a simplified diagram illustrating a reflective mode phosphor integrated laser-based white light source mounted in a surface mount package according to an embodiment of the present invention.

An alternative example of a packaged white light source according to the present invention is provided in the schematic diagram of FIG. 31A. In this example, a reflective mode white light source is configured in a surface mount device (SMD) type package. The example SMD package has a base member 3201 with the reflective mode phosphor member 3202 mounted on a support member or on a base member. The laser diode device 3203 may be mounted on a support member 3204 or a base member. The support member and base members are configured to conduct heat away from the phosphor member and laser diode members. The base member is comprised of a thermally conductive material such as copper, copper tungsten, aluminum, SiC, steel, diamond, composite diamond, AlN, sapphire, or other metals, ceramics, or semiconductors. The mounting to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diode are made to using wirebonds 3205 and 3206 to internal feedthroughs 3207 and 3208. The feedthroughs are electrically coupled to external leads. The external leads can be electrically coupled to a power source to electrify the white light source and generate white light emission. The top surface of the base member 3201 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, the example is FIG. 31A is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 31B:
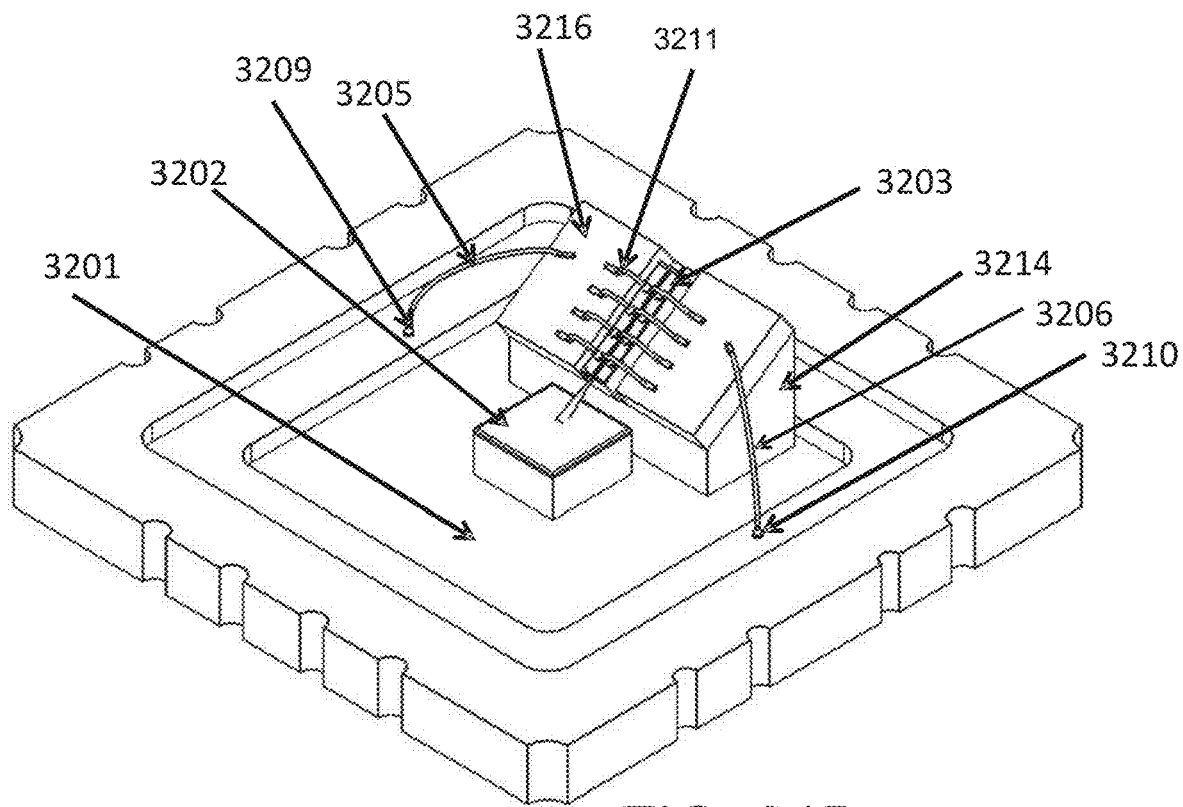
FIG. 31B is a simplified diagram illustrating a reflective mode phosphor integrated laser-based white light source mounted in a surface mount package according to an embodiment of the present invention.

An alternative example of a packaged white light source according to the present invention is provided in the schematic diagram of FIG. 31B. In this example, a reflective mode white light source is configured in a surface mount device (SMD) type package. The example SMD package has a common support base member 3201. The reflective mode phosphor member 3202 is attached to the base member, which could also include and intermediate submount member between the phosphor member 3202 and the base member 3201. The laser diode 3203 is mounted on an angled support member 3214, wherein the angled support member 3214 is attached to the base member 3201. The base member 3201 is configured to conduct heat away from the white light source and to a heat sink. The base member 3201 is comprised of a thermally conductive material such as copper, copper tungsten, aluminum, SiC, steel, diamond, composite diamond, AlN, sapphire, or other metals, ceramics, or semiconductors. The mounting to the base member 3201 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C. 900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the electrodes of the laser diode are made to using first wirebonds 3211 to members 3216. Wirebonds 3205 and 3206 are formed to internal feedthroughs 3209 and 3210. The feedthroughs are electrically coupled to external leads. The external leads can be electrically coupled to a power source to electrify the white light source and generate white light emission. The top surface of the base member 3201 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, the example is FIG. 31B is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 31C:
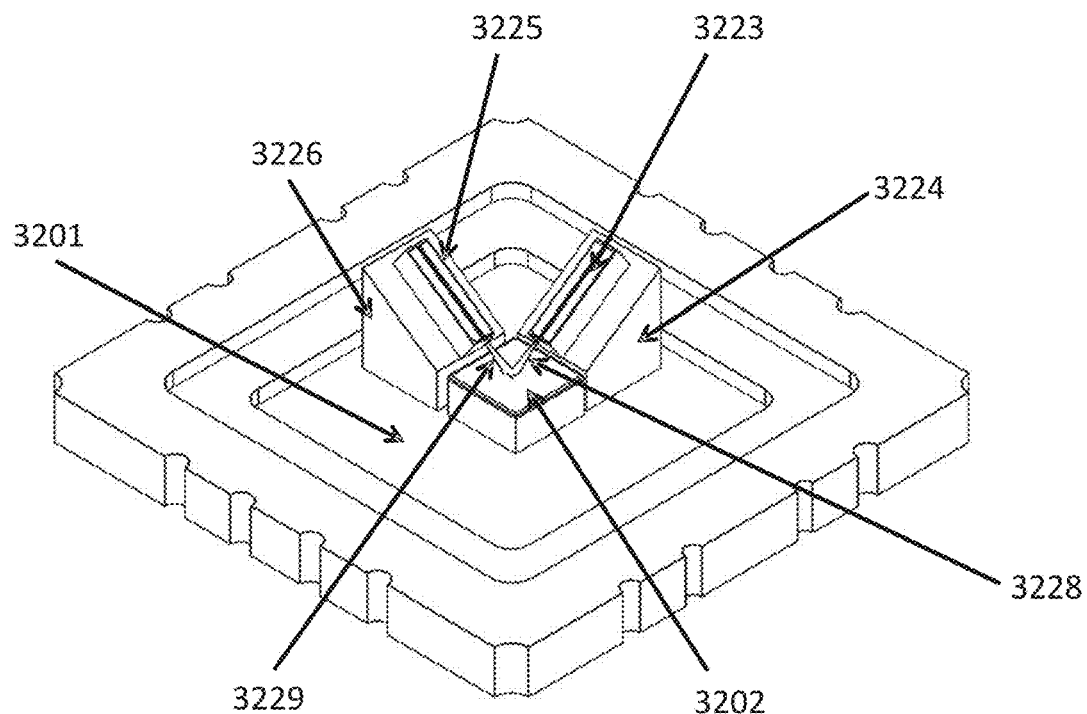
FIG. 31C is a simplified diagram illustrating a reflective mode phosphor integrated laser-based white light source with multiple laser diode devices mounted in a surface mount package according to an embodiment of the present invention.

An alternative example of a packaged white light source including 2 laser diode chips according to the present invention is provided in the schematic diagram of FIG. 31C. In this example, a reflective mode white light source is configured in a surface mount device (SMD) type package. The example SMD package has a base member 3201 with the reflective mode phosphor member 3202 mounted on a support member or on a base member. A first laser diode device 3223 may be mounted on a first support member 3224 or a base member. A second laser diode device 3225 may be mounted on a second support member 3226 or a base member. The first and second support members and base members are configured to conduct heat away from the phosphor member 3202 and laser diode members 3223 and 3225. The base member is comprised of a thermally conductive material such as copper, copper tungsten, aluminum, alumina, SiC, steel, diamond, composite diamond, AlN, sapphire, or other metals, ceramics, or semiconductors. The mounting to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm*cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diodes can be made to using wirebonds to internal feedthroughs. The feedthroughs are electrically coupled to external leads. The external leads can be electrically coupled to a power source to electrify the laser diode sources to emit a first laser beam 3228 from the first laser diode device 3223 and a second laser beam 3229 from a second laser diode device 3225. The laser beams are incident on the phosphor member 3202 to create an excitation spot and a white light emission. The laser beams are preferably overlapped on the phosphor 3202 to create an optimized geometry and/or size excitation spot. For example, in the example according to FIG. 31C the laser beams from the first and second laser diodes are rotated by 90 degrees with respect to each other such that the slow axis of the first laser beam is aligned with the fast axis of the second laser beam. The top surface of the base member 3201 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, the example is FIG. 31C is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 31D:
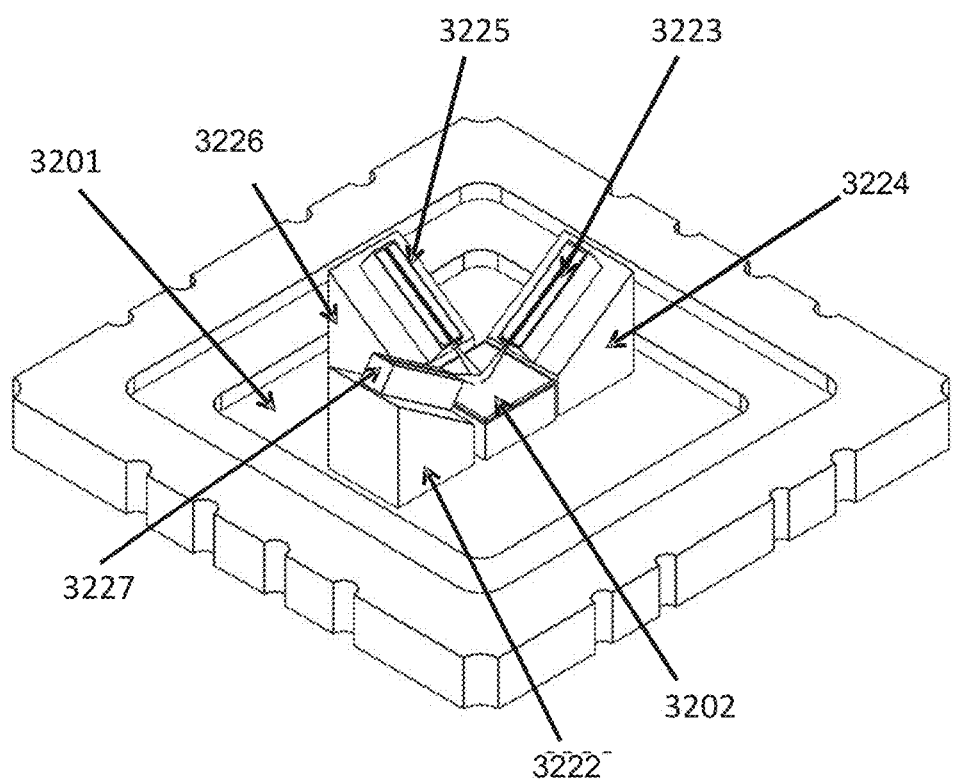
FIG. 31D is a simplified diagram illustrating a reflective mode phosphor integrated laser-based white light source with multiple laser diode devices mounted in a surface mount package according to an embodiment of the present invention.

An alternative example of a packaged white light source including 3 laser diode chips according to the present invention is provided in the schematic diagram of FIG. 31D. In this example, a reflective mode white light source is configured in a surface mount device (SMD) type package. The example SMD package has a base member 3201 with the reflective mode phosphor member 3202 mounted on a support member or on a base member. A first laser diode device 3223 may be mounted on a first support member 3224 or a base member. A second laser diode device 3225 may be mounted on a second support member 3226 or a base member. A third laser diode device 3227 may be mounted on a third support member 3222 or a base member. The support members and the base member are configured to conduct heat away from the phosphor member and laser diode members. The base member 3201 is comprised of a thermally conductive material such as copper, copper tungsten, aluminum, SiC, steel, diamond, composite diamond, AlN, sapphire, or other metals, ceramics, or semiconductors. The mounting to the base member 3201 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diodes can be made to using wirebonds to internal feedthroughs. The feedthroughs are electrically coupled to external leads. The external leads can be electrically coupled to a power source to electrify the laser diode sources to emit a first laser beam from the first laser diode device 3223, a second laser beam from a second laser diode device 3225, and a third laser beam from the third laser diode device 3227. The laser beams are incident on the phosphor member 3202 to create an excitation spot and a white light emission. The laser beams are preferably overlapped on the phosphor to create an optimized geometry and/or size excitation spot. The top surface of the base member 3201 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, the example is FIG. 31D is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 31E:
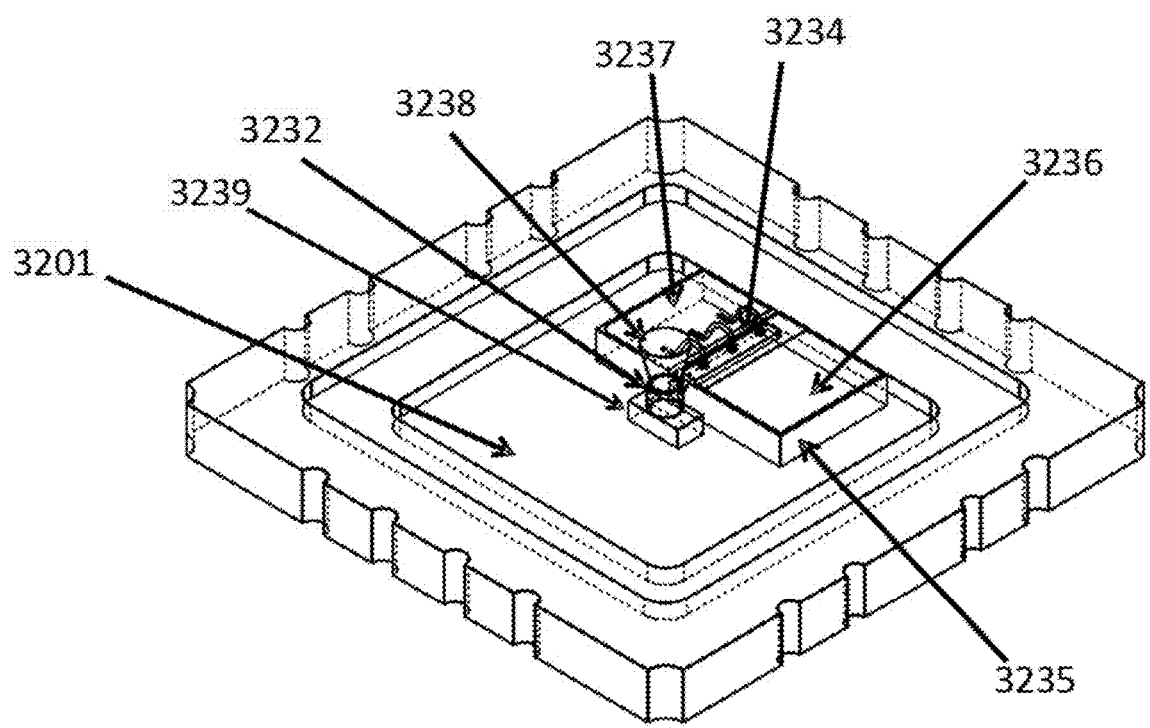
FIG. 31E is a simplified diagram illustrating a side-pumped phosphor integrated laser-based white light source mounted in a surface mount package according to an embodiment of the present invention.

An alternative example of a packaged white light source according to the present invention is provided in the schematic diagram of FIG. 31E. In this example, a reflective mode white light source is configured in a surface mount device (SMD) type package. The example SMD package has a base member 3201 serving as a common support member for the a side-pumped phosphor member 3232 mounted on a submount or support member 3239 and laser diode devices 3234 mounted on a submount or support member 3235. In some embodiments of this invention the laser diode and or the phosphor member may be mounted directly to the base member 3201 of the package. The support members and base members are configured to conduct heat away from the phosphor member 3232 and laser diode members 3234. The base member 3201 is comprised of a thermally conductive material such as copper, copper tungsten, aluminum, SiC, steel, diamond, composite diamond, AlN, sapphire, or other metals, ceramics, or semiconductors. The mounting of the submount or support members to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode can be electrically coupled to 3236 and 3237 electrodes on a submount member which would then be coupled to internal feedthroughs in the package member. The feedthroughs are electrically coupled to external leads. The external leads can be electrically coupled to a power supply source to electrify the laser diode and generate a laser beam incident on the side of the phosphor member 3232. The phosphor member 3232 may preferably be configured for primary white light emission 3238 from the top surface of the phosphor member 3232.

The top surface of the base member 3201 may be comprised of, coated with, or filled with a reflective layer to prevent or mitigate any losses relating from downward directed or reflected light. Moreover, all surfaces within the package including the laser diode member 3234 and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, the example is FIG. 31*e* is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 32:
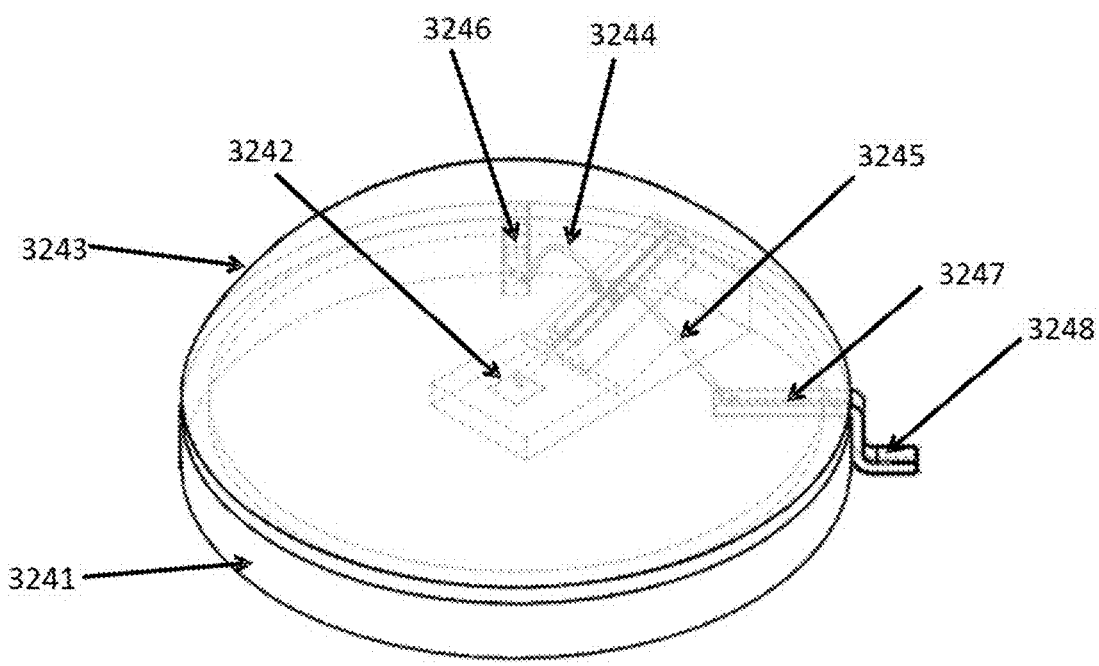
FIG. 32 is a simplified diagram illustrating a reflective mode phosphor integrated laser-based white light source mounted in a surface mount-type package and sealed with a cap member according to an embodiment of the present invention.

FIG. 32 is a schematic illustration of the CPoS white light source configured in a SMD type package as shown in FIG. 31, but with an additional cap member to form a seal around the white light source. As seen in FIG. 32, the SMD type package has a base member 3241 with the white light source 3242 mounted to the base. The mounting to the base can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Overlying the white light source is a cap member 3243, which is attached to the base member around the sides. In an example, the attachment can be a soldered attachment, a brazed attachment, a welded attachment, or a glued attachment to the base member. The cap member has at least a transparent window region and in preferred embodiments would be primarily comprised of a transparent window region such as the transparent dome cap illustrated in FIG. 32. The transparent material can be a glass, a quartz, sapphire, silicon carbide, diamond, plastic, or any suitable transparent material. The sealing type can be an environmental seal or a hermetic seal, and in an example the sealed package is backfilled with a nitrogen gas or a combination of a nitrogen gas and an oxygen gas. Electrical connections from the p-electrode and n-electrode of the laser diode are made using wire bonds 3244 and 3245. The wirebonds connect the electrode to electrical feedthroughs 3246 and 3247 that are electrically connected to external leads such as 3248 on the outside of the sealed SMD package. The leads are then electrically coupled to a power source to electrify the white light source and generate white light emission. In some embodiments, a lens or other type of optical element to shape, direct, or collimate the white light is included directly in the cap member. Of course, the example in FIG. 32 is merely an example and is intended to illustrate one possible configuration of sealing a white light source. Specifically, since SMD type packages are easily hermetically sealed, this embodiment may be suitable for applications where hermetic seals are needed.

Figure 32A:
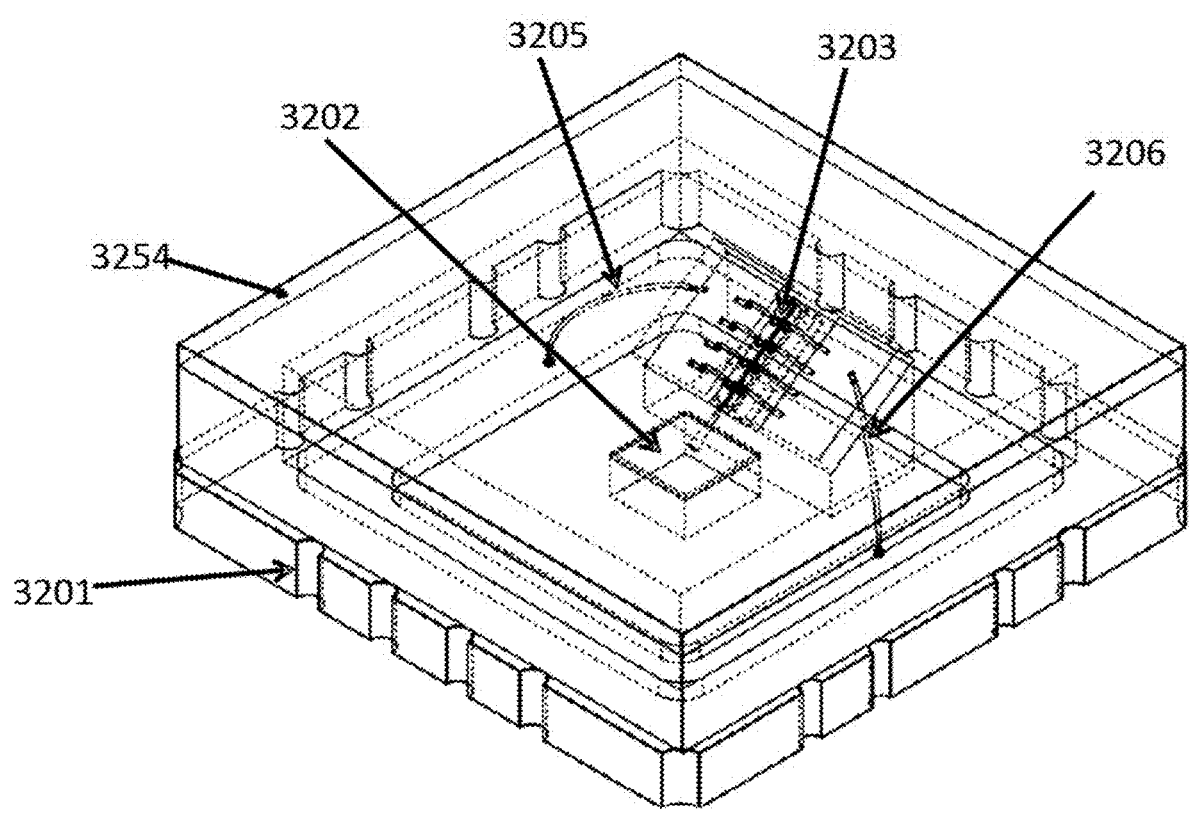
FIG. 32A is a simplified diagram illustrating a reflective mode phosphor integrated laser-based white light source mounted in a surface mount-type package and sealed with a cap member according to an embodiment of the present invention.

FIG. 32A is a schematic illustration of the white light source configured in a SMD type package as shown in FIG. 31B, but with an additional cap member to form a seal around the white light source. As seen in FIG. 32A, the SMD type package has a base member 3201 with the white light source comprised of a reflective mode phosphor member 3202 and a laser diode member 3203 mounted to submount members or the base member. The mounting to submount and/or the base can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Overlying the white light source is a cap member 3254, which is attached to the base member around the sides. In an example, the attachment can be a soldered attachment, a brazed attachment, a welded attachment, or a glued attachment to the base member. The cap member has at least a transparent window region and in preferred embodiments would be primarily comprised of a transparent window region such as the transparent flat cap or lid 3254 illustrated in FIG. 32A. The transparent material can be a glass, a quartz, sapphire, silicon carbide, diamond, plastic, or any suitable transparent material. The sealing type can be an environmental seal or a hermetic seal, and in an example the sealed package is backfilled with a nitrogen gas or a combination of a nitrogen gas and an oxygen gas. Electrical connections from the p-electrode and n-electrode of the laser diode are made using wire bonds 3205 and 3206. The wirebonds connect the electrode to electrical feedthroughs that are electrically connected to external leads on the outside of the sealed SMD package. The leads are electrically coupled to a power source to electrify the white light source and generate white light emission. In some embodiments, a lens or other type of optical element to shape, direct, or collimate the white light is included directly in the cap member. Of course, the example in FIG. 32A is merely an example and is intended to illustrate one possible configuration of sealing a white light source. Specifically, since SMD type packages are easily hermetically sealed, this embodiment may be suitable for applications where hermetic seals are needed.

Of course a suitable assembly process is required for the fabrication of integrated laser based white light sources as shown in FIG. 32A and other embodiments according to the present invention. In many embodiments, assembly processes suitable for a such a device would follow standard semiconductor and LED assembly processes as they are today. As an example a general assembly process would follow the subsequent steps:

I) The laser is attached to heat a conducting member such as a first submount member and optionally a second submount member, or a second and a third submount member II) The composite laser and heat conducting member are attached to common support member such as the package member [e.g. SMD package], or substrate member.

III) The phosphor is attached to the common support member such as a package member [e.g. SMD] or a substrate member.

IV) An ESD protection device [e.g. TVS] or other peripheral component is attached to a package member, submount member, or substrate member.

V) The subcomponents that require electrical connection to package are wirebonded to feedthroughs.

VI) An operation verification test is performed.

VII) The frame assembly is attached to package or substrate or the frame+lid assembly is attached to the package or substrate.

VIII) The completed SMD package is attached to a next level board such as an MCPCB, FR4, or suitable carrier substrate.

In step I the laser device would be attached to the heat conducting member by a selection of various materials to provide mechanical stability, alignment and thermal conductivity to suit the particular requirements of the product application. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In step II the combined member consisting of a laser and heat conducting member would then be presented with a similar set of materials choices for its attachment into the package or onto the substrate. The materials choices and processes selection would be as follows. Depending on the materials selection, the process flow could be adjusted such that each subsequent step in the process puts a lower temperature excursion on the device than the previous steps. In this way, the early joints or connections do not experience a secondary reflow. A typical pick and place style operation either with in situ heating/pressure or post reflow would be utilized for this attach process. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In step III the phosphor subcomponent attach would depend on the structure and design of the subcomponent. For a single piece, solid state object. The phosphor could be handled by a pick and place operation, as one would handle an LED attach today. This requires that the base of the phosphor subcomponent be prepared for standard metallized attaches would could utilize the following materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In the case of a less rigid phosphor subcomponent, which utilizes phosphor powders and binders like silicones. The method of attach would simply be the adhesion of the phosphor and silicone slurry to the package surface during the silicone drying steps. Methods of application of a phosphor slurry would include but not limited to a dispense and cure process, a spray and cure process, an electrophoretic deposition with silicone dispense and cure process, a mechanical coining of powder/embedding into the surface of the package metallization process, a sedimentation deposition process, or a jet dispense and cure process.

In step IV an ESD or other peripheral component attach process could follow industry standard attach protocols which would include one or more of a solder dispense/stencil or preform attach process, an ESD or peripheral attach via pick and place operation, or a reflow process.

In step V wirebonding of the attached subcomponents would utilize industry standard materials and processes. This would include wire materials selection Al, Cu, Ag and Au. Alternatively ribbon bonding could be employed if necessary or suitable for the application. Normal wirebonding techniques would include ball bonding, wedge bonding and compliant bonding techniques known to the semiconductor industry.

In step VI with device fully connected with subcomponents, an operation verification test could be placed in the assembly process to verify proper operation before committing the final assembly pieces (frame and Lid) to the SMD component. In case of a non-working device, this provides an opportunity to repair the unit before being sealed. This test would consist of a simple electrical turn on for the device to verify proper operation of the laser and possibly a soft ESD test to verify the ESD/TVS component is working. Typical operating values for voltage, current, light output, color, spot size and shape would be used to determine proper operation.

In step VII the frame assembly and attach steps would be used to prepare the device to be sealed from the environment. The frame would be attached to the SMD via a choice of materials depending on the level of sealing required by the device. In one example of sealing materials and processes include a AuSn attach to metalized frame and package surface to provide a true hermetic seal. AuSn dispense, stencil processes would place AuSn in the proper locations on the SMD. This would be followed by a pick and place of the frame onto the wet AuSn and followed by a reflow step. In a second example of sealing materials and processes include epoxy materials are used if the hermeticity and gas leak requirements are sufficient for product use conditions. Epoxy materials would typically be stenciled or dispensed followed by a pick and place of the frame and subsequent epoxy cure. In a third example of sealing materials and processes includes indium metal used by placing thin indium wire on the attach surface and applying heat and pressure to the indium using the frame as a pressing member to compress and mechanical attach the Indium to both the SMD and Frame surfaces.

An alternative approach to the frame assembly process would first attach the transparent Lid (typically Glass) to the frame and this combined unit would then be attached to the SMD as described by the methods above otherwise the lid attach separately would follow the same processes and materials choices, but the surfaces would be the top of the frame and the bottom of the lid.

In step VIII the completed SMD attach to next level board would employ industry standard attach methodologies and materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In all embodiments, transmissive and reflective mode, of the integrated CPoS white light source according to the present invention safety features and design considerations can be included. In any based laser based source, safety is a key aspect. It is critical that the light source cannot be compromised or modified in such a way to create laser diode beam that can be harmful to human beings, animals, or the environment. Thus, the overall design should include safety considerations and features, and in some cases even active components for monitoring. Examples of design considerations and features for safety include positioning the laser beam with respect to the phosphor in a way such that if the phosphor is removed or damaged, the exposed laser beam would not make it to the outside environment in a harmful form such as collimated, coherent beam. More specifically, the white light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor.

In one embodiment, an optical beam dump serves as an optical element to absorb the laser beam that could otherwise be dangerous to the outside environment. Design concerns in the beam dump would include the management and reduction of laser beam back reflections and scattering as well as dissipation of heat generated by absorption. Simple solutions where the optical power is not too high, the absorbing material can be as simple as a piece of black velvet or flock paper attached to a backing material with a glue, solder, or other material. In high power applications such as those that would incorporated into high power laser systems, beam dumps must often incorporate more elaborate features to avoid back-reflection, overheating, or excessive noise. Dumping the laser beam with a simple flat surface could result in unacceptably large amounts of light escaping to the outside world where it could be dangerous to the environment even though the direct reflection is mitigated. One approach to minimize scattering is to use a porous or deep dark cavity material deep lined with an absorbing material to dump the beam.

A commonly available type of beam dump suitable for most medium-power lasers is a cone of aluminum with greater diameter than the beam, anodized to a black color and enclosed in a canister with a black, ribbed interior. Only the point of the cone is exposed to the beam head-on; mostly, incoming light grazes the cone at an angle, which eases performance requirements. Any reflections from this black surface are then absorbed by the canister. The ribs both help to make light less likely to escape, and improve heat transfer to the surrounding air. (https://en.wikipedia.org/wikiBeam_dump).

Figure 33:
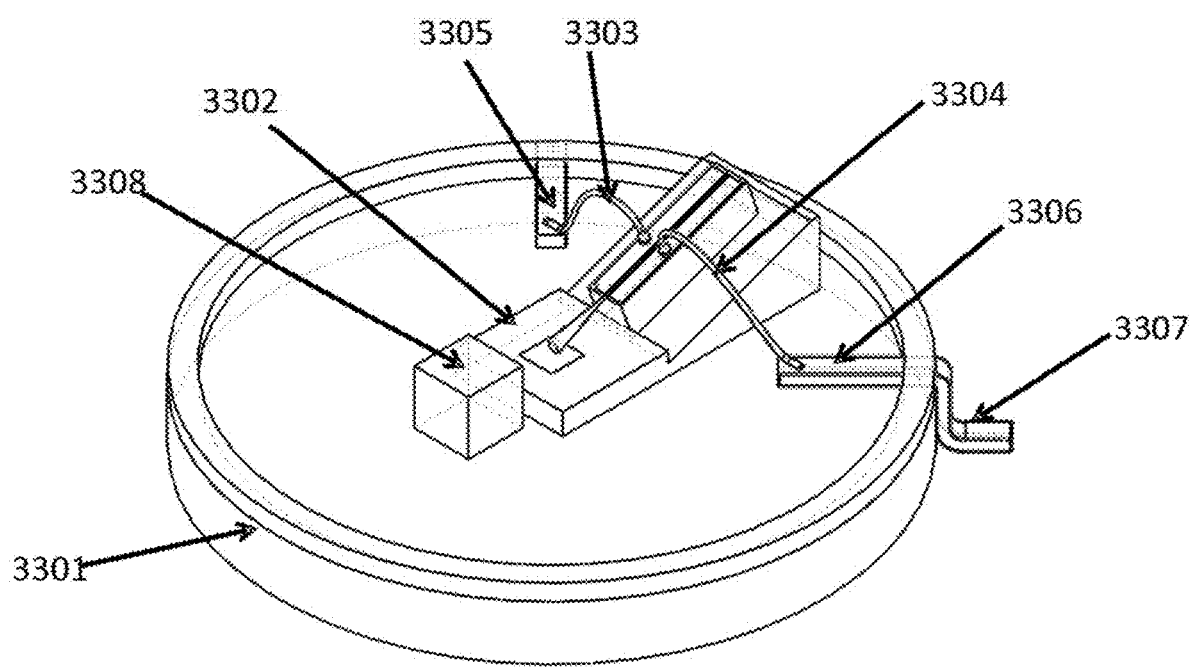
FIG. 33 is a simplified diagram illustrating a reflective mode phosphor integrated laser-based white light source mounted in a surface mount package with an integrated beam dump safety feature according to an embodiment of the present invention.

An example of a packaged CPoS white light source including a beam dump safety feature according to the present invention is provided in the schematic diagram of FIG. 33. In this example, a reflective mode white light source is configured in a surface mount device (SMD) type package. The example SMD package has a base member 3301 with the reflective mode white light source 3302 mounted on the base member wherein the base member 3301 is configured to conduct heat away from the white light source and to a heat sink. The base member 3301 is comprised of a thermally conductive material such as copper, copper tungsten, aluminum, alumina, SiC, steel, diamond, composite diamond, AlN, sapphire, or other metals, ceramics, or semiconductors. The mounting to the base member 3301 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively the joint could be formed from a metal-metal bond such as a Au—Au bond. Electrical connections from the p-electrode and n-electrode of the laser diode are made to using wirebonds 3303 and 3304 to internal feedthroughs 3305 and 3306. The feedthroughs are electrically coupled to external leads such as 3307. The external leads can be electrically coupled to a power source to electrify the white light source and generate white light emission. The example beam 3308 is configured in the optical pathway of the laser diode in an event the phosphor were damage or removed and the laser beam was reflecting from the support member of the phosphor. In this example, the beam dump is shaped like a cube, but this is just an example and the shape, size, and location of the beam dump would be optimized based on providing the safety function while not unacceptably comprising efficiency of the white light source. In this example, the face of the beam dump configured to be in the optical pathway of the reflected beam could be configured from a porous material with deep cavities that propagate through the cube beam dump. Additionally, the beam dump could be comprised of an absorbing to absorb the laser beam and the beam is well heat sunk to the package member and a heat sink to dissipate the thermal energy generated during the absorption of the laser beam. The sides of the beam dump member 3412 not positioned in the laser beam pathway could be comprised of a reflective material to increase the useful output white light. Moreover, all surfaces within the package including the laser diode member and submount member may be enhanced for increased reflectivity to help improve the useful white light output. In this configuration the white light source is not capped or sealed such that is exposed to the open environment. Of course, the example in FIG. 33 is merely an example and is intended to illustrate one possible simple configuration of a packaged CPoS white light source with a built in safety feature. In other embodiments more than one safety feature can be included, a safety system comprised of multiple safety elements can be included, and such safety systems can be comprised of active and passive safety elements. Moreover, the safety elements or safety systems can be included in other packages included flat packages, custom packages, or can-type packages.

Figure 33A:
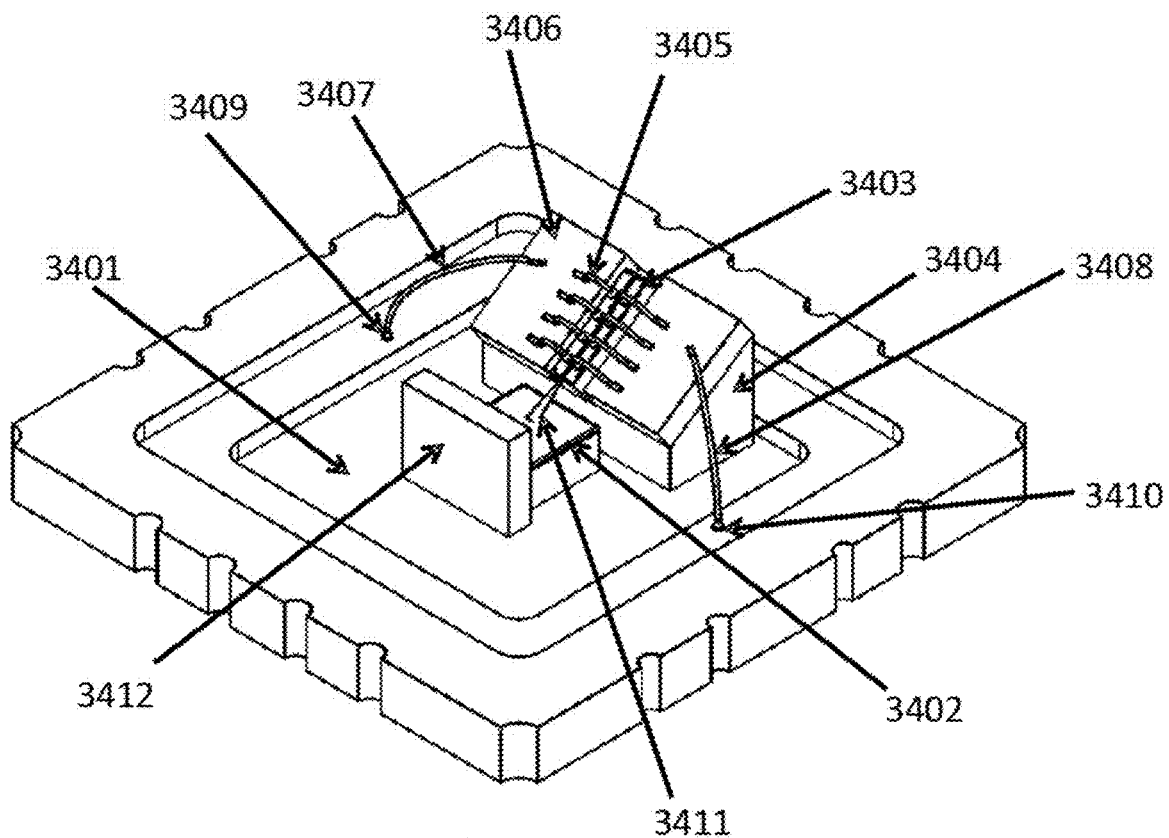
FIG. 33A is a simplified diagram illustrating a reflective mode phosphor integrated laser-based white light source mounted in a surface mount package with an integrated beam dump safety feature according to an embodiment of the present invention.

An alternative example of a packaged white light source according to the present invention is provided in the schematic diagram of FIG. 33A. In this example, a reflective mode white light source is configured in a surface mount device (SMD) type package including a beam dump member as a safety feature. The example SMD package has a common support base member 3401. The reflective mode phosphor member 3402 is attached to the base member, which could also include and intermediate submount member between the phosphor member 3402 and the base member 3401. The laser diode 3403 is mounted on an angled support member 3404, wherein the angled support member is attached to the base member 3401. The base member 3401 is configured to conduct heat away from the white light source and to a heat sink. The base member 3401 is comprised of a thermally conductive material such as copper, copper tungsten, aluminum, SiC, steel, diamond, composite diamond, AlN, sapphire, or other metals, ceramics, or semiconductors. The mounting to the base member 3401 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the electrodes of the laser diode are made to using wirebonds 3405 to members 3406. Wirebonds 3407 and 3408 are formed to internal feedthroughs 3409 and 3410. The feedthroughs are electrically coupled to external leads. The external leads can be electrically coupled to a power source to electrify the white light source and generate a laser beam 3411 incident on the phosphor member 3402 to yield a white light emission. A beam dump 3412 is positioned on the opposite side of the phosphor member 3402 relative to the laser excitation source. The beam dump 3412 provides an important safety feature, function to absorb and stray violet or blue laser light reflected from the top of the phosphor member 3402. Further, in the extreme case where the phosphor member 3402 is removed or compromised to create a potentially dangerous situation wherein a full-power or near full-power laser beam is reflected off the base member or other reflective members, the beam dump will serve to absorb a majority of the light and prevent dangerous laser beam exposure to outside world. The beam dump member could also be comprised of a functional element such as an electrostatic discharge (ESD) protection element such as a transient voltage suppression (TVS) element. In some embodiments the beam dump is a thermal fuse, which functions to heat up and create an open circuit to turn the laser diode off upon a direct exposure to the laser beam. The top surface of the base member 3401 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. Of course, the example is FIG. 33A is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

An alternative example of a packaged white light source according to the present invention is provided in the schematic diagram of FIG. 33A. In this example, a reflective mode white light source is configured in a surface mount device (SMD) type package including a beam dump member as a safety feature. The example SMD package has a common support base member 3401. The reflective mode phosphor member 3402 is attached to the base member, which could also include and intermediate submount member between the phosphor member 3402 and the base member 3401. The laser diode 3403 is mounted on an angled support member 504, wherein the angled support member is attached to the base member 3401. The base member 3401 is configured to conduct heat away from the white light source and to a heat sink. The base member 3401 is comprised of a thermally conductive material such as copper, copper tungsten, aluminum, SiC, steel, diamond, composite diamond, AlN, sapphire, or other metals, ceramics, or semiconductors. The mounting to the base member 3401 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the electrodes of the laser diode are made to using wirebonds 3405 to members 3406. Wirebonds 3407 and 3408 are formed to internal feedthroughs 3409 and 3410. The feedthroughs are electrically coupled to external leads. The external leads can be electrically coupled to a power source to electrify the white light source and generate a laser beam 3411 incident on the phosphor member 3402 to yield a white light emission. A beam dump 3412 is positioned on the opposite side of the phosphor member 3402 relative to the laser excitation source. The beam dump 3412 provides an important safety feature, function to absorb and stray violet or blue laser light reflected from the top of the phosphor member 3402. Further, in the extreme case where the phosphor member 3402 is removed or compromised to create a potentially dangerous situation wherein a full-power or near full-power laser beam is reflected off the base member or other reflective members, the beam dump will serve to absorb a majority of the light and prevent dangerous laser beam exposure to outside world. The beam dump member could also be comprised of a functional element such as an electrostatic discharge (ESD) protection element such as a transient voltage suppression (TVS) element. In some embodiments the beam dump is a thermal fuse, which functions to heat up and create an open circuit to turn the laser diode off upon a direct exposure to the laser beam. The top surface of the base member 3401 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. Of course, the example is FIG. 33A is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Of course, optical beam dumps is just one example of a laser safety feature, but there can be many others. Generally, the laser diode should not be configured to point toward the outside environment such that if there is a damaging or tampering event the direct laser will not escape to the outside world.

In some embodiments of the present invention a thermal fuse is integrated into the package with the phosphor member. Thermal fuses are simple devices configured to conduct electricity under normal operation and typically consist of a low melting point alloy. In one example, the thermal fuse is comprised of metal material with a low melting point and configured to rapidly heat when irradiated directly or indirectly with the violet or blue laser beam light. The rapid heat rise in the thermal fuse material causes the material to melt, creating a discontinuity in the fuse metal, which opens the electrical conduction pathway and prevents current flow through the fuse.

In this embodiment of the present invention, a thermal fuse is contained within the electrical pathway providing the current input from an external power source to the gain element of the laser diode. The thermal fuse is physically positioned in locations where the output of the violet or blue laser beam would be incident in the case that the phosphor member is comprised, broken, or removed. That is, the thermal fuse is placed in the package where the beam is not expected to be unless an upstream failure in the beam line has occurred. In the case of such an event, the violet or blue laser light would irradiate the fuse material inducing a temperature rise at or above the melting point and hence causing a melting of thermal fuse element. This melting would then open the electrical pathway and break the electrical circuit from the external power supply to the laser diode gain element and thereby shutting the laser device off. In this preferred example, the thermal fuse could cutoff power to the laser without requiring external control mechanisms.

There are a number of variations on the fusible alloy thermal fuse structure according to the present invention. In another example, one could utilize a tensioned spring which is soldered in place inside a ball of fusible allow. The spring and alloy provide the electrical circuit. When the alloy becomes soft enough, the spring pulls free, thereby breaking the circuit connection. In some embodiments the melting point could be suitably chosen to only break connection in the operating device when a sufficient temperature had been met or exceeded.

In some embodiments of this invention, safety features and systems use active components. Example active components include photodetectors/photodiode and thermistors. A photodiode is a semiconductor device that converts light into current wherein a current is generated when light within a certain wavelength range is incident on the photodiode. A small amount of current is also produced when no light is present. Photodiodes may be combined with components such as optical filters to provide a wavelength or polarization selection of the light incident on the detector, built-in lenses to focus the light or manipulate the light incident on the detector, and may have large or small surface areas to select a certain responsivity and/or noise level. The most prevalent photodiode type is based on Si as the optical absorbing material, wherein a depletion region is formed. When a photon is absorbed in this region an electron-hole pair is formed, which results in a photocurrent. The primary parameter defining the sensitivity of a photodiode is its quantum efficiency (QE) which is defined as the percentage of incident photons generating electron-hole pairs which subsequently contribute to the output signal. Quantum efficiencies of about 80% are usual for silicon detectors operating at wavelengths in the 800-900 nm region. The sensitivity of a photodiode may also be expressed in units of amps of photodiode current per watt of incident illumination. This relationship leads to a tendency for responsivity to reduce as the wavelength becomes shorter. For example, at 900 nm, 80% QE represents a responsivity of 0.58 A/W, whereas at 430 nm, the same QE gives only 0.28 A/W. In alternative embodiments, photodiodes based on other materials such as Ge, InGaAs, GaAs, InGaAsP, InGaN, GaN, InP, or other semiconductor based materials can be used. The photodiode can be a p-n type, a p-i-n type, an avalanche photodiode, a uni-traveling carrier photodiode, a partially depleted photodiode, or other type of diode.

The decreasing responsivity with such shorter wavelengths presents difficulty in achieving a high performance silicon based photodiode in the violet or blue wavelength range. To overcome this difficulty blue enhancement and/or filter techniques can be used to improve the responsivity this wavelength range. However, such techniques can lead to increased costs, which may not be compatible with some applications. Several techniques can be used to overcome this challenge including deploying new technologies for blue enhanced silicon photodiodes or using photodiodes based on different material systems such as photodiodes based on GaN/InGaN. In one embodiment an InGaN and/or GaN-containing photodiode is combined with the integrated white light source. In a specific embodiment, the photodiode is integrated with the laser diode either by a monolithic technique or by an integration onto a common submount or support member as the laser diode to form an integrated GaN/InGaN based photodiode.

In another embodiment of this invention to overcome the difficulty of achieving a low cost silicon based photodiode operable with high responsivity in the blue wavelength region, a wavelength converter material such as a phosphor can be used to down convert ultraviolet, violet, or blue laser light to a wavelength more suitable for high-responsivity photo-detection according to the criteria required in an embodiment for this invention. For example, if photodiodes operating in the green, yellow, or red wavelength regime can be lower cost and have a suitable responsivity for the power levels associated with a converted wavelength, the photodiode can be coated with phosphors to convert the laser light to a red, green, or yellow emission. In other embodiments the detectors are not coated, but a converter member such as a phosphor is place in the optical pathway of the laser beam or scattered laser beam light and the photodiode.

Strategically located detectors designed to detect direct blue emission from the laser, scattered blue emission, or phosphor emission such as yellow phosphor emission could be used to detect failures of the phosphor where a blue beam could be exposed or other malfunctions of the white light source. Upon detection of such an event, a close circuit or feedback loop would be configured to cease power supply to the laser diode and effectively turn it off.

As an example, a photodiode can be used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system.

In a preferred embodiment, a InGaN/GaN-based photodiode is integrated with the white light source. The InGaN/GaN-based photodiode can be integrated using a discrete photodiode mounted in the package or can be directly integrated onto a common support member with the laser diode. In a preferable embodiment, the InGaN/GaN-based photodiode can be monolithically integrated with the laser diode.

In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and shut it off.

In some embodiments additional optical elements are used to recycle reflected or stray excitation light. In one example, a re-imaging optic is used to re-image the reflected laser beam back onto the phosphor and hence re-cycle the reflected light.

Figure 33B:
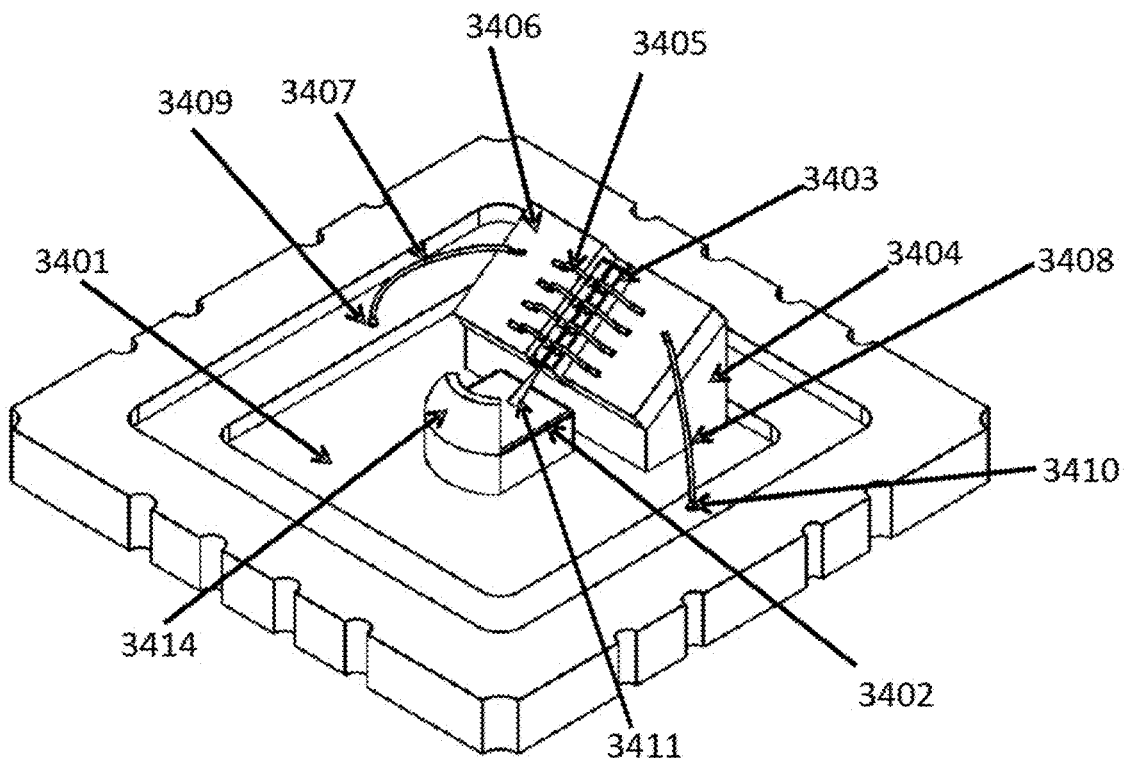
FIG. 33B is a simplified diagram illustrating a reflective mode phosphor integrated laser-based white light source mounted in a surface mount package with an integrated re-imaging optic to reflect and refocus the incident laser beam reflected from the phosphor according to an embodiment of the present invention.

An alternative example of a packaged white light source according to the present invention including a re-imaging optic is provided in the schematic diagram of FIG. 33B. In this example, a reflective mode white light source is configured in a surface mount device (SMD) type package including a reimaging optical as a safety feature and a photon recycling feature. The example SMD package has a common support base member 3401. The reflective mode phosphor member 3402 is attached to the base member, which could also include and intermediate submount member between the phosphor member 3402 and the base member 3401. The laser diode 3403 is mounted on an angled support member 3404, wherein the angled support member is attached to the base member 3401. The base member 3401 is configured to conduct heat away from the white light source and to a heat sink. The base member 3401 is comprised of a thermally conductive material such as copper, copper tungsten, aluminum, SiC, steel, diamond, composite diamond, AlN, sapphire, or other metals, ceramics, or semiconductors. The mounting to the base member 3401 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the electrodes of the laser diode are made to using wirebonds 3405 to members 3406. Wirebonds 3407 and 3408 are formed to internal feedthroughs 3409 and 3410. The feedthroughs are electrically coupled to external leads. The external leads can be electrically coupled to a power source to electrify the white light source and generate a laser beam 3411 incident on the phosphor member 3402 to create a primary excitation spot and yield a white light emission. A re-imaging optic 3414 is positioned on the opposite side of the phosphor member 3402 relative to the laser excitation source. The re-imaging optic 3414 functions to redirect and refocus the fraction of the excitation light that is reflected from the top surface of the phosphor member 3402. To avoid reduction in brightness or spot size increase, the re-imaging optic 3414 may create a reflected excitation spot on the phosphor member 3402 that is similar in size in shape to that of the primary excitation spot. Alternatively, the reimaged excitation spot may be smaller than the primary excitation spot. This re-imaging optic 3414 functions to prevent stray reflected laser light from escaping the package as a safety feature and can enhance the efficiency of the white light device by recycling the wasted reflected excitation light back onto the phosphor member 3402. The top surface of the base member 3401 may be comprised of, coated with, or filled with a reflective layer to prevent or mitigate any losses relating from downward directed or reflected light. Moreover, all surfaces within the package including the laser diode 3403 and submount member may be enhanced for increased reflectivity to help improve the useful white light output. In this configuration the white light source is not capped or sealed such that is exposed to the open environment. Of course, the example is FIG. 33B is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 33C:
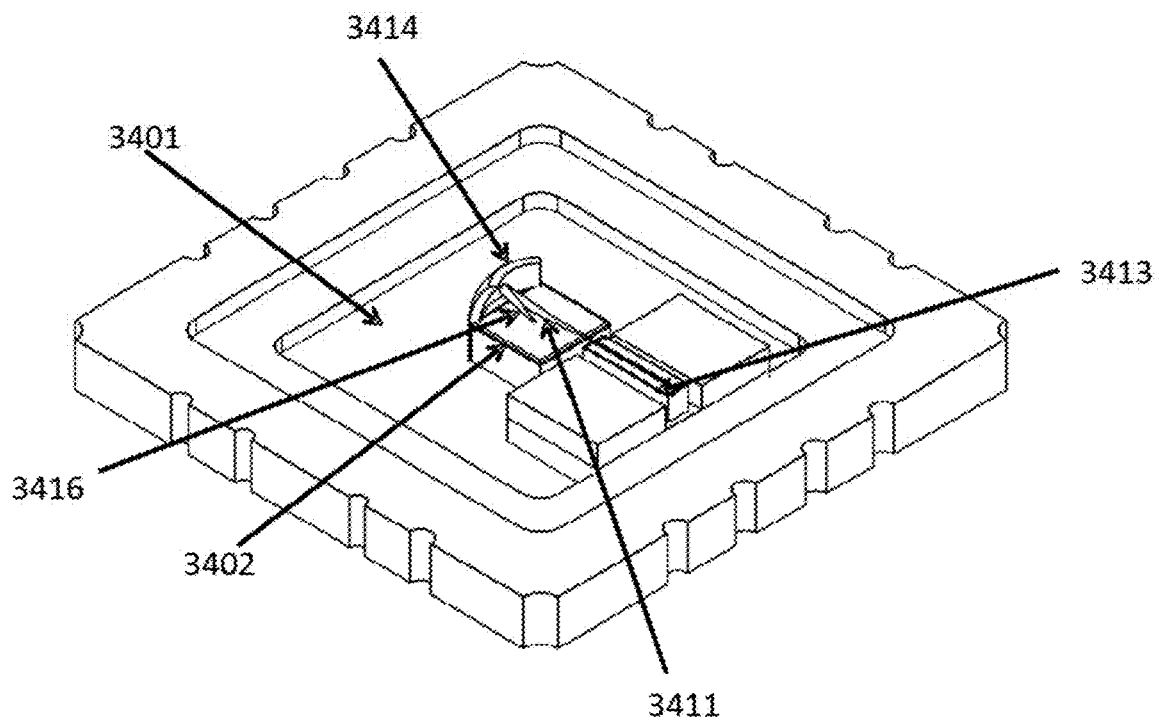
FIG. 33C is a simplified diagram illustrating a reflective mode phosphor integrated laser-based white light source mounted in a surface mount package with an integrated re-imaging optic to reflect and focus the direct laser beam onto the phosphor member.

An alternative example of a packaged white light source according to the present invention including a reflective optic is provided in the schematic diagram of FIG. 33C. In this example, a reflective mode white light source is configured in a surface mount device (SMD) type package including a reimaging optic to provide beam shaping benefits, manufacturability benefits, and a possible reduction of thermal impedance. In this example the SMD package has a common support base member 3401. The reflective mode phosphor member 3402 is attached to the base member, which could also include and intermediate submount member between the phosphor member and the base member. The laser diode on submount 3413 is mounted directly to the base of the package without the need for the angled support member as in FIG. 33B and other embodiments. The base member 3401 is configured to conduct heat away from the white light source and to a heat sink. The base member 3401 is comprised of a thermally conductive material such as copper, copper tungsten, aluminum, SiC, steel, diamond, composite diamond, AlN, sapphire, or other metals, ceramics, or semiconductors. The mounting to the base member 3401 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the electrodes of the laser diode are made by electrical coupling to feedthroughs in the package which are connected to external leads. The external leads can be electrically coupled to a power source to electrify the white light source and generate a laser beam 3411 incident on a re-imaging optic 3414 positioned on the opposite side of the phosphor member relative to the laser excitation source. The re-imaging optic 3414 functions to redirect and refocus the laser beam 3411 from the laser diode into an incident beam 3416 on the top surface of the phosphor 3402. In alternative configurations the re-imaging optic 3414 may be placed in alternative positions relative to the laser and phosphor. This general example using a re-imaging optic offers the advantage of potentially offering a more ideal spot size and geometry as dictated by the re-imaging optic and does not require inclusion of intermediate members such as the angled support member for easier manufacturing and lower thermal impedance. Moreover, this example provides a safety benefit. The use of the re-imaging optic 3414 can enable a very round excitation spot and/or a very small excitation spot such as less than 1 mm, less than 500 µm, less than 300 µm, less than 100 µm, or less than 50 µm. This re-imaging optic 3414 functions to prevent stray reflected laser light from escaping the package as a safety feature and can enhance the efficiency of the white light device by recycling the wasted reflected excitation light back onto the phosphor 3402. The top surface of the base member 3401 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. Of course, the example is FIG. 33C is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

In some embodiments of the present invention additional elements can be included within the package member to provide a shield or blocking function to stray or reflected light from the laser diode member. By blocking optical artifacts such as reflected excitation light, phosphor bloom patterns, or the light emitted from the laser diode not in the primary emission beam such as spontaneous light, scattered light, or light escaping a back facet the optical emission from the white light source can be more ideal for integration into lighting systems. Moreover, by blocking such stray light the integrated white light source will be inherently more safer. Finally, a shield member can act as an aperture such that white emission from the phosphor member is aperture through a hole in the shield. This aperture feature can form the emission pattern from the white source.

Figure 33D:
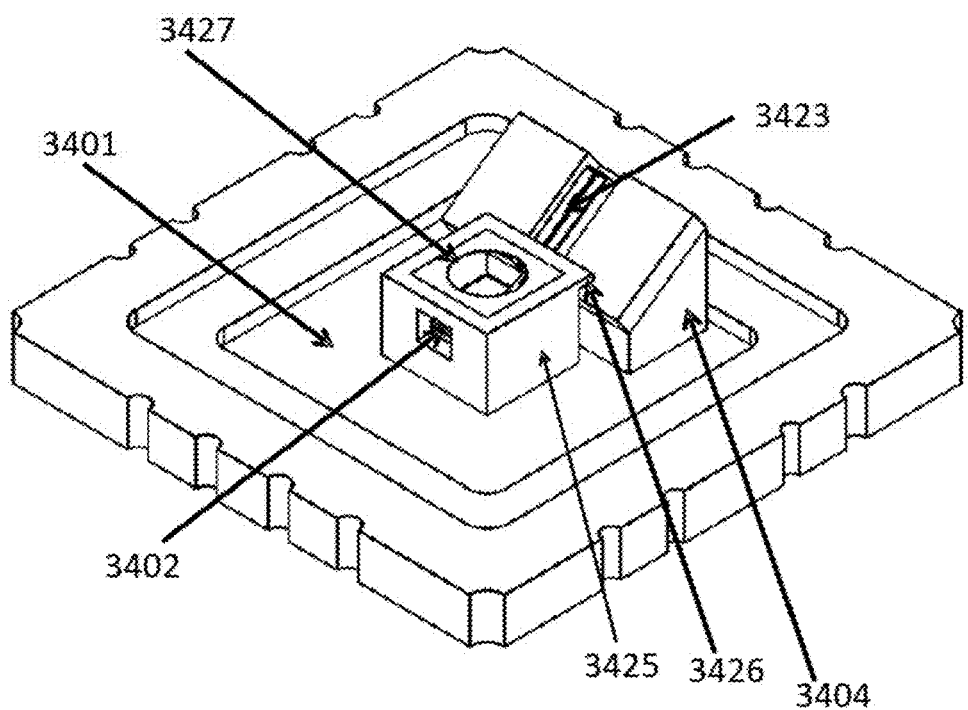
FIG. 33D is a simplified diagram illustrating a reflective mode phosphor integrated laser-based white light source mounted in a surface mount package with a shield or aperture member.

An alternative example of a packaged white light source according to the present invention including a reflective optic is provided in the schematic diagram of FIG. 33D. In this example, a reflective mode white light source is configured in a surface mount device (SMD) type package including a shield member to provide additional benefits such as improved white light emission spatial patter, reduction of undesired optical artifacts such as reflected excitation light or unwanted laser emission, and/or improved safety with prevention of stray laser light escaping the packaged. In this example the SMD package has a common support base member 3401. The reflective mode phosphor member 3402 is attached to the base member 3401 and at least partially enclosed by a shield member or aperture member. The shield member 3425 configured with at least an overhang 3426 to extend over the laser diode emitter facet. The laser diode on submount 3423 is mounted to an angled support member 3404 and attached to the base of the package. The base member 3401 is configured to conduct heat away from the white light source and to a heat sink. The base member 3401 is comprised of a thermally conductive material such as copper, copper tungsten, aluminum, SiC, steel, diamond, composite diamond, AlN, sapphire, or other metals, ceramics, or semiconductors. The mounting to the base member 3401 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the electrodes of the laser diode are made by electrical coupling to feedthroughs in the package which are connected to external leads. The external leads can be electrically coupled to a power source to electrify the white light source and generate a laser beam incident on the phosphor 3402 within the shield member 3425. The shield member configured with an aperture 3427 to allow the emission of the white light. In alternative configurations the shield member 3425 may enclose the entire laser diode and provide a further level of safety. The use of aperture 3427 can enable a very ideal or round excitation spot and/or a very small excitation spot such as less than 1 mm, less than 500 μm, less than 300 μm, less than 100 μm, or less than 50 μm. The top surface of the base member 3401 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. Of course, the example is FIG. 33D is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

In many applications according to the present invention, the packaged integrated white light source will be attached to a heat sink member. The heat sink is configured to transfer the thermal energy from the packaged white light source to a cooling medium. The cooling medium can be an actively cooled medium such as a thermoelectric cooler or a microchannel cooler, or can be a passively cooled medium such as an air-cooled design with features to maximize surface and increase the interaction with the air such as fins, pillars, posts, sheets, tubes, or other shapes. The heat sink will typically be formed from a metal member, but can be others such as thermally conductive ceramics, semiconductors, or composites.

The heat sink member is configured to transport thermal energy from the packaged laser diode based white light source to a cooling medium. The heat sink member can be comprised of a metal, ceramic, composite, semiconductor, plastic and is preferably comprised of a thermally conductive material. Examples of candidate materials include copper which may have a thermal conductivity of about 400 W/(mK), aluminum which may have a thermal conductivity of about 200 W/(mK), 4H—SiC which may have a thermal conductivity of about 370 W/(mK), 6H—SiC which may have a thermal conductivity of about 490 W/(mK), AlN which may have a thermal conductivity of about 230 W/(mK), a synthetic diamond which may have a thermal conductivity of about >1000 W/(mK), a composite diamond, sapphire, or other metals, ceramics, composites, or semiconductors. The heat sink member may be formed from a metal such as copper, copper tungsten, aluminum, or other by machining, cutting, trimming, or molding.

The attachment joint joining the packaged white light source according to this invention to the heat sink member should be carefully designed and processed to minimize the thermal impedance. Therefore a suitable attaching material, interface geometry, and attachment process practice must be selected for appropriate thermal impedance with sufficient attachment strength. Examples include AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink.

Figure 34:
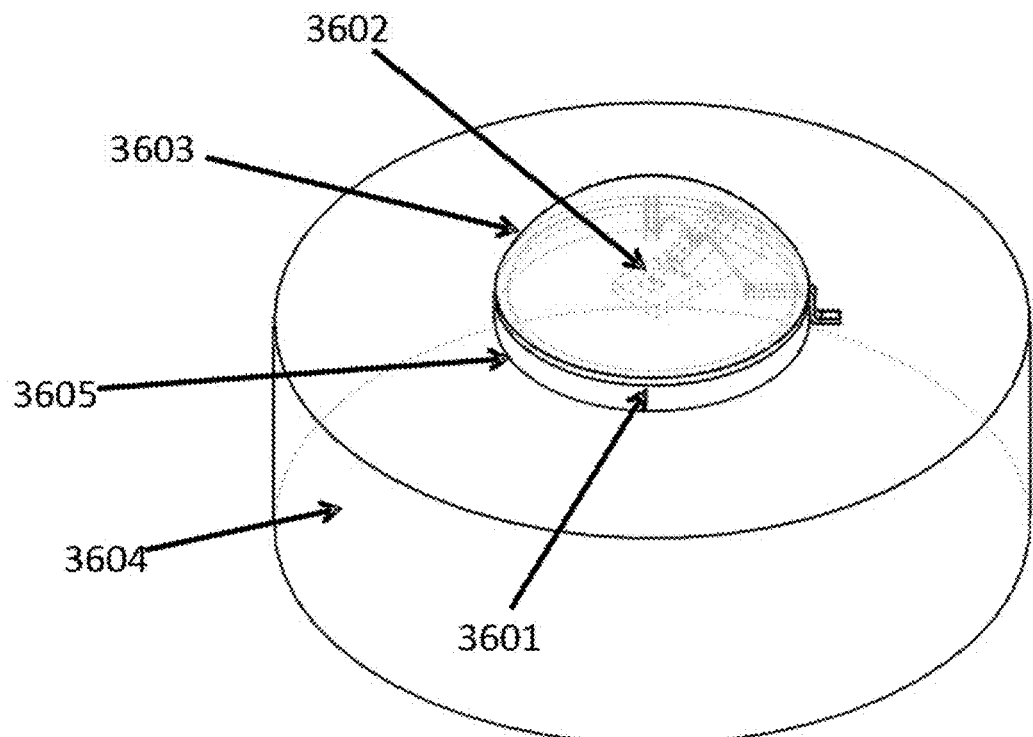
FIG. 34 is a simplified diagram illustrating a reflective mode phosphor integrated laser-based white light source mounted in a surface mount-type package, sealed with a cap member, and mounted on a heat-sink according to an embodiment of the present invention.

FIG. 34 is a schematic illustration of a CPoS white light source configured in a sealed SMD mounted on a heat sink member according to the present invention. The sealed white light source 3602 in an SMD package is similar to that example shown in FIG. 32. As seen in FIG. 34, the SMD type package has a base member 3601 (i.e., base member 3241 in FIG. 32) with the white light source 3602 mounted to the base member 3601 and a cap member 3603 providing a seal for the light source. The mounting to the base member 3601 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The cap member has at least a transparent window region. The transparent material can be glass, quartz, sapphire, silicon carbide, diamond, plastic, or any suitable transparent material. The base member 3601 of the SMD package is attached to a heat sink member 3604. The heat sink member 3604 can be comprised of a material such as a metal, ceramic, composite, semiconductor, or plastic and is preferably comprised of a thermally conductive material. Examples of candidate materials include aluminum, copper, copper tungsten, steel, SiC, AlN, diamond, a composite diamond, sapphire, or other materials. Of course, the example in FIG. 34 is merely an example and is intended to illustrate one possible configuration of a white light source according to the present invention mounted on a heat sink. Specifically, the heat sink member could include features to help transfer heat such as fins.

Light sources based on integrated lasers and phosphors mounted in packages such as an SMD can be attached to an external board to allow electrical and mechanical mounting of packages. In addition to providing electrical and mechanical interfaces to the SMD package, these boards also supply the thermal interface to the outside world such as a heat-sink. Such boards can also provide for improved handling for small packages such as an SMD (typically less than 2 cm×2 cm) during final assembly. In addition to custom board designs, there are a number of industry standard board designs that include metal core printed circuit board (MCPCB) with base being Cu, Al or Fe alloys, fiber filled epoxy boards such as the FR4, Flex/Hybrid Flex boards that are typically polyimide structures with Cu interlayers and dielectric isolation to be used in applications which need to be bent around a non-flat surface, or a standard heat sink material board that can be directly mounted to an existing metal frame in a larger system.

In many embodiments according to the present invention the completed SMD is attached to the next level board would employ industry standard attach methodologies and materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

Figure 34A:
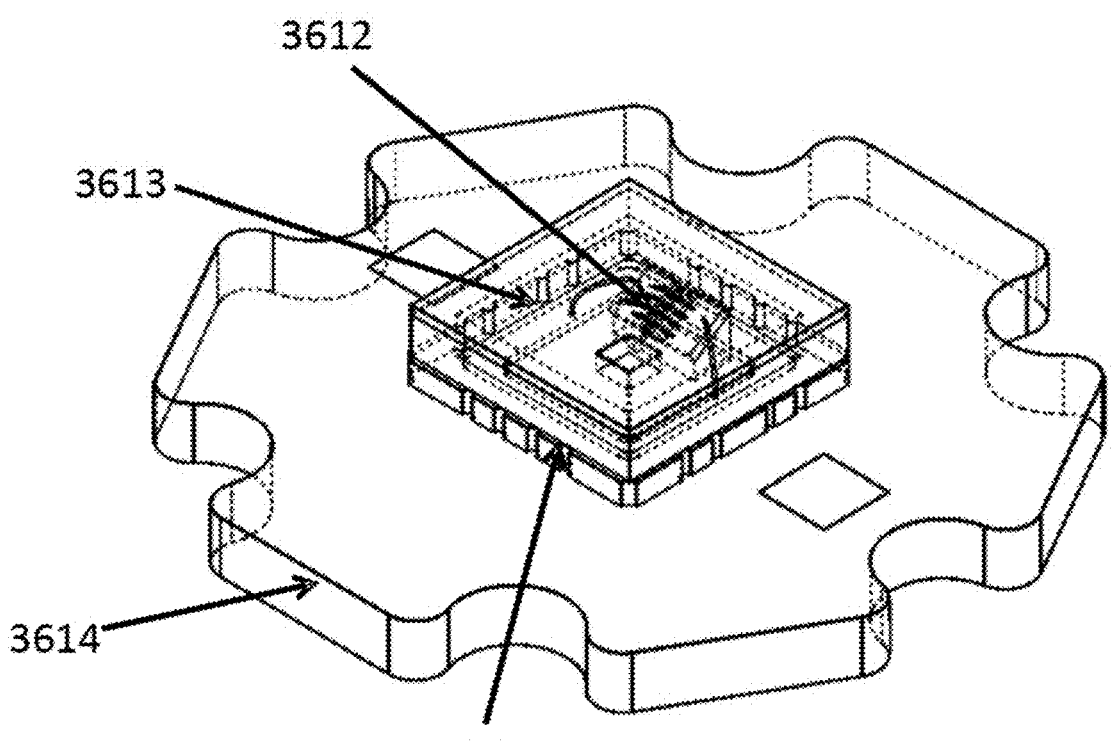
FIG. 34A is a simplified diagram illustrating a reflective mode phosphor integrated laser-based white light source mounted in a surface mount package mounted onto a starboard according to an embodiment of the present invention.

FIG. 34A is a schematic illustration of a white light source configured in a sealed SMD mounted on a board member such as a starboard according to the present invention. The sealed white light source 3612 in an SMD package is similar to that example shown in FIG. 32A. As seen in FIG. 34A, the SMD type package has a base member 3611 (i.e., the base member 3201 of FIG. 32A) with the white light source 3612 mounted to the base and a cap member 3613 providing a seal for the light source 3612. The mounting to the base member 3611 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressure-less sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900× C), processes can avoid thermal load restrictions on downstream processes, allowing completed devices to have very good and consistent bonds throughout. The cap member 3613 has at least a transparent window region. The transparent material can be glass, quartz, sapphire, silicon carbide, diamond, plastic, or any suitable transparent material. The base member 3611 of the SMD package is attached to a starboard member 3614 configured to allow electrical and mechanical mounting of the integrated white light source, provide electrical and mechanical interfaces to the SMD package, and supply the thermal interface to the outside world such as a heat-sink. The starboard member 3614 can be comprised of a material such as a metal, ceramic, composite, semiconductor, or plastic and is preferably comprised of a thermally conductive material. Examples of candidate materials include aluminum, alumina, copper, copper tungsten, steel, SiC, AlN, diamond, a composite diamond, sapphire, or other materials. Of course, the example in FIG. 34A is merely an example and is intended to illustrate one possible configuration of a white light source according to the present invention mounted on a heat sink. Specifically, the heat sink could include features to help transfer heat such as fins.

In some embodiments of this invention, the CPoS integrated white light source is combined with a optical member to manipulate the generated white light. In an example the white light source could serve in a spot light system such as a flashlight or an automobile headlamp or other light applications where the light must be directed or projected to a specified location or area. As an example, to direct the light it should be collimated such that the photons comprising the white light are propagating parallel to each other along the desired axis of propagation. The degree of collimation depends on the light source and the optics using to collimate the light source. For the highest collimation a perfect point source of light with 4-pi emission and a sub-micron or micron-scale diameter is desirable. In one example, the point source is combined with a parabolic reflector wherein the light source is placed at the focal point of the reflector and the reflector transforms the spherical wave generated by the point source into a collimated beam of plane waves propagating along an axis.

In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector.

In another example a simple singular lens or system of lenses is used to collimate the white light into a projected beam. In a specific example, a single aspheric lens is place in front of the phosphor member emitting white light and configured to collimate the emitted white light. In another embodiment, the lens is configured in the cap of the package containing the integrated white light source. In some embodiments, a lens or other type of optical element to shape, direct, or collimate the white light is included directly in the cap member. In an example the lens is comprised of a transparent material such as glass, SiC, sapphire, quartz, ceramic, composite, or semiconductor.

Such white light collimating optical members can be combined with the white light source at various levels of integration. For example, the collimating optics can reside within the same package as the integrated white light source in a co-packaged configuration. In a further level of integration the collimating optics can reside on the same submount or support member as the white light source. In another embodiment, the collimating optics can reside outside the package containing the integrated white light source.

In one embodiment according to the present invention, a reflective mode integrated white light source is configured in a flat type package with a lens member to create a collimated white beam as illustrated in FIGS. 35A-35B. As seen in FIGS. 35A-35B, the flat type package has a base or housing member 3501 with a collimated white light source 3502 mounted to the base and configured to create a collimated white beam to exit a window 3503 configured in the side of the base or housing member 3501. The mounting to the base or housing can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Electrical connections to the white light source 3502 can be made with wire bonds to the feedthroughs 3504 that are electrically coupled to external pins 3505. In this example, the collimated reflective mode white light source 3502 comprises the laser diode 3506, the phosphor wavelength converter 3507 configured to accept a laser beam emitted from the laser diode 3506, and a collimating lens such as an aspheric lens 3508 configured in front of the phosphor 3507 to collect the emitted white light and form a collimated beam. The collimated beam is directed toward the window 3503 formed from a transparent material. The transparent material can be glass, quartz, sapphire, silicon carbide, diamond, plastic, or any suitable transparent material. The external pins 3505 are electrically coupled to a power source to electrify the white light source 3502 and generate white light emission. As seen in the Figure, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, the example in FIGS. 35A-35B is merely an example and is intended to illustrate one possible configuration of sealing a white light source.

In one embodiment according to the present invention, a transmissive mode integrated white light source is configured in a flat type package with a lens member to create a collimated white beam as illustrated in FIGS. 36A-36B. As seen in FIGS. 36A-36B, the flat type package has a base or housing member 3501 with a collimated white light source 3512 mounted to the base member 3501 and configured to create a collimated white beam to exit a window 3503 configured in the side of the base or housing member 3501. The mounting to the base or housing member 3501 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/mK and electrical conductivity of about 16 micro-ohm×cm whereas pressureless sintered Ag can have a thermal conductivity of about 125 W/mK and electrical conductivity of about 4 micro-ohm×cm, or pressured sintered Ag can have a thermal conductivity of about 250 W/mK and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Electrical connections to the white light source 3512 can be made with wire bonds to the feedthroughs 3504 that are electrically coupled to external pins 3505. In this example, the collimated transmissive mode white light source 3512 comprises the laser diode 3516, the phosphor wavelength converter 3517 configured to accept a laser beam emitted from the laser diode 3516, and a collimating lens such as an aspheric lens 3518 configured in front of the phosphor 3517 to collect the emitted white light and form a collimated beam. The collimated beam is directed toward the window 3503 formed from a transparent material. The transparent material can be glass, quartz, sapphire, silicon carbide, diamond, plastic, or any suitable transparent material. The external pins 3505 are electrically coupled to a power source to electrify the white light source 3512 and generate white light emission. As seen in the Figure, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, the example in FIGS. 36A-36B is merely an example and is intended to illustrate one possible configuration of sealing a white light source.

Figure 35:
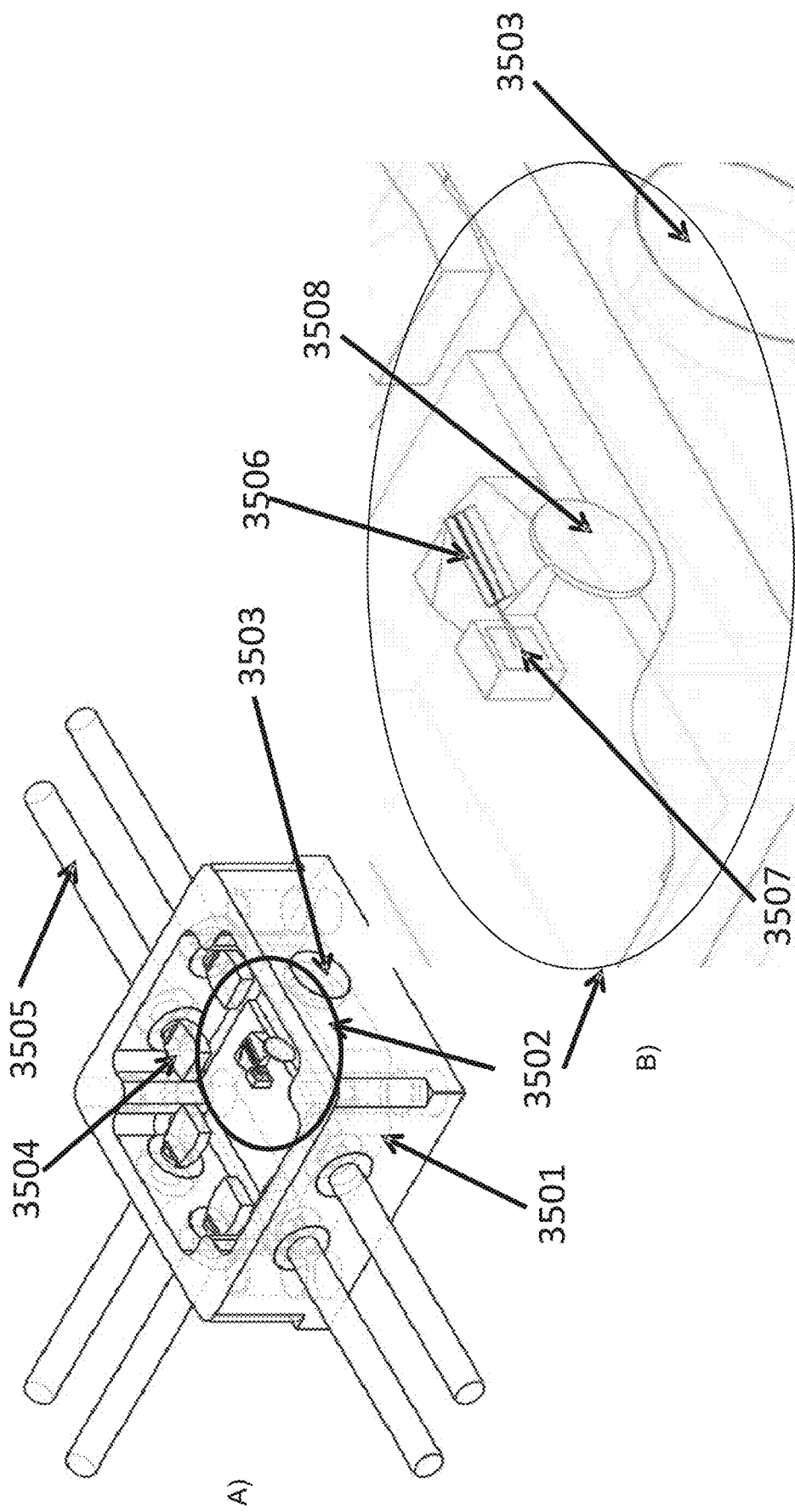
FIGS. 35A-35B are simplified diagrams illustrating a reflective mode phosphor integrated laser-based white light source mounted in a flat-type package with a collimating optic according to an embodiment of the present invention.
Figure 36:
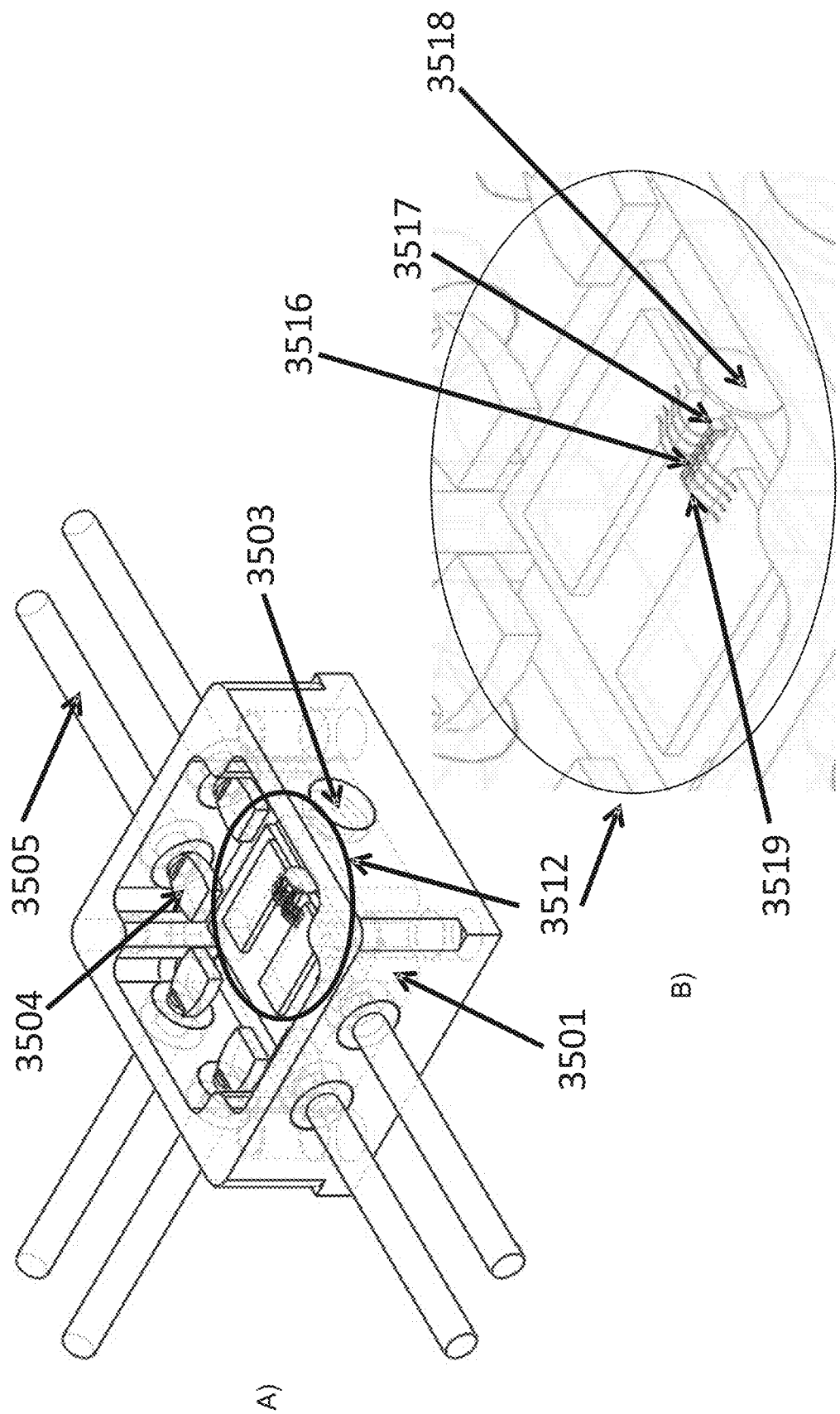
FIGS. 36A-36B are simplified diagrams illustrating a transmissive mode phosphor integrated laser-based white light source mounted in a flat-type package with a collimating optic according to an embodiment of the present invention.
Figure 37:
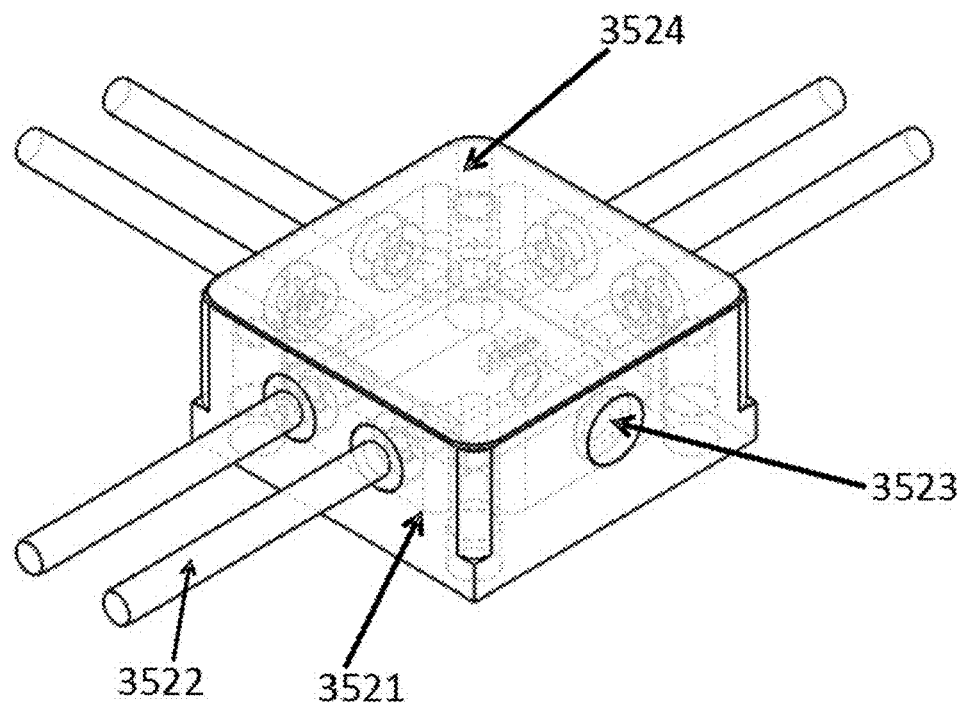
FIG. 37 is a simplified diagram illustrating an integrated laser-based white light source mounted in a flat-type package and sealed with a cap member according to an embodiment of the present invention.

The flat type package examples shown in FIGS. 35 and 36 according to the present invention are illustrated in an unsealed configuration without a lid to show examples of internal configurations. However, flat packages are easily sealed with a lid or cap member. FIG. 37 is an example of a sealed flat package with a collimated white light source inside. As seen in FIG. 37, the flat type package has a base or housing member 3521 with external pins 3522 configured for electrical coupling to internal components such as the white light source, safety features, and thermistors. The sealed flat package is configured with a window 3523 for the collimated white beam to exit and a lid or cap 3524 to form a seal between the external environment and the internal components. The lid or cap can be soldered, brazed, welded, glued to the base, or other. The sealing type can be an environmental seal or a hermetic seal, and in an example the sealed package is backfilled with a nitrogen gas or a combination of a nitrogen gas and an oxygen gas.

Figure 38:
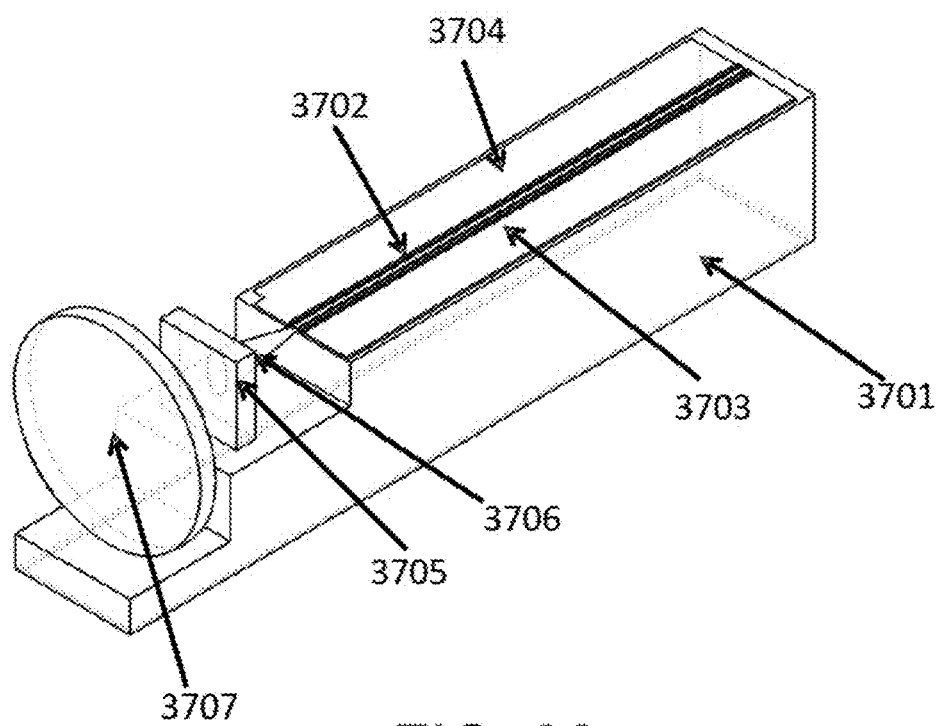
FIG. 38 is a simplified diagram illustrating an integrated laser-based white light source operating in transmissive mode with a collimating lens according to an embodiment of the present invention.

FIG. 38 presents a schematic diagram illustrating a transmissive phosphor embodiment of an integrated white light source including a white light collimating optic according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment such as those shown in FIG. 4 and in FIG. 11 could be used for this integrated collimated white light embodiment. The laser based CPoS white light device is comprised of submount material 3701 that serves as the common support member configured to act as an intermediate material between a laser diode 3702 formed in transferred gallium and nitrogen containing epitaxial layers and a final mounting surface and as an intermediate material between the phosphor plate material 3705 and a final mounting surface. The laser diode 3702 and/or submount is configured with electrodes 3703 and 3704 that may be formed with deposited metal layers and combination of metal layers including, but not limited to Au, Pd, Pt, Ni, Al, titanium, or others. Wirebonds can be configured to couple the electrical power to the electrodes 3703 and 3704 on the laser diode. The laser beam 3706 is incident on the phosphor 3705 to form a white a light exiting the phosphor 3705. The white light exiting the phosphor 3705 is coupled into a lens such as an aspheric lens 3707 for collimation and beam shaping. The electrodes 3703 and 3704 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration with an integrated collimating optic and there could be many variants on this embodiment including using a conventional chip on submount configuration as shown in FIG. 4 for integration of the collimation optic with the laser diode and phosphor. In other alternatives phosphors with different sizes and shapes can be used, different geometrical designs of the submount or common support member can be used, different orientations of the laser output beam with respect to the phosphor can be deployed, and different electrode and electrical designs can be implemented, and others.

Figure 39:
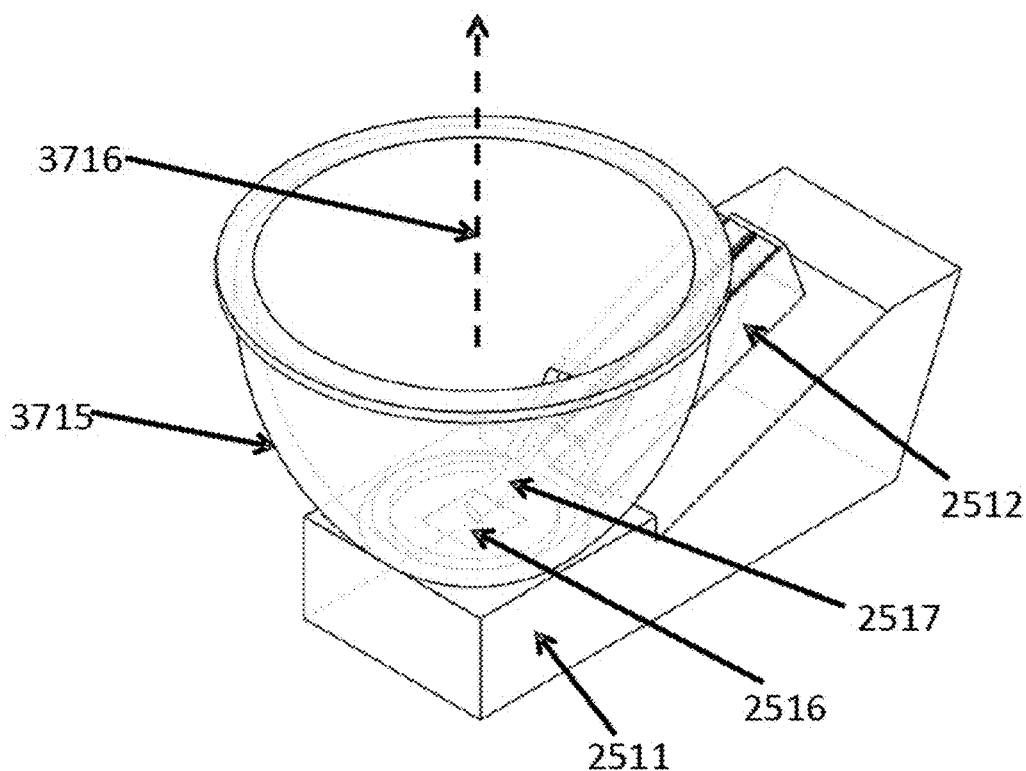
FIG. 39 is a simplified diagram illustrating an integrated laser-based white light source operating in reflective mode with a collimating reflector according to an embodiment of the present invention.

FIG. 39 presents a schematic diagram illustrating a reflective mode phosphor embodiment of an integrated white light source according to FIG. 25, but also including a reflector optic such as a parabolic reflector to collimate the white light according to the present invention. In this embodiment the gallium and nitrogen containing laser diode or chip on submount is mounted on a common support member which could be the submount member 2512 for the laser diode. The common support member also supports the phosphor member 2516 configured to be located in the pathway of the laser diode output beam 2517, wherein the laser diode beam can excite the phosphor and emit a white light. A reflector member 3715 such as a parabolic reflector is positioned with respect to the primary emission surface of the phosphor member 2516 such that the phosphor member 2516 is near the focal point of the reflector member 3715. The reflector member 3715 is configured to collect the white emission from the phosphor 2516 and collimate it into a beam of white light projected along an axis 3716. The reflector member 3715 is configured with an opening or other entry for the laser beam 2517 to enter inside the reflector to interact with the phosphor 2516. In other alternatives phosphors with different sizes and shapes can be used, different geometrical designs of the submount or common support member can be used, different orientations of the laser output beam with respect to the phosphor can be deployed, different collimation optics or other optics can be used, and different electrode and electrical designs can be implemented, and others.

Figure 40:
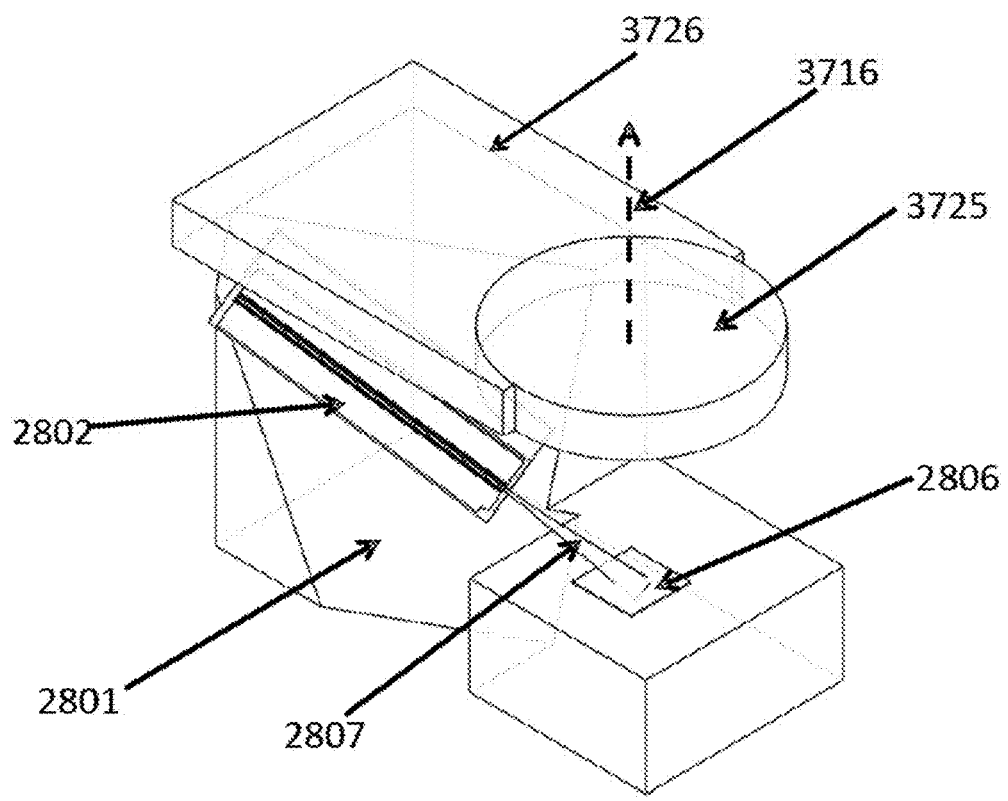
FIG. 40 is a simplified diagram illustrating an integrated laser-based white light source operating in reflective mode with a collimating lens according to an embodiment of the present invention.

FIG. 40 presents a schematic diagram illustrating a reflective mode phosphor embodiment of an integrated white light source according to FIG. 28, but also including a lens such as an aspheric lens to collimate the white light according to the present invention. In this embodiment the gallium and nitrogen containing laser diode 2802 or chip on submount is mounted on a common support member 2801 which could be the submount member for the laser diode 2802. The common support member 2801 also supports the phosphor member 2806 configured to be located in the pathway of the laser diode output beam 2807, wherein the laser diode output beam 2807 can excite the phosphor member 2806 and emit a white light. A lens member 3725 such as an aspheric lens is positioned in front of or above the primary emission surface from the phosphor member 2806. The lens 3725 is configured to collect the white emission from the phosphor member 2806 and collimate it into a beam of white light projected along an axis 3716. The lens 3725 is supported by a mechanical support member, which can be an additional member 3726 or can be supported directly by the common support member. In other alternatives phosphors with different sizes and shapes can be used, different geometrical designs of the submount or common support member can be used, different orientations of the laser output beam with respect to the phosphor can be deployed, different collimation optics or other optics can be used, and different electrode and electrical designs can be implemented, and others.

Figure 41:
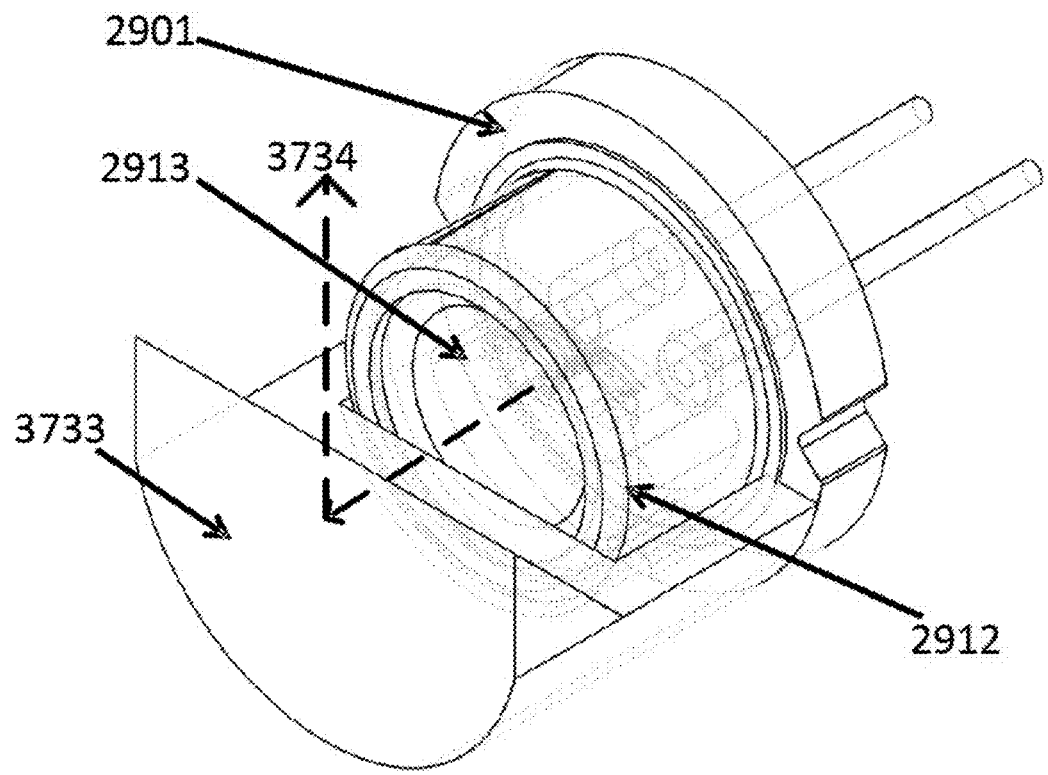
FIG. 41 is a simplified diagram illustrating an integrated laser-based white light source mounted in a can-type package with a collimating reflector according to an embodiment of the present invention.

FIG. 41 is a schematic illustration of the CPoS white light source configured in a can type package as shown in FIG. 30, but with an additional reflector member configured to collimate and project the white light. The example configuration for a collimated white light from TO-can type package according to FIG. 42 comprises a TO-can base 2901, a cap 2912 configured with a transparent window region 2913 mounted to the base. The cap 2912 can be soldered, brazed, welded, or glue to the base. A reflector member 3733 is configured outside the window region 2913 wherein the reflector member 3733 functions to capture the emitted white light passing the window, collimate the light, and then project it along the axis 3734. Of course, this is merely an example and is intended to illustrate one possible configuration of combining the integrated CPoS white light source according to this invention with a collimation optic. In another example, the reflector could be integrated into the window member of the cap or be included within the TO package member.

Figure 42:
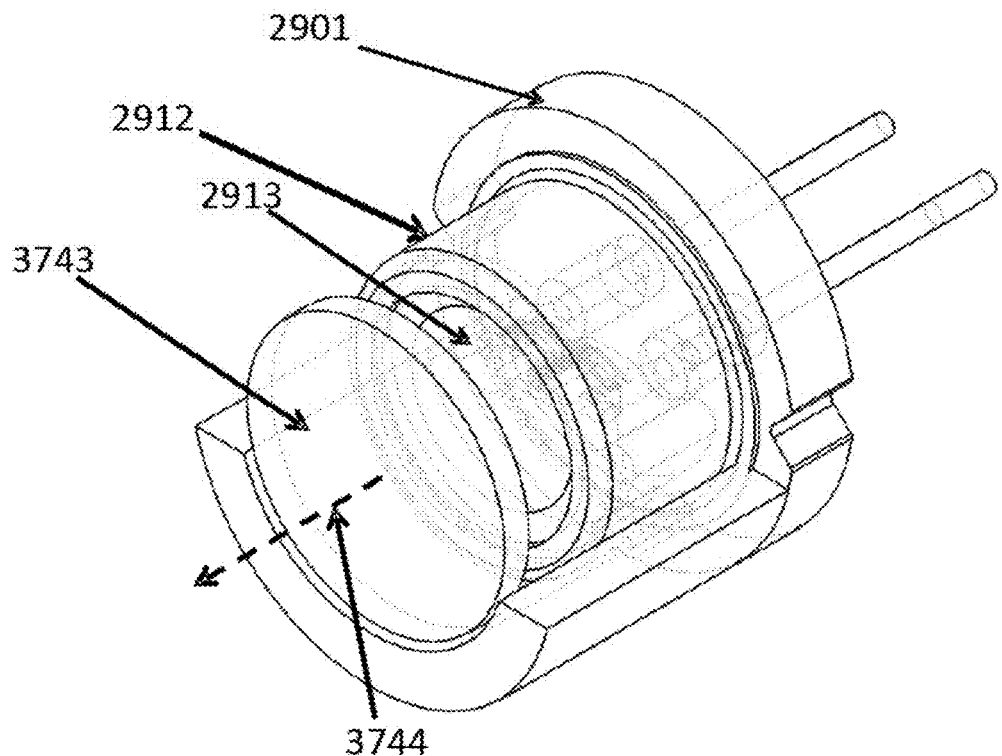
FIG. 42 is a simplified diagram illustrating an integrated laser-based white light source mounted in a can-type package with a collimating lens according to an embodiment of the present invention.

In an alternative embodiment, FIG. 42 provides a schematic illustration of the CPoS white light source configured in a can type package as shown in FIG. 30, but with an additional lens member configured to collimate and project the white light. The example configuration for a collimated white light from TO-can type package according to FIG. 42 comprises a TO-can base 2901, a cap 2912 configured with a transparent window region 2913 mounted to the base 2901. The cap 2912 can be soldered, brazed, welded, or glue to the base. An aspheric lens member 3743 configured outside the window region 2913 wherein the lens 3743 functions to capture the emitted white light passing the window, collimate the light, and then project it along the axis 3744. Of course, this is merely an example and is intended to illustrate one possible configuration of combining the integrated white light source according to this invention with a collimation optic. In another example, the collimating lens could be integrated into the window member on the cap or could be included within the package member.

Figure 43:
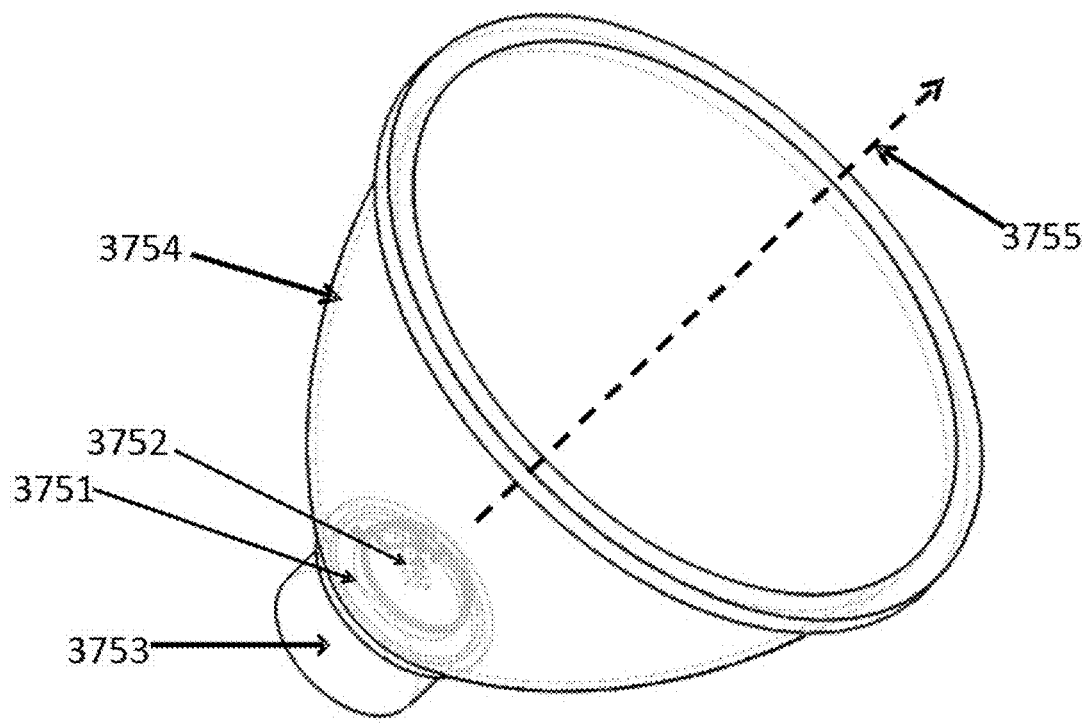
FIG. 43 is a simplified diagram illustrating a reflective mode phosphor integrated laser-based white light source mounted in a surface mount type package mounted on a heat sink with a collimating reflector according to an embodiment of the present invention.

In an alternative embodiment, FIG. 43 provides a schematic illustration of a white light source according to this invention configured in an SMD-type package as shown in FIG. 32, but with an additional parabolic member configured to collimate and project the white light. The example configuration for a collimated white light from SMD-type package according to FIG. 43 comprises an SMD type package 3751 comprising a based and a cap or window region and the integrated white light source 3752. The SMD package is mounted to a heat-sink member 3753 configured to transport and/or store the heat generated in the SMD package from the laser and phosphor member. A reflector member 3754 such as a parabolic reflector is configured with the white light emitting phosphor member of the white light source at or near the focal point of the parabolic reflector. The parabolic reflector functions to collimate and project the white light along the axis of projection 3755. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

Figure 43A:
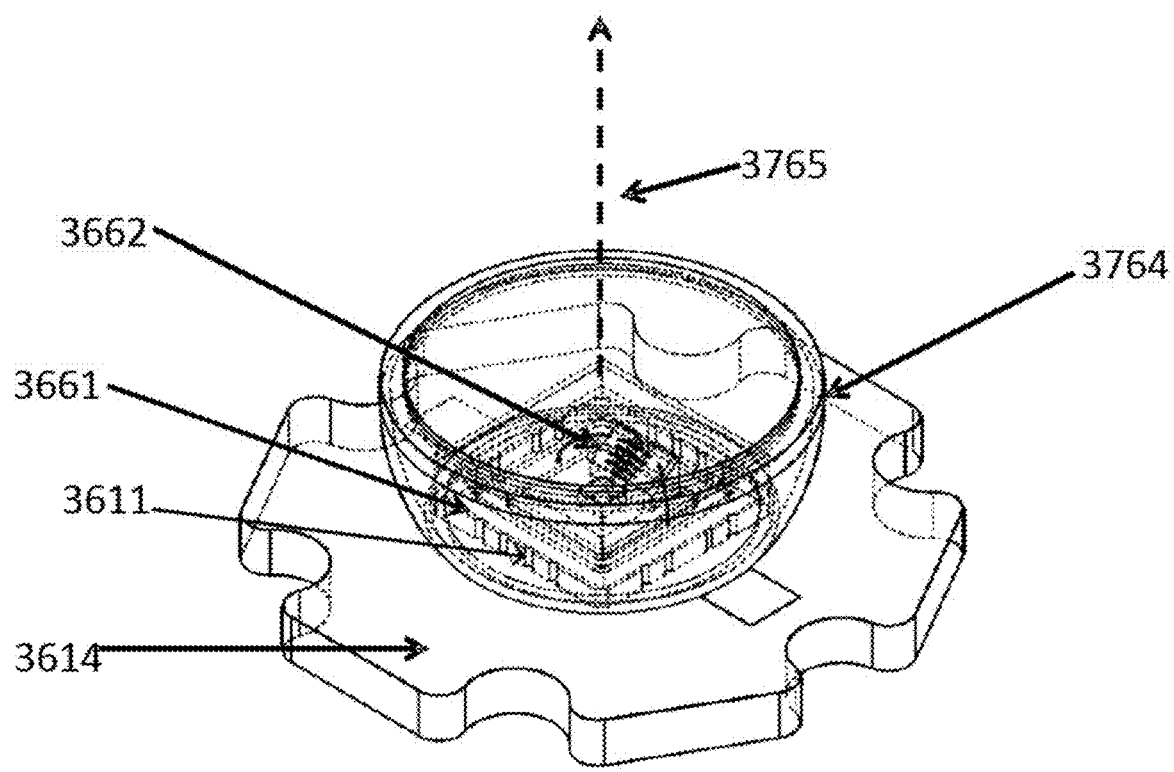
FIG. 43A is a simplified diagram illustrating a reflective mode phosphor integrated laser-based white light source mounted in a surface mount type package mounted on a starboard with a collimating reflector according to an embodiment of the present invention.

In an alternative embodiment, FIG. 43A provides a schematic illustration of a white light source according to this invention configured in an SMD-type package as shown in FIG. 34A, but with an additional parabolic reflector member or alternative collimating optic member such as lens or TIR optic configured to collimate and project the white light. The example configuration for a collimated white light from SMD-type package according to FIG. 43A comprises an SMD type package 3661 comprising a based 3611 and a cap or window region and the integrated white laser based light source 3662. The SMD package 3661 is mounted to a starboard member 3614 configured to allow electrical and mechanical mounting of the integrated white light source, provide electrical and mechanical interfaces to the SMD package 3661, and supply the thermal interface to the outside world such as a heat-sink. A reflector member 3764 such as a parabolic reflector is configured with the white light emitting phosphor member of the white light source at or near the focal point of the parabolic reflector. The parabolic reflector 3764 functions to collimate and project the white light along the axis of projection 3765. Of course, this is merely an example and is intended to illustrate one possible configuration of combining the integrated white light source according to this invention with a reflector collimation optic. In another example, the collimating reflector could be integrated into the window member of the cap or could be included within the package member. The collimating optic could be a lens member, a TIR optic member, a parabolic reflector member, or an alternative collimating technology, or a combination. In an alternative embodiment, the reflector is integrated with or attached to the submount.

Figure 44:
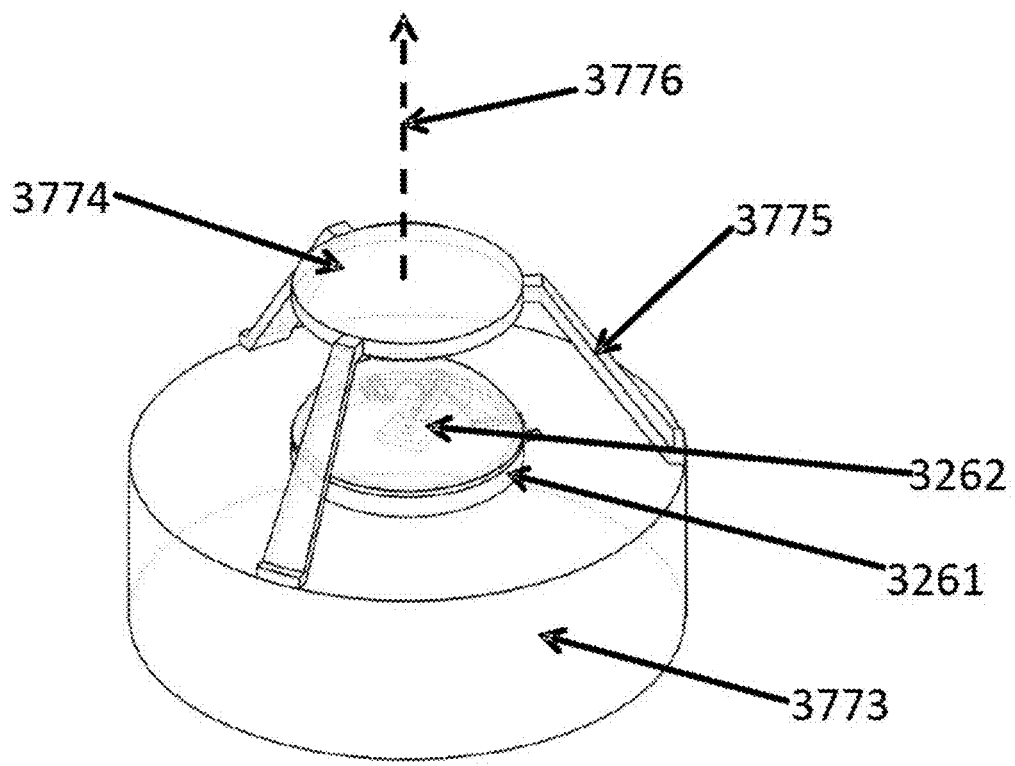
FIG. 44 is a simplified diagram illustrating a reflective mode phosphor integrated laser-based white light source mounted in a surface mount type package mounted on a heat sink with a collimating lens according to an embodiment of the present invention.

In an alternative embodiment, FIG. 44 provides a schematic illustration of a white light source according to this invention configured in an SMD-type package as shown in FIG. 32, but with an additional lens member configured to collimate and project the white light. The example configuration for a collimated white light from SMD-type package according to FIG. 44 comprises an SMD type package 3261 comprising a based and a cap or window region and the integrated white light source 3262. The SMD package 3261 is mounted to a heat-sink member 3773 configured to transport and/or store the heat generated in the SMD package 3261 from the laser and phosphor member. A lens member 3774 such as an aspheric lens is configured with the white light emitting phosphor member of the white light source 3262 to collect and collimate a substantial portion of the emitted white light. The lens member 3774 is supported by support members 3775 to mechanically brace the lens member 3774 in a fixed position with respect to the white light source 3262. The support members 3775 can be comprised of metals, plastics, ceramics, composites, semiconductors or other. The lens member 3774 functions to collimate and project the white light along the axis of projection 3776. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

Figure 45:
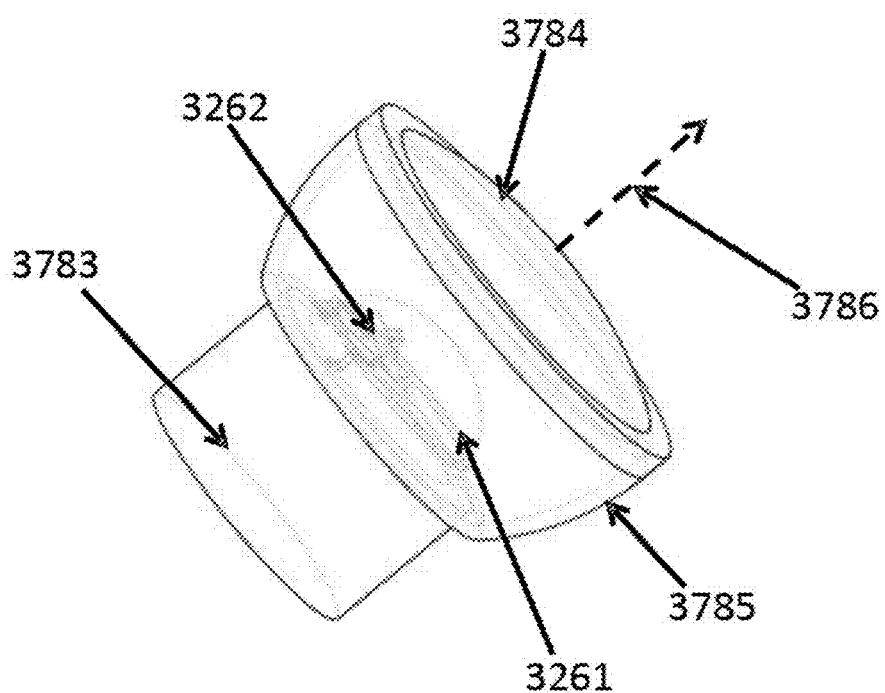
FIG. 45 is a simplified diagram illustrating a reflective mode phosphor integrated laser-based white light source mounted in a surface mount type package mounted on a heat sink with a collimating lens and reflector member according to an embodiment of the present invention.

In an embodiment according to the present invention, FIG. 45 provides a schematic illustration of a white light source according to this invention configured in an SMD-type package as shown in FIG. 32, but with an additional lens member and reflector member configured to collimate and project the white light. The example configuration for a collimated white light from SMD-type package according to FIG. 45 comprises an SMD type package 3261 comprising a based and a cap or window region and the integrated white light source 3262. The SMD package 3261 is mounted to a heat-sink member 3783 configured to transport and/or store the heat generated in the SMD package 3261 from the laser and phosphor member. A lens member 3784 such as an aspheric lens is configured with the white light source 3262 to collect and collimate a substantial portion of the emitted white light. A reflector housing member 3785 or lens member 3784 is configured between the white light source 3262 and the lens member 3784 to reflect any stray light or light (that would not otherwise reach the lens member) into the lens member for collimation and contribution to the collimated beam. In one embodiment the lens member 3784 is supported by the reflector housing member 3785 to mechanically brace the lens member 3784 in a fixed position with respect to the white light source 3262. The lens member 3784 functions to collimate and project the white light along the axis of projection 3786. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

Integrated laser plus phosphor light sources devices in packages such as an SMD can be attached to an external board to allow electrical and mechanical mounting of packages. In addition to providing electrical and mechanical interfaces to the SMD package, these boards also supply the thermal interface to the outside world such as a heat-sink. Such boards can also provide for improved handling for small packages such as an SMD (typically less than 2 cm×2 cm) during final assembly. In addition to custom board designs, there are a number of industry standard board designs that include metal core printed circuit board (MCPCB) with base being Cu, Al or Fe alloys, fiber filled epoxy boards such as the FR4, Flex/Hybrid Flex boards that are typically polyimide structures with Cu interlayers and dielectric isolation to be used in applications which need to be bent around a non-flat surface, or a standard heat sink material board that can be directly mounted to an existing metal frame in a larger system.

A further understanding of the nature and advantages of the present invention may be realized by reference to the latter portions of the specification and attached drawings.

In all of the side pumped and transmissive and reflective embodiments of this invention the additional features and designs can be included. For example shaping of the excitation laser beam for optimizing the beam spot characteristics on the phosphor can be achieved by careful design considerations of the laser beam incident angle to the phosphor or with using integrated optics such as free space optics like collimating lens. Safety features can be included such as passive features like physical design considerations and beam dumps and/or active features such as photodetectors or thermistors that can be used in a closed loop to turn the laser off when a signal is indicated. Moreover, optical elements can be included to manipulate the generated white light. In some embodiments reflectors such as parabolic reflectors or lenses such as collimating lenses are used to collimate the white light or create a spot light that could be applicable in an automobile headlight, flashlight, spotlight, or other lights.

In one embodiment, the present invention provides a laser-based white light source comprising a form factor characterized by a length, a width, and a height. The apparatus has a support member and at least one gallium and nitrogen containing laser diode devices and phosphor material overlying the support member. The laser device is capable of providing an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In a preferred embodiment the phosphor material can provide a yellowish emission in the 560 nm to 580 nm range such that when mixed with the blue emission of the laser diode a white light is produced. In other embodiments, phosphors with red, green, yellow, and even blue emission can be used in combination with the laser diode excitation source to produce a white light emission with color mixing. The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In other embodiments free space optics such as collimating lenses can be used to shape the beam prior to incidence on the phosphor. The beam can be characterized by a polarization purity of greater than 60% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 10 W. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the laser diode device to generate the laser beam and excite the phosphor material. The white light source configured to produce greater than 1 lumen, 10 lumens, 100 lumens, 250 lumens, 500 lumens, 1000 lumens, 3000 lumens, 10000 lumens, or greater of white light output. The support member is configured to transport thermal energy from the at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

According to an embodiment, the present invention provides a dynamic laser-based light source or light projection apparatus including a micro-display such as a microelectromechanical system (MEMS) scanning mirror, or "flying mirror" or a digital light processing (DLP) chip to dynamically modify the spatial pattern and/or the color of the emitted light. In one embodiment the light is pixelated to activate certain pixels and not activate other pixels to form a spatial pattern or image of white light. In another example, the dynamic light source is configured for steering or pointing the light beam. The steering or pointing can be accomplished by a user input configured from a dial, switch, or joystick mechanism or can be directed by a feedback loop including sensors.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes a of a violet laser diode or blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a microelectromechanical system (MEMS) scanning mirror, or "flying mirror", configured to project the laser light or laser pumped phosphor white light to a specific location to the outside world. By rastering the laser beam using the MEMS mirror a pixel in two dimensions can be formed to create a pattern or image.

According to an embodiment, the present invention includes a housing having an aperture and an input interface for receiving one or more signals such as frames of images. The dynamic light system also includes a processing module. In one embodiment, the processing module is electrically coupled to an ASIC for driving the laser diode and the MEMS scanning mirrors.

In one embodiment, a laser driver module is provided. Among other things, the laser driver module is adapted to adjust the amount of power to be provided to the laser diode. For example, the laser driver module generates a drive current based one or more pixels from the one or more signals such as frames of images, the drive currents being adapted to drive a laser diode. In a specific embodiment, the laser driver module is configured to generate pulse-modulated signal at a frequency range of about 50 to 300 MHz.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes a violet laser diode or blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a laser driver module coupled to the laser source. The apparatus can include a digital light processing (DLP) chip comprising a digital mirror device. The digital mirror device includes a plurality of mirrors, each of the mirrors corresponding to one or more pixels of the one or more frames of images. The apparatus includes a power source electrically coupled to the laser source and the digital light processing chip.

The apparatus can include a laser driver module coupled to the laser source. The apparatus includes an optical member provided within proximity of the laser source, the optical member being adapted to direct the laser beam to the digital light processing chip. The apparatus includes a power source electrically coupled to the laser source and the digital light processing chip. In one embodiment, the dynamic properties of the light source may be initiated by the user of the apparatus. For example, the user may activate a switch, dial, joystick, or trigger to modify the light output from a static to a dynamic mode, from one dynamic mode to a different dynamic mode, or from one static mode to a different static mode.

In a specific embodiment of the present invention including a dynamic light source, the dynamic feature is activated by a feedback loop including a sensor. Such sensors may be selected from, but not limited to a microphone, geophone, hydrophone, a chemical sensor such as a hydrogen sensor, CO2 sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video sensor, transducer, image sensor, infrared sensor, SONAR, LIDAR, or others.

In one example of a dynamic light feature including a feedback loop with a sensor a motion sensor is included. The dynamic light source is configured to illuminate a location where the motion is detected by sensing the spatial of position of the motion and steering the output beam to that location. In another example of a dynamic light feature including a feedback loop with a sensor an accelerometer is included. The accelerometer is configured to anticipate where the laser light source apparatus is moving toward and steer the output beam to that location even before the user of the apparatus can move the light source to be pointing at the desired location. Of course, these are merely examples of implementations of dynamic light sources with feedback loops including sensors. There can be many other implementations of this invention concept that includes combining dynamic light sources with sensors.

In certain embodiments, the integrated white light source apparatus includes an electrostatic discharge (ESD) protection element. For example, an ESD protection element would be used to protect the integrated white light source from damage that could occur with a sudden flow of current resulting from a build-up of charge. In one example a transient voltage suppression (TVS) element is employed.

In certain embodiments, the integrated white light source apparatus, the source is operable in an environment comprising at least 150,000 ppm oxygen gas.

In certain embodiments, the integrated white light source apparatus, the support member comprises a material selected from copper, copper tungsten, aluminum, silicon, and a combination of any of the foregoing.

In certain embodiments, the integrated white light source apparatus comprises a microchannel cooler thermally coupled to the support member.

In certain embodiments, the integrated white light source apparatus comprises a heat heat-sink thermally coupled to the common support member. In one example the heat sink has fins or a measure for increased surface area.

In certain embodiments, the integrated white light source apparatus comprises a heat spreader coupled between the common support member and the heat sink.

In certain embodiments, the integrated white light source apparatus, an optical coupler comprises one or more optical fibers.

In certain embodiments of the integrated white light source apparatus, the output beam is geometrically configured to optimize an interaction with a phosphor material.

In certain embodiments of the integrated white light source apparatus, the white light source is configured in a package. In one example, the package is hermetically sealed.

In certain embodiments of the integrated white light source apparatus, the white light source is configured in a package such a flat package(s), surface mount packages such as SMDs, TO9 Can, TO56 Can, TO-5 can, TO-46 can, CS-Mount, G-Mount, C-Mount, micro-channel cooled package(s), and others.

In certain embodiments of the integrated white light source apparatus, the emitted white light is collimated using a reflector or lens.

Figure 46:
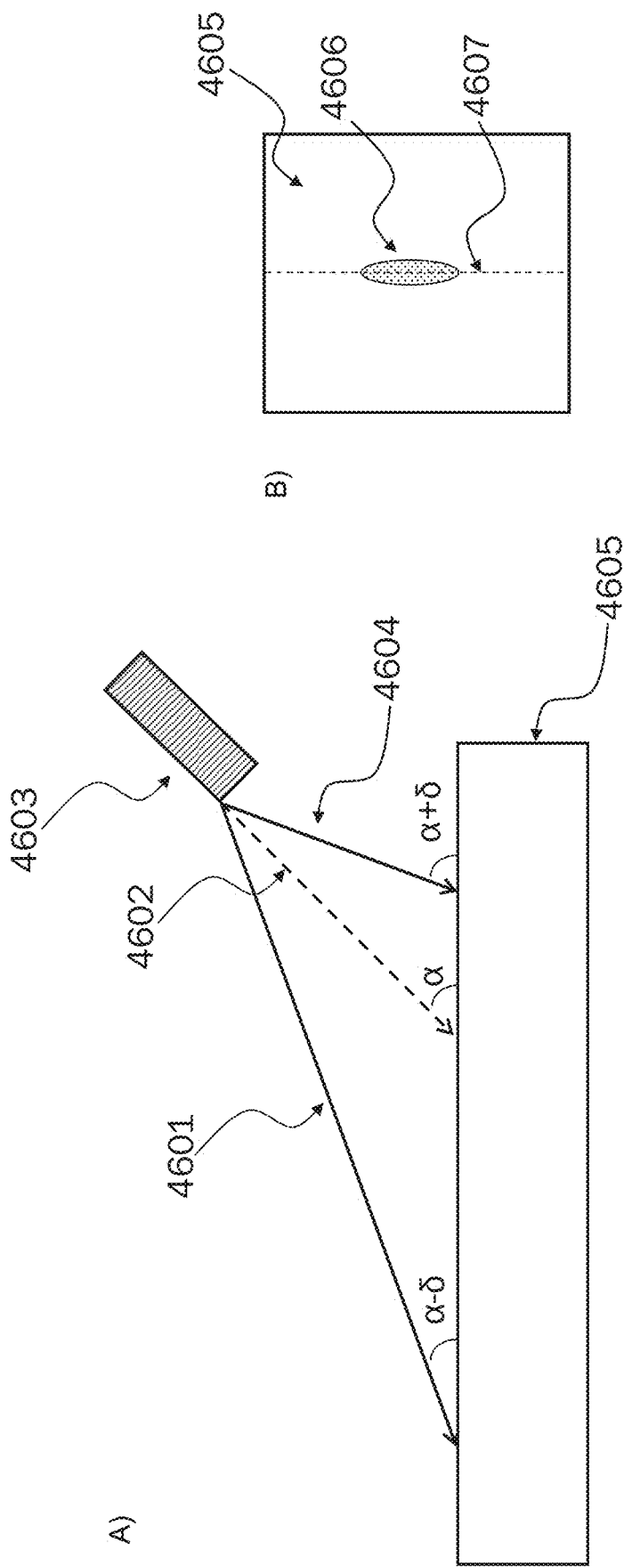
FIGS. 46A-46B are simplified diagrams illustrating a geometrical layout of a laser pumped phosphor white light emitter operated in reflection mode according to an embodiment of the present invention.

In another aspect, the present invention provides a device configured as laser-pumped solid-state white light source operating in reflection mode. FIG. 46A shows a schematic representation of such a device. A phosphor plate 4605 is illuminated by a blue or violet laser from a laser diode 4603 with the centerline of emission incident at some angle α relative to a top surface of the phosphor plate 4605. Optionally, the angle of incidence sometime is described as an angle relative to surface normal, which is equal to 90−α. The laser light is diverging in embodiments where the laser light is not collimated with a lens, such that a full width at half max (FWHM) angle 26 for the laser light is relatively large. Numerals 4602 represents the centerline direction of the laser emission, 4601 and 4604 respectively correspond to the upper and lower bounds of the FWHM angles. The centerline 4602 is incident on the phosphor at an angle α while the upper extreme of the far-field is incident at α−δ and the lower extreme is incident at α+δ. In other words, the angle of incidence of the laser light on the top surface of the phosphor plate 4605 varies from α−δ to α+δ across the major axis of the light spot 4606. Referring to FIG. 46B, the diverged laser light leads to an elongated light spot 4606 on the phosphor plate 4605. A cross section line 4607 of the light spot 4606 is shown in a dashed line in parallel to the fast axis of the laser propagation.

In some embodiments, the angle of incidence of the laser light to hit the phosphor relative to surface normal can be provided in a range between 0 degrees to 89 degrees. In an embodiment, even a laser fired parallel (nearly 90 degrees relative to surface normal) to a phosphor surface will have some interaction with the phosphor due to divergence. There may be good reason to choose a configuration like this where the excitation blue laser light never interacts with a surface to maintain its coherence. The angle of incidence between the laser beams and the phosphor member is comprised of an incidence angle with respect to the fast-axis and an incidence angle with respect to the slow-axis. At least one of the incidence angles with respect to the fast axis or the incidence angle with respect to the slow axis is an off-normal angle ranging between 0 degrees and 89 degrees. In another embodiment, a 0 degree laser beam striking perpendicular to phosphor surface would also have angled light at +/−20 degrees relative to the surface normal due to divergence when the laser light is provided without collimation. This may also be an interesting configuration where the phosphor is in a base of a parabolic mirror, the laser diode is mounted up in space, and the collection and propagation of the phosphor-emitted light is truly reflected light only. In some embodiments, for most configurations of making the laser-based white light source in reflection mode or transmission mode, the excitation laser light can be configured to hit the phosphor surface with a laser beam in an angle of incidence with respect to the fast-axis relative to surface normal of the phosphor member in a range between 25 degrees and 45 degrees. Due to about +/−20 degrees angled divergence in the case without collimation, the angle of incidence between the laser beams without any collimation and the phosphor member is comprised of an incidence angle with respect to the fast-axis and is characterized by angle ranging between 5 degrees and 65 degrees.

In some embodiments, the laser light is incident into the phosphor plate as a pump laser light for exciting the phosphor material to generate an emitted light with wavelengths longer than that of the pump laser light. In general, spectrum of the emitted light is a substantial white light emission. In some embodiments, the variation in the angle of incidence of the pump laser light from the laser diode 4603 has several impacts on the operation of the device. Firstly, spectrum of white light emission of the device is contributed from a portion of the pump laser light that is reflected or scattered from the top surface of the phosphor plate 4605 or another portion from scattering centers deep in the volume of the phosphor plate 4605. The varying angle of incidence may lead to variation in the fraction of incident laser light scattered from the top surface and therefore cause the spectrum of the white light emission to be non-uniform across the same area of the light spot 4606. Secondly, because the laser power emitted versus angle from the laser diode 4603 is symmetric about a center line of emission, the varying angle of incidence of the laser light requires that the laser power on the phosphor per unit area of the phosphor plate 4605 also varies across the area of the light spot 4606. This may lead to the light intensity of the white light emission varying noticeably across the whole area of the light spot 4606. Thirdly, the optical properties of the phosphor plate 4605 may result in spatial nonuniformity of the emitted spectra as well as variation in the spectra as measured at different angles in the far-field, and this would be true for both embodiments with uncollimated pump lasers as wells as collimated pump lasers.

If the phosphor plate 4605 contains many scattering centers either on the top surface or within the bulk, then both the direction of travel of the pump laser light transmitted into the phosphor plate 4605 as well as the longer wavelength emitted light emitted by the phosphor member (after it absorbs the pump laser light) will be highly randomized by the many scattering events they experience. Examples of a highly scattering phosphor member would include but are not limited to composite or polycrystalline phosphor materials. Optionally, a phosphor member is comprised of sintered phosphor powder of uniform composition. The powdered phosphor material exhibits strong optical anisotropy such that random orientation of the phosphor powder particles leads to strong scattering of light when transitioning between particles. The sintered phosphor material has a solid body containing a significant volume fraction of voids in vacuum or filled with air. The index of refraction of phosphor is significantly different from air or vacuum. Additionally, the sintered phosphor material based on phosphor powders with two or more compositions or phosphor powders bound by some matrix material where either the plurality of phosphor compositions are sufficiently different in refractive index or the matrix material differs sufficiently in refractive index. In these kinds of sintered phosphor materials, the scatterings are significant at interfaces between these phosphor materials with different compositions or bounded by exotic matrix material. Furthermore, the strength or nature of the scattering may vary strongly with wavelength of light due to, for example, a strong dispersion in optical index with wavelength. In such cases, the scattering for the pump laser light may differ significantly from that of the phosphor-emitted light, such that the spatial and angular emission spectra are still non-uniform.

On the other hand, if the phosphor plate 4605 is made of a single-crystal phosphor, which is highly uniform in composition and crystal orientation and contain no or virtually no scattering centers within the bulk of the phosphor member. In this case (and in cases where the scattering properties of the phosphor material are weak), most of the pump laser light admitted into the phosphor member will be absorbed and down-converted by the phosphor to produce the emitted light since there are few opportunities for it to be scattered back out of the phosphor. The uniformity of the white light spectrum of the phosphor-emitted light at different viewing angles is then limited by the difference in the strength of pump laser scattering at the top (excitation) surface of the phosphor plate 4605 relative to the angular distribution of white light emission of longer wavelength from the phosphor. Moreover, the phosphor emitted light with longer wavelength can propagate through the phosphor member bulk without significant scattering. This laser-pumped solid-state white light source configuration based on single-crystal phosphor plate is problematic because a significant fraction of the phosphor-emitted light may traverse the extent of the phosphor plate 4605 and be emitted at any edges of the phosphor member that do not contribute to white light emission. Moreover, if there is a small amount of scattering in the volume of the phosphor member or at the upper and lower surfaces, then phosphor-emitted light that has propagated far from the area of the light spot 4606 may be scattered out of the phosphor plate 4605 and collected by any focusing optics. This would result in the formation of a longer-wavelength bloom or halo surrounding the white-colored light spot 4606.

In a specific aspect, the present disclosure provides a method of introducing features into a phosphor member aiming to improve spatial or angular uniformity of a white light spectrum of a phosphor-emitted light converted from an incoming laser light. Optionally, these features are provided either on the surface or within the bulk of the phosphor member to modify how the laser light is either scattered or to modify the angular distribution of the phosphor-emitted light.

In an embodiment, the features introduced to a single crystal phosphor member include modifications made on surface morphology or interior structure of the phosphor member. Optionally, these modifications can be some defective regions formed by a focused laser beam. In particular, a laser dicing technique can be applied. In an example, a so-called stealth laser dicing technique is used, which is a form of laser-based material-cutting technique using a laser with a wavelength that is not strongly absorbed or reflected by the material. The laser beam used for stealth dicing is focused through a lens such that the point of maximum optical power density lies within the thickness of the material being diced. When the peak power density of the focused laser beam exceeds a material dependent threshold, non-linear effects lead to extremely high absorption only near the point of maximum optical power density. Elsewhere in the laser path the laser beam is insufficiently focused to induce the non-linear effects that drive strong absorption and the absorption remains relatively weak. Optionally, the position or focal length of the focusing lens can be adjusted to control the depth of the point of maximum optical power density within the material be diced. Optionally, a translatable stage can be used to move the diced material laterally beneath the laser optics, allowing for arbitrary patterns of laser dicing cuts to be made at one or more depths within the diced material.

In an alternative example, a conventional ablative laser dicing is used, where the dicing laser wavelength is strongly absorbed by the diced material, resulting in ablation of the diced material through the entire thickness of the diced material or until the dicing laser light is sufficiently attenuated that ablation can no longer occur. Stealth laser dicing has the advantage over conventional ablative laser dicing in that the defective regions can be formed within the thickness of the diced material and are surrounded through a narrow boundary region by undamaged material. This allows for scattering features to be formed through the full thickness of the material without producing a full-thickness cut to the material that would result in separation of the material into multiple pieces. Also it does not require dicing from both sides of the material.

Damages to the surface or interior structure from the focused laser beam include formation of one or more of voids, cracks and regions of melted and re-solidified material. These defects in the material can act as optical scattering centers, and can be used to modify how light propagates through the material. In the case of a phosphor plate used for making laser-based white lighting system in a reflection-mode, the pump laser is incident on a top excitation surface of the phosphor plate at some fixed angle. A fraction of the pump laser beam is reflected off of the top excitation surface of the phosphor plate while the remainder is transmitted into the phosphor plate where it is scattered by a plurality of scattering centers on the excitation surface or inside bulk and absorbed by the phosphor to convert into phosphor-emitted light with longer wavelength and outputted again through the top excitation surface. In the other case of a phosphor plate used for making laser-based white light source in a transmission-mode, the pump laser that is incident through the top excitation surface of the phosphor plate is scattered by a plurality of scattering centers inside the bulk of the phosphor plate while being converted to phosphor-emitted light. A fraction of the pump laser beam is transmissive through the phosphor plate to mix with the phosphor-emitted light to output a white light emission via an emission surface (alternate to the excitation surface, typically a bottom surface) of the phosphor plate. Design of different scattering centers inside the bulk or on the surface of the phosphor plate becomes important to control the phosphor-emitted white light with enhanced intensity in controlled direction, spectrum range, and spot size for either reflection or transmission-modes of the phosphor.

Figure 47:
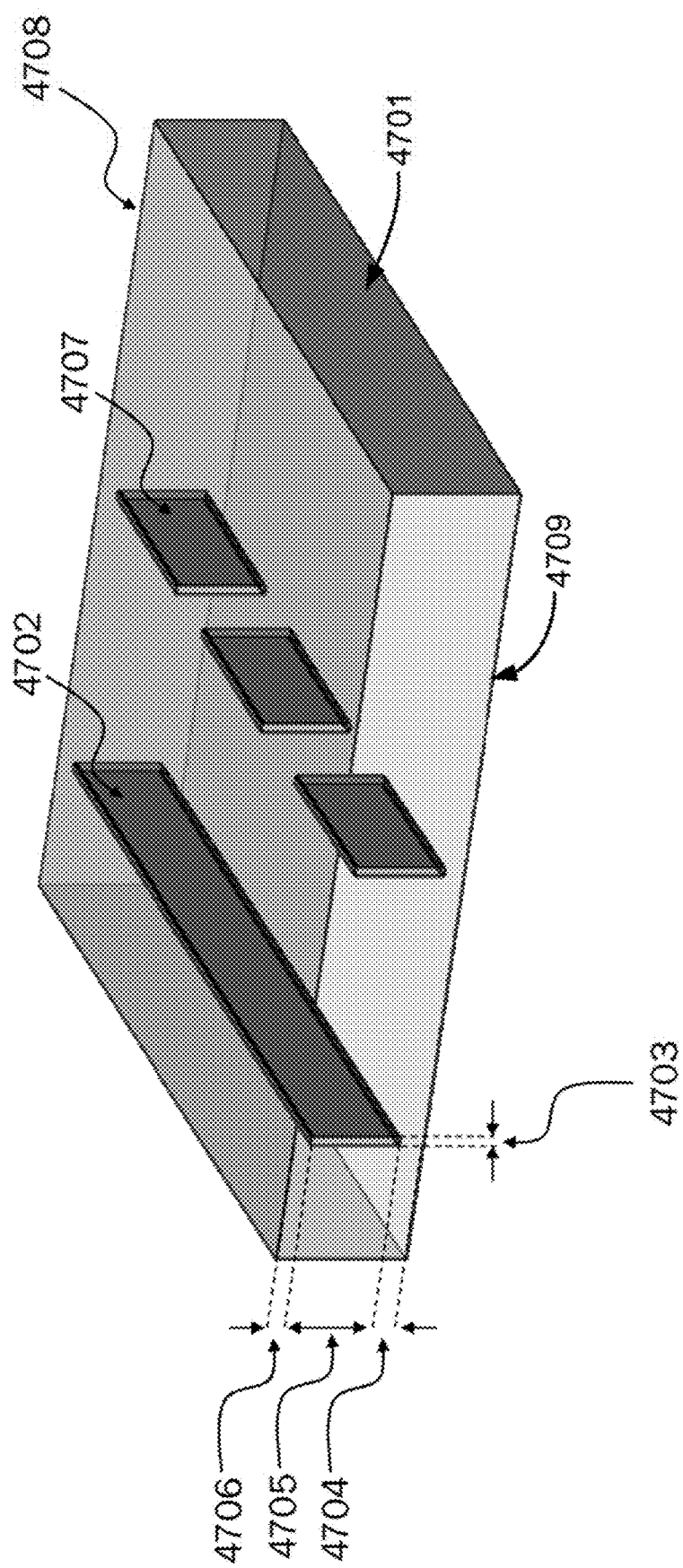
FIG. 47 is a schematic diagram of a phosphor plate containing defective regions according to some embodiments of the present invention.
Figure 48:
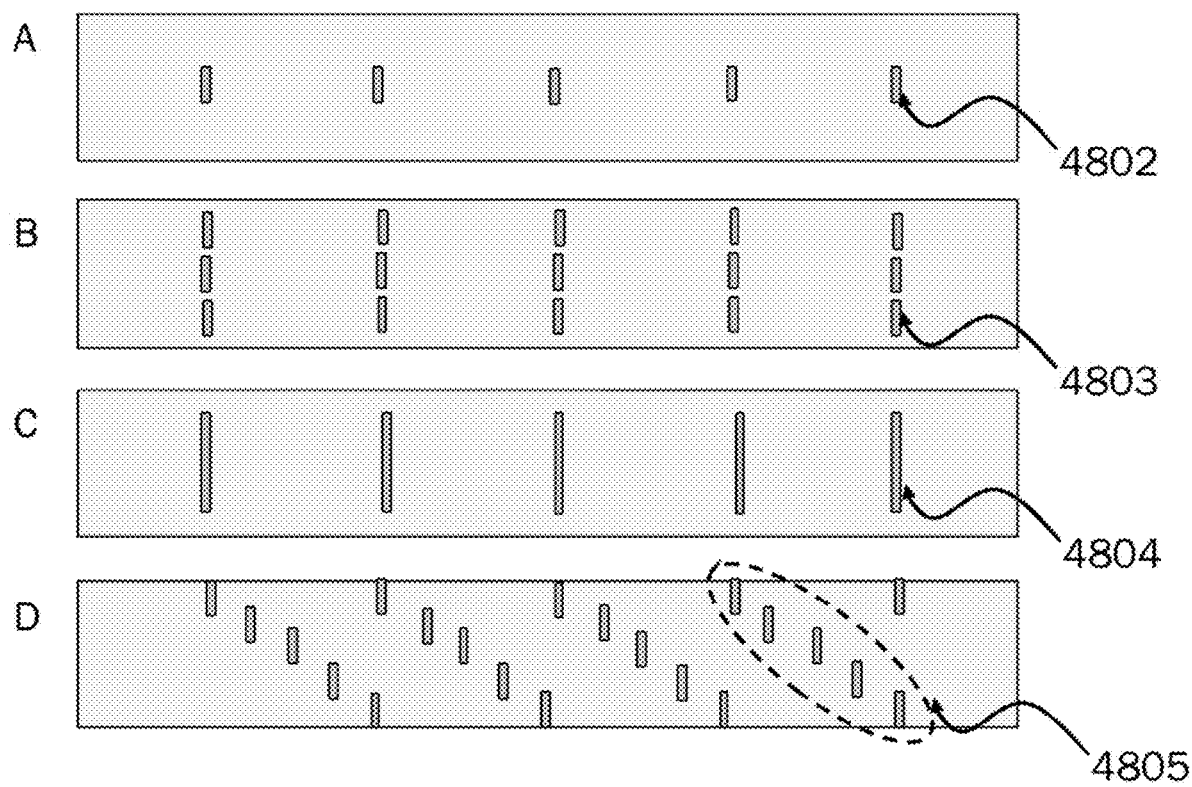
FIGS. 48A-48D show cross-section views of optional phosphor plates containing alternative defective regions according to some embodiments of the present invention.

FIG. 47 a schematic diagram of a phosphor plate containing defective regions according to some embodiments of the present invention. As shown, a phosphor plate 4701 contains defective regions produced by stealth laser dicing. A continuous defective region 4702 in linear shape through one dimension across the phosphor plate is produced fully embedded in the phosphor plate 4701. The continuous defect region 4702 is characterized by features like a width 4703, a vertical extent 4705, a distance 4706 below the upper surface 4708 of the phosphor plate 4701, and a distance 4704 above the lower surface 4709 of the phosphor plate 4701. Alternatively, a discontinuous defective region 4707 may also be included. The discontinuous defective region 4707 is characterized by multiple linear defective sections with different lengths along one same dimension across the phosphor plate 4701 and with other features being substantially similar to those for characterizing the continuous defect region. While the linear feature is shown for the defective regions in the FIG. 47, the scribed features of the defective regions can be of an arbitrary shape limited only by the translation capabilities of the sample stage for preparing or programming the stealth laser dicing. For example, one could create circular or curved features, randomly positioned features, points, and hexagonal patterns among others.

FIGS. 48A-48D show cross-section views of optional phosphor plates containing alternative defective regions according to some embodiments of the present invention. In an embodiment, these phosphor plates contain defective regions produced by stealth laser dicing. For a phosphor plate A, a plurality of defective regions 4802 produced by a single laser pass where each defective region is fully enclosed within a bulk of the phosphor plate. Optionally, the defective regions 4802 are located at a uniform distance below an upper (excitation) surface of the phosphor plate. For another phosphor plate B, a plurality of defective regions 4803 is produced by a plurality of laser passes. Each defective region formed during each laser pass is non-overlapping with other defective regions formed by previous laser passes. Optionally, the depth of the defective region beneath the upper surface of the phosphor plate is controlled by the laser focusing lens position or focal length. For yet another phosphor plate C, a plurality of defective regions 4804 is produced by a plurality of laser passes where consecutive laser passes are configured to produce an overlapping region of damage as a scattering center continuous through the thickness of the phosphor plate. For still another phosphor plate D, a plurality of defective regions 4805 is produced by a plurality of laser passes where consecutive laser passes are configured to produce non-overlapping regions of damage at different depths in the phosphor. Optionally, the lateral position of the damaged regions is varied at each depth. Such a configuration would be advantageous when it is desired to have varying amounts of scattering from different depths in the phosphor plate. It would also provide for scattering centers at all depths in the device without requiring a full thickness cut that would result in the phosphor plate separating into multiple discontinuous pieces.

In some embodiments, the longer wavelength light is emitted by phosphor material from an area of the same size, shape, and location as the incident pump laser spot is on the excitation surface of the phosphor plate. In other words, the white light spot has a uniform ratio of pump laser light to phosphor-emitted light across its entire area when imaged by an optical element. If the phosphor plate contains an insufficient density of scattering centers, such as in the case of a single crystal phosphor, then the longer wavelength light emitted by the phosphor can be trapped in the phosphor plate and propagate far from the area of the pump laser spot before being scattered out of the phosphor plate. This results in a light spot consisting of a white center point surrounded by a yellow halo.

Figure 49:
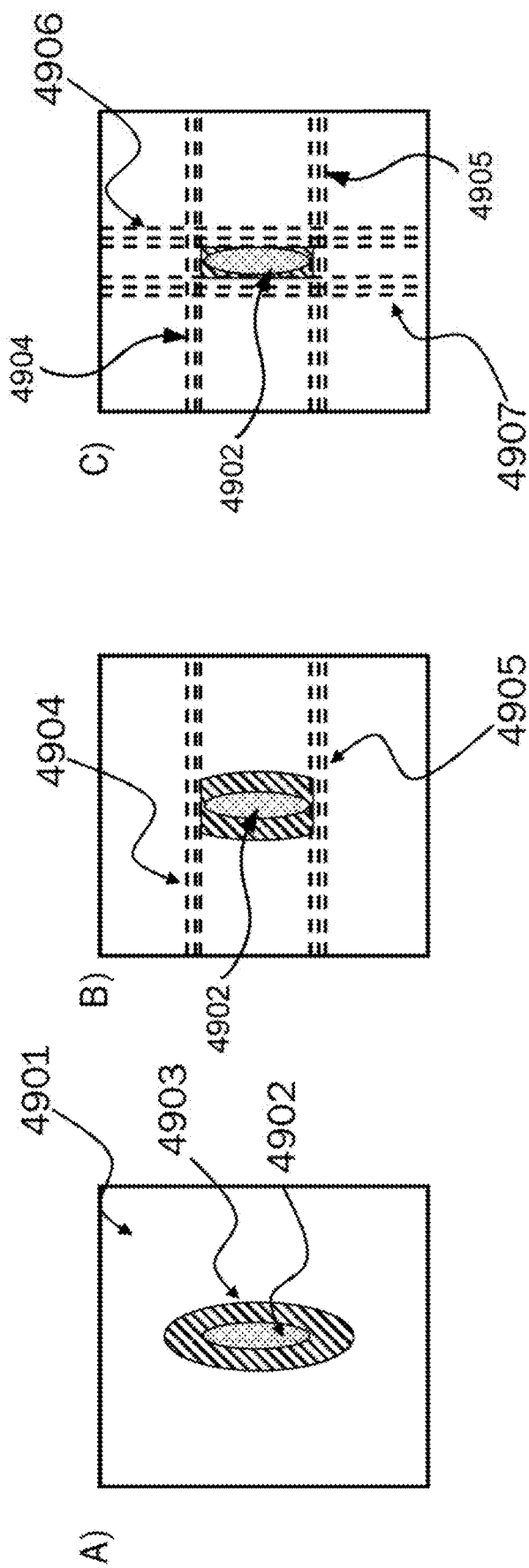
FIGS. 49A-49C are plan views of (A) a laser spot illuminated on a phosphor plate; (B) one or more defective regions on the phosphor plate in horizontal direction to limit the laser spot; and (C) one or more defective regions on the phosphor plate in vertical direction to limit the laser spot according to some embodiments of the present invention.

In an aspect, the present disclosure provides a method of forming defective regions as scattering centers into phosphor plates to improve their scattering properties. In some embodiments, the defective regions are configured such that they surround the pump laser spot and scatter the phosphor-emitted light that would otherwise propagate through the phosphor and potentially form a yellow halo or wasted at edges of the phosphor plates. FIGS. 49A-49C are plan views of (A) a laser spot illuminated on a phosphor plate; (B) one or more defective regions on the phosphor plate in horizontal direction to limit the laser spot; and (C) one or more defective regions on the phosphor plate in vertical direction to limit the laser spot according to some embodiments of the present invention. As shown in part A of the Figure, the laser spot 4902 is an area illuminated by incident pump laser light surrounded by bloom or halo 4903 of long wavelength phosphor-emitted light. In part B of the Figure, the defective regions are formed by laser dicing and configured as two groups of horizontal lines 4904 and 4905. Optionally, the two groups of defective regions 4904 and 4905 are formed around a pump laser spot 4902. Optionally, these horizontal line defects are configured to prevent phosphor-emitted light from propagating a significant distance from the pump laser spot 4902 before being scattered out of the phosphor. In part C of the Figure, one or more vertical passes of a stealth laser dicing process are performed to produce defective regions configured as two groups of vertical lines 4906 and 4907 that act as scattering centers that prevent light from propagating significant distances within the phosphor. Optionally, the two groups of vertical defective regions 4906 and 4907 are formed in addition to two groups of horizontal defective regions 4904 and 4905 around a pump laser spot 4902.

In some other embodiments, the laser diced defective regions are configured as concentric circles or ellipses surrounding the pump laser spot. In some additional embodiments the defective regions are configured as a square, rectangle, hexagon or other polygon, among other shapes. In some embodiments, scattering centers are formed within the area of the laser spot to improve scattering of one or both of the laser pump light and the phosphor emitted light. Depending on embodiments, different shape may be selected for producing optimal effect of producing brighter white light spot substantially at the pump laser spot with substantially uniform spectrum across the area of the spot.

Figure 50:
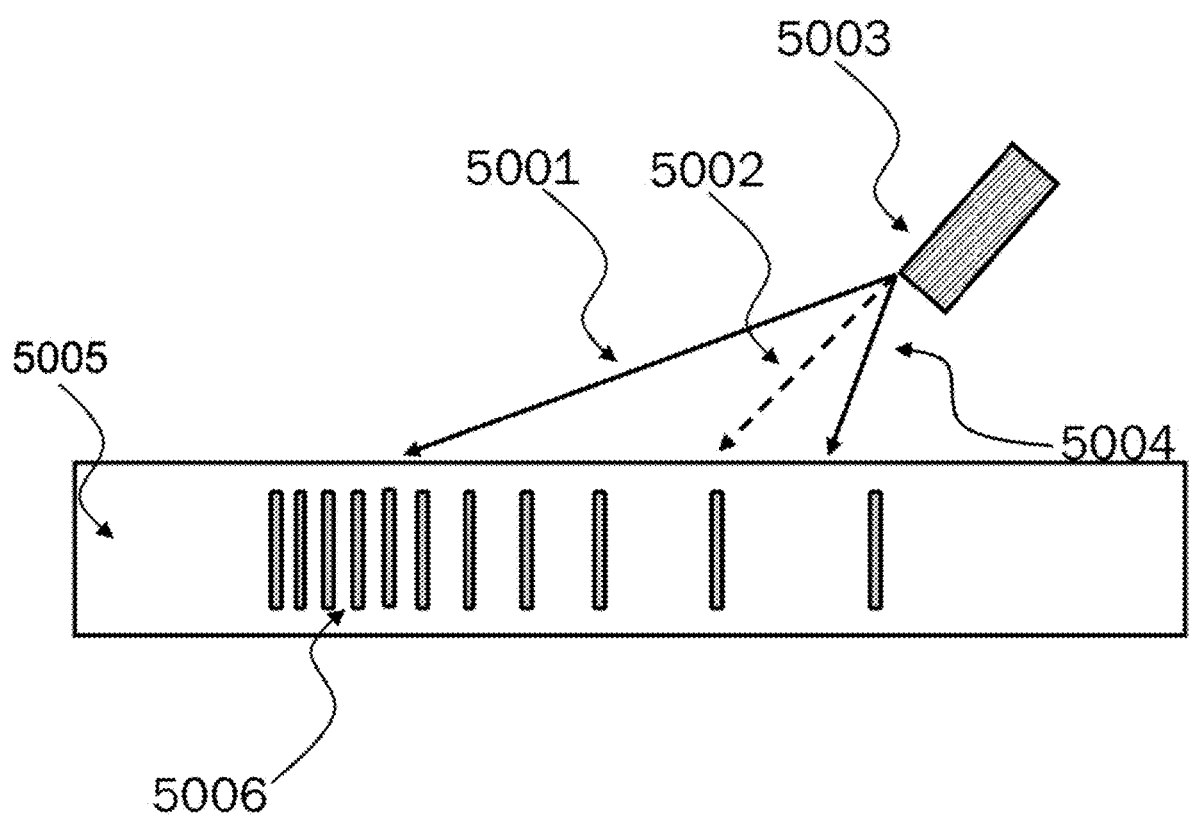
FIG. 50 is a cross-section view of a pump laser light incident on a phosphor plate containing defective regions that are not periodically spaced in the direction parallel to the projection of the laser fast axis according to an embodiment of the present invention.

In some embodiments, the scattering centers produced with damage from laser scribing are configured such that the density of defective regions is not uniform within the pump laser spot. FIG. 50 is a cross-section view of a pump laser light incident on a phosphor plate containing defective regions that are not periodically spaced in the direction parallel to the projection of the laser fast axis according to an embodiment of the present invention. In the example, the laser diode 5003 illuminates a phosphor member 5005. Emission directions 5001, 5002, and 5004 indicate the pump laser light with a relatively diverging beam around a center line 5002. The emission direction 5001 corresponds to an upper bound and the emission direction 5004 corresponds to a lower bound of the full width at half max angles of pump laser light. On a top surface of the phosphor plate 5005, the upper bound and lower bound of the pump laser light beam defines the area of a pump laser spot. Referring to FIG. 50, a plurality of defective regions 5006 are formed by laser scribing within the bulk of the phosphor plate 5005. The spacing of the defective regions 5006 is varied parallel to the length of the laser spot in the direction parallel to the projection of the laser fast axis. Optionally, the spacing variation is introduced in order to modify the scattering and extraction efficiency of pump laser light and phosphor-emitted light across the area of the pump laser spot. A region with widely spaced laser scribed features would have less scattering, and would exhibit a longer path length for phosphor-emitted light to spread from one side of the pump laser spot to the other. Such a configuration would be advantageous in the case when the surface texture of the phosphor is such that fraction of laser light scattered from the top surface of phosphor increases as the incidence angle decreases. By introducing scattering centers with non-uniform density, the phosphor-emitted light can be preferentially spread from one region of the pump laser spot to another to compensate for the reduced pumping efficacy.

In a separate embodiment, the scattering centers formed by laser scribing in the phosphor are arranged such that their lateral distribution and densities are different at different depths in the phosphor. An advantage of this configuration is the ability to have one set of scattering centers near the phosphor surface configured to efficiently scatter short wavelength pump laser light and one or more sets of scattering centers near the middle or bottom of the phosphor plate configured to efficiently scatter longer wavelength light emitted by the phosphor. Since the short wavelength blue light will be strongly absorbed in the phosphor, the spatial separation of the two sets of scattering centers can provide selectivity in how the scattering profile is controlled for the pump laser light relative to the phosphor-emitted light.

In an alternative embodiment, an uncollimated pump laser light has a diverging beam, such that the pump laser light is incident on the phosphor surface at different incident angles at different positions. Variation in the incident angle may lead to variation in the angle of specularly reflected laser light, variation in the angular distribution of diffusely scattered light for randomly roughened phosphor surfaces, and variation in the fraction of the laser pump light transmitted into the phosphor material. In some embodiments, the surface texture is modified to induce a spatial variation in either transmission of the pump laser light into the phosphor or diffuse reflection of the pump laser light off of the top surface of the phosphor in order to modulate the (phosphor-emitted) white light intensity and color point across the area of the laser spot.

Figure 51:
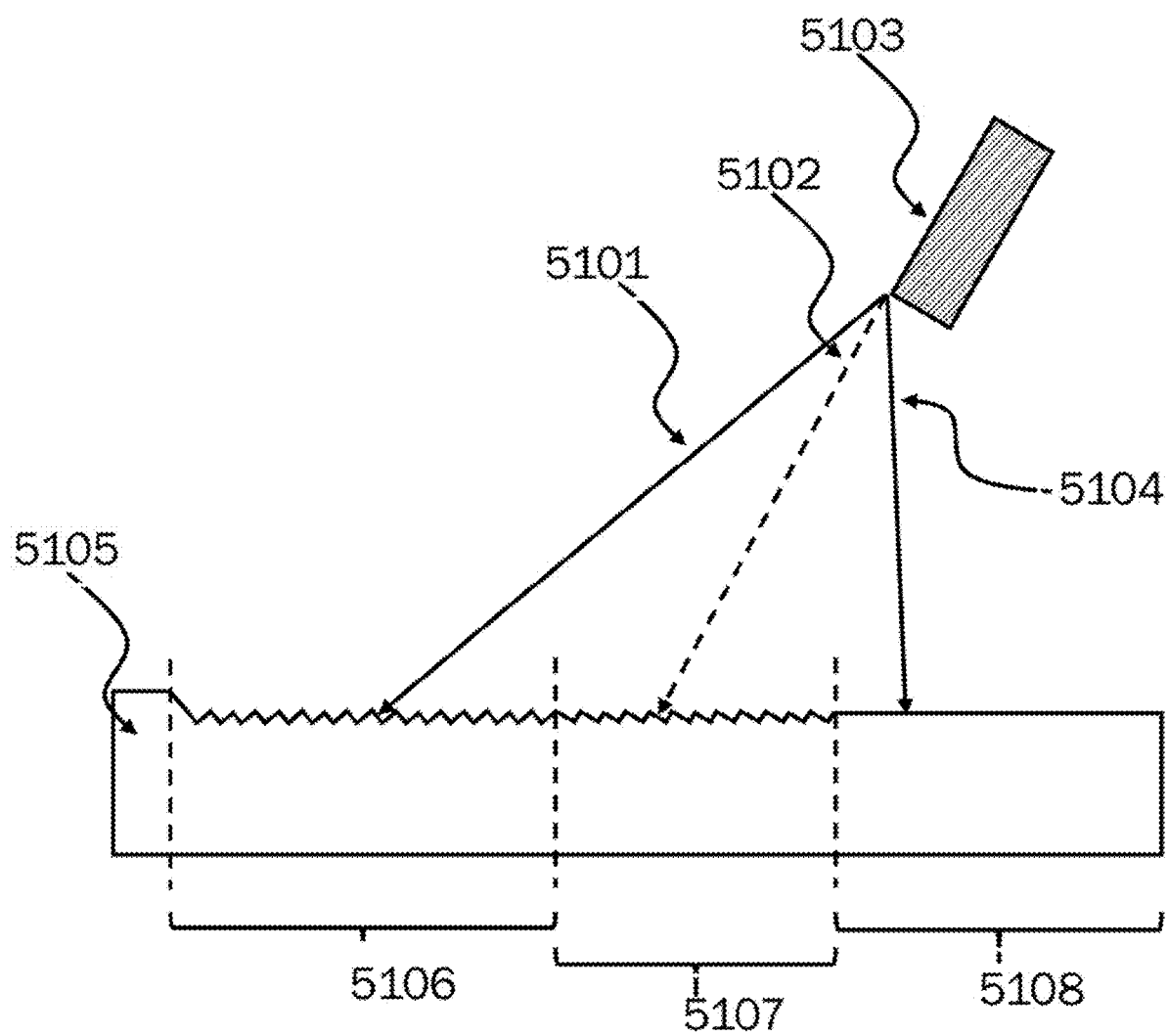
FIG. 51 is a cross-section view of a pump laser light incident on a phosphor plate containing defective regions that are not periodically spaced in the direction parallel to the projection of the laser fast axis according to another embodiment of the present invention.

As an example, FIG. 51 shows a schematic cross-sectional view of a pump laser light incident on a phosphor plate provided with non-uniform chirped patterning of the phosphor surface according to an embodiment of the present disclosure. The laser diode 5103 illuminates a phosphor member 5105. The phosphor surface is patterned with a plurality of regions where the surface texture is modified to induce a variation in the transmission of the pump laser light into the phosphor member 5105. One patterned surface region 5106 corresponding to the shallowest incident angle 5101 is provided with a patterned surface texture including a plurality of steep sidewalls tilted to facing the pump laser light that is incident at an angle closer to normal incidence. Each steep sidewall is characterized by a width viewed from the incoming laser light. Optionally, the plurality of steep sidewalls is substantially a linear stripe in parallel to each other one by one laid in multiple rows around the part of the beam spot area receiving the laser beam with shallowest angles of incidence on the patterned surface region 5106. Optionally, the plurality of steep sidewalls is curved to substantially match a shape of the beam spot area. Additionally, another patterned surface region 5107 corresponding to the centerline emission angle 5102 of the pump laser is patterned with a plurality of linear stripes with shallower sidewalls than those in the region 5106 such that the pump laser light incident around the centerline is at an angle still closer to the normal incidence. Furthermore, yet another patterned surface region 5108 corresponding to the laser light with the steepest incident angle 5104 is not textured as the pump laser light is already incident on the phosphor at some angle close to normal incidence.

In some embodiments, the phosphor plate is patterned using a wet or dry etch process with features being defined using a nano-imprinting lithography or optical lithography process. The features may also be formed by a micromachining process such as laser ablation. The features will form a so-called photonic crystal where a periodic variation in refractive index of an optical medium results in the formation of allowed and disallowed combinations of the frequency of light and the propagation direction through that medium. Optionally, the optical medium (or photonic crystal) is part of the phosphor plate. Optionally, the optical medium is attached on top of the phosphor plate. Such an embodiment exhibits one of two advantages. The first is that the photonic crystal can be designed such that light from the pump laser, which has a well-known frequency and an angle of incidence on the phosphor plate, can be scattered into the phosphor with high efficiency. In some embodiments, the geometry of the photonic crystal is varied spatially such that, at a point in the laser beam spot area projected directly on the phosphor plate, the photonic crystal is optimized for coupling of laser light into the phosphor plate for the particular angle of incidence at that point in the laser beam spot area. For this purpose, the photonic crystal might be configured to be either one dimensional or two dimensional. Such a configuration is highly advantageous for making a laser-based solid state white light source utilizing a violet or ultra-violet pump laser. In such a device, the pump laser light makes up little of the luminous efficacy of the white light source and scattering a fraction of the pump laser light into the emitted white light spectrum is not required to produce a white light spectrum.

Figure 52:
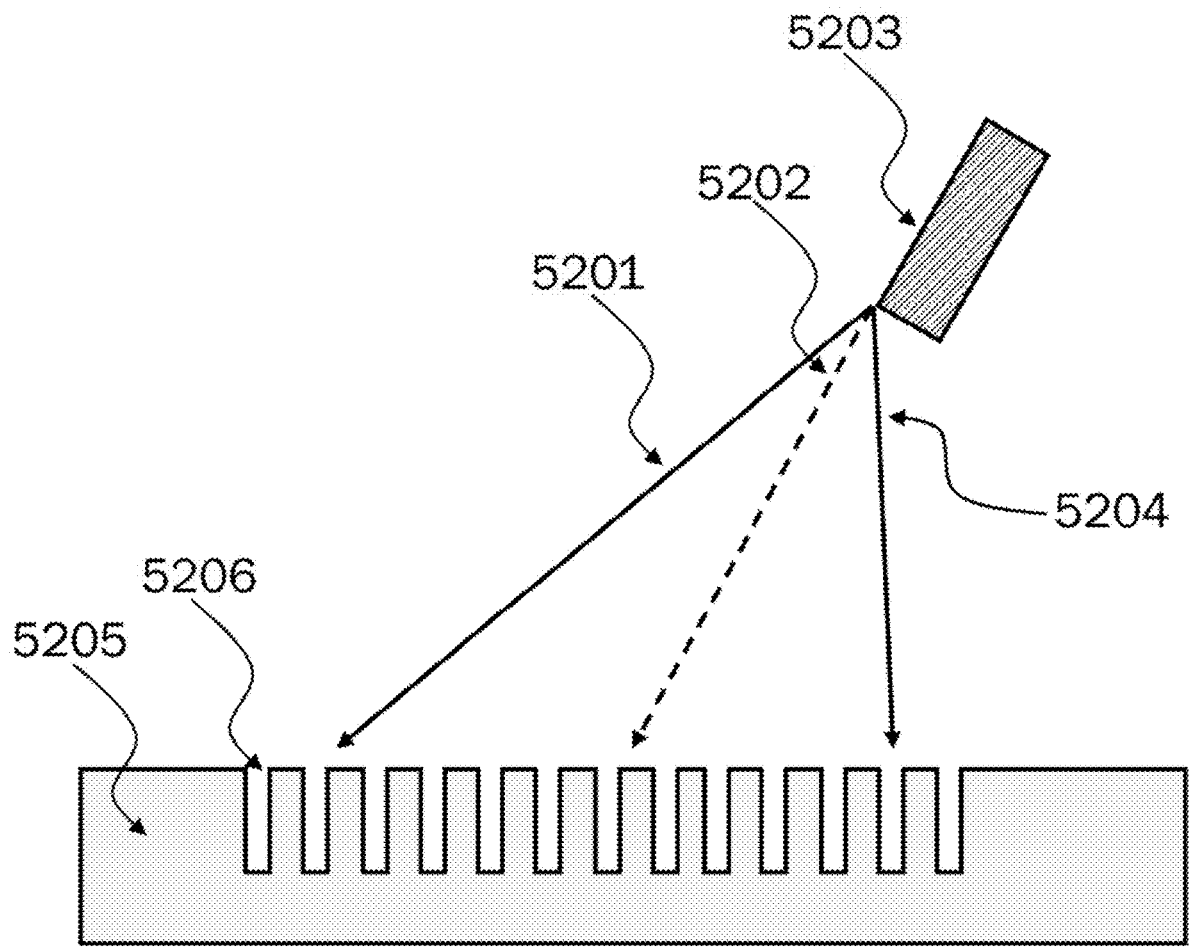
FIG. 52 is a cross-section view of a pump laser light incident on a phosphor plate configured as a photonic crystal having chirped patterning on an excitation surface according to an embodiment of the present invention.

In such a configuration, highly efficient in-coupling of the laser light into the phosphor is highly advantageous. In an example, FIG. 52 shows a schematic cross-sectional view of a pump laser light incident on a phosphor plate configured as a photonic crystal according to an embodiment of the present disclosure. Referring to FIG. 52, defective regions 5206 in the photonic crystal 5205 are periodically spaced in the direction parallel to the projection of the laser fast axis. The laser diode 5203 illuminates a photonic crystal 5205. The laser beam from the laser diode 5203 is diverging with beam directions varying from a first line 5201 to a second line 5204 around a centerline 5202. The first line 5201 and the second line 5204 correspond to respective an upper bound direction and lower bound direction of the laser emission around the centerline 5202. Optionally, the upper bound direction or the lower bound direction is referring respectively to the full width at half max angles. Optionally, the photonic crystal 5205 is part of a phosphor plate patterned with a mask and etched to produce a one or two-dimensional pattern 5206. Optionally, the pattern 5206 contains voids into the phosphor plate filled of air. Optionally, the voids are filled with a dielectric material.

In another embodiment, additional advantage is that, in a thick slab of phosphor member, the phosphor-emitted light is outputted in all directions with relatively equal probability. As previously discussed, such emission is non-ideal because a large fraction of the phosphor-emitted light is outputted perpendicular to the thickness of the phosphor plate such that it is either guided by total internal reflection or traverses the width of the phosphor plate before encountering a scattering center. Such laterally guided modes are an especially significant problem in single crystal phosphor plates, where there are virtually no scattering centers. The addition of a photonic crystal to the phosphor plate can improve performance by inhibiting the transmission of laterally guided modes, thereby shifting a larger fraction of the phosphor-emitted light of the phosphor to vertical emission. A secondary benefit is that the photonic crystal can be designed to either broaden or narrow the angular emission of the phosphor plate to better match that of the scattered pump laser light, which will reduce non-uniformity in color over viewing angle of the white light spot.

Figure 53:
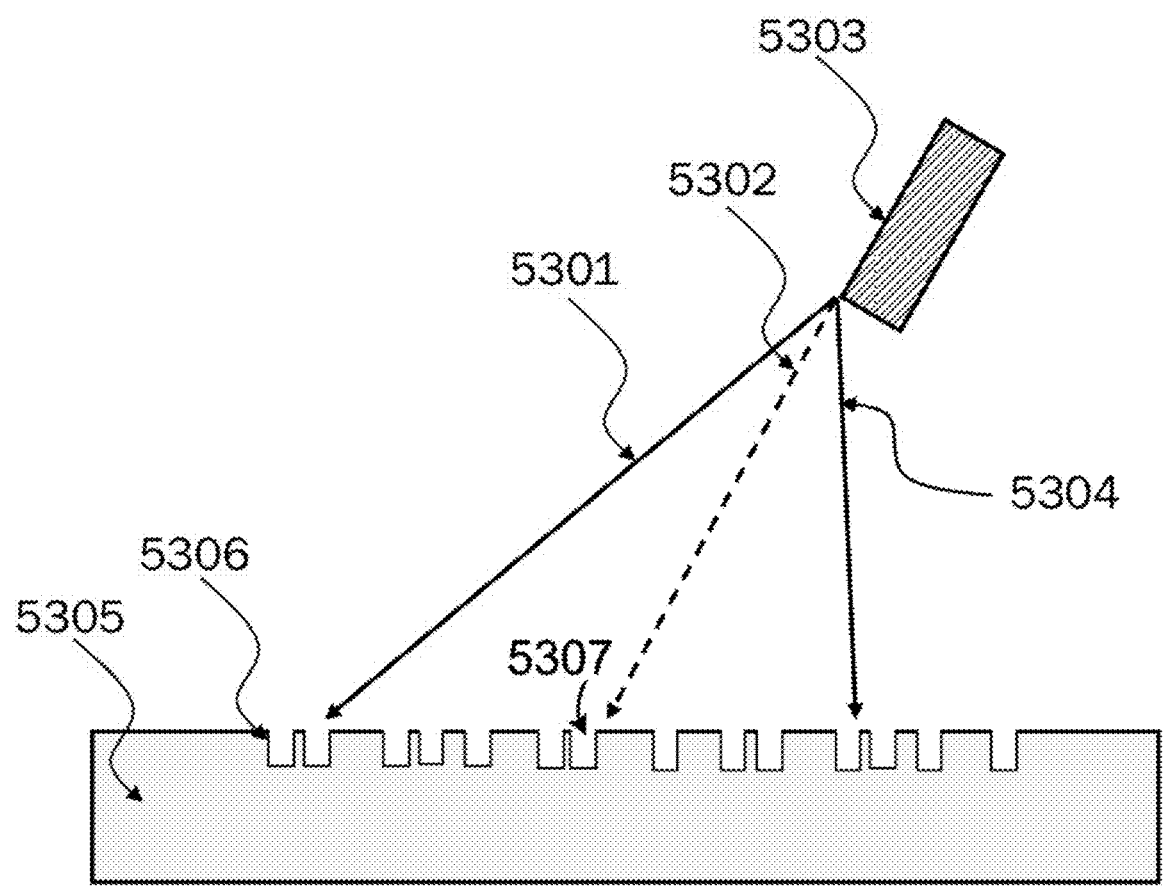
FIG. 53 is a cross-section view of a pump laser light incident on a phosphor plate containing defective regions that are not periodically spaced in the direction parallel to the projection of the laser fast axis according to still another embodiment of the present invention.

In an embodiment, nano-scale surface roughening textures can be formed for provide desired scattering centers of the photonic crystal or directly of the phosphor member. For example, a moth eye structure including patterned or random nano-scale pits is provided to the surface of the photonic crystal. This small scale roughening texture acts to reduce the surface average index of refraction. Reduction of surface index of refraction is desirable as it reduces a) scattering reflections, b) Fresnel reflections, and c) total internal reflections of light within the photonic crystal. Thus, it is more advantageous to use moth eye roughening textures on the surface of the photonic crystal to promote directional scattering of the pump laser light for enhancing conversion by the phosphor to generate phosphor-emitted light. Optionally, these nano-scale structures are created typically by energetic plasma etching of the material surface with proper reactive chemistry choices for the material. FIG. 53 depicts such a structure on a surface of a phosphor plate according to an embodiment of the present invention.

Referring to FIG. 53, the laser diode 5303 illuminates a phosphor member 5305. The surface of the phosphor member 5305 is patterned with a plurality of regions 5306 in the surface being modified into a moth eye structure. The region 5306 corresponding to the shallowest incident angle 5301 is provided with patterning inducing steep sidewalls facing the pump laser, such that the laser light is incident on the patterned surface of the phosphor member 5305 at an angle closer to normal incidence. The region 5307 corresponding to the centerline emission angle of the pump laser beam is patterned with shallower sidewalls than those in the regions 5306 such that the centerline light from the pump laser is incident on the patterned surface of the phosphor member 5305 at an angle closer to normal incidence. These are merely an example of many possible nano-scale roughening textures that can be provided to form the photonic crystal or directly to the excitation surface of the phosphor member to create desirable scattering of the pump laser light as well as the phosphor-emitted light for improving beam quality of the white light source. Optionally, the photonic crystal with moth eye structure can be applied for the white light source based on phosphors in both reflection-mode and transmission-mode.

Figure 54:
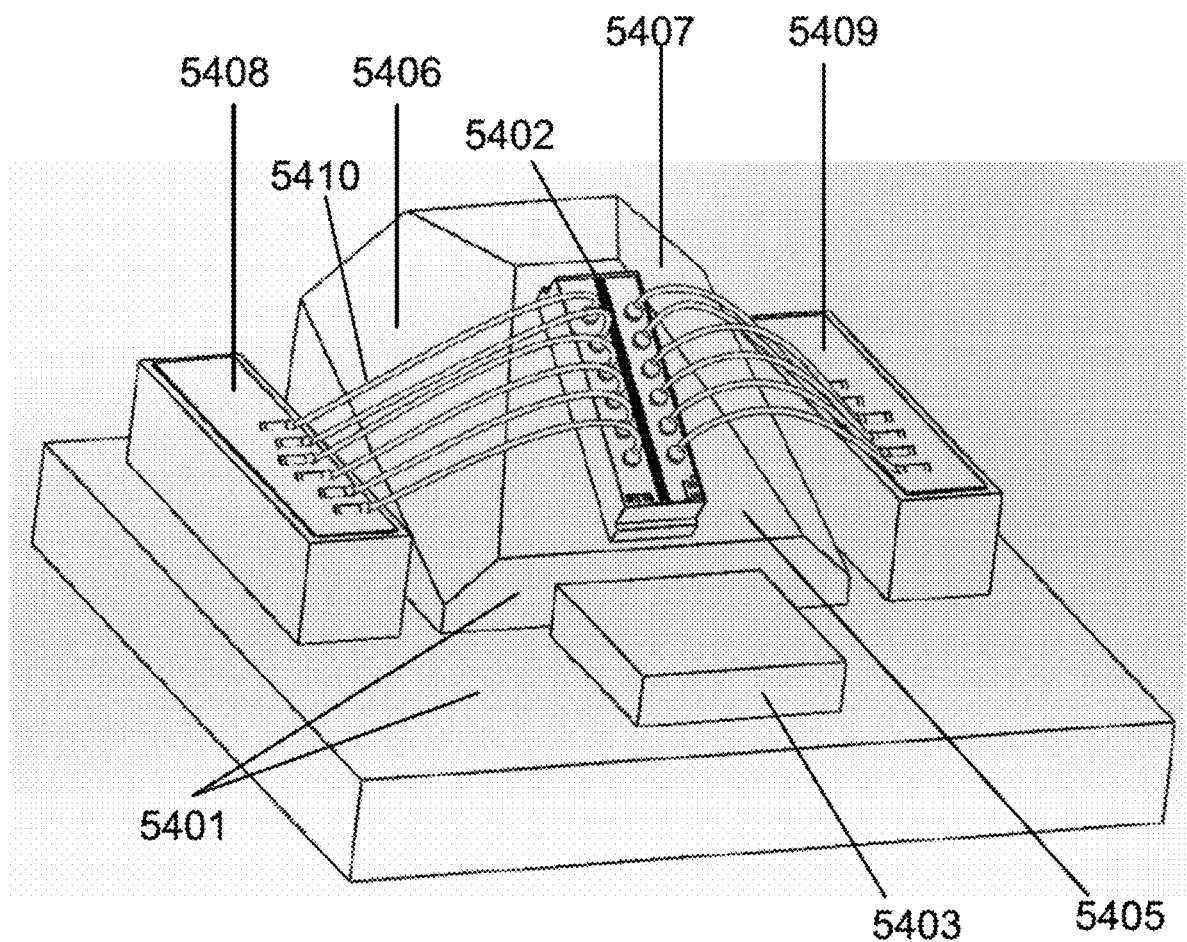
FIG. 54 is a perspective view of an integrated white light source with a common supporting member according to an embodiment of the present invention.

In an embodiment, the present invention provides a packaged white light source having a common supporting member. FIG. 54 shows a perspective view of a packaged white light source with a common supporting member according to an embodiment of the present invention. Referring to FIG. 54, the packaged white light source includes at least one laser diode 5402, a phosphor member 5403, a shaped support member 5401, electrical terminals 5408 and 5409, and wires 5404 forming an electrical connection to the laser diode. It is understood that additional elements may be included in this packaged white light source.

In a specific embodiment, the shaped support member 5401 includes one substantially flat surface portion onto which the phosphor member 5403 is attached with the use of solder, brazing, sintering materials, or thermally conductive adhesive. In another specific embodiment, the shaped support member 5401 includes one or more wedge portions with inclined planes 5405 onto which one or more laser diodes 5402 are attached. The laser diodes 5402 are attached with the use of solder, brazing, sintering materials, or thermally conductive adhesive. The inclined planes 5405 are configured to dispose the laser diode 5402 in such a way that the laser beam it emits is directed at a top surface of the phosphor member 5403, with an angle of incidence in a range from 0 degrees up to ~90 degrees as measured from the normal of the phosphor top surface. Typically, the angle of incidence is in a range of 5 to 65 degrees relative to surface normal. This necessitates that the inclines planes 5405 are not parallel to the flat surface portion onto which the phosphor member 5403 is attached. Furthermore, an aperture of the one or more laser diodes 5402 are positioned at an elevated height compared to the top surface of the phosphor member 5403. Of course, top, or bottom, or surface normal are relative term depending on specific package geometry and not limited to a specific direction.

In an implementation of the integrated white light source, heat is extracted from the bottom of the shaped support member 5401. For example, by attaching the shaped support member 5401, which is selected to be a good thermally conductive material itself, to a PCB or to a heat sink by means of soldering, brazing, mechanical fasteners, or by using a high thermal conductivity adhesive, heat generated by the laser diode 5402 can be transferred out effectively. The heat spreading path from the bottom of the laser diode 5402 to the bottom of the shaped support member 5401 is optimized within the constraints of overall size of the integrated white light source and the relative positions of laser diodes 5402 and phosphor member 5403. The cross section of the shaped support member 5401 increases as a function of the distance from the heat source. The primary heat source is a ridge portion located at the top of the laser diode 5402. In one embodiment, said functional relationship of cross section depending on the distance from the heat source is that the cross section is greater than or substantially equal to the square of the distance from the heat source.

Optionally, the shaped support member 5401 is made from a material with high thermal conductivity. Optionally, the shaped support member 5401 is made from Cu or an alloy containing Cu. In a specific embodiment the shaped support member 5401 is made from a single piece of the material with no joints, as this provides the lowest thermal resistance from heat sources to heat sink. Optionally, the shaped support member 5401, including the flat surface portion and the one or more wedge portions, can be manufactured with a stamping process, or with subtractive machining processes into a single piece of submount structure for a surface mount device (SMD) package. In an alternate specific embodiment, the shaped support member 5401 includes two or more separate pieces joined with the use of soldering, brazing or sintering materials. For example, the flat surface portion belongs to a primary submount structure as a separate piece. The flat surface portion is used for supporting the phosphor member 5403. The primary submount structure also has a flat bottom portion for mounting onto a heat sink. The mounting material is optimized with thermally conductive junction or material. While, the one or more wedge portions could be made several inclined planes 5405 from a complex shaped piece as one or more secondary submount structures for supporting the laser diode 5402. Optionally, the one or more wedge portions are attached with the flat surface portion of the primary submount structure. Again, the attachment between the secondary submount structure and the primary submount structure can be made thermally conductive. For example, the height of the phosphor member 5403 could be adjusted by inserting a thermally conductive thin riser (not shown) between the flat bottom portion of the shaped support member 5401 and the phosphor member 5403.

Optionally, the geometry shapes of the shaped support member 5401 are optimized to minimize blockage of light emitted from the top of the phosphor member 5403. During a design of the packaged white light source, any volume of the shaped support member 5401 that has the potential to block light, while at the same time not substantially contributing to the heat extraction from the laser diode 5402, is removed. In a specific embodiment, relief features are provided to the inclined planes 5405. Arbitrarily shaped relief features are also possible.

Figure 55:
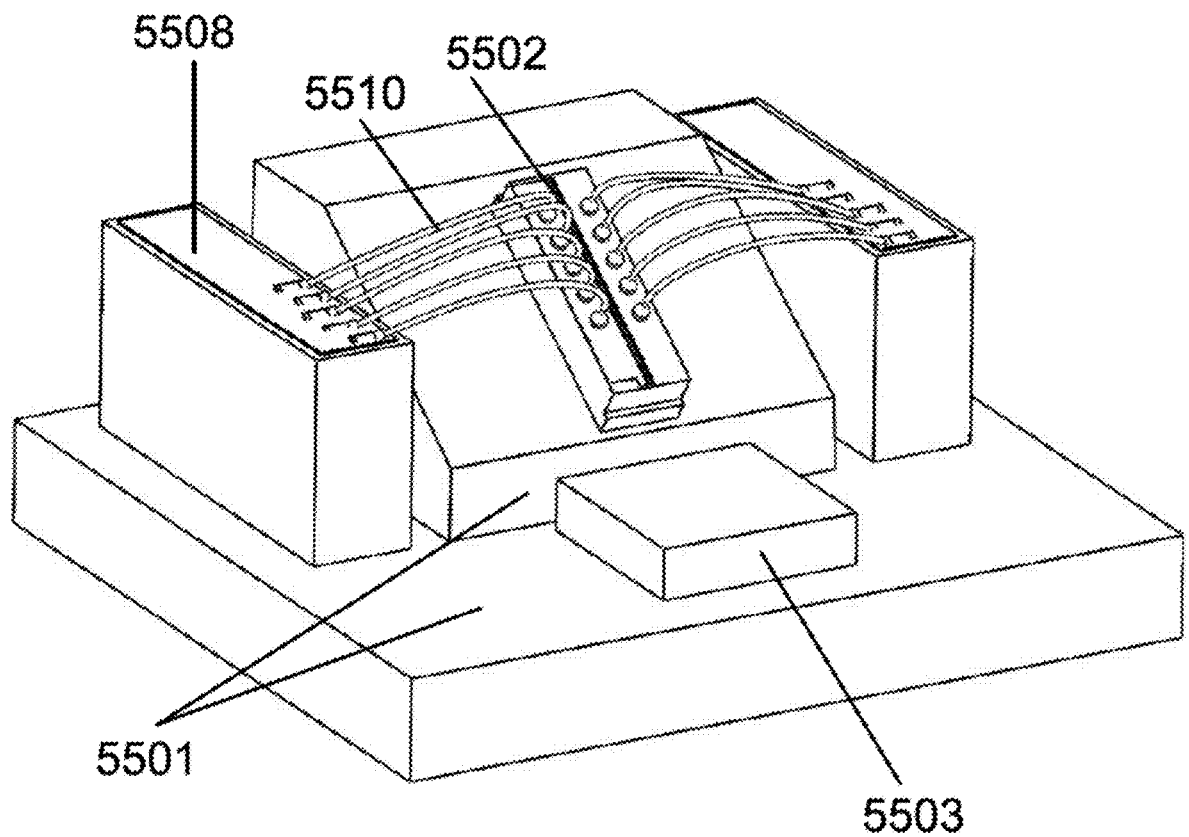
FIG. 55 is a perspective view of an integrated white light source with a common supporting member according to another embodiment of the present invention.

For example, one or more relief features 5406, 5407 are formed in planar shape to serve the purpose of allowing an unobstructed run of the wire bonds 5410 between the laser diode 5402 and the electrical terminals 5408. The shaped support member 5401 is typically made from bare metal, and the wire bonds 5410 are bare metal without electrical insulation. In order to prevent a short circuit the wire bonds 5410 must therefore not be in contact with the support member 5401. Wire bonds 5410 can be assembled with some amount of loop height, with limited ability to loop over obstructing features. However, loops may sag during subsequent process steps, and some amount of vertical clearance margin in necessary to account for process variations. For these stated reasons the relief features 5406 and 5407 are a crucial part of the design of the shaped support member 5401. To provide contrast, FIG. 55 shows the consequence of a shaped support member 5501 designed without relief features. In order to enable unobstructed wire bonds 5510 between the laser diode 5502 and the electric terminals 5508 the height of the electrical terminals 5508 have been increased. This is not a preferred embodiment, since the increased height puts the electrical terminals 5508 in the path of light emitted from the phosphor member 5503, which leads to a reduction in the light output from the white light source.

Figure 56:
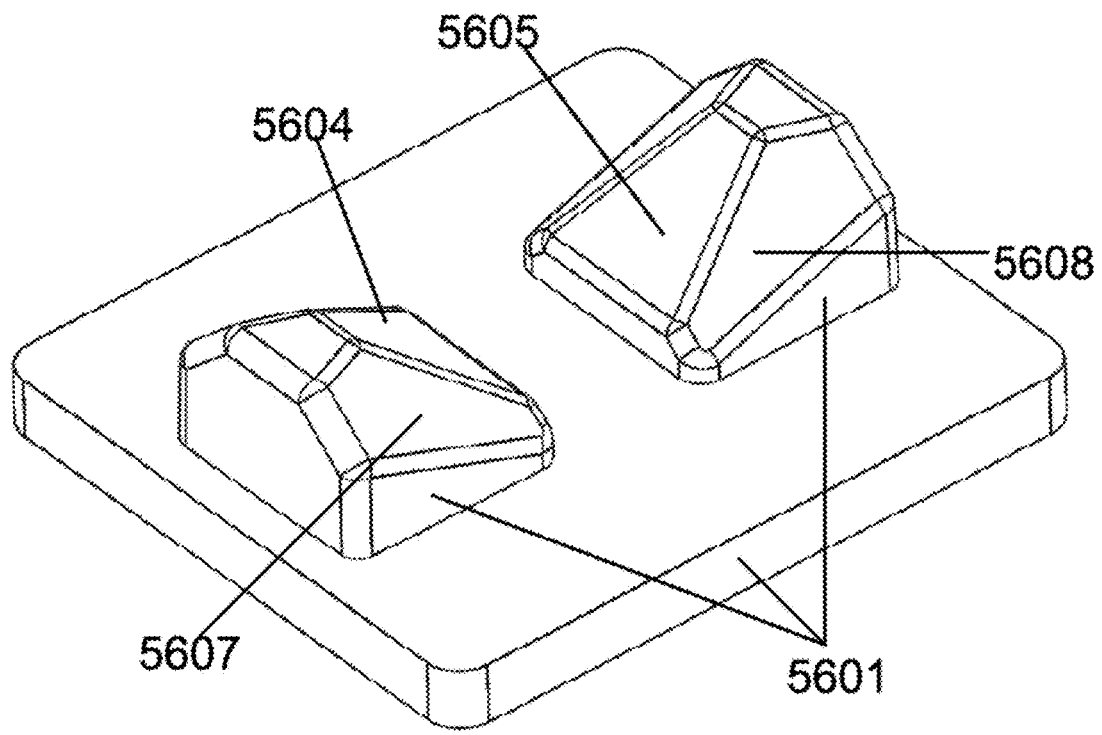
FIG. 56 is a perspective view of a common supporting member for the integrated white light source according to an embodiment of the present invention.

Optionally, the shaped support member for supporting the one or more laser diodes and the phosphor member is made by a single piece of thermally conductive material. Optionally, the shaped support member is configured to support the phosphor member with a flat surface portion and to support multiple laser diodes with multiple wedge portions containing inclined planes with different wedge angles relative to a surface normal of the flat surface portion. Each wedge portion further includes multiple relief members associated with the inclined planes, depending on embodiments. FIG. 56 shows one embodiment of the shaped support member 5601. It has two inclined planes 5604 and 5605 for supporting two laser diodes (not shown) and each inclined plane has respective relief feature 5607 or 5608.

Figure 57:
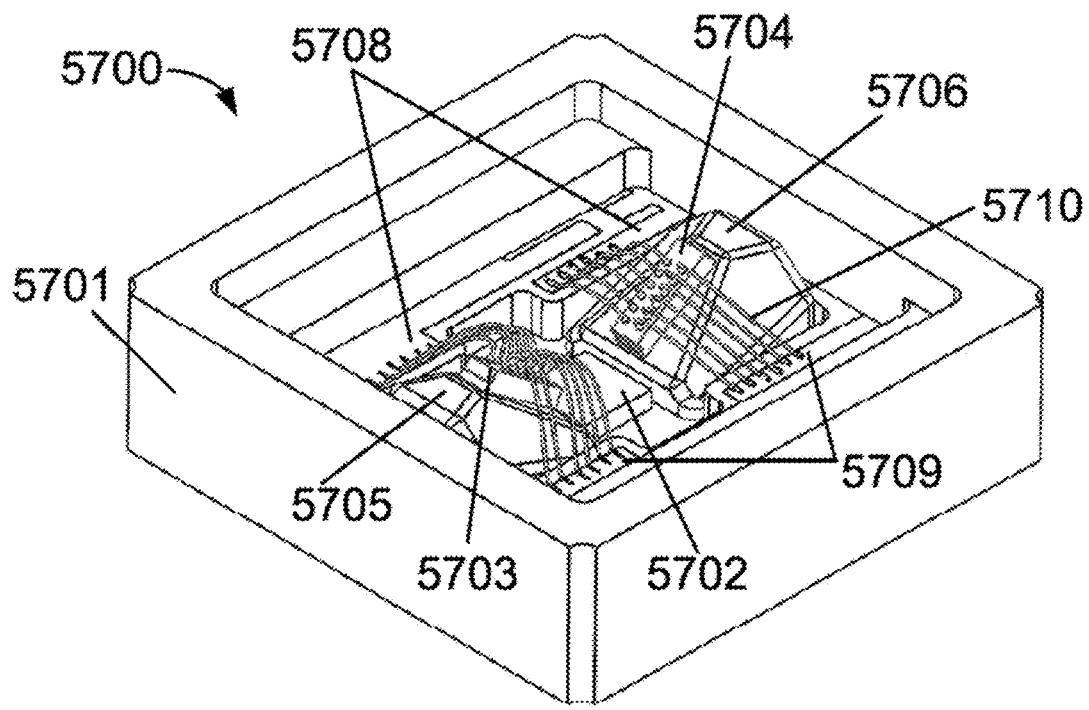
FIG. 57 is a perspective view of a partially packaged white light source according to an embodiment of the present invention.

FIG. 57 shows some additional elements of an integrated laser-based white light source according to an embodiment of the present invention. As shown, the integrated white light source 5700 includes a shaped support member that is substantially similar to the shaped support member 5601 depicted in FIG. 56. It has two inclined planes 5705 and 5706 respectively for supporting two laser diodes 5703 and 5704. Further, the integrated white light source 5700 includes one phosphor member 5702 disposed in a flat region between two inclined planes 5705 and 5706. Additionally, the integrated white light source 5700 includes several electrical terminals 5708, 5709. Multiple wires 5710 form electrical connections between the electrical terminals 5708 or 5709 and the laser diodes 5703 or 5704. Furthermore, the integrated white light source 5700 includes a frame member 5701. Optionally, the frame member 5701 includes a base and a surrounding edge for providing a cavity to hold all elements of the integrated white light source described above as one package. It is understood that more additional elements may be included in the integrated white light source package.

Figure 58:
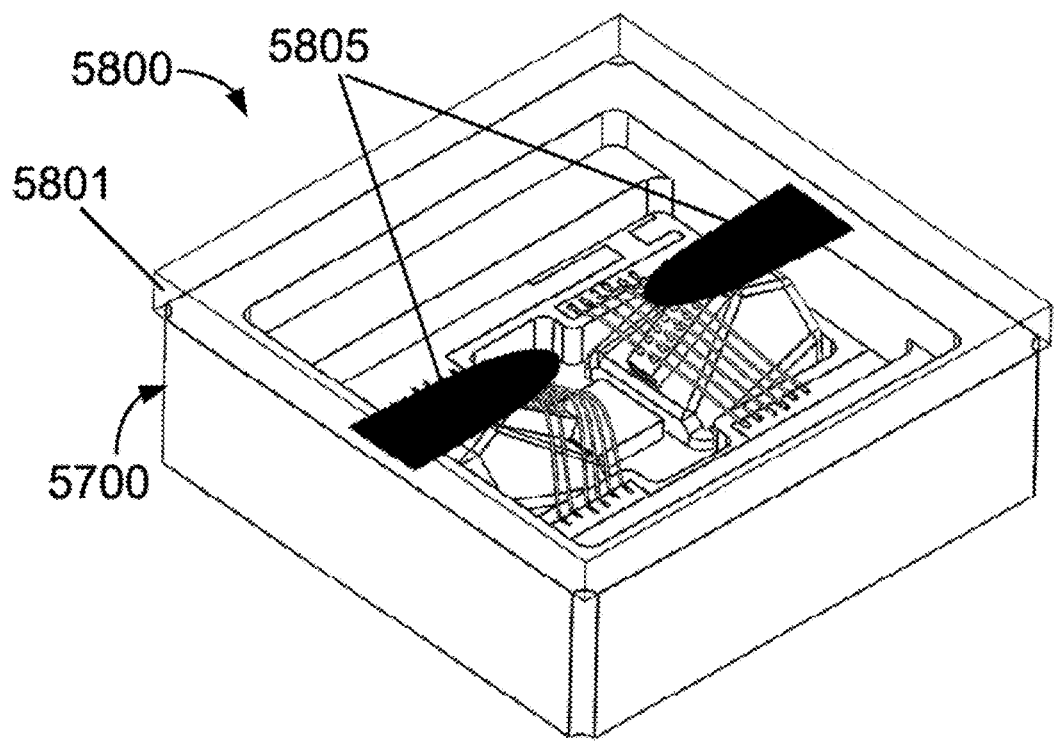
FIG. 58 is a perspective view of a partially packaged white light source according to another embodiment of the present invention.

In another embodiment, the integrated white light source package includes a lid member coupled with the frame member. FIG. 58 shows an integrated laser-based white light source package according to another embodiment of the present invention. As shown, an integrated white light source 5800 includes a lid member 5801 that is disposed on top of the integrated white light source 5700 of FIG. 57. In particular, the lid member 5801 is attached with top surrounding edge of the frame member 5701 for forming one fully assembled package. Optionally, the lid member 5801 is sealed with the frame member 5701 to prevent the cavity in the fully assembled package from interference of the outside environment. Optionally, the lid member 5801 includes at least one transparent region that enables emission out of the phosphor member to exit the package. FIG. 58 shows a perspective view of an embodiment of the integrated white light source package with a transparent lid member 5801 assembled with a solid frame of a white light source 5700, having a partial view inside the cavity where two laser diodes are supported by a shaped support member and wirebonded with electrical terminals and are configured to emit lasers to induce excitation of a phosphor member to reemit electromagnetic radiation for forming substantially a white light. The material of the transparent region of the lid member 5801 can be a material that transmits at least 50% of the white light in at least a portion of the visible light spectrum. Examples of such materials include soda lime glass, borosilicate glass, quartz, and sapphire. Furthermore, the material can be coated on one or more sides with thin optical coatings that alter the transmission characteristics of the transparent region. Examples of coatings include broadband antireflective coatings.

Referring to FIG. 58, the transparent region of the lid member 5801 includes one or more patterned regions 5805. The transmission characteristics of the patterned regions 5805 are modified to improve the light emission quality. In one embodiment, the one or more patterned regions 5805 absorb and/or reflect light at the excitation wavelength of laser light from the laser diodes, and are spatially configured to prevent the laser light undergoing Fresnel reflection at the phosphor member surface from exiting the package. In this embodiment, the design of the patterned region 5805 takes into account the known divergence of the laser diodes along the slow and fast axis. Along with information about the relative positions and angles of the laser diode, phosphor member surface, and the lid member, partial regions on the lid member where Fresnel reflected laser light intersects the lid member can be calculated. The calculated regions can be enlarged by an appropriate amount, to account for variations in laser divergence and variations in the lateral alignment of the lid member 5801 with respect to the laser diode positions. The calculated regions including the optional enlargement can then constitute the patterned regions 5805.

In another embodiment, the patterned regions 5805 on the lid member 5801 are designed to prevent additional undesirable light from exiting the package. Undesired light includes stray light reflected off wire bonds on the laser diode, light from the laser diode back-facet including either the low level of light that is emitted during normal operation or higher levels of light emitted in case of a failure of the laser diode. For example, the degradation of the back-facet coating may produce some undesired light. The patterned regions 5805 act as a safety feature of the white light source, since they can prevent potentially harmful laser light from exiting the package. With this design the patterned regions 5805 are located in close proximity to the laser diode, along the length of the laser diode and in particular near the back facet where the laser light emits out.

Optionally, the patterned regions 5805 illustrated in FIG. 58 are configured according to a design that caters to both the aforementioned embodiments. The patterned regions 5805 on the lid member 5801 are thus designed to prevent undesirable light of several separate origins from exiting the package: 1) laser light undergoing Fresnel reflection at the phosphor member surface, 2) stray light reflected off wire bonds on the laser diode, and 3) light from the laser diode back-facet.

Optionally, the patterned regions 5805 can include a coating on one or two sides of the lid member 5801. The coating can be a thin film metal coating, comprising a single layer or multiple layers of metals. The coating can also include an organic or inorganic pigment printed on the surface by means of screen printing, ink-jet printing, or other processes. Printed materials may undergo a heat treatment after printing to achieve desirable material properties.

Optionally, the patterned regions 5805 can also include a piece part separate from the lid member 5801, but located adjacent to the lid member 5801. For example, the patterned region 5805 can be a separate part made by a thin sheet metal in a specific shape and disposed in position as shown in FIG.

58. The separate part can be manufactured through methods commonly used for making metal stencils, including laser cutting, photo chemical etching, or electroforming. Additional mechanical operations such as stamping and metal forming operation can be employed to create a 3-dimensional structure. In the assembled package of the integrated white light source 5800 the separate part of the patterned region 5805 can be held in place by being pressed between the lid member 5801 and one or more internal surfaces of the package such as the shaped support member or the frame member.

As laser facets are sensitive to dust/contamination, it is important that the package design of the laser-based integrated white light source should ensure a clean environment for the laser in operation for the lifetime of the product. This is usually accomplished by sealing the device from the environment and backfilling the package space with a controlled ambient such as N2 or CDA gas. A partial or hermetic seal is desired on the sealing interfaces, e.g., between the lid and the frame, to limit and control ingress of undesirable contaminants (dust, moisture, corrosives) to the cavity in which the laser resides. Epoxies are one possible partial hermetic seal technology for these types of devices but volatile organics (VOCs) emitted by the epoxy during the curing/sealing process can end up inside the cavity and cause unwanted organic residues to reside on the laser facet, and under operation result in charring of these residues ultimately resulting in damage to the laser device operation and early failure of the device.

Figure 59A:
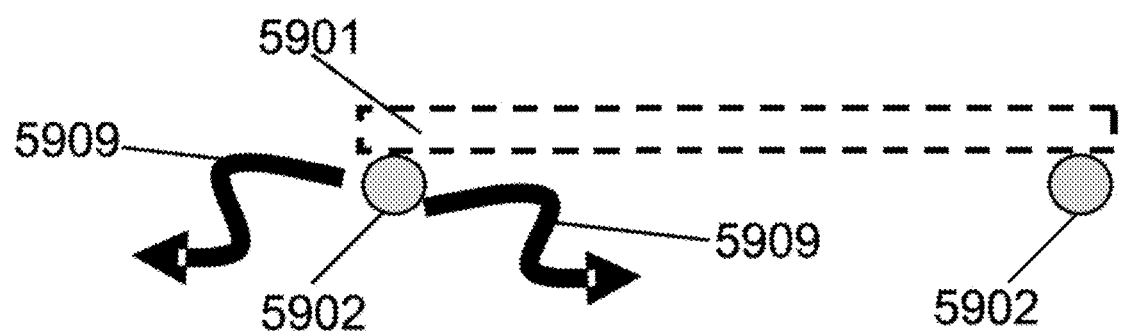
FIG. 59A is a schematic diagram illustrating a step of packaging an integrated white light source according to an embodiment of the present invention.

In a specific embodiment, the present invention provides a method of sealing members in an assembly package of the integrated white light source described herein. Optionally, the method includes using a B-stage epoxy to seal the interfaces of the assembly package for the purpose of reducing VOC contamination on the package interior. In particular, the method includes applying a B-stage epoxy firstly to a first surface of a first member to be packaged. Optionally, as shown in FIG. 59A, the first member includes a lid member 5901. Optionally, the first member is a window member. Optionally, the first surface is a bottom surface of the window member. Optionally, the B-stage epoxy 5902 is applied to a peripheral edge region of the bottom surface of the window member 5901.

Figure 59B:
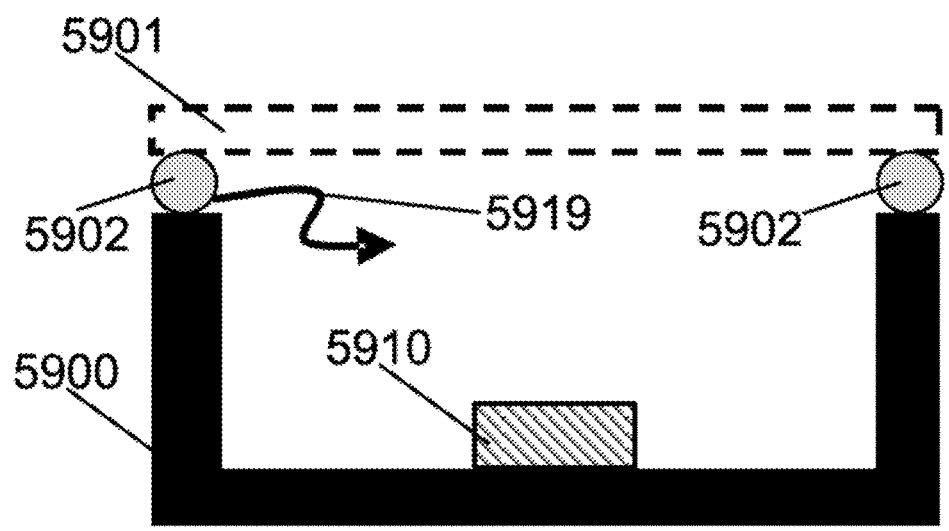
FIG. 59B is a schematic diagram illustrating a step of packaging an integrated white light source according to an embodiment of the present invention.

The method further includes partially curing the B-stage epoxy applied on the first member isolated from a second member to be packaged. Optionally, as shown in FIG. 59A, the partially curing the B-stage epoxy 5902 substantially releases VOCs 5909 therein to form a low-outgassing state. Optionally, as shown in FIG. 59B, the second member includes a support member 5900 to hold a laser diode 5910 with a facet. Optionally, the support member 5900 is a frame member having a second surface configured to be attached with the first surface of the first member. Optionally, the second surface is a top surface of a wall ridge or surrounding edge of the frame member. Additionally, the method includes attaching the first member to the second member by engaging the first surface via the partially cured B-stage epoxy with the second surface. Furthermore, the method includes performing a final curing of the B-stage epoxy in the low outgassing state to seal an interface between the first surface and the second surface. Optionally, as shown in FIG. 59B, the release of VOCs 5919 is substantially reduced during the final curing. Optionally, the B-stage epoxy can be one selected from a class of epoxy materials that are highly thermal conductive and can be cured in the two-step process yielding much reduced VOCs, or a combination of multiple of above materials.

In another specific embodiment, the method includes using sintered nano-metals to seal the interfaces of the assembly package for the purpose of reducing out-gas contamination on the package interior. In particular, sintered nano-metals can be used for sealing the first member with the second member of the integrated white light source to reduce or eliminate the need for epoxy seals. Optionally, the sintered nano-metals provide a solid hermetic joint between two surfaces of a lid and a frame. Optionally, the sintered nano-metals are created at sufficiently low temperatures to allow manufacturability of sealed devices. A number of nano-metal sintering solders are available and include Ag, and Cu nano-metals.

Figure 60:
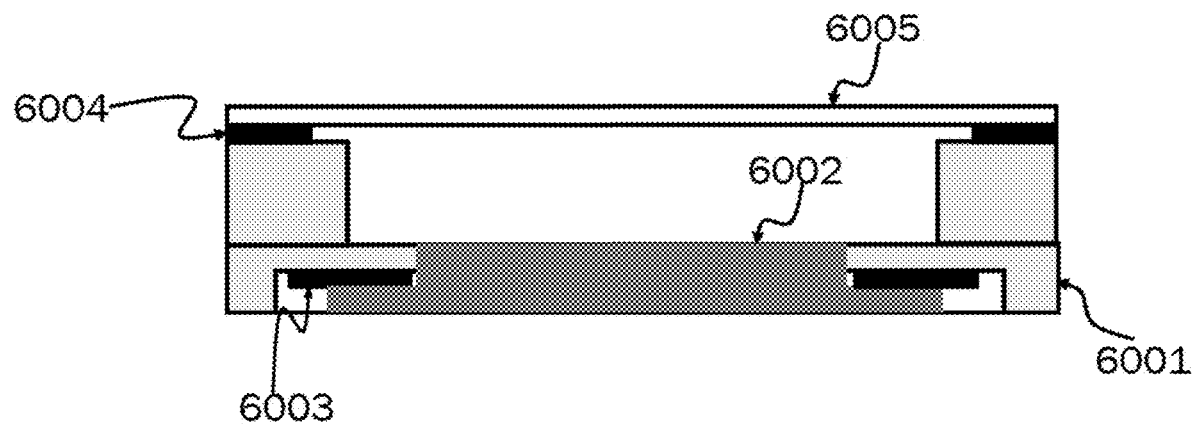
FIG. 60 is a schematic diagram of a hermetic sealed package with a window attachment and slug attachment according to an embodiment of the present invention.

In an embodiment, the sintered nano-metals seal technology can be applied for hermetic package, slug attachment, and window attachment. In an example, the sintered nano-metals seal technology is substantially a high power semiconductor packaging technology. FIG. 60 is a schematic diagram of a hermetic seal package with a window attachment and slug attachment according to an embodiment of the present invention. A metal slug 6002 is bonded to a ceramic frame 6001 by various processes depending on the application requirement. For high power, hermetic applications, this is typically accomplished by brazing the metal slug 6002 to the ceramic frame 6001 in a very high temperature process in a range of 650-850° C. Due to the high temperature processing, controlling the placement accuracy of the slug 6002 within the frame 6001 is difficult and can lead to post-brazing misalignment of the slug 6002 and the frame 6001.

For light emitting device packages, lasers typically require a hermetic environment for good reliability. As shown in the FIG. 60, a window member 6005, typically made by soda lime glass, borosilicate glass, quartz, and sapphire, is attached to the surface of the package frame 6001 sealed by a few sealing materials 6004 through relevant processes. For example, the hermetic sealing of the integrated white light source package can be accomplished by attaching the window member to surface of the package frame using epoxy and metal-alloy solder to form a joint 6004 between the window member 6005 and the frame member 6001. Optionally, the joint 6004 can be made using an epoxy selected from one or more B-stage epoxy that are suitable for performing two-stage curing process described earlier. Optionally, the joint 6004 can be made using solders like AuSn, In, PbSn, SAC305, etc. Regular epoxy bonding is disliked as it outgases during the curing process whereby these outgassed materials end up sealed inside the package. Soldering of the window to package reduces the outgassing problem but increases the process temperatures required for a good bond seal.

Optionally, the use of solders for attaching the window member 6005 to the ceramic package frame member 6001 can provide a hermetic seal for the window to the package rendering the cavity space a well-controlled environment for laser operation. In order for a good hermetic contact to be made for most solders, the ceramic surface of the frame member 6001 as well as the glass surface of the window member 6005 would need to be prepared for solder reflow by coatings typically containing inert metal layers like Au, Pd, Ag, Os or Pt. These metal coatings provide a smooth, wetting surface for the solder alloys.

In a specific embodiment, the sintered nano-metals can be used as a soldering technology that can improve the joint between the window member and the frame member for the assembly package of the integrated white light source. The sintered nano-metals used as a solder provide a lower thermal process and allow better control and placement accuracy for the final package. A number of nano-metal sintering solders are available and include Ag and Cu based nano-metals. These nano-metal materials can form solid joints with high thermal conductivities ranged from 75 W/m·K to ~300 W/m·K. Manufacturable processing of these materials includes paste dispense and 250° C. curing to form the joint. These joints can be made hermatic when sufficient paste is used to form a solid, continuous joining. As the nano-metal material sinters during this process, it is difficult to further reflow this material as its melting point becomes close to that of the pure metal after sintering (Ag~960° C., Cu~1085° C.) and allows great flexibility on thermal processes further down the process. Standard solders like SAC, PbSn do not sinter and thus retain a very low melting point, which limits further process steps to below this melting point, constraining the order of processing steps to lower and lower temperatures.

Figure 61:
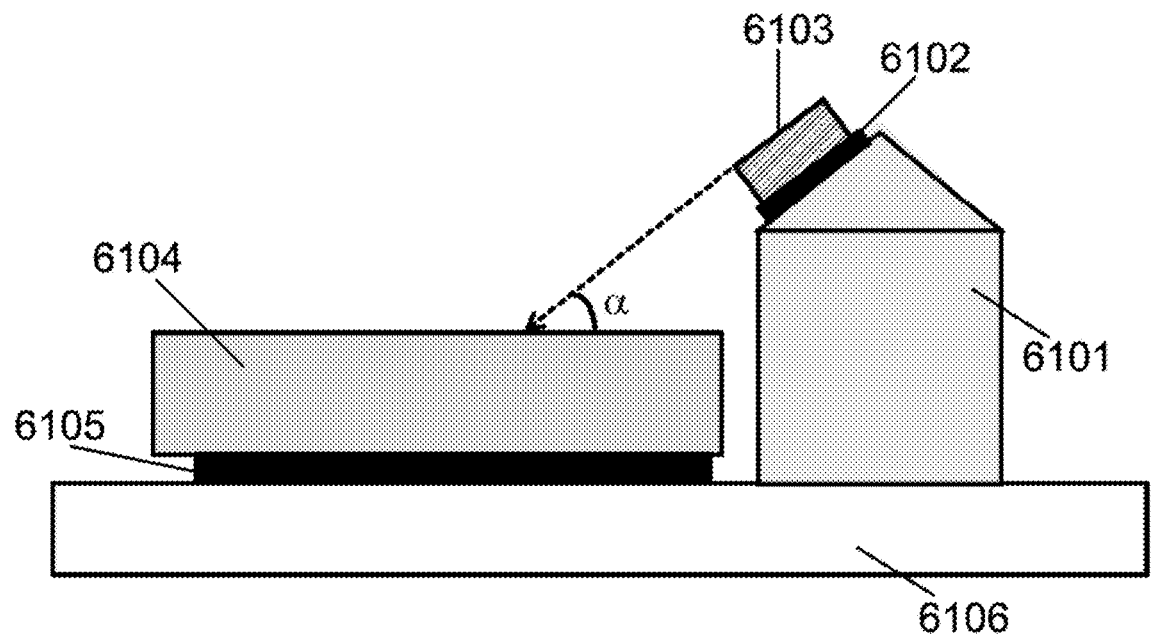
FIG. 61 is a schematic diagram showing an integrated white light source with laser and phosphor being attached to a package support member according to an embodiment of the present invention.

In another specific embodiment, the sintered nano-metals seal technology can be applied for laser attachment, and phosphor attachment. FIG. 61 is a schematic diagram showing an integrated white light source with laser and phosphor being attached to a package support member according to an embodiment of the present invention. As shown, the laser subcomponents used in the integrated white light source require very good thermal conductance to the package support member 6106 due to the high thermal power dissipated by the laser. The laser subcomponent 6103 is typically a multilayered structure consisting of a GaN laser structure bonded to a submount. This laser subcomponent 6103 is then soldered onto a wedge mount 6101 formed on the package support member 6106. The laser diode 6103 and the phosphor member 6104 are attached to mounting surfaces overlying the package support member 6106 with a non-parallel geometrical relationship determined by an offset angle (a) and at different heights such that the emission of the excitation beam from the laser diode 6103 exits the laser diode at a greater height than the top surface of the phosphor member 6104. The wedge mount 6101 is used to elevate and tilt the laser into its proper position inside the package such that the output beam from the laser diode 6103 is incident on the phosphor member 6104 with a predetermined spatial location, a predetermined incident angle (a), and a predetermined excitation spot diameter, which all dictate the performance of the laser based light source.

Conventionally, the laser subcomponent is typically soldered onto the wedge mount using standard solder (e.g., SnAgCu—SAC, PbSn, AuSn, etc). These conventional solders are mediocre thermal conductors (typically 50 W/m·K) and can be a limiting factor on the removal of heat from the laser subcomponent thereby limiting device efficiency, light output, and reliability.

In the embodiment, sintered nano-metals can be used as a soldering technology to form attach joint 6102 between the laser subcomponent 6103 and the wedge mount 6101 as we as to form attach joint 6105 between the phosphor 6104 and the package support member 6106. The sintered nano-metals can improve the thermal conductivity of the attach joint 6102 or 6105 to provide improved thermal conduction path for the laser subcomponent 6103 and phosphor 6104. This allows for lower laser operating temperatures, improved light output and efficiency for either laser excitation or the phosphor re-emission, and improved reliability of the integrated white light source. A number of sintered nano-metal based solders are available and include Ag and Cu based sintered nano-metals. These materials form solid joints with thermal conductivities ranging from 75 W/m·K to 300 W/m·K and can be made by simple manufacturable processing that requires a paste dispense and 250° C. curing. As the material sinters during this process, it is difficult to further reflow this material as its melting point becomes close to that of the pure metal after sintering (Ag~960° C., Cu~1085° C.) and allows great flexibility on thermal processes further down the process. Standard solders like SAC, PbSn do not sinter and thus retain a very low melting point, which limits further process steps to below this melting point, constraining the order of processing steps to lower and lower temperatures.

Figure 62:
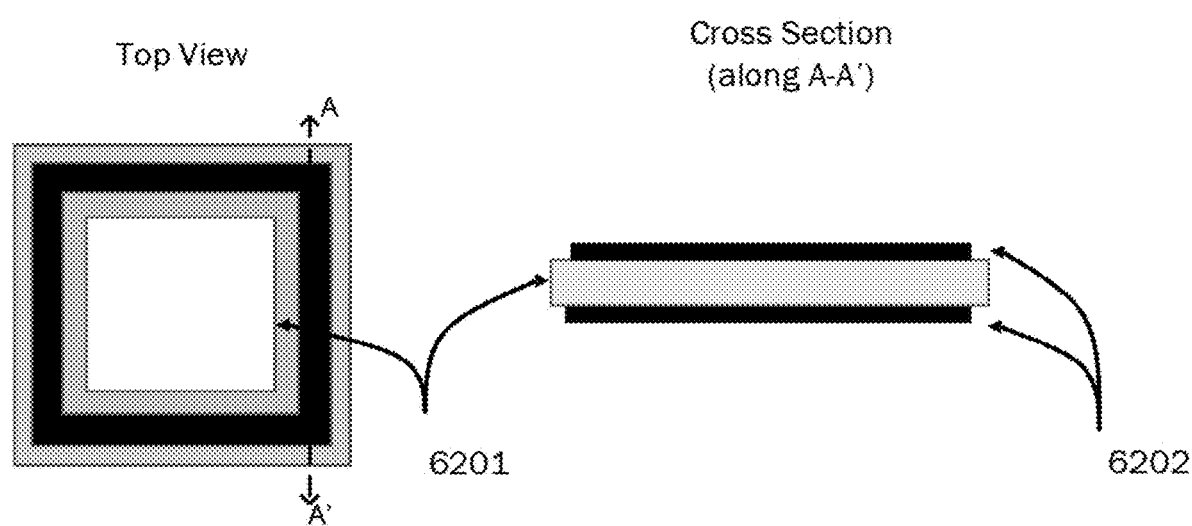
FIG. 62 is a schematic top view and cross section view of an exemplary composite preform of solder for packaging an integrated white light source according to an embodiment of the present invention.

In some embodiments, the solders could take a number of forms including pastes, preforms, or composite performs. FIG. 62 shows an example of a composite preform of a metal frame 6201 sandwiched by solder material 6202. The metal frame 6201 can be pre-formed in a desired shape that is fitted with the integrated white light source package shown in FIG. 60. Optionally, the metal frame 6201 is made of Cu, Kovar, steel, etc., selected specifically for improving temperature coefficient match between the window member and the package during temperature excursions in process or operation.

Figure 63:
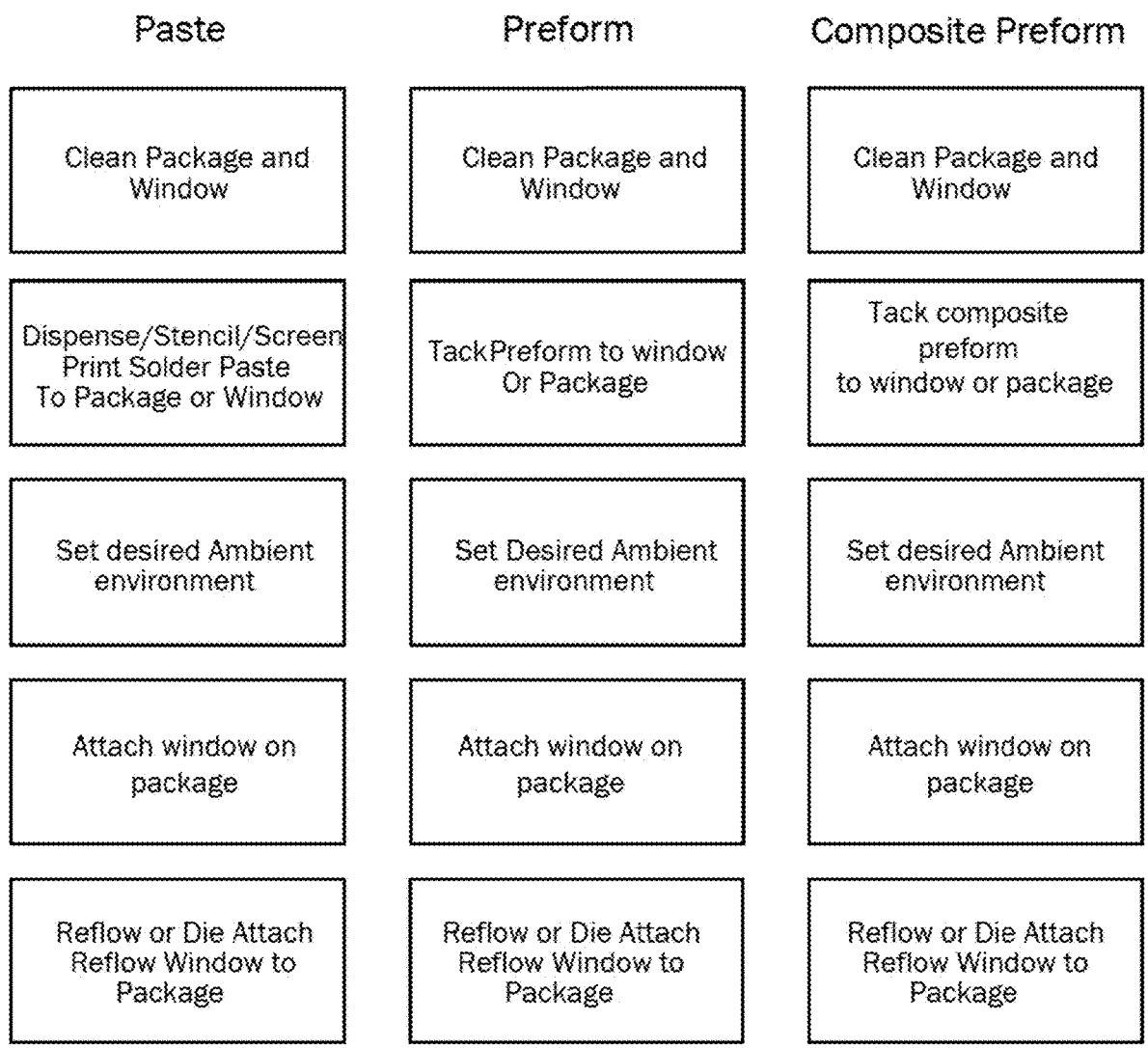
FIG. 63 shows three exemplary process flow of applying solder to attach window member to frame member in a hermetic seal for white light source package according to some embodiments of the present invention.

Semiconductor processes for solders would be employed for completing the hermetic seal. FIG. 63 shows typical flow diagrams for processes which start with paste, perform or composite performs. Typical reflow conditions for the solders would be used but alternative approaches for causing reflow could also be used such as die bonding, localized laser heating of solder, IR heating of solder, resistive heating of solder to minimize thermal excursions on the other parts of the completed package such as the laser, the phosphor, and ESD devices. In an embodiment, when the solder is provided as a paste, the soldering process of attaching a window to a package includes cleaning the package and the window and dispensing the paste to the package or the window. Optionally, the paste can also be stenciled to the package or the window. Optionally, the paste can be screen printed onto the package or the window. Additionally, the soldering process includes setting a desired ambient environment and attaching the window on the package. Finally, the soldering process includes reflowing the window to the package. Optionally, the reflowing step is to use die attach reflow process.

In another embodiment, when the solder is provided as a preform or a composite preform, the soldering process of attaching a window to a package includes cleaning the package and the window and tacking the preform or the composite preform to the window or the package. Additionally, the soldering process includes setting a desired ambient environment and attaching the window on the package. Finally, the soldering process includes reflowing the window to the package. Optionally, the reflowing step is to use die attach reflow process.

In a preferred configuration of this integrated white light source, the window is attached to the frame member using a die attaching or thermal oven reflow techniques with solders such as AuSn solder, SAC solder such as SAC305, lead containing solder, or indium, but can be others. In an alternative embodiment sintered Ag pastes or films can be used for the attach process at the interface.

In an alternative preferred configuration of this integrated white light source, the window is comprised in a composite metal lid member and the lid member is secured to the SMD package using a welding process. The welding process would be ideal for ensuring hermeticity of the package as it is a commonly used method for sealing conventional laser diode product packages such as TO canister packages, butterfly packages, and other packages. In this configuration the window would be attached to a metal member that was compatible with the welding process, such that the lid member was a composite member comprised of a glass or sapphire window region and a metallic region suitable for welding. In one embodiment this configuration, the lid member would be welded to a frame member wherein the frame member would be comprised of a metal suitable for a welding process. In another configuration of this embodiment, the lid member could be welded to the base member or a support member of the SMD package. In one such configuration there would be no need for a frame. In one example, the lid member would be similar to a TO canister cap member.

The SMD consisting of a blue chip-on-submount (CoS) edge emitting laser diode and broad yellow emitting phosphor can emit color temperatures greater than ~6300 K varying with choice of materials and laser wavelength. In order to emit warmer white with lower correlated color temperature (CCT) a red source may be incorporated. This red source may be addition of another phosphor material, quantum dot, photo-stimulable quantum, well structure or addition of a red emitting solid state device like an LED, laser, OLED or similar. Addition of red LEDs are similarly unsuitable for incorporation into high luminance laser based warm-white emitting devices due to the extended emitting area which is 10 to 100 times larger than present in high luminance laser based cool-white emitting devices. These red emitting solutions are not sufficient for incorporation into high luminance laser based warm-white emitting devices if a homogenous color spot is desired.

Figure 64:
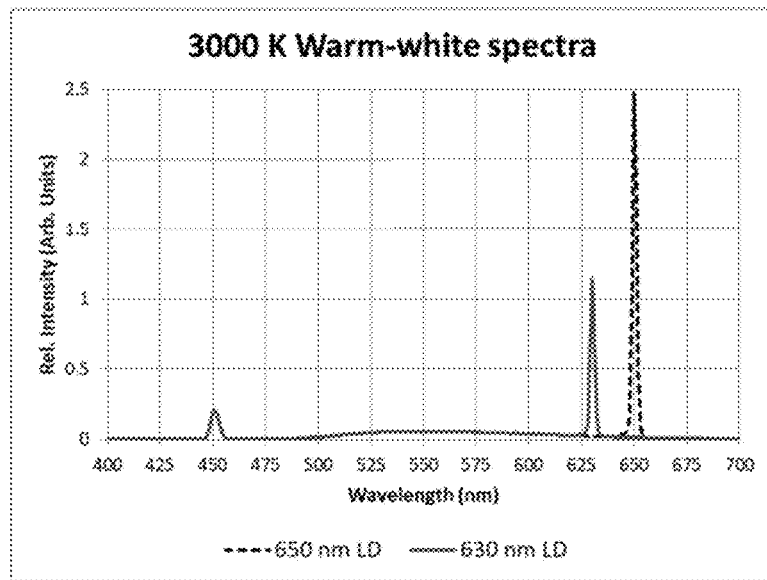
FIG. 64 is a plot illustrating an example spectra for a Blue laser phosphor converted cool white device with addition of either red laser 625 nm or red laser 650 nm top achieve Warm white 3000K.
Figure 65:
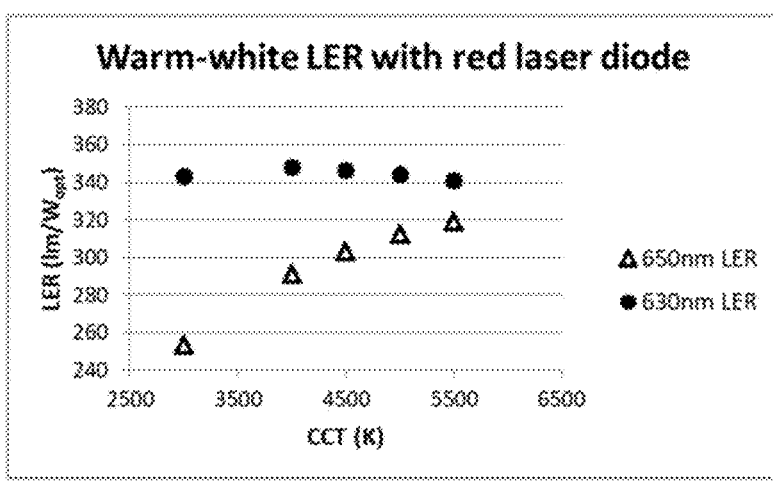
FIG. 65 is a plot illustrating an example of luminous efficacy of radiation (LER, luminous flux per radiant flux of the emitted light) for laser based warm-white emission simulated at various CCTs incorporating either 630 or 650 nm red laser diode.

To preserve the high luminance capability of laser based white emitters in a warm-white device, a red laser diode can be used as the red emission source. Cool-white versions of these devices incorporate blue laser emission in order to excite a 100 to 300 μm diameter spot on broad yellow emitting phosphor material. The effective emission point of these devices is this excited spot on the yellow phosphor. A warm-white device may be made by addition of a red laser diode. The red laser emission may be projected onto the blue-excited spot of the phosphor material to preserve the high luminance properties of the laser based white emitter. Further, color uniformity is maintained by presenting red emission to the same spot area as the blue excitation spot on the phosphor material. The choice of red laser wavelength has significant effects on the CCT of the emitted white light. The ability to emit the warm-white color efficiently is also effected by choice of red laser wavelength. FIG. 64 presents the warm-white spectra obtained in simulation when incorporating a red laser diode emitting 630 or 650 nm with the blue laser diode and yellow phosphor. In these emission spectra, the total blue and yellow components of the emission are almost identical. The red laser emission of a 650 nm laser diode may contain greater than 2 times the optical power to achieve 3000 K warm-white as compared to a 630 nm red laser diode. FIG. 65 presents the luminous efficacy of radiation (LER, luminous flux per radiant flux of the emitted light) for laser based warm-white emission simulated at various CCTs incorporating either 630 or 650 nm red laser diode.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. An integrated white light source comprising:
a laser diode device comprising a gallium and nitrogen containing material and configured as an excitation source;
a phosphor member configured as a wavelength converter and an emitter and coupled to the laser diode device;
a common support member configured to support the laser diode device and the phosphor member,
a heat sink thermally coupled to the common support member, the common support member configured to transport thermal energy from the laser diode device and phosphor member to the heat sink;
an output facet configured on the laser diode device configured to output a laser beam comprised of electromagnetic radiation selected from a violet and/or a blue emission with a first wavelength ranging from 400 nm to 485 nm;
a free space, between the output facet and the phosphor member with a non-guided characteristic capable of transmitting the laser beam from the laser diode device to an excitation surface of the phosphor member;
a range of angles of incidence between the laser beam and the excitation surface of the phosphor member so that on average the laser beam has an off-normal incidence to the excitation surface and a beam spot is configured for a certain geometrical size and shape;
wherein the phosphor member is configured to convert a fraction of the electromagnetic radiation from the laser beam with the first wavelength to an emitted electromagnetic radiation with a second wavelength that is longer than the first wavelength;
a plurality of scattering centers associated with the phosphor member configured to scatter electromagnetic radiation with the first wavelength from the laser beam incident on the phosphor member, wherein the plurality of scattering centers comprises one or more patterned surface textures on the excitation surface of the phosphor member, including a first plurality of linear stripes with steep sidewalls laid along a length of the beam spot area in a direction parallel to a projection of a fast axis of the laser beam near upper bound part of the beam spot area on the excitation surface and configured to face the laser beam near the upper bound of the beam spot area with substantially close to a normal angle of incidence;
a reflective mode characterizing the phosphor member such that the laser beam is incident on a beam spot area on the excitation surface of the phosphor member and a white light emission is outputted substantially from the same beam spot area, the white light emission being comprised of a mixture of wavelengths characterized by at least the second wavelength emitted electromagnetic radiation from the phosphor member; and
a form factor characterizing a package of the integrated white light source, the form factor having a length, a width, and a height dimension.

2. The integrated white light source of claim 1, wherein the common support member is configured to have a submount structure to support the laser diode device in a surface mount device (SMD) package.

3. The integrated white light source of claim 1, wherein the plurality of scattering centers comprises defective regions embedded locally in non-defective bulk of the phosphor member, wherein the defective regions comprise one or more defects having single length extended continuously across a lateral length the phosphor member and/or having multiple discontinuous lengths extended to the same lateral dimension of the phosphor member; or one or more sets of defects located at a first depth below the excitation surface of the phosphor member overlapped with some defects located at a second depth; or one or more sets of defective regions formed in a close-loop shape surrounding the beam spot area, the close-loop shape being one selected from a circle, an ellipse, a square, a rectangle, hexagon, and other polygon.

4. The integrated white light source of claim 1, further comprising a second plurality of linear stripes with shallower sidewalls laid along the length of the beam spot area next to the first plurality of linear stripes in the direction parallel to the projection of the fast axis of the laser beam near center part of the beam spot area and configured to face the laser beam around a center line of the beam spot area with substantially close to a normal angle of incidence.

5. The integrated white light source of claim 1, wherein the phosphor member is configured as a photonic crystal comprising a set of voids filled with air or a dielectric material in the excitation surface periodically spaced in the direction parallel to a projection of a fast axis of the laser beam to scatter electromagnetic radiation of the laser beam with the first wavelength within the phosphor member to be converted to the emitted beam with the second wavelength that is longer than the first wavelength.

6. The integrated white light source of claim 1, wherein the phosphor member is configured as a photonic crystal comprising a plurality of nano-scale surface textures formed into the excitation surface to create a moth eye structure for reducing average index of refraction.

7. The integrated white light source of claim 1, wherein the phosphor member is configured as a photonic crystal attached to the excitation surface of the phosphor member, wherein the photonic crystal comprises a surface formed with a sets of defective voids or moth eye textures configured to scatter electromagnetic radiation of the laser beam with the first wavelength incident on the excitation surface of the phosphor member and convert to the emitted beam with the second wavelength that is longer than the first wavelength.

8. The integrated white light source of claim 1, wherein the phosphor member is comprised of a ceramic yttrium aluminum garnet (YAG) doped with Ce or a single crystal YAG doped with Ce or a powdered YAG comprising a binder material; wherein the phosphor member has an optical conversion efficiency of greater than 50 lumen per optical watt.

9. The integrated white light source of claim 1, wherein the phosphor member is comprised of a single crystal plate or ceramic plate selected from a Lanthanum Silicon Nitride compound and Lanthanum aluminum Silicon Nitrogen Oxide compound containing $Ce^{3+}$ ions atomic concentration ranging from 0.01% to 10%.

10. An integrated white light source comprising:
a laser diode device comprising a gallium and nitrogen containing material and configured as an excitation source;
a phosphor member configured as a wavelength converter and an emitter and coupled to the laser diode device;
a common support member configured to support the laser diode device and the phosphor member,
a heat sink thermally coupled to the common support member, the common support member configured to transport thermal energy from the laser diode device and phosphor member to the heat sink;
an output facet configured on the laser diode device configured to output a laser beam comprised of electromagnetic radiation selected from a violet and/or a blue emission with a first wavelength ranging from 400 nm to 485 nm;
a free space, between the output facet and the phosphor member with a non-guided characteristic capable of transmitting the laser beam from the laser diode device to an excitation surface of the phosphor member;
a range of angles of incidence between the laser beam and the excitation surface of the phosphor member so that on average the laser beam has an off-normal incidence to the excitation surface and a beam spot is configured for a certain geometrical size and shape;
wherein the phosphor member is configured to convert a fraction of the electromagnetic radiation from the laser beam with the first wavelength to an emitted electromagnetic radiation with a second wavelength that is longer than the first wavelength;
a plurality of scattering centers associated with the phosphor member configured to scatter electromagnetic radiation with the first wavelength from the laser beam incident on the phosphor member, wherein the plurality of scattering centers comprises a first sets of linear defective regions formed near a first boundary of the beam spot area; a second sets of linear defective regions formed near a second boundary of the beam spot area, the second sets of linear defective regions being substantially in parallel to the first sets of linear defective regions; a third sets of linear defective regions formed near a third boundary of the beam spot area and a fourth sets of linear defective regions formed near a fourth boundary of the beam spot area; the fourth sets of linear defective regions being substantially in parallel to the third sets of linear defective regions and perpendicular to the first sets of linear defective regions; or a series of linear defective regions formed in parallel to each other with a spacing between any two neighboring linear defective regions being varied along a length of the beam spot area in a direction parallel to a projection of a fast axis of the incident laser beam on the excitation surface of the phosphor member;
a reflective mode characterizing the phosphor member such that the laser beam is incident on a beam spot area on the excitation surface of the phosphor member and a white light emission is outputted substantially from the same beam spot area, the white light emission being comprised of a mixture of wavelengths characterized by at least the second wavelength emitted electromagnetic radiation from the phosphor member; and
a form factor characterizing a package of the integrated white light source, the form factor having a length, a width, and a height dimension.

11. An integrated white light source based on a beam of laser light, comprising:
a laser diode device comprising a gallium and nitrogen containing material and configured as an excitation source;
a phosphor member configured as a wavelength converter and an emitter and coupled to the laser diode device;
a shaped support member having at least a flat surface portion and one or more wedge portions with inclined planes, each inclined plane forming a wedge angle relative to surface normal of the flat surface region, the flat surface region being configured to support the phosphor member with an excitation surface, and the each inclined plane being configured to have one of the one or more laser diode devices being attached thereon;

an output facet configured on the laser diode device configured to output a laser beam comprised of electromagnetic radiation selected from a violet and/or a blue emission with a first wavelength ranging from 400 nm to 485 nm;

a range of angles of incidence between the laser beam and the excitation surface of the phosphor member so that on average the laser beam has an off-normal incidence to the excitation surface and a beam spot area is configured for a certain geometrical size and shape confined from a lower bound to an upper bound of the laser beam;

wherein the phosphor member is configured to convert a fraction of the electromagnetic radiation from the laser beam with the first wavelength to an emitted electromagnetic radiation with a second wavelength that is longer than the first wavelength, and wherein the phosphor member is configured as a photonic crystal comprising a set of voids filled with air or a dielectric material in the excitation surface periodically spaced in the direction parallel to a projection of a fast axis of the laser beam to scatter electromagnetic radiation of the laser beam with the first wavelength within the phosphor member to be converted to the emitted beam with the second wavelength that is longer than the first wavelength;

a reflective mode characterizing the phosphor member such that the laser beam is incident on a beam spot area on the excitation surface of the phosphor member and a white light emission is outputted substantially from the same beam spot area, the white light emission being comprised of a mixture of wavelengths characterized by at least the second wavelength emitted electromagnetic radiation from the phosphor member; and a form factor characterizing a package of the integrated white light source including a frame member and a lid member, the form factor having a length, a width, and a height dimension.

12. The integrated white light source of claim 11, wherein the phosphor member is configured as a photonic crystal comprising a plurality of nano-scale surface textures formed into the excitation surface to create a moth eye structure for reducing average index of refraction.

13. The integrated white light source of claim 11, wherein the phosphor member is configured as a photonic crystal attached to the excitation surface of the phosphor member, wherein the photonic crystal comprises a surface formed with a sets of defective voids or moth eye textures configured to scatter electromagnetic radiation of the laser beam with the first wavelength incident on the excitation surface of the phosphor member and convert to the emitted beam with the second wavelength that is longer than the first wavelength.

14. The integrated white light source of claim 11, wherein the shaped support member is configured to have a submount structure at the flat surface portion integrated the one or more wedge portions in one piece of material or as a separate base for attaching one or more wedge portions to support the laser diode device in a surface mount device (SMD) package with the lid member sealed over the frame member.

15. The integrated white light source of claim 11, wherein the phosphor member is comprised of a ceramic yttrium aluminum garnet (YAG) doped with Ce or a single crystal YAG doped with Ce or a powdered YAG comprising a binder material; and wherein the phosphor has an optical conversion efficiency of greater than 50 lumen per optical watt.

16. The integrated white light source of claim 11, wherein the phosphor member is comprised of a single crystal plate or ceramic plate selected from a Lanthanum Silicon Nitride compound and Lanthanum aluminum Silicon Nitrogen Oxide compound containing $Ce^{3+}$ ions atomic concentration ranging from 0.01% to 10%.

17. An integrated white light source based on a beam of laser light, comprising:

a laser diode device comprising a gallium and nitrogen containing material and configured as an excitation source;

a phosphor member configured as a wavelength converter and an emitter and coupled to the laser diode device;

a shaped support member having at least a flat surface portion and one or more wedge portions with inclined planes, each inclined plane forming a wedge angle relative to surface normal of the flat surface region, the flat surface region being configured to support the phosphor member with an excitation surface, and the each inclined plane being configured to have one of the one or more laser diode devices being attached thereon;

an output facet configured on the laser diode device configured to output a laser beam comprised of electromagnetic radiation selected from a violet and/or a blue emission with a first wavelength ranging from 400 nm to 485 nm;

a range of angles of incidence between the laser beam and the excitation surface of the phosphor member so that on average the laser beam has an off-normal incidence to the excitation surface and a beam spot area is configured for a certain geometrical size and shape confined from a lower bound to an upper bound of the laser beam;

wherein the phosphor member is configured to convert a fraction of the electromagnetic radiation from the laser beam with the first wavelength to an emitted electromagnetic radiation with a second wavelength that is longer than the first wavelength;

a plurality of scattering centers associated with the phosphor member configured to scatter electromagnetic radiation with the first wavelength from the laser beam incident on the phosphor member, wherein the plurality of scattering centers comprises one or more patterned surface textures on the excitation surface of the phosphor member, including a first plurality of linear stripes with steep sidewalls laid along a length of the beam spot area in a direction parallel to a projection of a fast axis of the laser beam near upper bound part of the beam spot area on the excitation surface and configured to face the laser beam near the upper bound of the beam spot area with substantially close to a normal angle of incidence;

a reflective mode characterizing the phosphor member such that the laser beam is incident on a beam spot area on the excitation surface of the phosphor member and a white light emission is outputted substantially from the same beam spot area, the white light emission being comprised of a mixture of wavelengths characterized by at least the second wavelength emitted electromagnetic radiation from the phosphor member; and a form factor characterizing a package of the integrated white light source including a frame member and a lid member, the form factor having a length, a width, and a height dimension.

18. The integrated white light source of claim 17, further comprising a second plurality of linear stripes with shallower sidewalls laid along the length of the beam spot area next to the first plurality of linear stripes in the direction parallel to the projection of the fast axis of the laser beam near center part of the beam spot area and configured to face the laser beam around a center line of the beam spot area with substantially close to a normal angle of incidence.

\* \* \* \* \*